United States Patent
Lee et al.

(10) Patent No.: US 12,552,985 B2
(45) Date of Patent: Feb. 17, 2026

(54) HETEROCYCLIC COMPOUND AND ORGANIC LIGHT-EMITTING DEVICE COMPRISING SAME

(71) Applicant: LT MATERIALS CO., LTD., Yongin-si (KR)

(72) Inventors: Gi-Back Lee, Yongin-si (KR); Nam-Jin Lee, Yongin-si (KR); Won-Jang Jeong, Yongin-si (KR); Dong-Jun Kim, Yongin-si (KR)

(73) Assignee: LT MATERIALS CO., LTD., Yongin-si (KR)

( * ) Notice: Subject to any disclaimer, the term of this patent is extended or adjusted under 35 U.S.C. 154(b) by 912 days.

(21) Appl. No.: 17/781,291

(22) PCT Filed: Nov. 27, 2020

(86) PCT No.: PCT/KR2020/017025
§ 371 (c)(1),
(2) Date: May 31, 2022

(87) PCT Pub. No.: WO2021/112496
PCT Pub. Date: Jun. 10, 2021

(65) Prior Publication Data
US 2023/0023238 A1    Jan. 26, 2023

(30) Foreign Application Priority Data
Dec. 2, 2019    (KR) .......................... 10-2019-0158383

(51) Int. Cl.
*H01L 51/00* (2006.01)
*C07D 471/04* (2006.01)
(Continued)

(52) U.S. Cl.
CPC ............ *C09K 11/06* (2013.01); *C07D 471/04* (2013.01); *H10K 85/654* (2023.02);
(Continued)

(58) Field of Classification Search
CPC ............ C09K 11/06; C09K 2211/1018; C07D 471/04; C07D 487/04; H10K 85/654;
(Continued)

(56) References Cited

U.S. PATENT DOCUMENTS 3,917,610 A * 11/1975 Takacs ................ C07D 471/04
546/148
4,356,429 A    10/1982 Tang
(Continued)

FOREIGN PATENT DOCUMENTS

CN    111683947 A *  9/2020    ............. H10K 50/00
JP    2021508698 A *  3/2021    ............ C07D 221/18
(Continued)

OTHER PUBLICATIONS

International Search Report for PCT/KR2020/017025 mailed on Mar. 15, 2021.
(Continued)

*Primary Examiner* — Michael M Dollinger
(74) *Attorney, Agent, or Firm* — Birch, Stewart, Kolasch & Birch, LLP

(57) ABSTRACT

The present specification relates to a heterocyclic compound represented by Chemical Formula 1, and an organic light emitting device including the same.

13 Claims, 2 Drawing Sheets

(51) Int. Cl.
*C09K 11/06* (2006.01)
*H10K 85/60* (2023.01)
*H10K 50/16* (2023.01)
*H10K 50/18* (2023.01)
*H10K 50/19* (2023.01)

(52) U.S. Cl.
CPC .. *H10K 85/6572* (2023.02); *C09K 2211/1018* (2013.01); *H10K 50/16* (2023.02); *H10K 50/18* (2023.02); *H10K 50/19* (2023.02)

(58) Field of Classification Search
CPC .... H10K 85/6572; H10K 50/16; H10K 50/18; H10K 50/19; C07F 9/6561
See application file for complete search history.

(56) References Cited

U.S. PATENT DOCUMENTS

| | | |
|---|---|---|
| 8,399,880 B2 | 3/2013 | Kim et al. |
| 12,286,428 B2 * | 4/2025 | Nair ............ A61P 29/00 |
| 2008/0076188 A1 * | 3/2008 | Patsenker ............ C07D 307/77 546/100 |
| 2015/0076466 A1 | 3/2015 | Park |
| 2018/0323379 A1 | 11/2018 | Kim et al. |
| 2020/0308150 A1 | 10/2020 | Lee et al. |
| 2021/0292320 A1 * | 9/2021 | Panarese ............ C07D 471/04 |

FOREIGN PATENT DOCUMENTS

| | | |
|---|---|---|
| KR | 10-1127579 B1 | 3/2012 |
| KR | 10-2014-0093163 A | 7/2014 |
| KR | 10-2017-0053534 A | 5/2017 |
| KR | 10-2019-0037925 A | 4/2019 |
| WO | WO 2013/163022 A1 | 10/2013 |

OTHER PUBLICATIONS

Kuwabara et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenylamino)triphenylamine (m-MTDATA), as Hole-Transport Materials" Advanced Material, 1994, vol. 6, No. 9, pp. 677-679.

* cited by examiner

[FIG. 1]
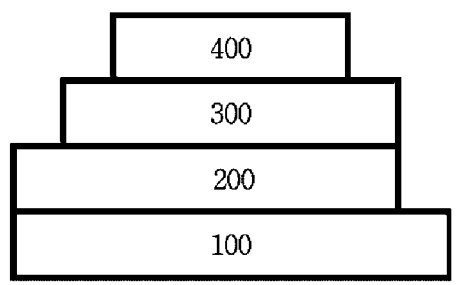
[FIG. 2]
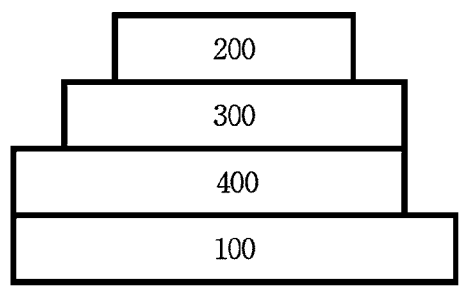
[FIG. 3]
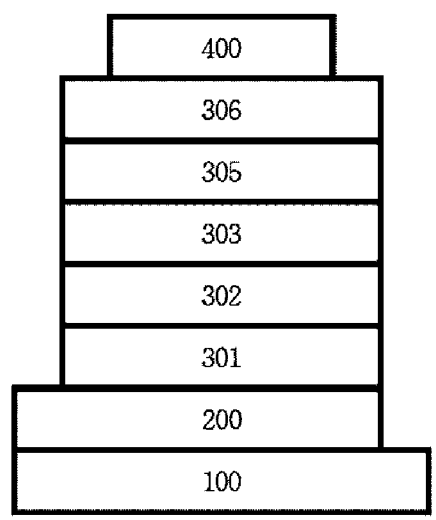

【FIG. 4】
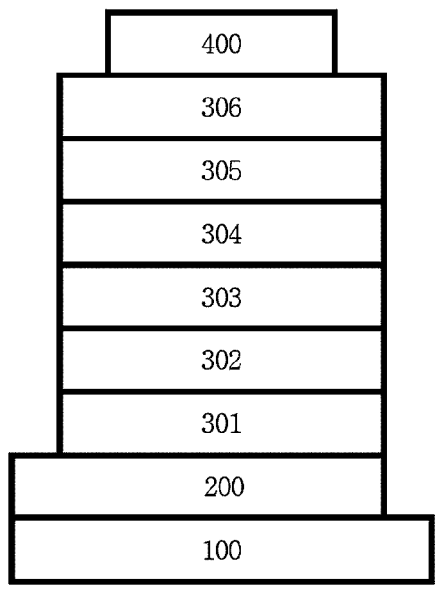
【FIG. 5】
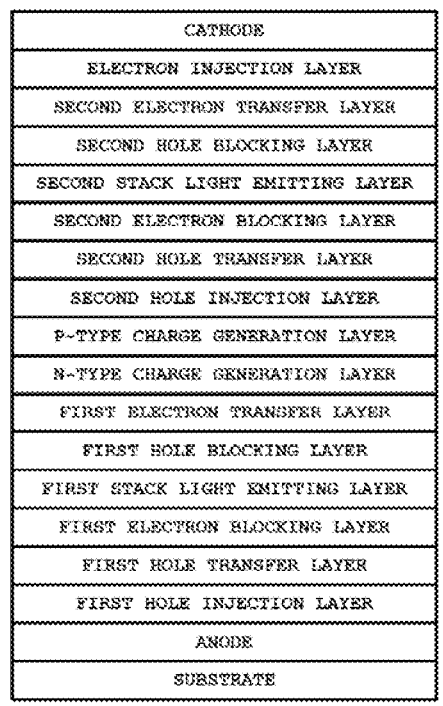

HETEROCYCLIC COMPOUND AND ORGANIC LIGHT-EMITTING DEVICE COMPRISING SAME

TECHNICAL FIELD

The present specification relates to a heterocyclic compound, and an organic light emitting device including the same.

The present specification claims priority to and the benefits of Korean Patent Application No. 10-2019-0158383, filed with the Korean Intellectual Property Office on Dec. 2, 2019, the entire contents of which are incorporated herein by reference.

BACKGROUND ART

An electroluminescent device is one type of self-emissive display devices, and has an advantage of having a wide viewing angle, and a high response speed as well as having an excellent contrast.

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

A material of the organic thin film may have a light emitting function as necessary. For example, as a material of the organic thin film, compounds capable of forming a light emitting layer themselves alone may be used, or compounds capable of performing a role of a host or a dopant of a host-dopant-based light emitting layer may also be used. In addition thereto, compounds capable of performing roles of hole injection, hole transfer, electron blocking, hole blocking, electron transfer, electron injection and the like may also be used as a material of the organic thin film.

Development of an organic thin film material has been continuously required for enhancing performance, lifetime or efficiency of an organic light emitting device.

DISCLOSURE

Technical Problem

The present specification is directed to providing a heterocyclic compound, and an organic light emitting device including the same.

Technical Solution

One embodiment of the present specification provides a heterocyclic compound represented by the following Chemical Formula 1.

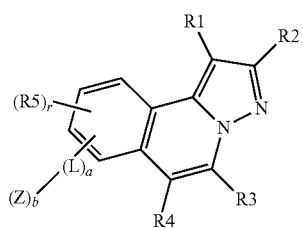

[Chemical Formula 1]

In Chemical Formula 1,

R1 to R5 are each independently hydrogen; deuterium; a halogen group; a cyano group; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms, L is a direct bond; a substituted or unsubstituted arylene group having 6 to 60 carbon atoms; or a substituted or unsubstituted heteroarylene group having 2 to 60 carbon atoms, and Z is a substituted or unsubstituted aryl group having 10 to 60 carbon atoms; or a substituted or unsubstituted phosphine oxide group, or represented by the following Chemical Formula 2,

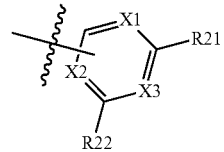

[Chemical Formula 2]

in Chemical Formula 2,

X1 to X3 are each CR or N, and at least one thereof is N,

R, R21 and R22 are each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms, adjacent groups among X1 to X3, R21 and R22 may bond to each other to form a substituted or unsubstituted ring, r is an integer of 0 to 3, a and b are each an integer of 1 to 5, and when r, a and b are each 2 or greater, substituents in the parentheses are the same as or different from each other.

Another embodiment of the present application provides an organic light emitting device including a first electrode; a second electrode provided opposite to the first electrode; and an organic material layer provided between the first electrode and the second electrode, wherein the organic material layer comprises one or more types of the heterocyclic compound represented by Chemical Formula 1.

Advantageous Effects

A heterocyclic compound described in the present specification can be used as a material of an organic material layer of an organic light emitting device. The heterocyclic compound is capable of performing a role of a hole injection material, a hole transfer material, a light emitting material, an electron transfer material, an electron injection material Or the like in the organic light emitting device. Particularly, the heterocyclic compound can be used as an electron transfer layer material, a hole blocking layer material or a charge generation layer material of the organic light emitting device Chemical Formula 1 has pyrazolo[5,1-a]isoquinoline as a core structure, has the benzene ring substituted with a substituent including pyridine; pyrimidine; triazine; phenanthroline; or anthracene, and has a substituent in the pyridine ring or the pyrazole ring, and thereby enhances an electron transfer ability of an electron transfer layer by excellent electron withdrawing properties of the azine functional group improving electron flow. In addition, by the substituent with strengthened hole properties and the azine moiety bonding to each other, the al stability of the compound can be enhanced by increasing planarity of the azine derivative, and the glass transition temperature. Electron transfer ability and hole blocking ability can be enhanced through adjusting band gap and energy level value in a triplet state.

In addition, when using the heterocyclic compound of Chemical Formula 1 as a material of an electron transfer layer or a hole blocking layer of an organic light emitting device, driving voltage of the device can be lowered, light efficiency can be enhanced, and lifetime properties of the device can be enhanced.

DESCRIPTION OF DRAWINGS

FIG. 1 to FIG. 5 are diagrams each illustrating a lamination structure of an organic light emitting device according to one embodiment of the present specification.
- 100: Substrate
- 200: Anode
- 300: Organic Material Layer
- 301: Hole Injection Layer
- 302: Hole Transfer Layer
- 303: Light Emitting Layer
- 304: Hole Blocking Layer
- 305: Electron Transfer Layer
- 306: Electron Injection Layer
- 400: Cathode

[Mode for Disclosure]

Hereinafter, the present specification will be described in more detail.

In the present specification, a certain part "including" certain constituents means capable of further including other constituents, and does not exclude other constituents unless particularly stated on the contrary.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, ⊰ means a substituted position.

In the present specification, "substituted or unsubstituted" means being substituted with one or more substituents selected from the group consisting of deuterium; a halogen group; a cyano group; a C1 to C60 linear or branched alkyl group; a C2 to C60 linear or branched alkenyl group; a C2 to C60 linear or branched alkynyl group; a C3 to C60 monocyclic or polycyclic cycloalkyl group; a C2 to C60 monocyclic or polycyclic heterocycloalkyl group; a C6 to C60 monocyclic or polycyclic aryl group; a C2 to C60 monocyclic or polycyclic heteroaryl group; a silyl group; a phosphine oxide group; and an amine group, or being substituted with a substituent linking two or more substituents selected from among the substituents illustrated above, or being unsubstituted.

In the present specification, a "case of a substituent being not indicated in a chemical formula or compound structure" means that a hydrogen atom bonds to a carbon atom. However, since deuterium ($^2H$) is an isotope of hydrogen, some hydrogen atoms may be deuterium.

In one embodiment of the present application, a "case of a substituent being not indicated in a chemical formula or compound structure" may mean that positions that may come as a substituent may all be hydrogen or deuterium. In other words, since deuterium is an isotope of hydrogen, some hydrogen atoms may be deuterium that is an isotope, and herein, a content of the deuterium may be from 0% to 100%.

In one embodiment of the present application, in a "case of a substituent being not indicated in a chemical formula or compound structure", hydrogen and deuterium may be mixed in compounds when deuterium is not explicitly excluded such as a deuterium content being 0%, a hydrogen content being 100% or substituents being all hydrogen.

In one embodiment of the present application, deuterium is one of isotopes of hydrogen, is an element having deuteron formed with one proton and one neutron as a nucleus, and may be expressed as hydrogen-2, and the elemental symbol may also be written as D or $^2H$.

In one embodiment of the present application, an isotope means an atom with the same atomic number (Z) but with a different mass number (A), and may also be interpreted as an element with the same number of protons but with a different number of neutrons.

In one embodiment of the present application, a meaning of a content T % of a specific substituent may be defined as $T2/T1 \times 100 = T$ % when the total number of substituents that a basic compound may have is defined as T1, and the number of specific substituents among these is defined as T2.

In other words, in one example, having a deuterium content of 20% in a phenyl group represented by

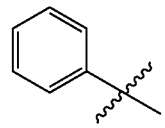 [SMILES: *c1ccccc1]

means that the total number of substituents that the phenyl group may have is 5 (T1 in the formula), and the number of deuterium among these is 1 (T2 in the formula). In other words, having a deuterium content of 20% in a phenyl group may be represented by the following structural formulae.

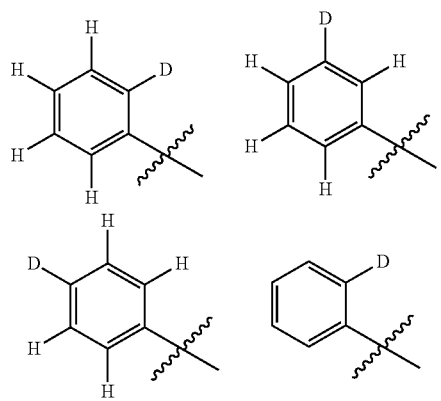

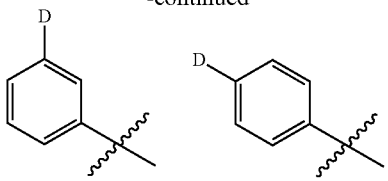

In addition, in one embodiment of the present application, "a phenyl group having a deuterium content of 0%" may mean a phenyl group that does not include a deuterium atom, that is, a phenyl group that has 5 hydrogen atoms.

In the present specification, the halogen may be fluorine, chlorine, bromine or iodine.

In the present specification, the alkyl group includes linear or branched having 1 to 60 carbon atoms, and may be further substituted with other substituents. The number of carbon atoms of the alkyl group may be from 1 to 60, specifically from 1 to 40 and more specifically from 1 to 20. Specific examples thereof may include a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethyl-butyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group and the like, but are not limited thereto.

In the present specification, the alkenyl group includes linear or branched having 2 to 60 carbon atoms, and may be further substituted with other substituents. The number of carbon atoms of the alkenyl group may be from 2 to 60, specifically from 2 to 40 and more specifically from 2 to 20. Specific examples thereof may include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenyl-vinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the alkynyl group includes linear or branched having 2 to 60 carbon atoms, and may be further substituted with other substituents. The number of carbon atoms of the alkynyl group may be from 2 to 60, specifically from 2 to 40 and more specifically from 2 to 20.

In the present specification, the cycloalkyl group includes monocyclic or polycyclic having 3 to 60 carbon atoms, and may be further substituted with other substituents. Herein, the polycyclic means a group in which the cycloalkyl group is directly linked to or fused with other cyclic groups. Herein, the other cyclic groups may be a cycloalkyl group, but may also be different types of cyclic groups such as a heterocycloalkyl group, an aryl group and a heteroaryl group. The number of carbon groups of the cycloalkyl group may be from 3 to 60, specifically from 3 to 40 and more specifically from 5 to 20. Specific examples thereof may include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the heterocycloalkyl group includes O, S, Se, N or Si as a heteroatom, includes monocyclic or polycyclic having 2 to 60 carbon atoms, and may be further substituted with other substituents. Herein, the polycyclic means a group in which the heterocycloalkyl group is directly linked to or fused with other cyclic groups. Herein, the other cyclic groups may be a heterocycloalkyl group, but may also be different types of cyclic groups such as a cycloalkyl group, an aryl group and a heteroaryl group. The number of carbon atoms of the heterocycloalkyl group may be from 2 to 60, specifically from 2 to 40 and more specifically from 3 to 20.

In the present specification, the aryl group includes monocyclic or polycyclic having 6 to 60 carbon atoms, and may be further substituted with other substituents. Herein, the polycyclic means a group in which the aryl group is directly linked to or fused with other cyclic groups. Herein, the other cyclic groups may be an aryl group, but may also be different types of cyclic groups such as a cycloalkyl group, a heterocycloalkyl group and a heteroaryl group. The aryl group includes a spiro group. The number of carbon atoms of the aryl group may be from 6 to 60, specifically from 6 to 40 and more specifically from 6 to 25. Specific examples of the aryl group may include a phenyl group, a biphenyl group, a triphenyl group (terphenyl group), a naphthyl group, an anthryl group, a chrysenyl group, a phenanthrenyl group, a perylenyl group, a fluoranthenyl group, a triphenylenyl group, a phenalenyl group, a pyrenyl group, a tetracenyl group, a pentacenyl group, a fluorenyl group, an indenyl group, an acenaphthylenyl group, a benzofluorenyl group, a spirobifluorenyl group, a 2,3-dihydro-1H-indenyl group, a fused cyclic group thereof, and the like, but are not limited thereto.

In the present specification, the terphenyl group may be selected from among the following structural formulae.

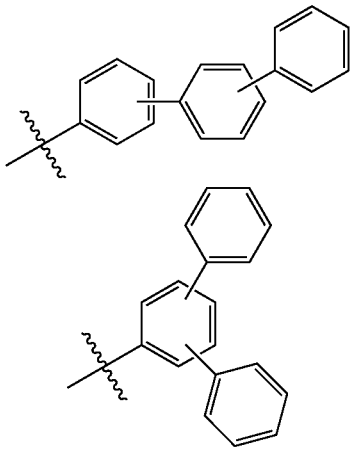

In the present specification, the fluorenyl group may be substituted, and adjacent substituents may bond to each other to form a ring.

When the fluorenyl group is substituted,

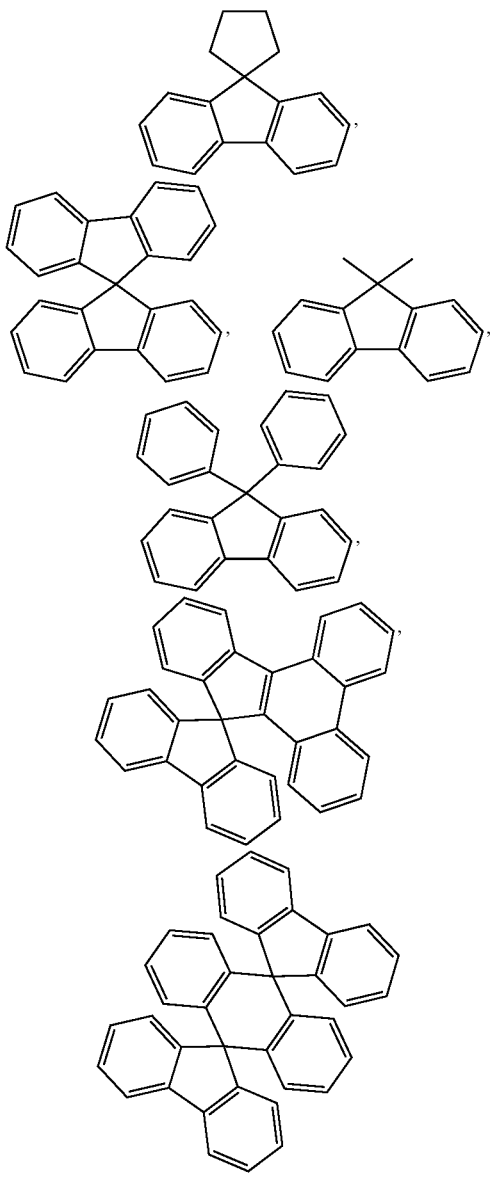

and the like may be included, however, the structure is not limited thereto.

In the present specification, the heteroaryl group includes O, S, SO$_2$, Se, N or Si as a heteroatom, includes monocyclic or polycyclic having 2 to 60 carbon atoms, and may be further substituted with other substituents. Herein, the polycyclic means a group in which the heteroaryl group is directly linked to or fused with other cyclic groups. Herein, the other cyclic groups may be a heteroaryl group, but may also be different types of cyclic groups such as a cycloalkyl group, a heterocycloalkyl group and an aryl group. The number of carbon atoms of the heteroaryl group may be from 2 to 60, specifically from 2 to 40 and more specifically from 3 to 25. Specific examples of the heteroaryl group may include a pyridyl group, a pyrrolyl group, a pyrimidyl group, a pyridazinyl group, a furanyl group, a thiophene group, an imidazolyl group, a pyrazolyl group, an oxazolyl group, an isoxazolyl group, a thiazolyl group, an isothiazolyl group, a triazolyl group, a furazanyl group, an oxadiazolyl group, a thiadiazolyl group, a dithiazolyl group, a tetrazolyl group, a pyranyl group, a thiopyranyl group, a diazinyl group, an oxazinyl group, a thiazinyl group, a dioxynyl group, a triazinyl group, a tetrazinyl group, a quinolyl group, an isoquinolyl group, a quinazolinyl group, an isoquinazolinyl group, a qninozolinyl group, a naphthyridyl group, an acridinyl group, a phenanthridinyl group, an imidazopyridinyl group, a diazanaphthalenyl group, a triazaindene group, an indolyl group, an indolizinyl group, a benzothiazolyl group, a benzoxazolyl group, a benzimidazolyl group, a benzothiophene group, a benzofuran group, a dibenzothiophene group, a dibenzofuran group, a carbazolyl group, a benzocarbazolyl group, a dibenzocarbazolyl group, a phenazinyl group, a dibenzosilole group, spirobi(dibenzosilole), a dihydrophenazinyl group, a phenoxazinyl group, a phenanthridyl group, an imidazopyridinyl group, a thienyl group, an indolo[2,3-a]carbazolyl group, an indolo[2,3-b]carbazolyl group, an indolinyl group, a 10,11-dihydro-dibenzo[b,f]azepine group, a 9,10-dihydroacridinyl group, a phenanthrazinyl group, a phenothiathiazinyl group, a phthalazinyl group, a naphthylidinyl group, a phenanthrolinyl group, a benzo[c][1,2,5]thiadiazolyl group, a 5,10-dihydrobenzo[b,e][1,4]azasilinyl group, a pyrazolo[1,5-c]quinazolinyl group, a pyrido[1,2-b]indazolyl group, a pyrido[1,2-a]imidazo[1,2-e]indolinyl group, a benzofuro[2,3-d]pyrimidyl group; a benzothieno[2,3-d]pyrimidyl group; a benzofuro[2,3-a]carbazolyl group, a benzothieno[2,3-a]carbazolyl group, a 1,3-dihydroindolo[2,3-a]carbazolyl group, a benzofuro[3,2-a]carbazolyl group, a benzothieno[3,2-a]carbazolyl group, a 1,3-dihydroindolo[3,2-a]carbazolyl group, a benzofuro[2,3-b]carbazolyl group, a benzothieno[2,3-b]carbazolyl group, a 1,3-dihydroindolo[2,3-b]carbazolyl group, a benzofuro[3,2-b]carbazolyl group, a benzothieno[3,2-b]carbazolyl group, a 1,3-dihydroindolo[3,2-b]carbazolyl group, a benzofuro[2,3-c]carbazolyl group, a benzothieno[2,3-c]carbazolyl group, a 1,3-dihydroindolo[2,3-c]carbazolyl group, a benzofuro[3,2-c]carbazolyl group, a benzothieno[3,2-c]carbazolyl group, a 1,3-dihydroindolo[3,2-c]carbazolyl group, a 1,3-dihydroindeno[2,1-b]carbazolyl group, a 5,11-dihydroindeno[1,2-b]carbazolyl group, a 5,12-dihydroindeno[1,2-c]carbazolyl group, a 5,8-dihydroindeno[2,1-c]carbazolyl group, a 7,12-dihydroindeno[1,2-a]carbazolyl group, a 11,12-dihydroindeno[2,1-a]carbazolyl group and the like, but are not limited thereto.

In the present specification, being substituted with a carbazole group includes both carbon of the carbazole and N of the carbazole bonding to the position of substitution.

In the present specification, the silyl group is a substituent including Si, having the Si atom directly linked as a radical, and is represented by —Si(R101)(R102)(R103). R101 to R103 are the same as or different from each other, and may be each independently a substituent formed with at least one of hydrogen; deuterium; a halogen group; an alkyl group; an alkenyl group; an alkoxy group; a cycloalkyl group; an aryl group; and a heteroaryl group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the phosphine oxide group is represented by —P(=O)(R104)(R105), and R104 and R105 are the same as or different from each other and may be each independently a substituent foiled with at least one of hydrogen; deuterium; a halogen group; an alkyl group; an alkenyl group; an alkoxy group; a cycloalkyl group; an aryl group; and a heteroaryl group. Specifically, the phosphine oxide group may be substituted with an aryl group, and as the aryl group, the examples described above may be applied. Examples of the phosphine oxide group may include a dimethylphosphine oxide group, a diphenylphosphine oxide group, a dinaphthylphosphine oxide group and the like, but are not limited thereto.

In the present specification, the amine group is represented by —N(R106)(R107), and R106 and R107 are the same as or different from each other and may be each independently a substituent formed with at least one of hydrogen; deuterium; a halogen group; an alkyl group; an alkenyl group; an alkoxy group; a cycloalkyl group; an aryl group; and a heteroaryl group. The amine group may be selected from the group consisting of —NH$_2$; a monoalkylamine group; a monoarylamine group; a monoheteroarylamine group; a dialkylamine group; a diarylamine group; a diheteroarylamine group; an alkylarylamine group; an alkylheteroarylamine group; and an arylheteroarylamine group, and although not particularly limited thereto, the number of carbon atoms is preferably from 1 to 30. Specific examples of the amine group may include a methylamine group, a dimethylamine group, an ethylamine group, a diethylamine group, a phenylamine group, a naphthylamine group, a biphenylamine group, a dibiphenylamine group, an anthracenylamine group, a 9-methyl-anthracenylamine group, a diphenylamine group, a phenylnaphthylamine group, a ditolylamine group, a phenyltolylamine group, a triphenylamine group, a biphenylnaphthylamine group, a phenylbiphenylamine group, a biphenylfluorenylamine group, a phenyltriphenylenylamine group, a biphenyltriphenylenylamine group and the like, but are not limited thereto.

In the present specification, the examples of the aryl group described above may be applied to the arylene group except that the arylene group is a divalent group.

In the present specification, the examples of the heteroaryl group described above may be applied to the heteroarylene group except that the heteroarylene group is a divalent group.

In the present specification, the "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

As the aliphatic hydrocarbon ring, the aromatic hydrocarbon ring, the aliphatic heteroring or the aromatic heteroring that adjacent groups may form, the structures illustrated as the cycloalkyl group, the aryl group, the cycloheteroalkyl group and the heteroaryl group described above may be used except for those that are not a monovalent group.

One embodiment of the present specification provides a heterocyclic compound represented by Chemical Formula 1.

In one embodiment of the present specification, L is a direct bond; a substituted or unsubstituted arylene group having 6 to 60 carbon atoms; or a substituted or unsubstituted heteroarylene group having 2 to 60 carbon atoms.

In one embodiment of the present specification, L is a direct bond; a substituted or unsubstituted arylene group having 6 to 40 carbon atoms; or a substituted or unsubstituted heteroarylene group having 2 to 40 carbon atoms.

In one embodiment of the present specification, L is a direct bond; a substituted or unsubstituted arylene group having 6 to 20 carbon atoms; or a substituted or unsubstituted heteroarylene group having 2 to 20 carbon atoms.

In one embodiment of the present specification, L is a direct bond; a substituted or unsubstituted phenylene group; a substituted or unsubstituted biphenylene group; a substituted or unsubstituted anthracenylene group; a divalent pyridine group unsubstituted or substituted with an aryl group; a divalent pyrimidine group unsubstituted or substituted with an aryl group; or a divalent triazine group unsubstituted or substituted with an aryl group.

In one embodiment of the present specification, L is a direct bond; a phenylene group; a biphenylene group; an anthracenylene group; a divalent pyridine group unsubstituted or substituted with one or more substituents selected from the group consisting of a phenyl group and a biphenyl group; a divalent pyrimidine group unsubstituted or substituted with one or more substituents selected from the group consisting of a phenyl group and a biphenyl group; or a divalent triazine group unsubstituted or substituted with one or more substituents selected from the group consisting of a phenyl group and a biphenyl group.

In one embodiment of the present specification, Z may be a substituted or unsubstituted aryl group having 10 to 60 carbon atoms; or a substituted or unsubstituted phosphine oxide group, or represented by the following Chemical Formula 2.

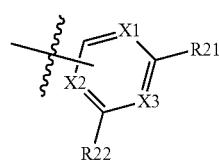

[Chemical Formula 2]

In Chemical Formula 2,
X1 to X3 are each CR or N, and at least one thereof is N,
R, R21 and R22 are each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms, and
adjacent groups among X1 to X3, R21 and R22 may bond to each other to form a substituted or unsubstituted ring.

In one embodiment of the present specification, Z may be a substituted or unsubstituted aryl group having 10 to 60 carbon atoms; or a substituted or unsubstituted phosphine oxide group.

In one embodiment of the present specification, Z may be a substituted or unsubstituted aryl group having 10 to 40 carbon atoms; or a substituted or unsubstituted phosphine oxide group.

In one embodiment of the present specification, Z may be a substituted or unsubstituted aryl group having 10 to 20 carbon atoms; or a substituted or unsubstituted phosphine oxide group.

In one embodiment of the present specification, Z may be a substituted or unsubstituted aryl group having 10 to 20 carbon atoms; or a phosphine oxide group unsubstituted or substituted with an alkyl group.

In one embodiment of the present specification, Z may be a substituted or unsubstituted anthracenyl group; or a phosphine oxide group unsubstituted or substituted with an alkyl group.

In one embodiment of the present specification, Z may be an anthracenyl group unsubstituted or substituted with an aryl group or a phosphine oxide group; or a phosphine oxide group unsubstituted or substituted with an alkyl group.

In one embodiment of the present specification, Z may be an anthracenyl group unsubstituted or substituted with an aryl group or a phosphine oxide group; or a phosphine oxide group unsubstituted or substituted with a methyl group.

In one embodiment of the present specification, when Z is a substituted or unsubstituted phosphine oxide group, Z may be represented by —P(=O) (R104)(R105), and R104 and R105 may be each independently hydrogen; deuterium; an alkyl group; or an aryl group.

In one embodiment of the present specification, Z is represented by —P(=O) (R104)(R105), and R104 and R105 may be each independently an alkyl group.

In one embodiment of the present specification, Z is represented by —P(=O) (R104)(R105), and R104 and R105 may be each independently an alkyl group having 1 to 10 carbon atoms.

In another embodiment of the present specification, Z may be represented by Chemical Formula 2.

In one embodiment of the present specification, Chemical Formula 2 may be represented by the following Chemical Formula 2-A.

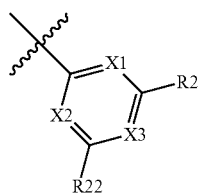

[Chemical Formula 2-A]

In Chemical Formula 2-A,
each substituent has the same definition as in Chemical Formula 2.

In one embodiment of the present specification, one of X1 to X3 of Chemical Formula 2 is N and the rest are CR, and R, R21 and R22 are each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms, and adjacent groups among R of X1 to X3, R21 and R22 may bond to each other to form a substituted or unsubstituted ring.

In one embodiment of the present specification, one of X1 to X3 is N and the rest are CR, and R, R21 and R22 are each independently hydrogen; deuterium; a substituted or unsubstituted alkyl group having 1 to 40 carbon atoms; a substituted or unsubstituted aryl group having 6 to 40 carbon atoms; or a substituted or unsubstituted heteroaryl group having 2 to 40 carbon atoms, and adjacent groups among R of X1 to X3, R21 and R22 may bond to each other to form a substituted or unsubstituted hydrocarbon ring or a substituted or unsubstituted heteroring.

In one embodiment of the present specification, one of X1 to X3 is N and the rest are CR, and R, R21 and R22 are each independently hydrogen; deuterium; a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms, and adjacent groups among R of X1 to X3, R21 and R22 may bond to each other to form a substituted or unsubstituted heteroring having 2 to 60 carbon atoms.

In one embodiment of the present specification, one of X1 to X3 is N and the rest are CR, and R, R21 and R22 are each independently hydrogen; deuterium; a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms, and adjacent groups among R of X1 to X3, R21 and R22 may bond to each other to form a substituted or unsubstituted aromatic heteroring having 6 to 60 carbon atoms.

In one embodiment of the present specification, one of X1 to X3 is N and the rest are CR, and R, R21 and R22 are each independently hydrogen; deuterium; a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms, and adjacent groups among R of X1 to X3, R21 and R22 may bond to each other to form a substituted or unsubstituted quinoline ring.

In one embodiment of the present specification, two of X1 to X3 are N and the other one is CR, and R, R21 and R22 may be each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms.

In one embodiment of the present specification, X1 to X3 are N, and R21 and R22 may be each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms.

In one embodiment of the present specification, Chemical Formula 2 may be any one selected from among the following structural formulae.

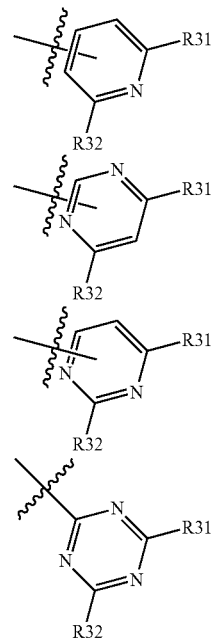

-continued

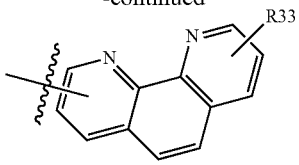

In the structural formulae, R31 and R32 are each independently a substituted or unsubstituted alkyl group having 1 to 20 carbon atoms; a substituted or unsubstituted aryl group having 6 to 60 carbon atoms; or a substituted or unsubstituted heteroaryl group having 2 to 60 carbon atoms, and R33 is hydrogen; deuterium; or a substituted or unsubstituted aryl group having 6 to 60 carbon atoms.

In one embodiment of the present specification, R31 and R32 are each independently a substituted or unsubstituted aryl group having 6 to 60 carbon atoms; or a substituted or unsubstituted heteroaryl group having 2 to 60 carbon atoms.

In one embodiment of the present specification, R31 and R32 are each independently a substituted or unsubstituted aryl group having 6 to 40 carbon atoms; or a substituted or unsubstituted heteroaryl group having 2 to 40 carbon atoms.

In one embodiment of the present specification, R31 and R32 are each independently a substituted or unsubstituted aryl group having 6 to 20 carbon atoms; or a substituted or unsubstituted heteroaryl group having 2 to 20 carbon atoms.

In one embodiment of the present specification, R31 and R32 are each independently a substituted or unsubstituted aryl group having 6 to 20 carbon atoms.

In one embodiment of the present specification, R31 and R32 are each independently a substituted or unsubstituted phenyl group; a substituted or unsubstituted biphenyl group; or a substituted or unsubstituted terphenyl group.

In one embodiment of the present specification, R31 and R32 are each independently a phenyl group unsubstituted or substituted with a carbazole group; a biphenyl group; or a terphenyl group.

In one embodiment of the present specification, R33 is hydrogen; deuterium; or a substituted or unsubstituted aryl group having 6 to 60 carbon atoms.

In one embodiment of the present specification, R33 is hydrogen; deuterium; or a substituted or unsubstituted aryl group having 6 to 40 carbon atoms.

In one embodiment of the present specification, R33 is hydrogen; deuterium; or a substituted or unsubstituted aryl group having 6 to 20 carbon atoms.

In one embodiment of the present specification, R33 is hydrogen; deuterium; or a substituted or unsubstituted phenyl group.

In one embodiment of the present specification, R33 is hydrogen; deuterium; or a phenyl group.

In one embodiment of the present specification, R33 is hydrogen; or a phenyl group.

In one embodiment of the present specification, Chemical Formula 2 may be any one selected from among the following structural formulae.

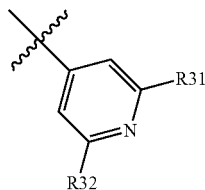

-continued

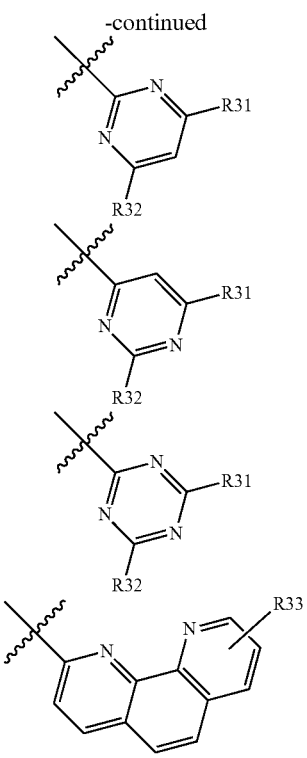

In the structural formulae, each substituent has the same definition as described above.

In one embodiment of the present specification, R1 to R5 are each independently hydrogen; deuterium; a halogen group; a cyano group; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms.

In one embodiment of the present specification, R1 to R5 are each independently hydrogen; deuterium; a halogen group; a cyano group; a substituted or unsubstituted alkyl group having 1 to 30 carbon atoms; a substituted or unsubstituted aryl group having 6 to 30 carbon atoms; or a substituted or unsubstituted heteroaryl group having 2 to 30 carbon atoms.

In one embodiment of the present specification, R1 to R3 are each independently hydrogen; deuterium; a halogen group; a cyano group; a substituted or unsubstituted alkyl group having 1 to 10 carbon atoms; or a substituted or unsubstituted aryl group having 6 to 20 carbon atoms.

In one embodiment of the present specification, R1 to R3 are each independently hydrogen; deuterium; a cyano group; a substituted or unsubstituted methyl group; a substituted or unsubstituted ethyl group; or a substituted or unsubstituted phenyl group.

In one embodiment of the present specification, R1 to R3 are each independently hydrogen; deuterium; a cyano group; a methyl group; an ethyl group; or a phenyl group unsubstituted or substituted with a cyano group.

In one embodiment of the present specification, at least two of R1 to R3 are each independently a cyano group; a substituted or unsubstituted alkyl group having 1 to 10 carbon atoms; or a substituted or unsubstituted aryl group having 6 to 20 carbon atoms.

In one embodiment of the present specification, at least two of R1 to R3 are each independently a cyano group; a substituted or unsubstituted methyl group; a substituted or unsubstituted ethyl group; or a substituted or unsubstituted phenyl group.

In one embodiment of the present specification, R4 is hydrogen.

In one embodiment of the present specification, R5 is hydrogen.

In one embodiment of the present specification, r is an integer of 0 to 3.

In one embodiment of the present specification, r is an integer of 1 to 3.

In one embodiment of the present specification, a and b are each an integer of 1 to 5.

In one embodiment of the present specification, a and b are each an integer of 1 to 3.

In one embodiment of the present specification, a and b are 1.

In another embodiment, a and b are 2.

In another embodiment, a and b are 3.

In one embodiment of the present specification, Chemical Formula 1 may be represented by any one of the following Chemical Formulae 1-1 to 1-4.

[Chemical Formula 1-1]
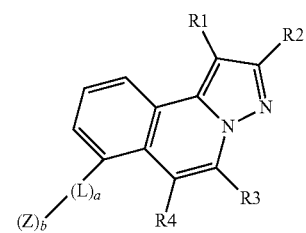

[Chemical Formula 1-2]
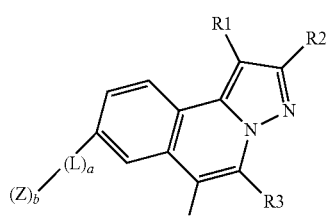

[Chemical Formula 1-3]
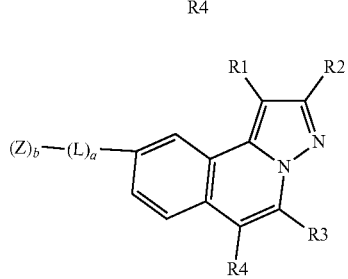

[Chemical Formula 1-4]
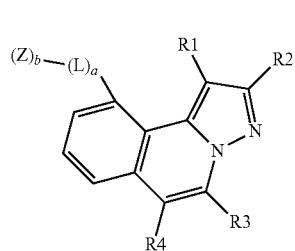

In Chemical Formulae 1-1 to 1-4, each substituent has the same definition as in Chemical Formula 1.

In one embodiment of the present specification, Chemical Formula 1 may be represented by any one of the following Chemical Formulae 2-1 to 2-3.

[Chemical Formula 2-1]
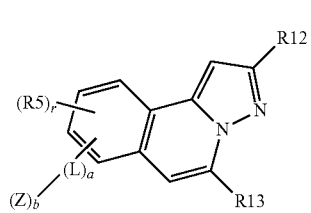

[Chemical Formula 2-2]
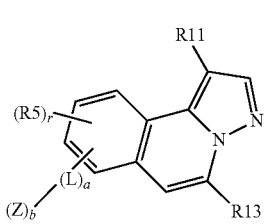

[Chemical Formula 2-3]
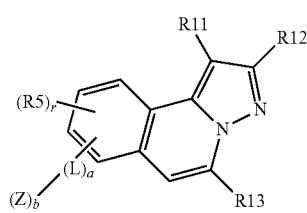

In Chemical Formulae 2-1 to 2-3, R5, L, Z, r, a and b have the same definitions as in Chemical Formula 1, R11 to R13 are each independently a halogen group; a cyano group; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms.

In one embodiment of the present specification, Chemical Formula 1 may be represented by any one of the following compounds, but is not limited thereto.

1
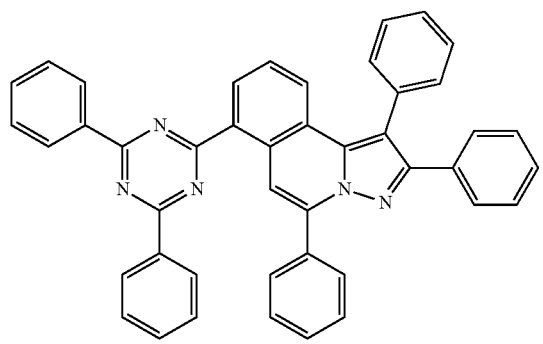
2
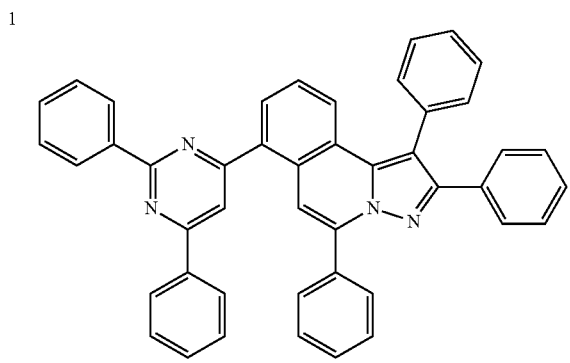
3
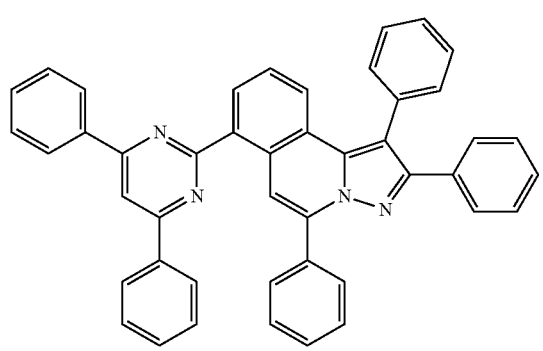
4
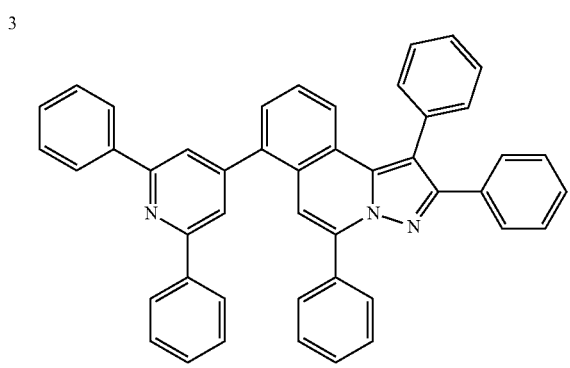
5
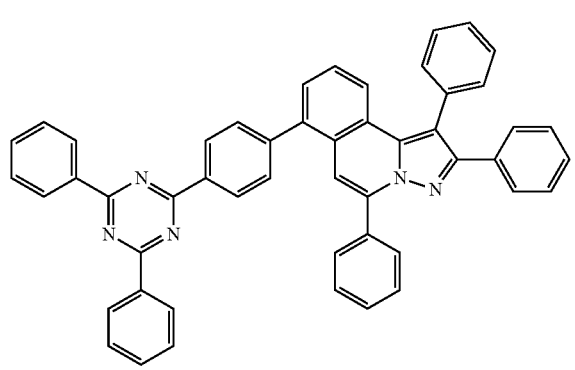
6
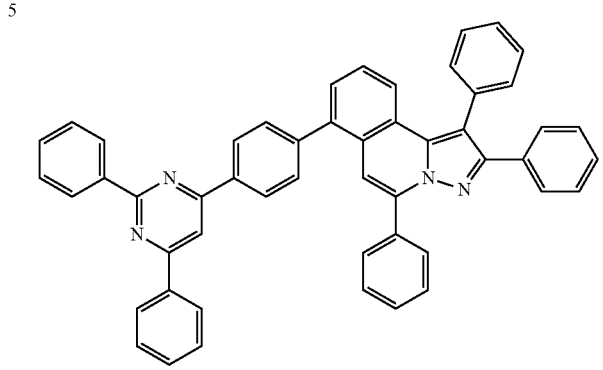
7
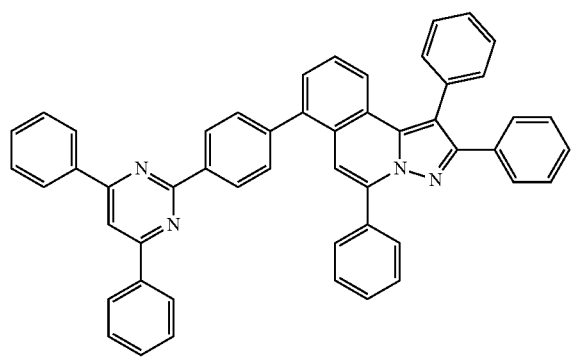
8
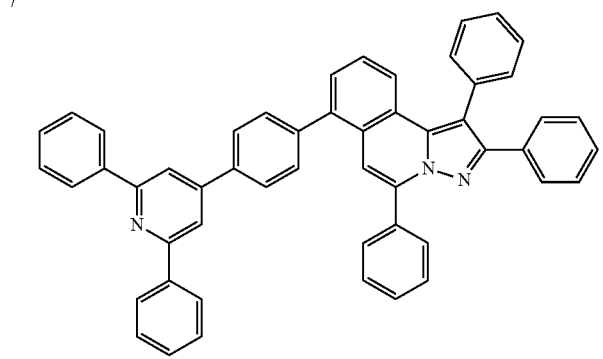

9
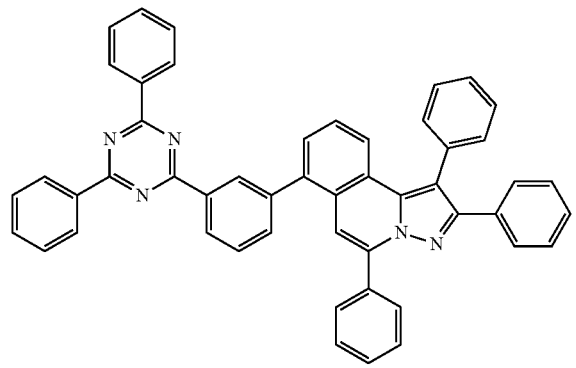
10
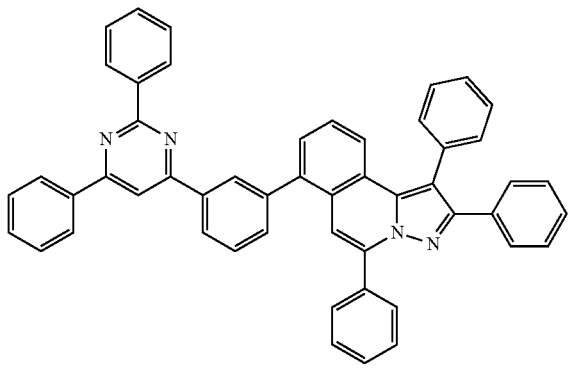
11
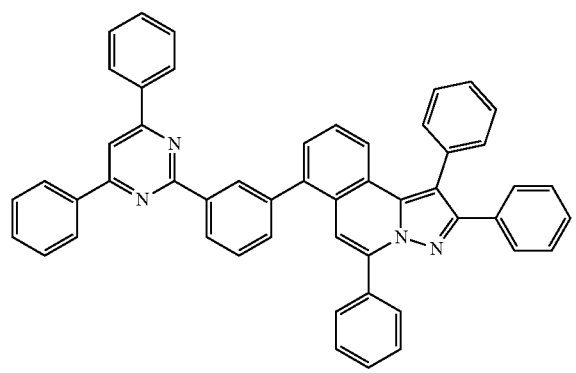
12
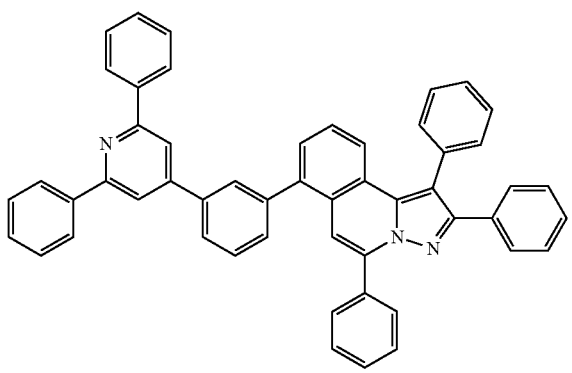
13
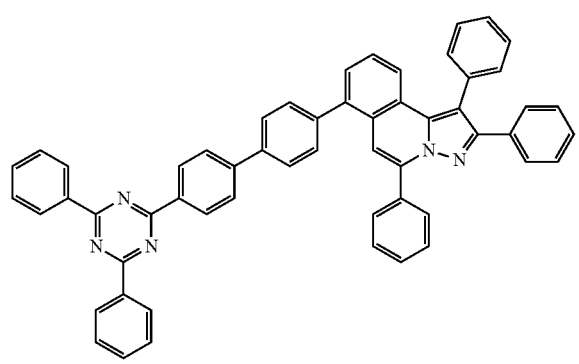
14
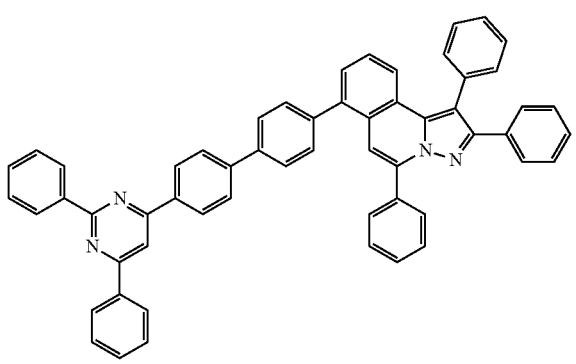
15
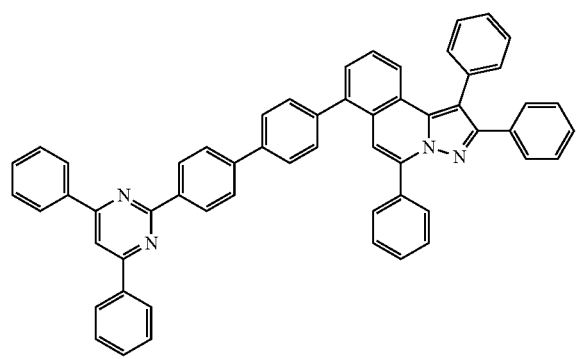
16
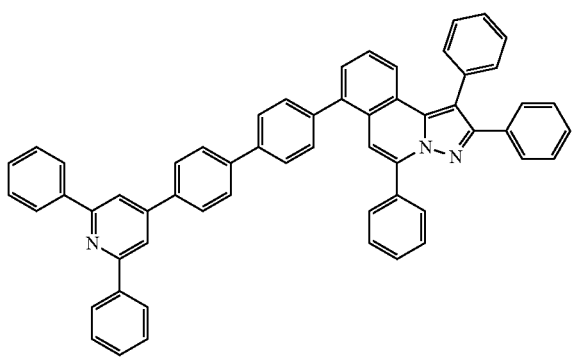

-continued
17
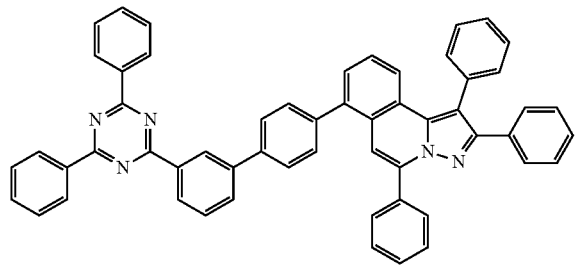
18
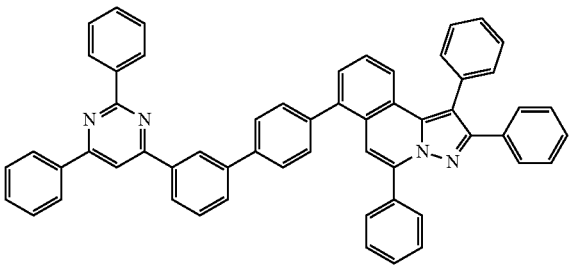
19
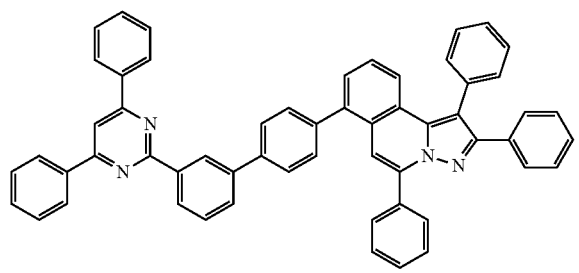
20
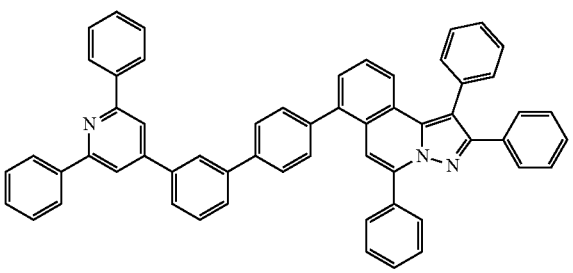
21
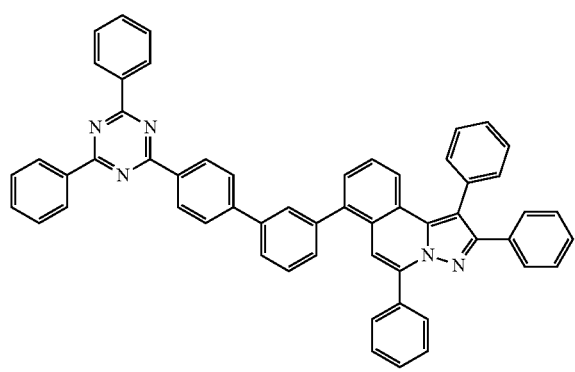
22
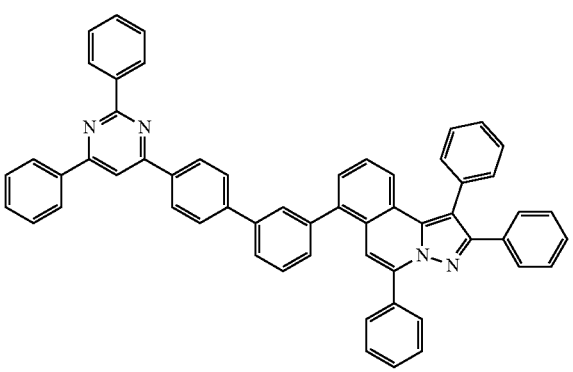
23
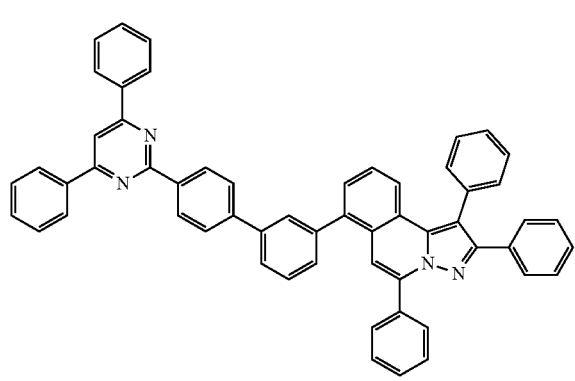
24
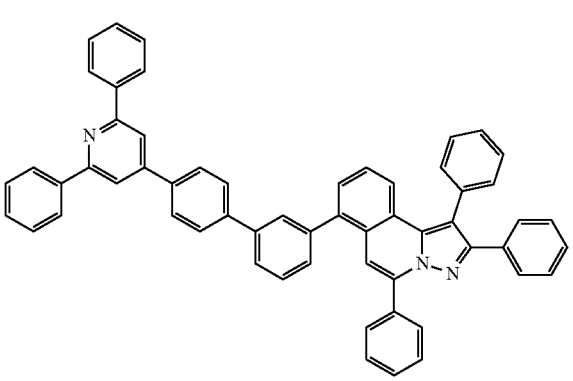
25
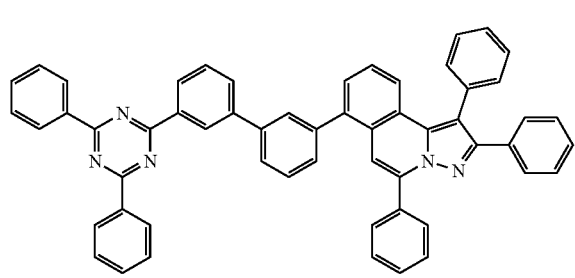
26
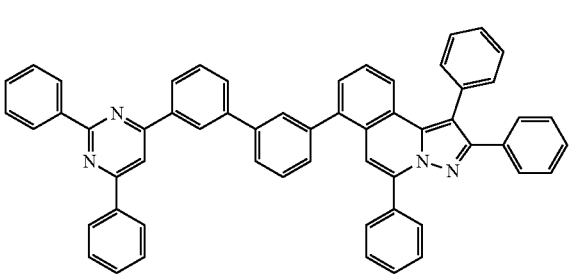

-continued
27
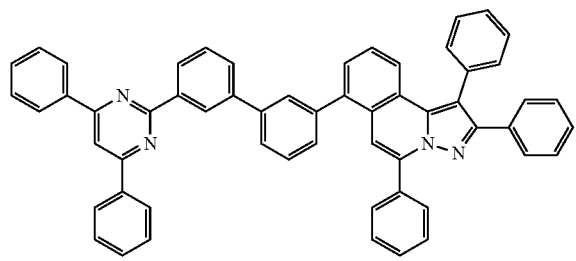
28
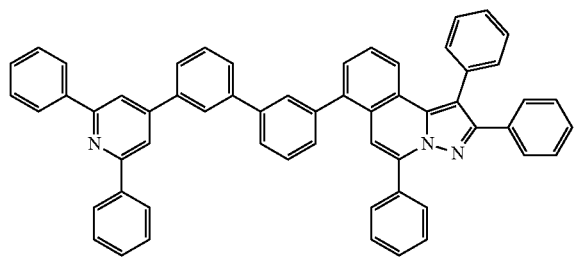
29
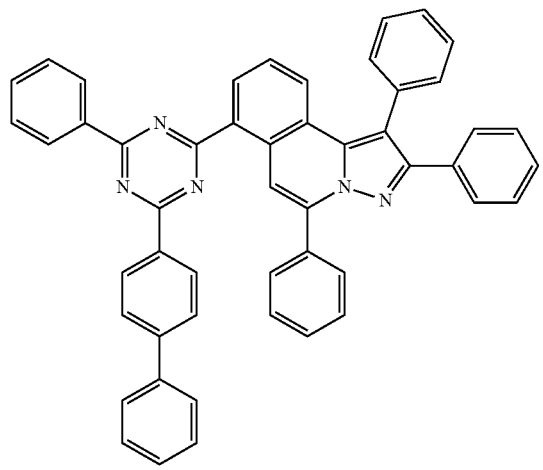
30
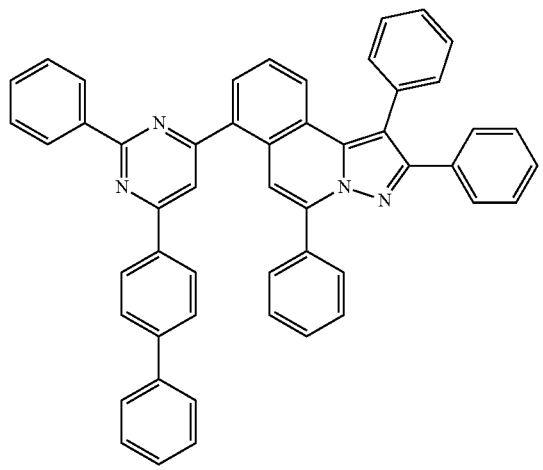
31
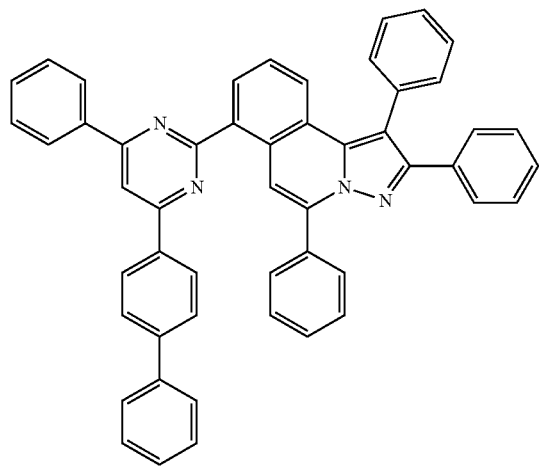
32
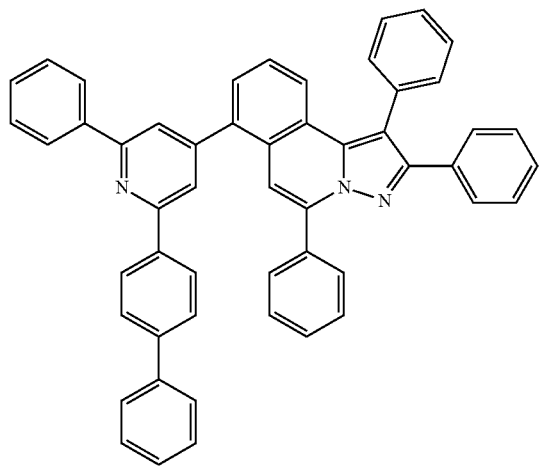
33
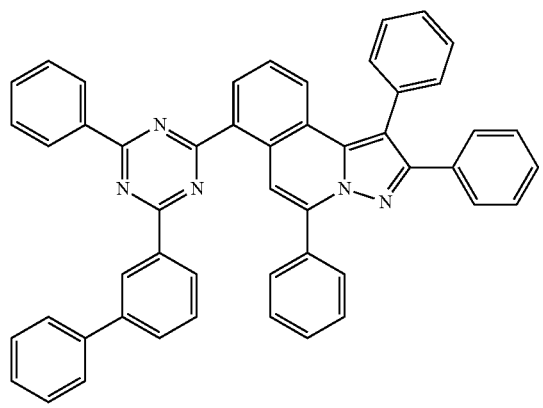
34
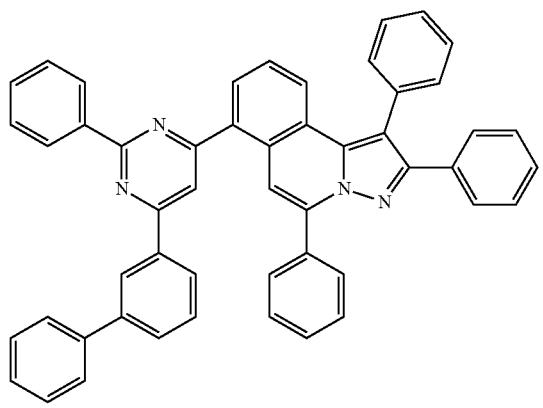

35
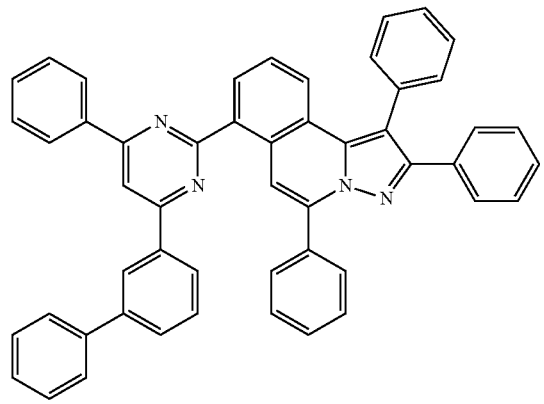
36
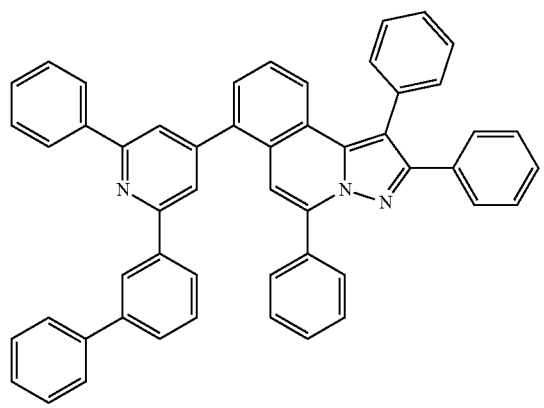
37
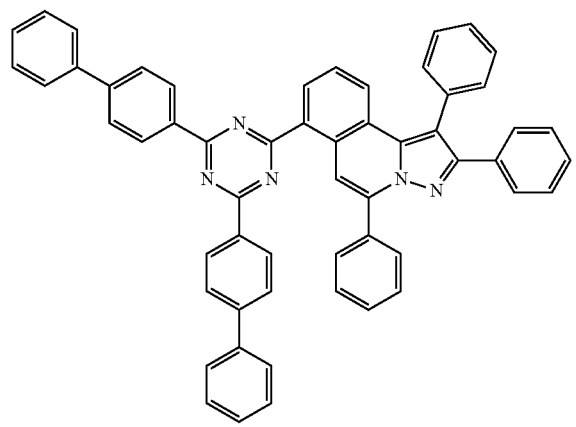
38
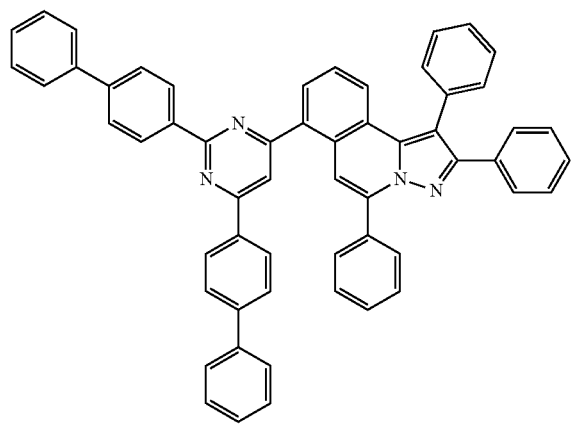
39
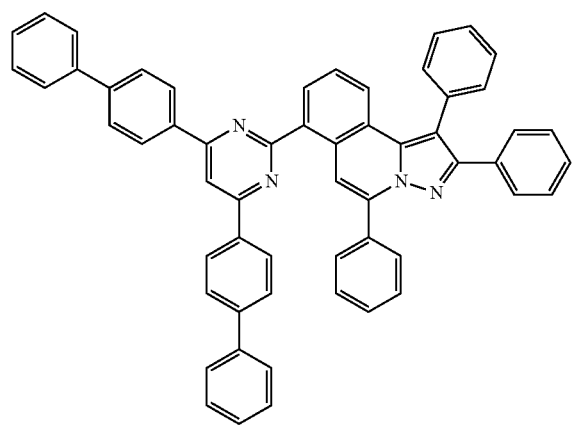
40
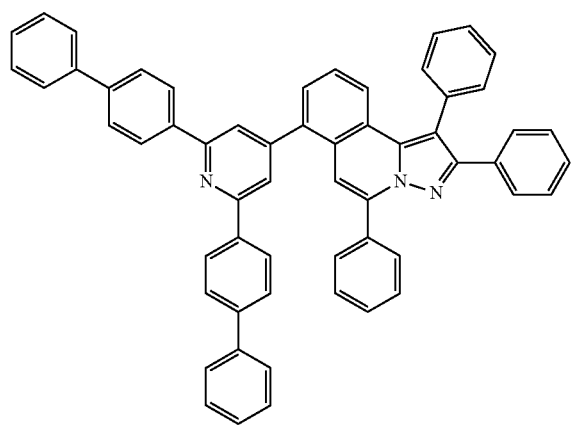

-continued
41
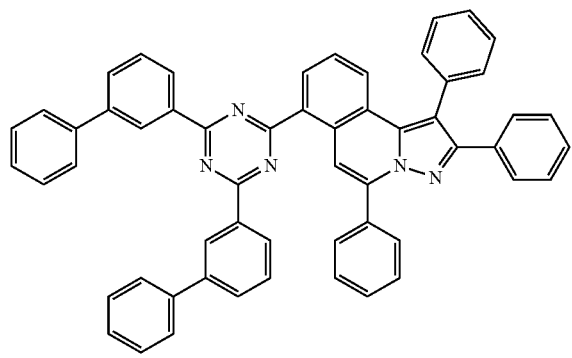
42
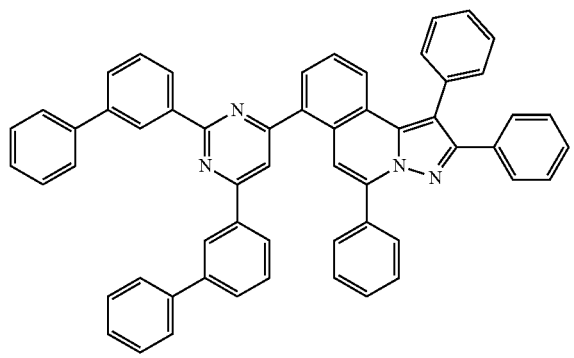
43
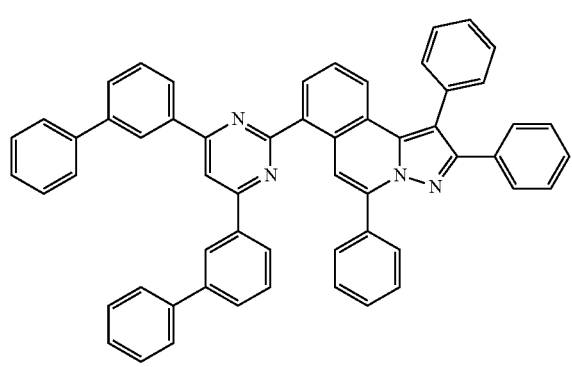
44
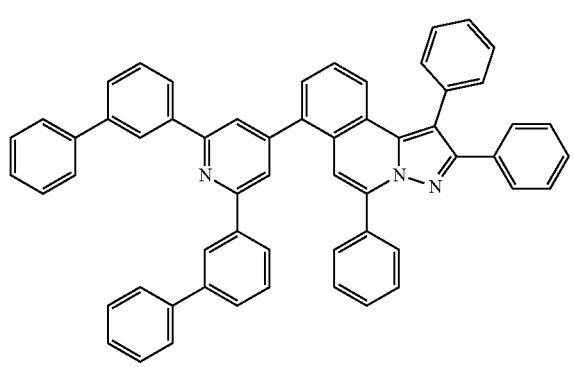
45
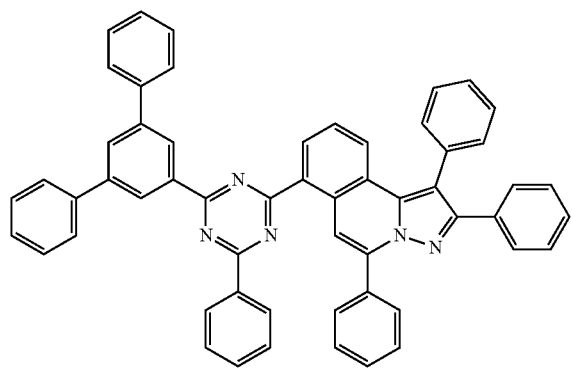
46
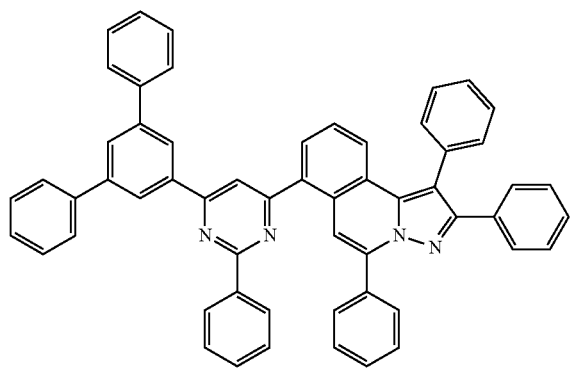
47
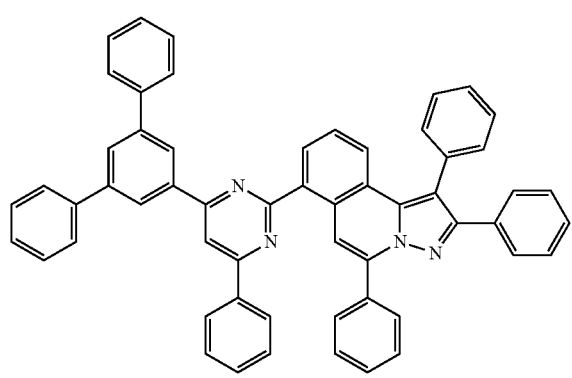
48
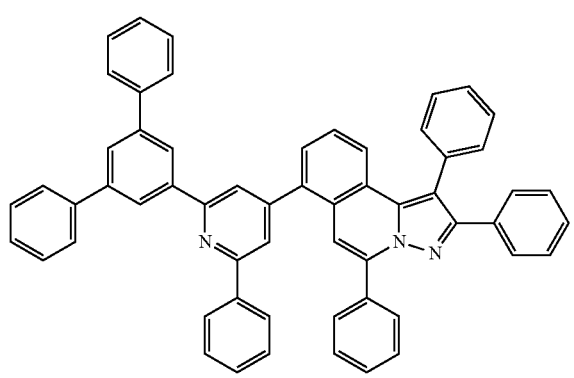

-continued
49
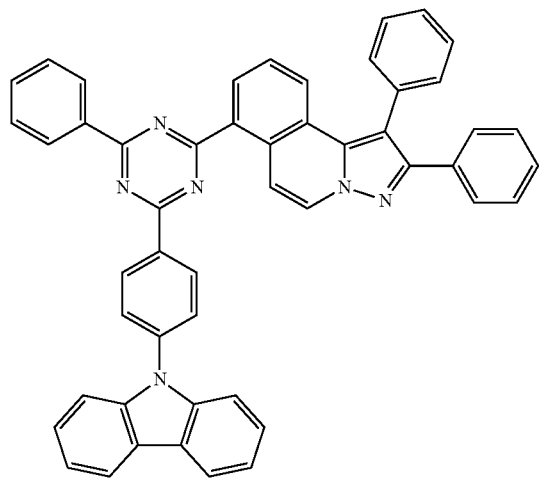
50
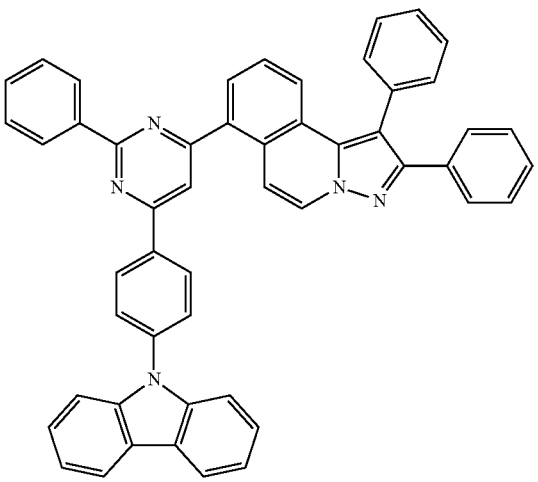
51
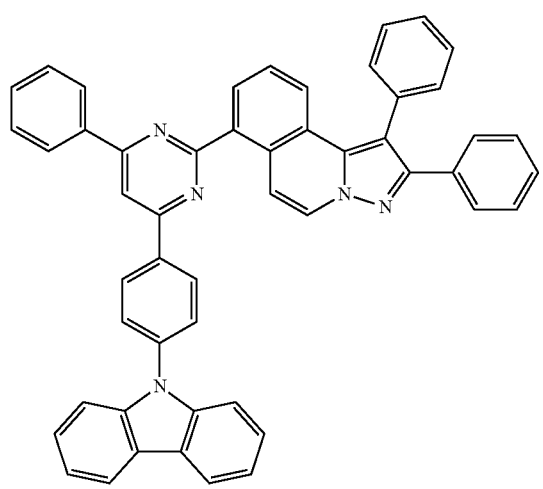
52
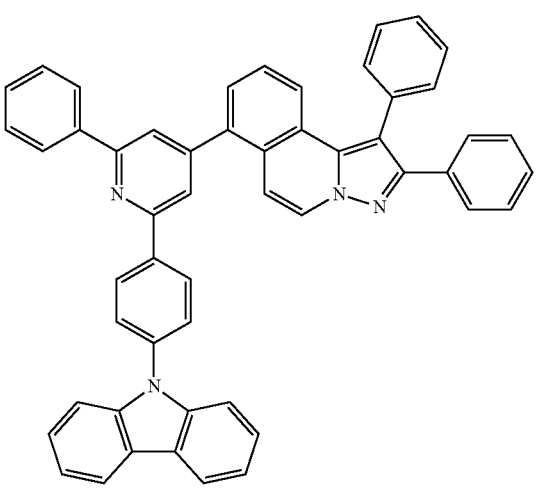
53
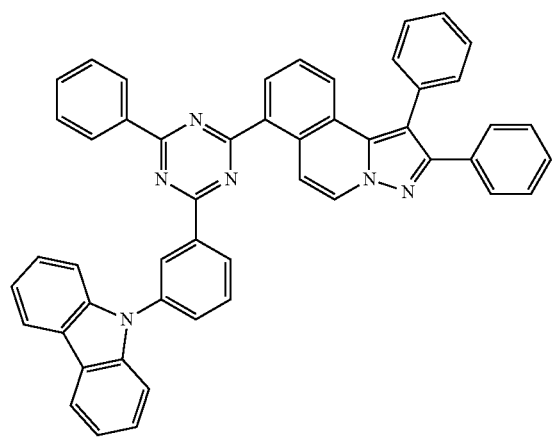
54
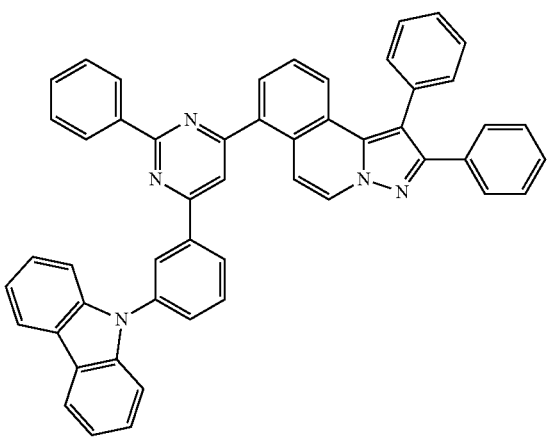

-continued
55
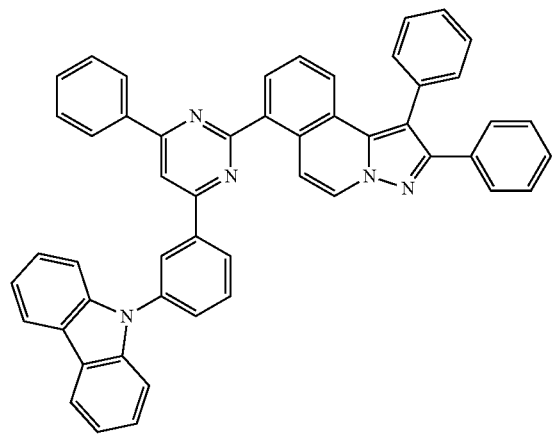
56
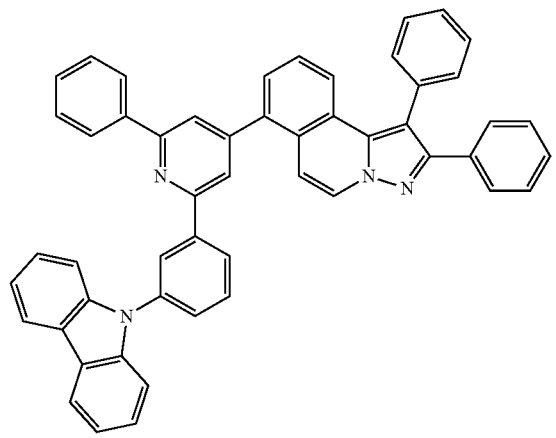
57
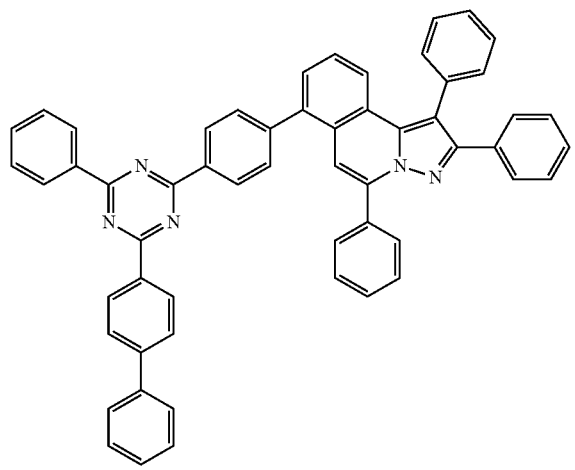
58
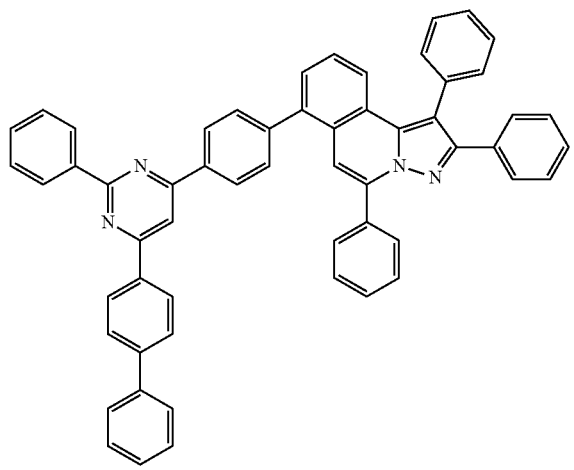
59
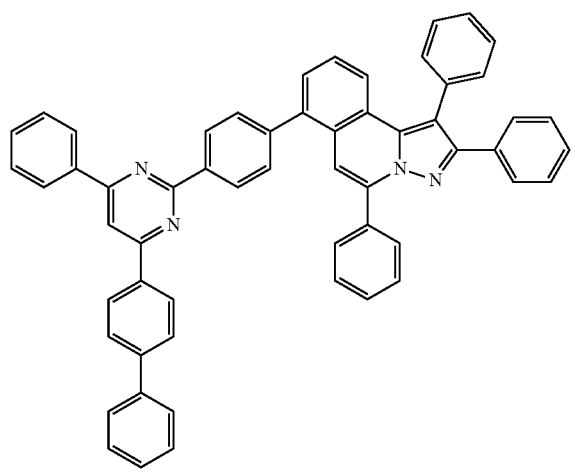
60
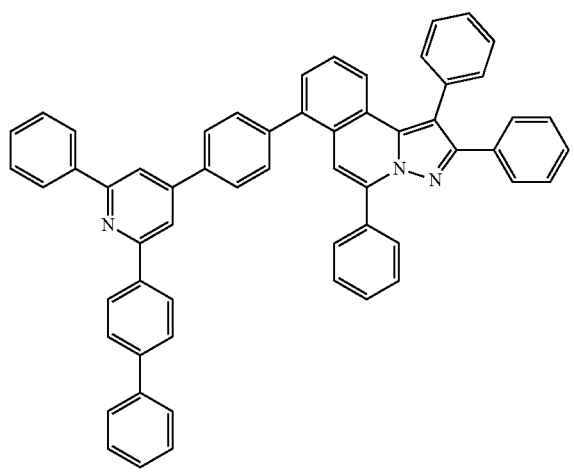

-continued
61
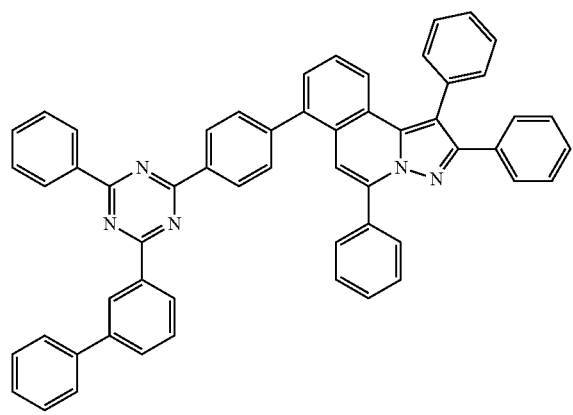
62
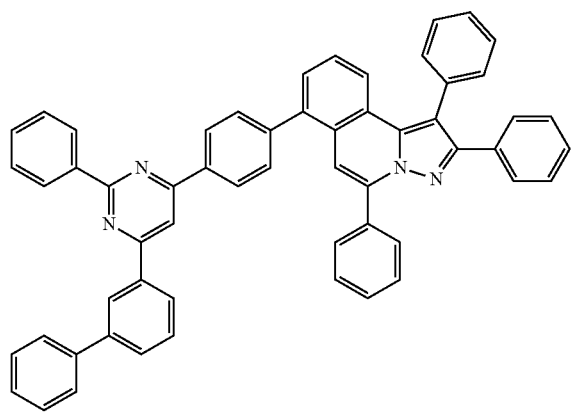
63
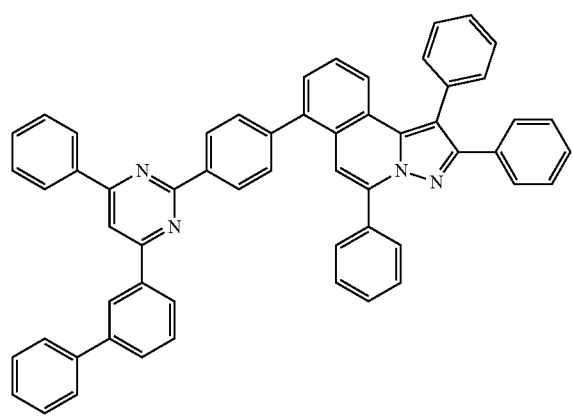
64
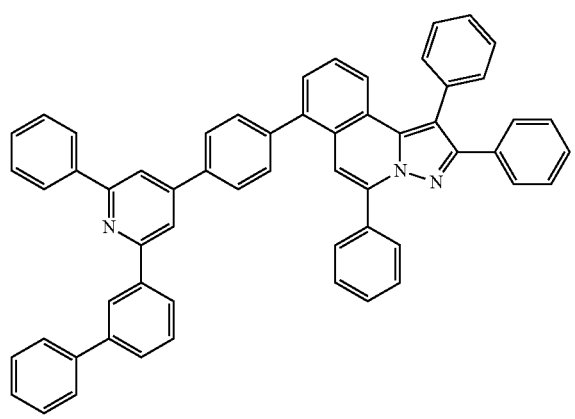
65
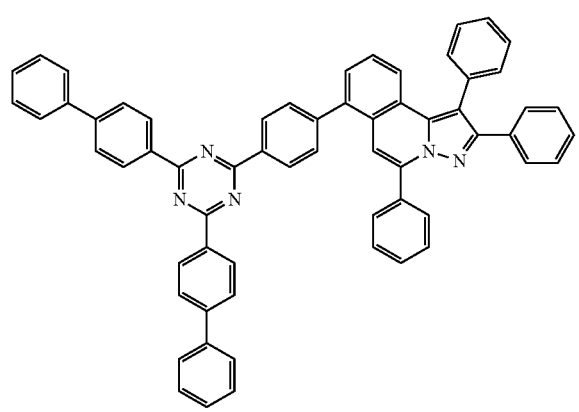
66
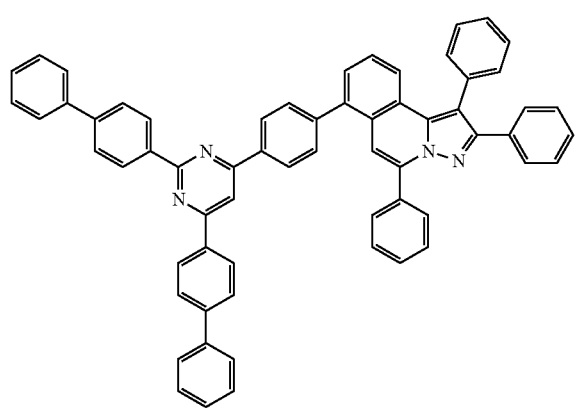

-continued
67
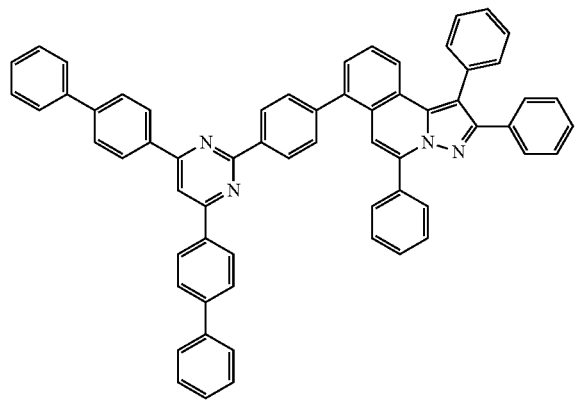
68
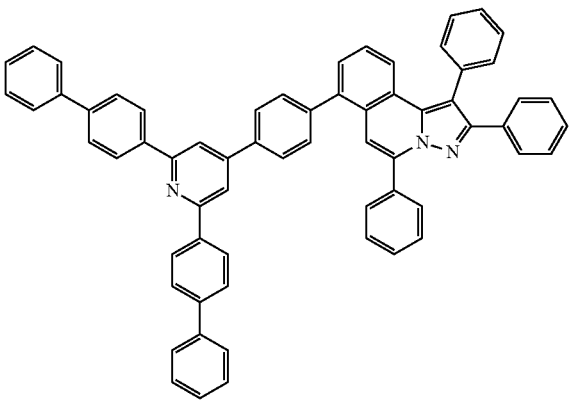
69
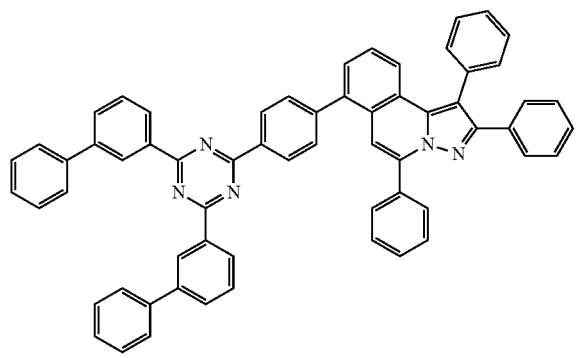
70
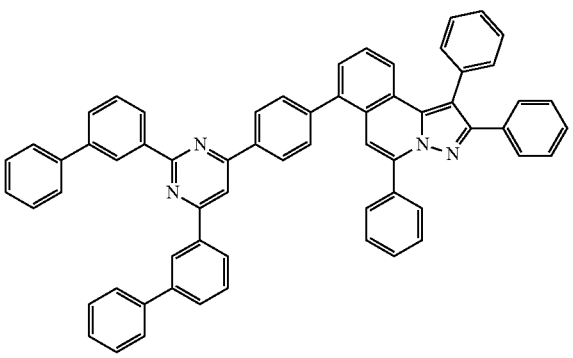
71
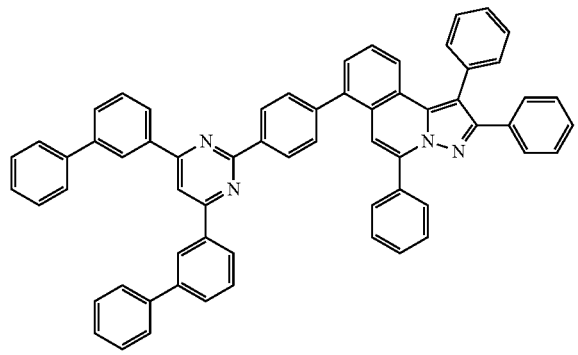
72
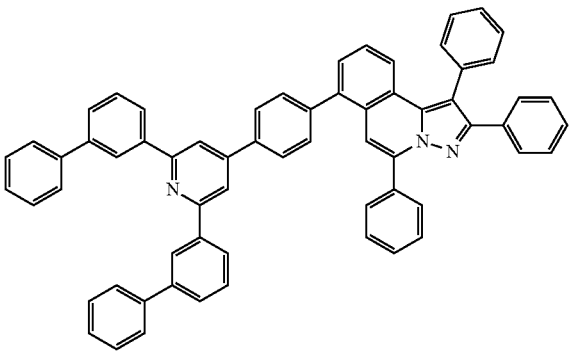
73
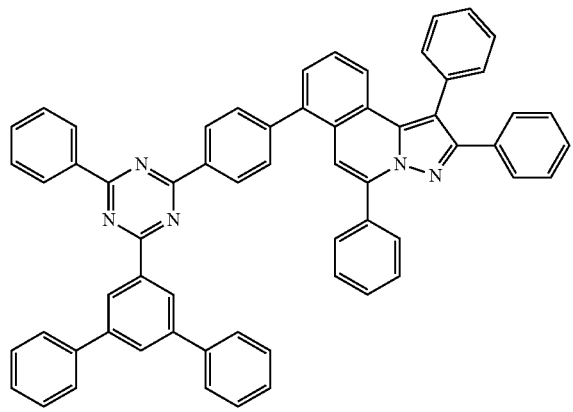
74
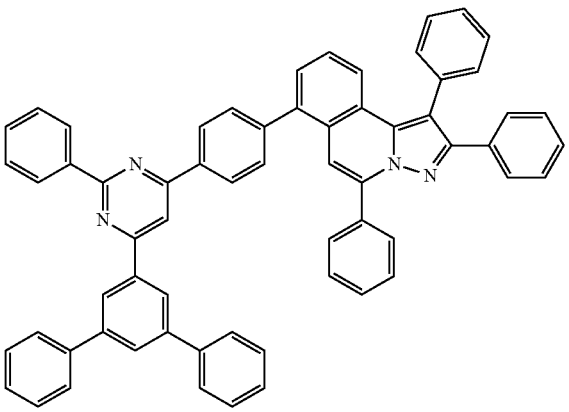

-continued
75
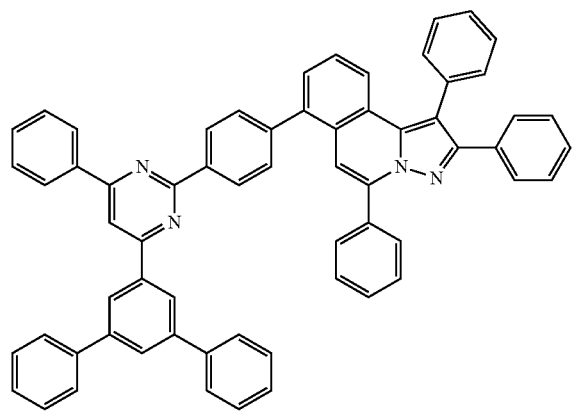
76
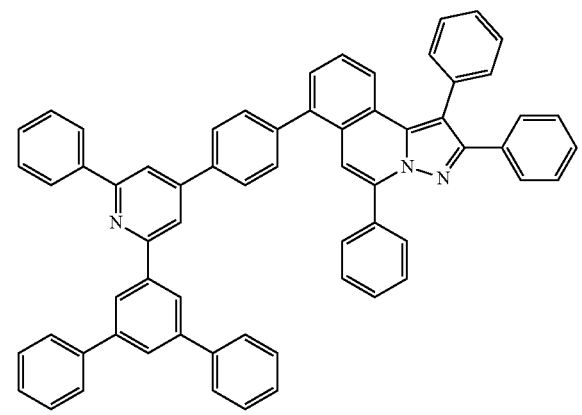
77
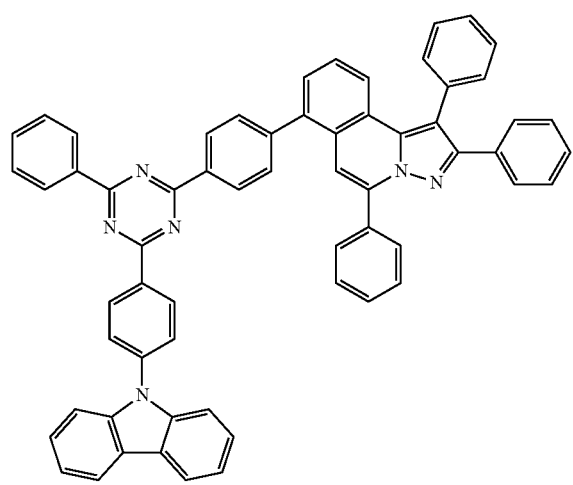
78
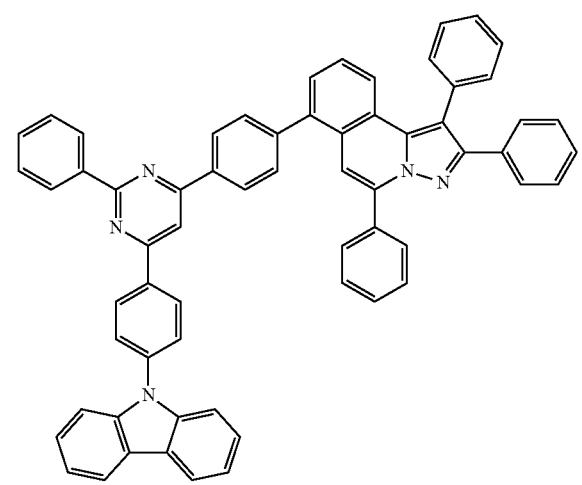
79
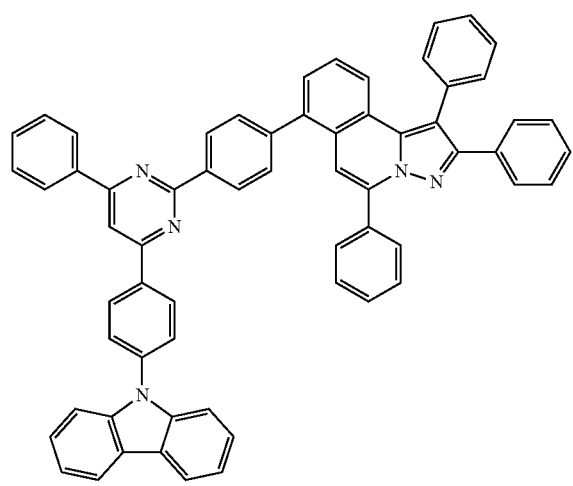
80
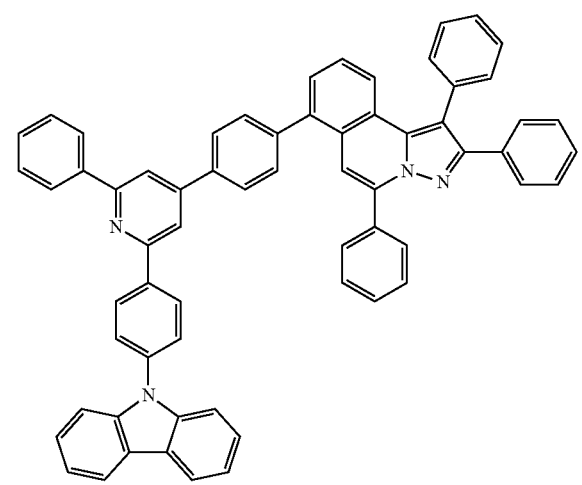

-continued
81
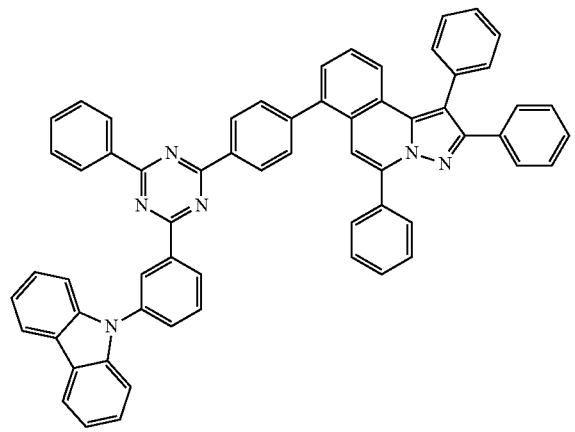
82
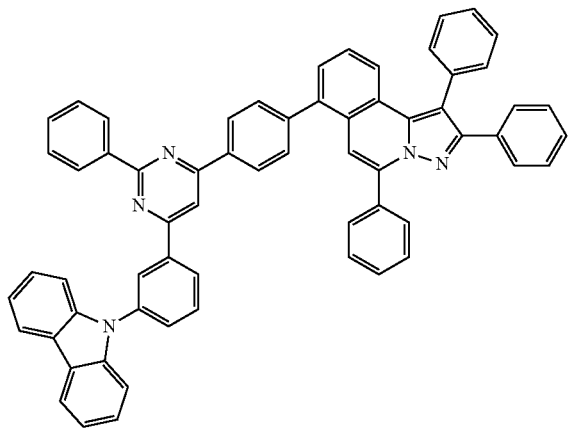
83
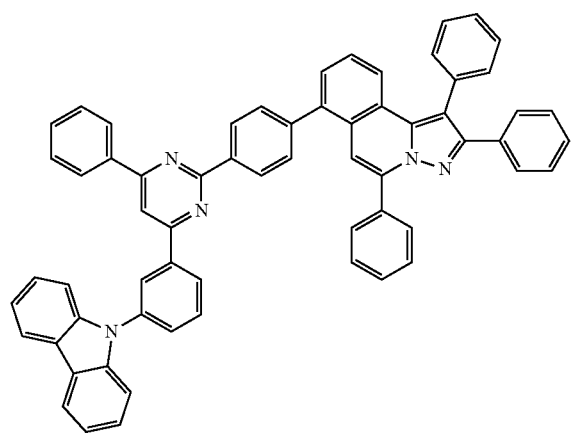
84
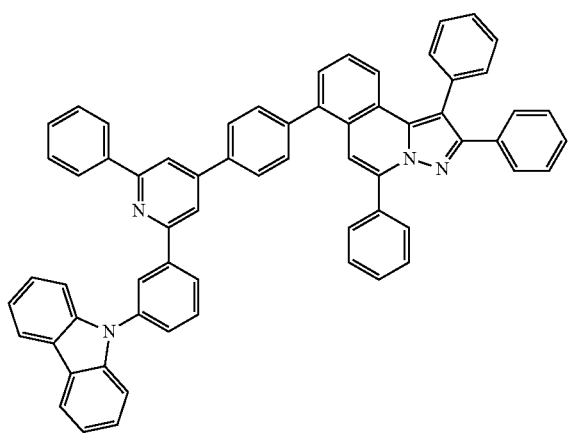
85
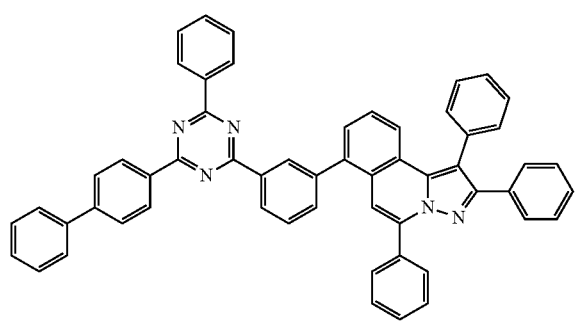
86
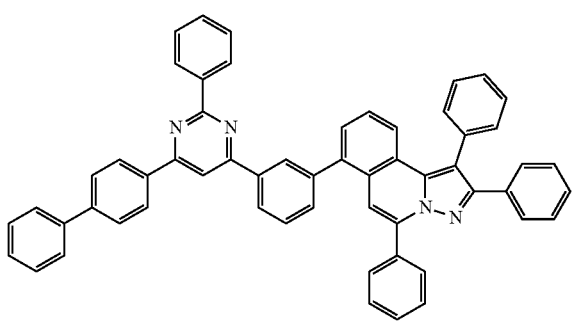
87
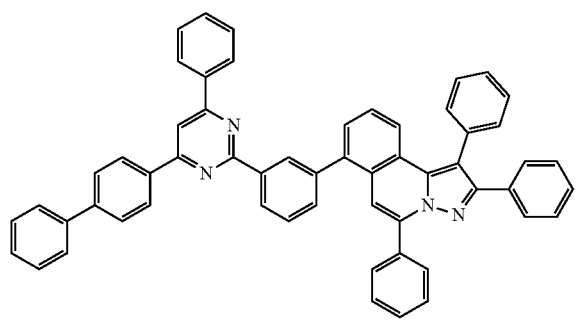
88
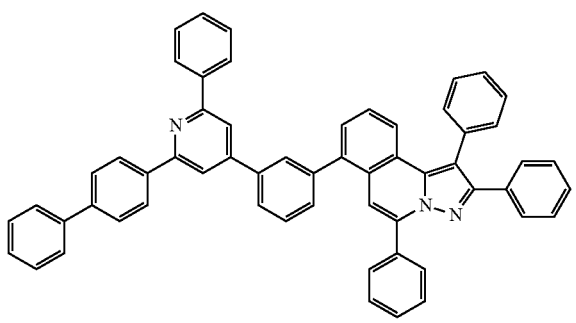

-continued
89
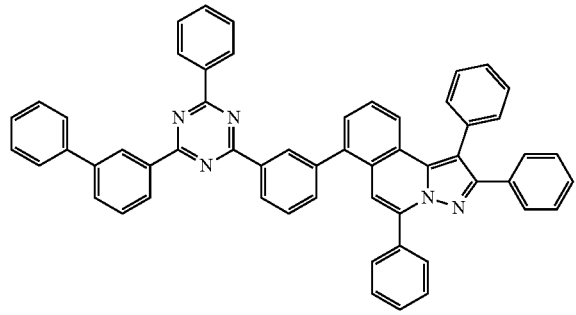
90
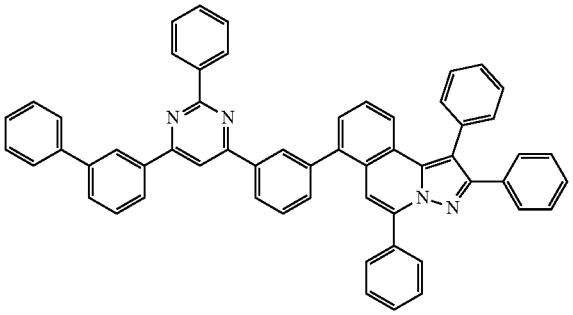
91
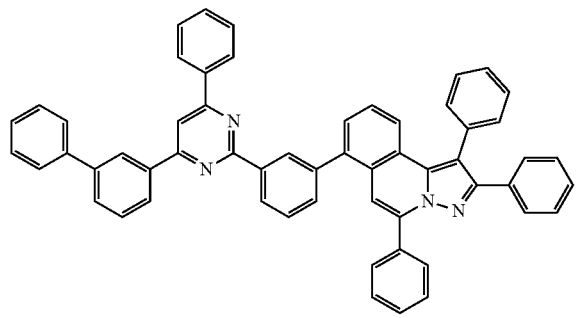
92
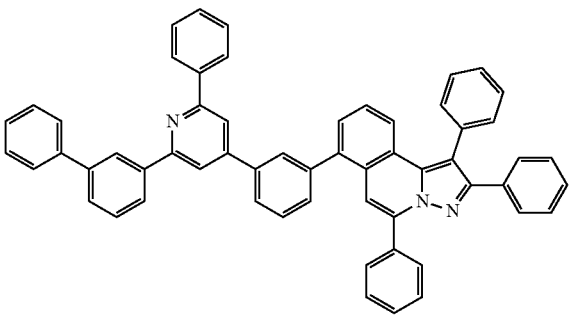
93
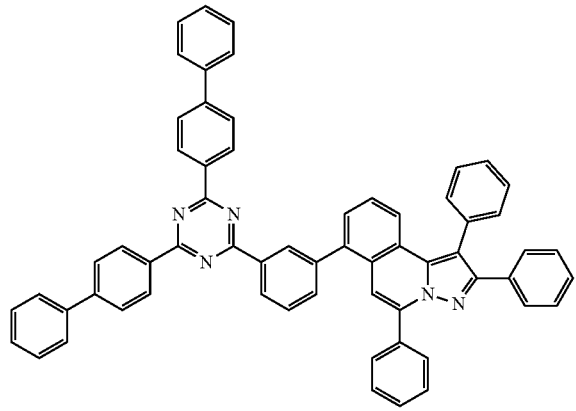
94
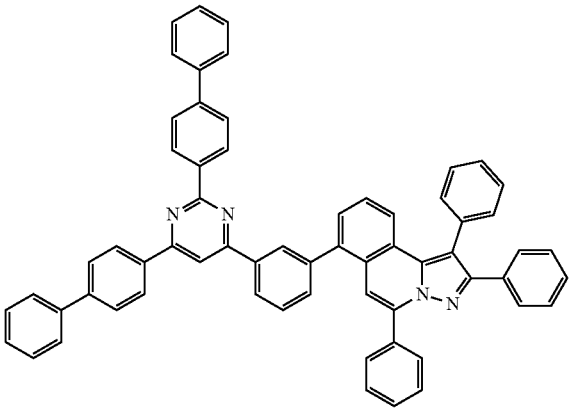
95
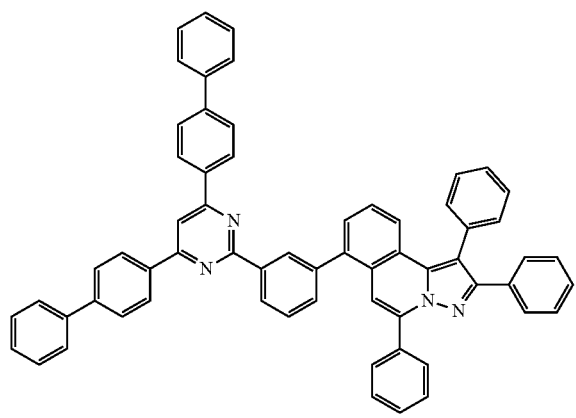
96
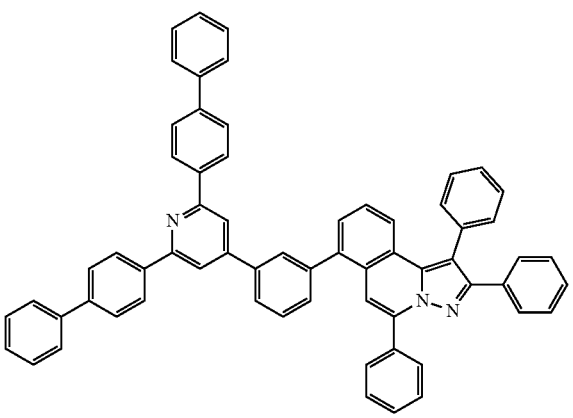

-continued
97
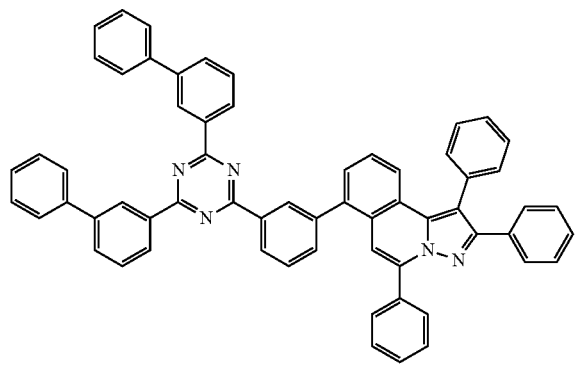
98
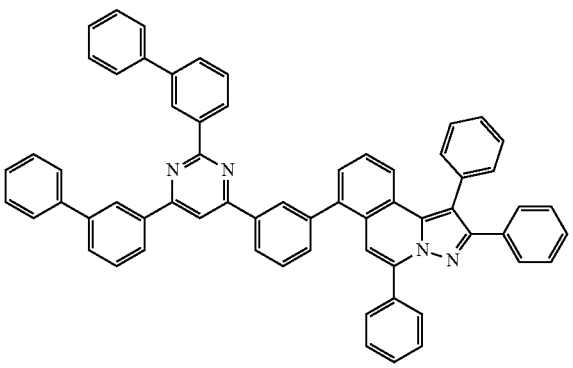
99
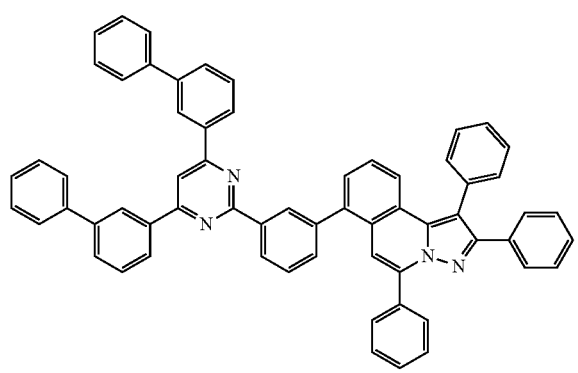
100
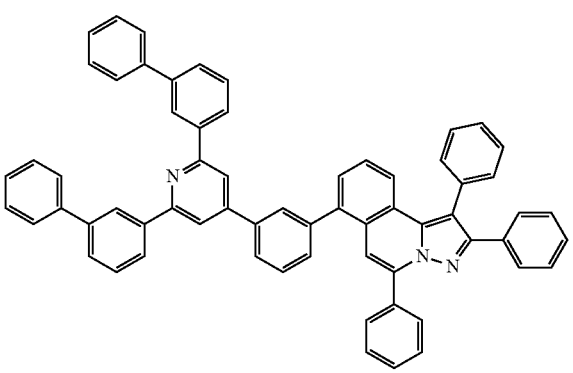
101
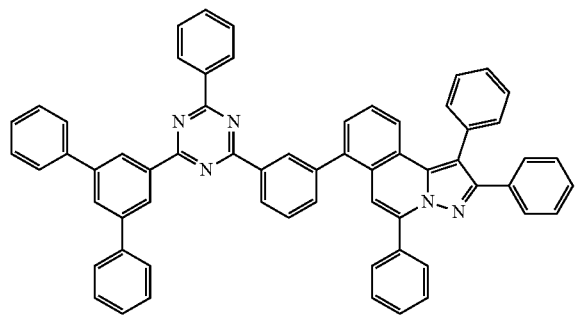
102
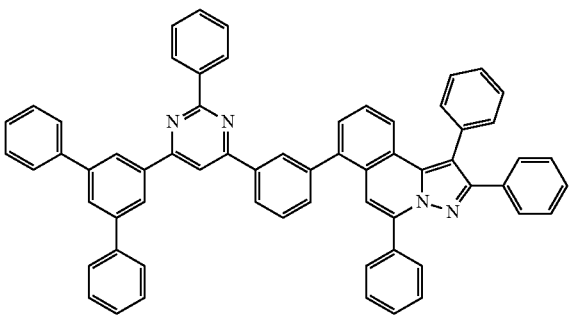
103
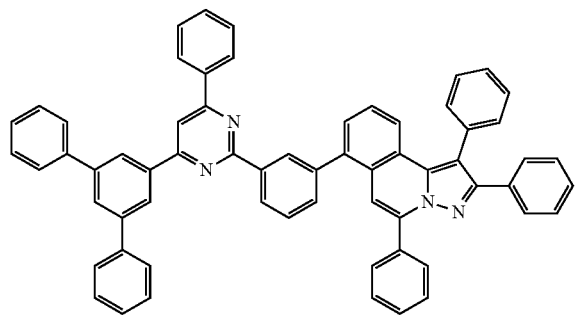
104
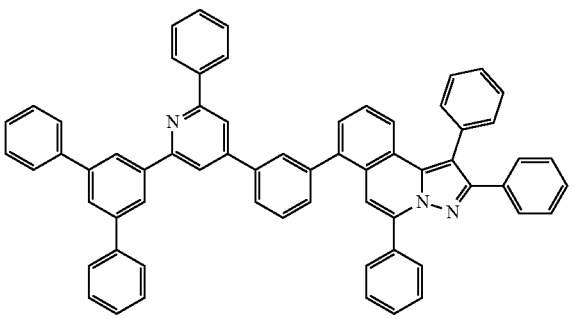

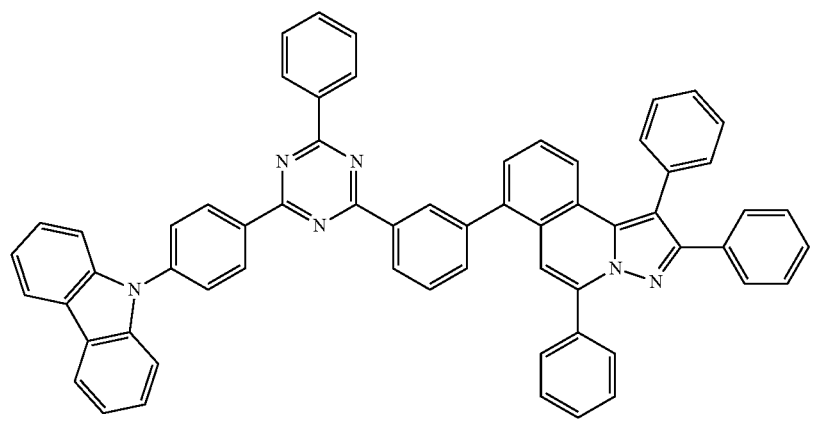
105
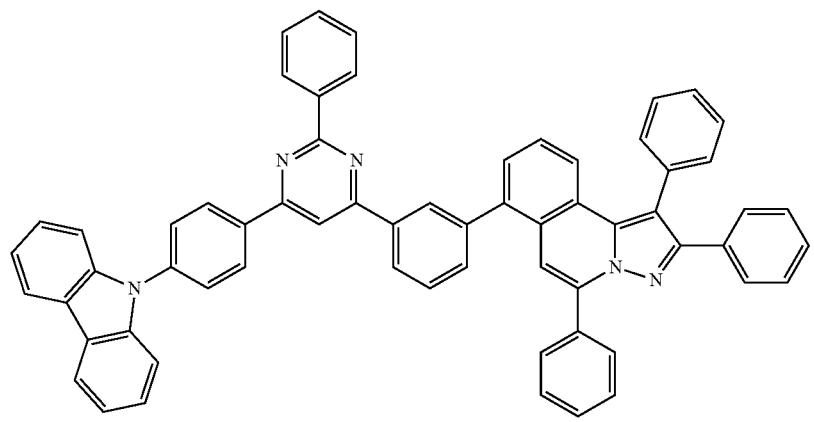
106
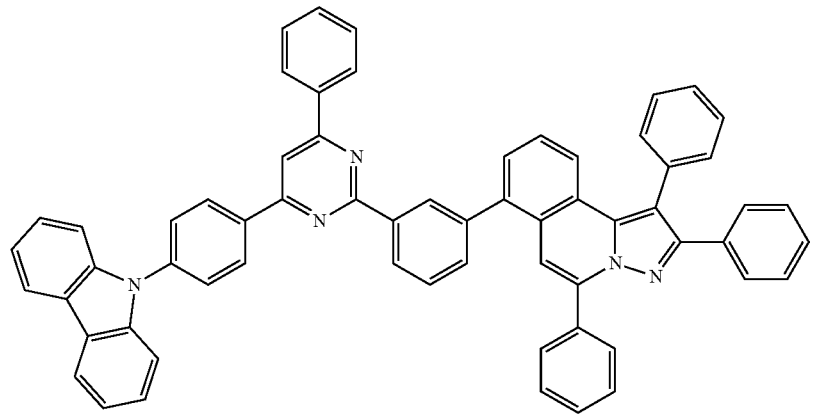
107

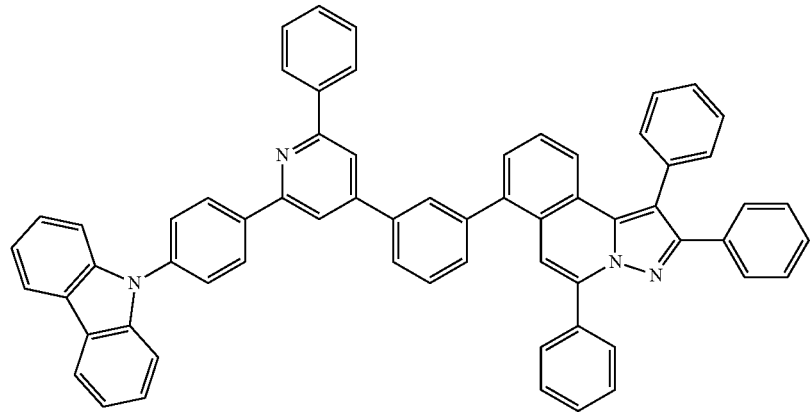
108
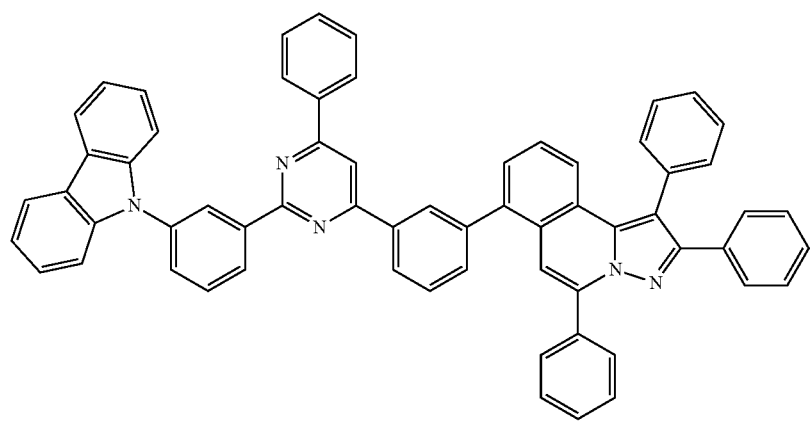
109
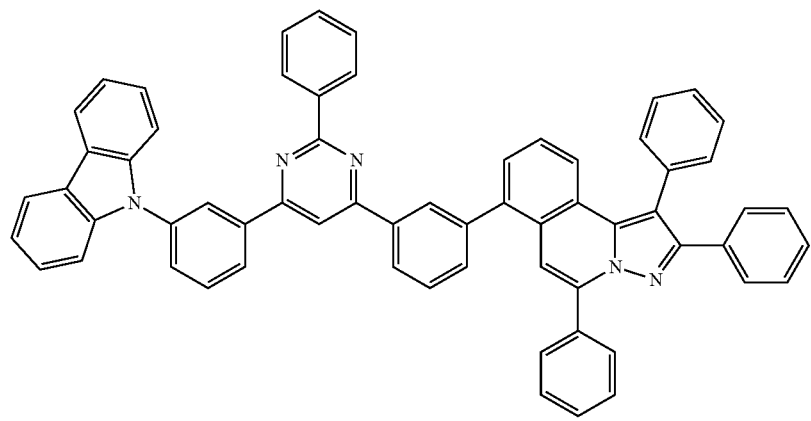
110

-continued
111
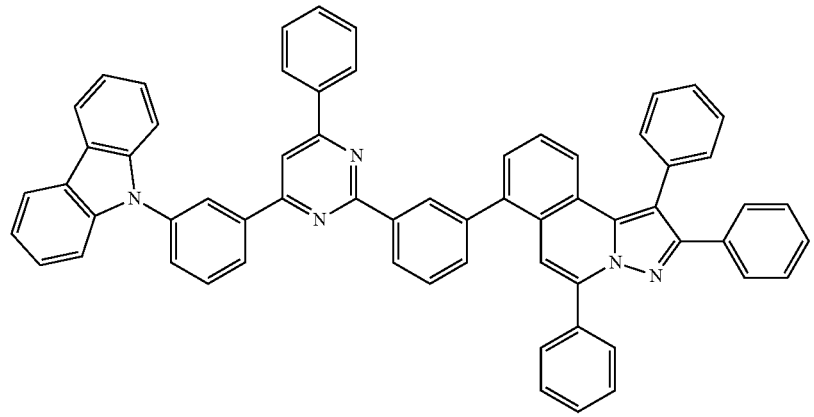
112
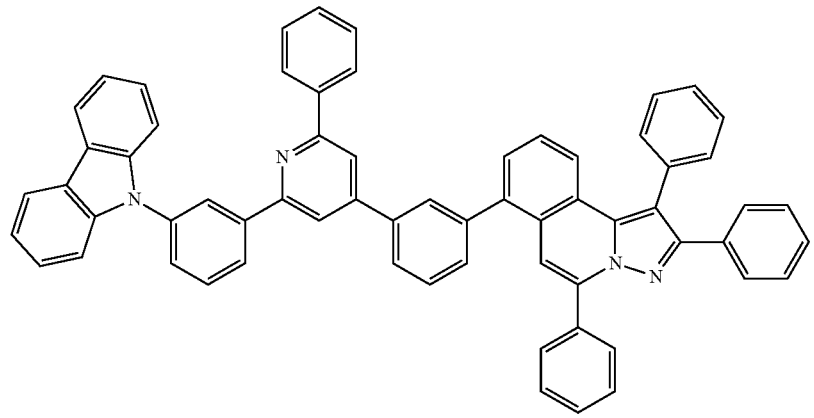
113
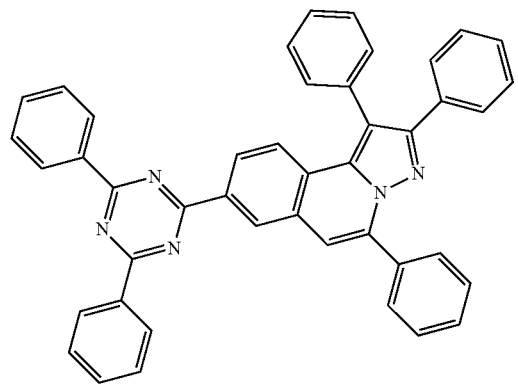
114
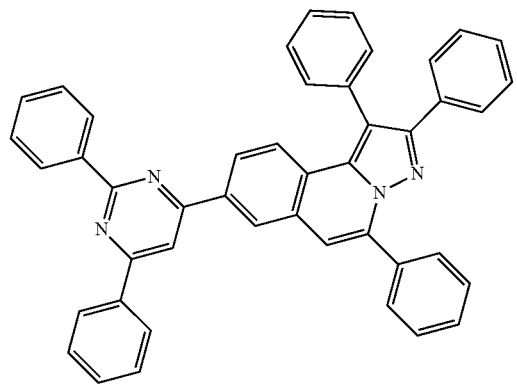
115
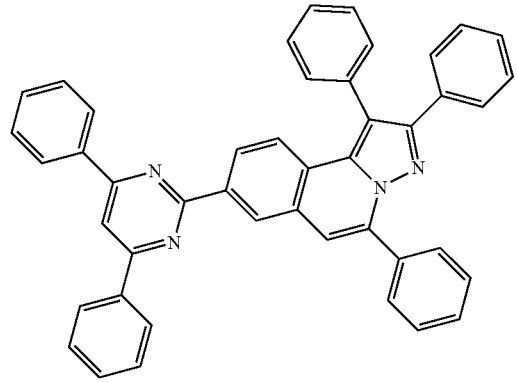
116
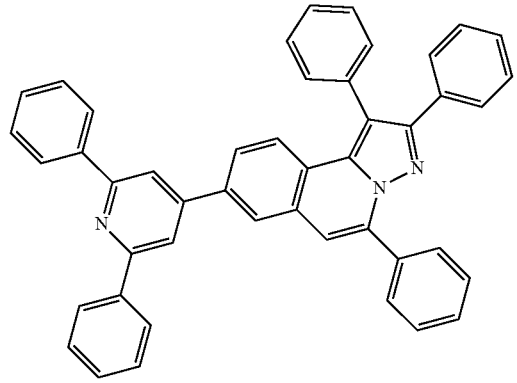

-continued
117
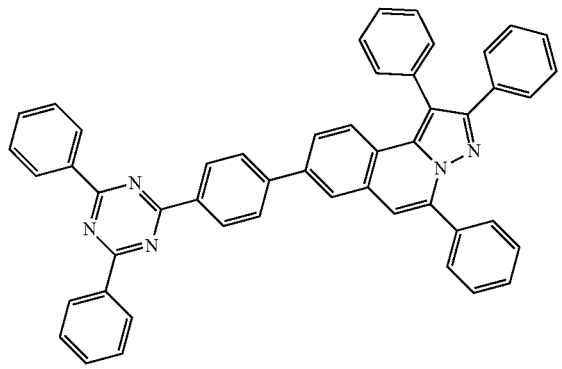
118
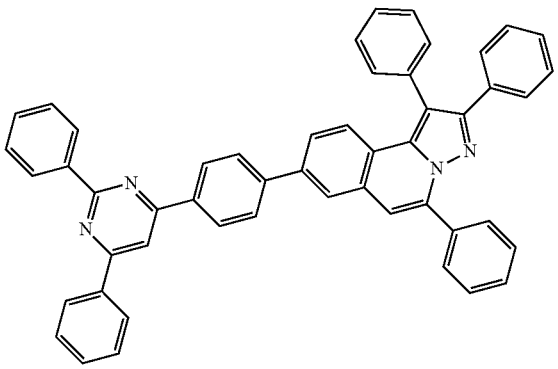
119
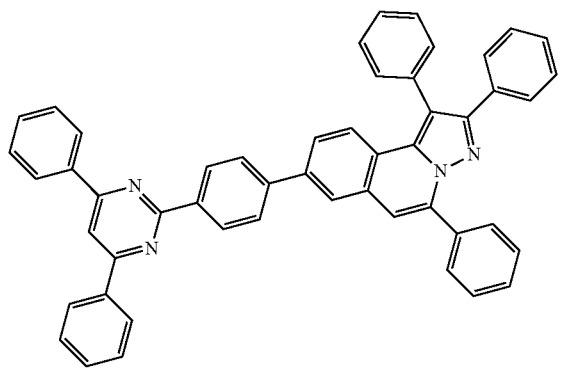
120
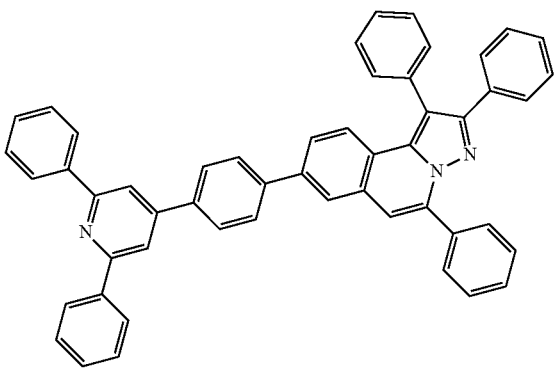
121
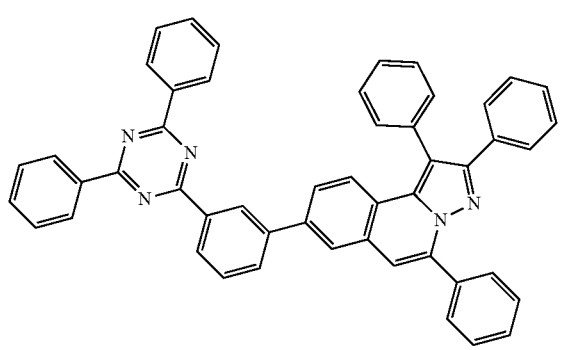
122
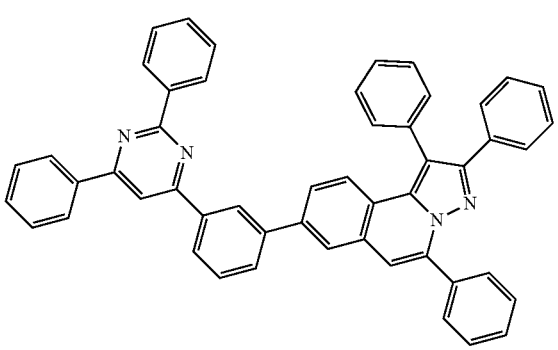
123
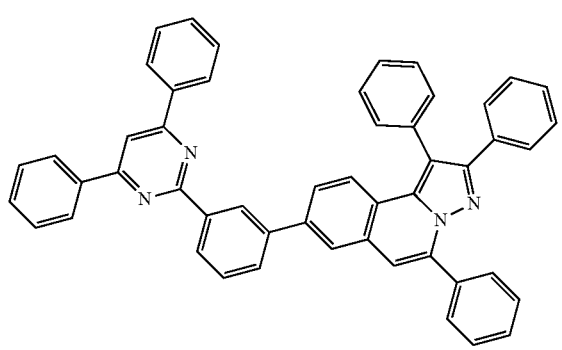
124
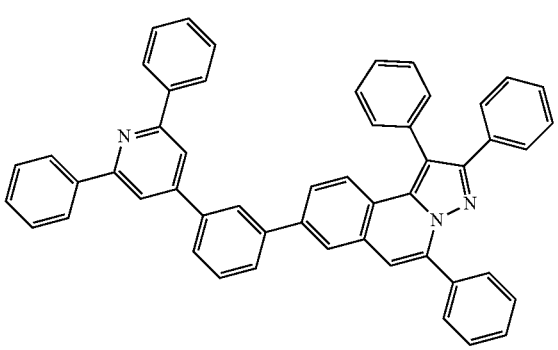

125 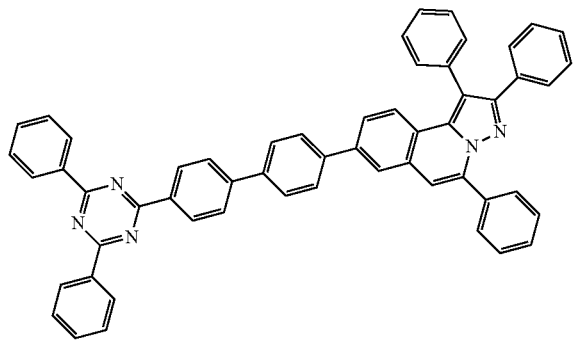
126 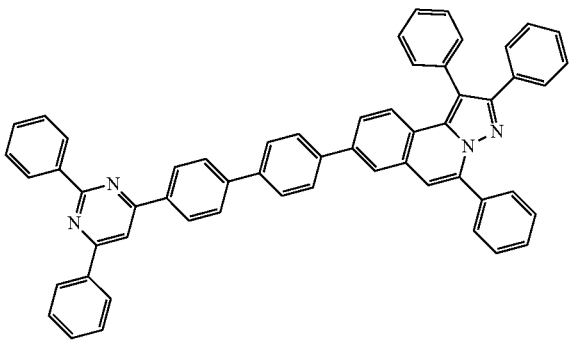
127 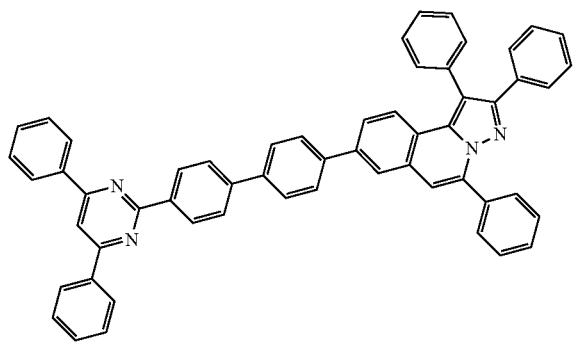
128 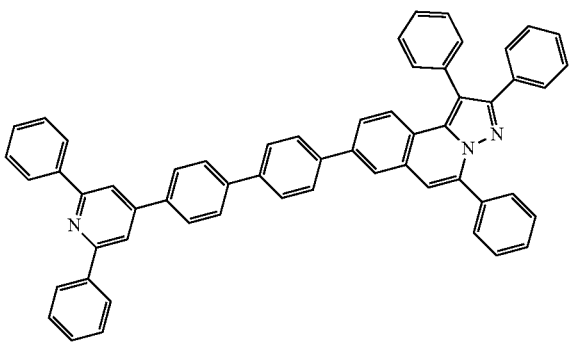
129 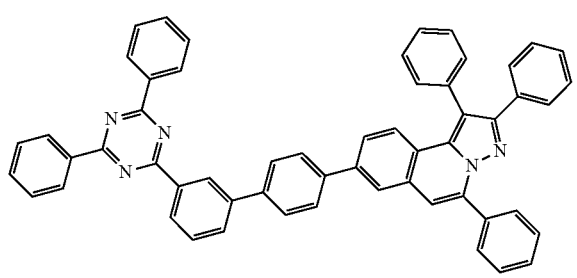
130 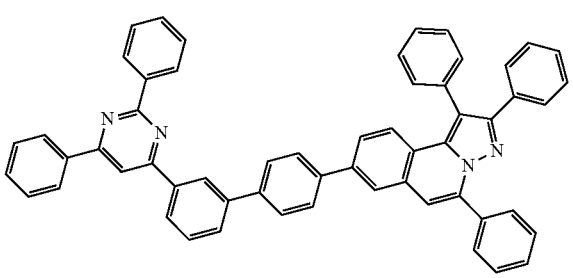
131 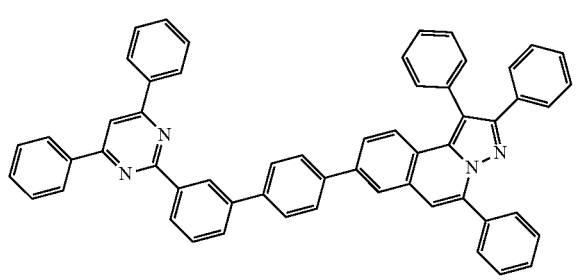
132 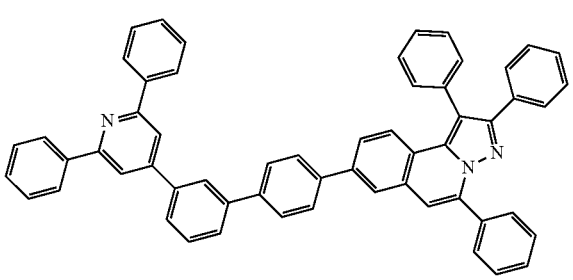
133 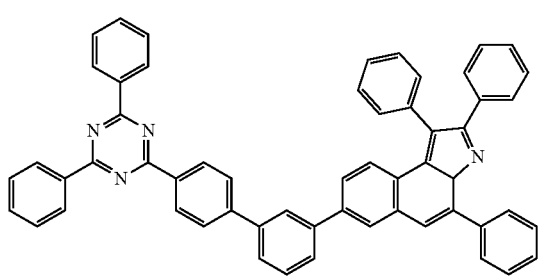
134 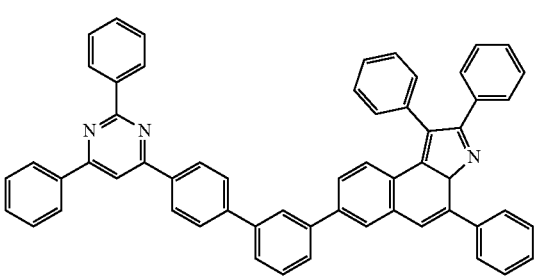

135 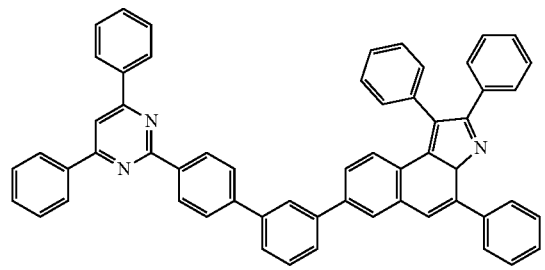
136 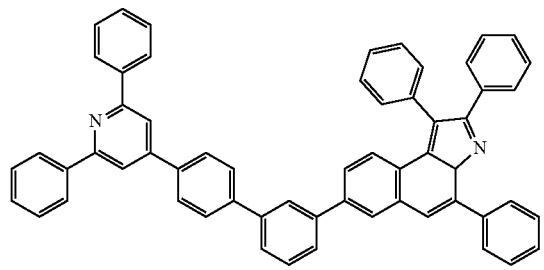
137 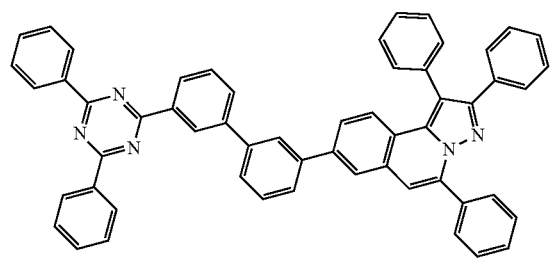
138 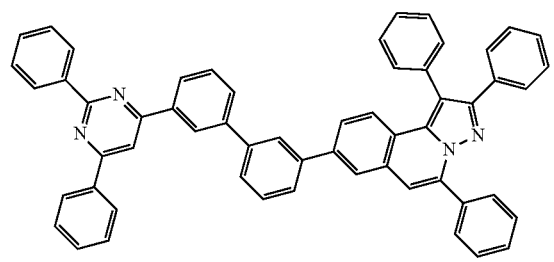
139 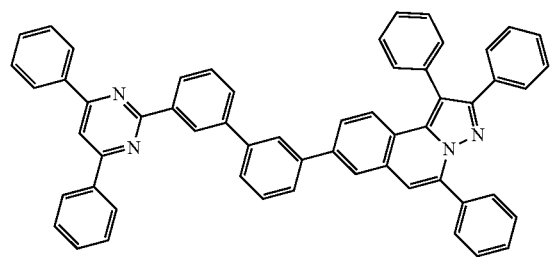
140 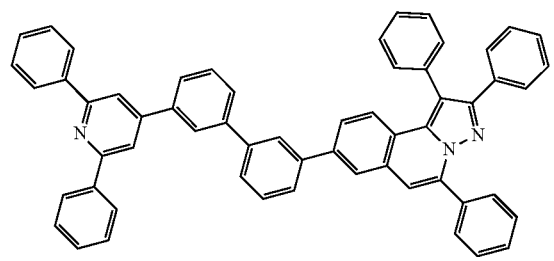
141 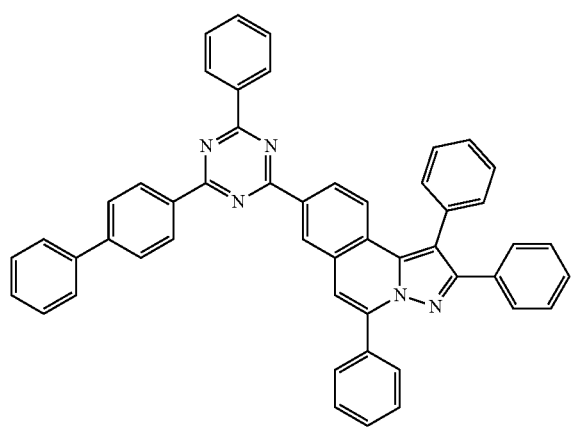
142 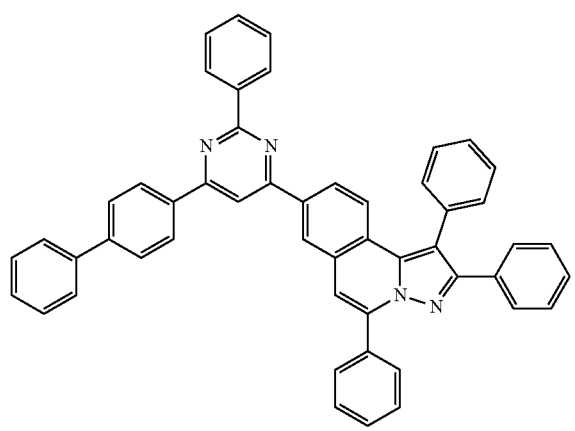

-continued
143
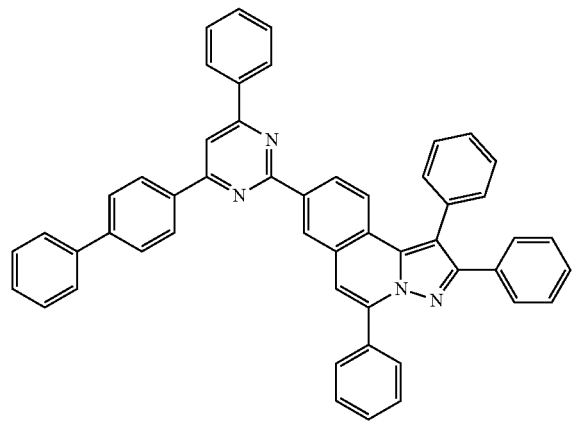
144
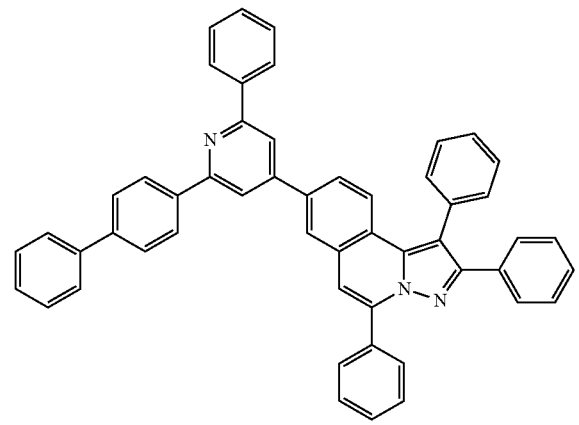
145
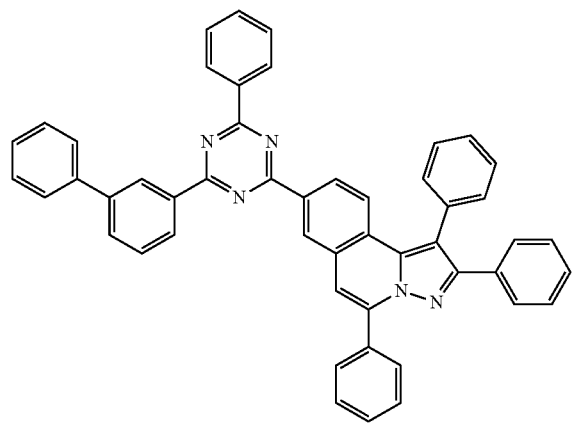
146
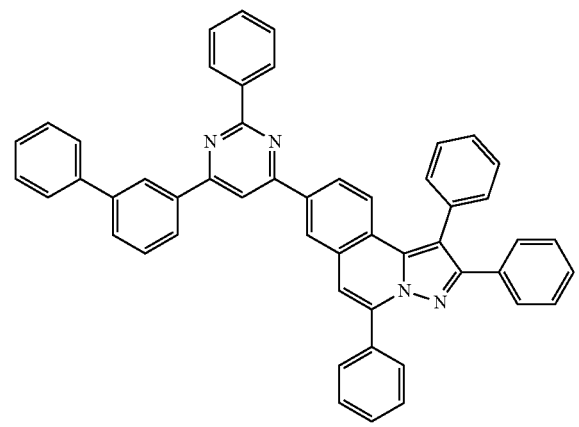
147
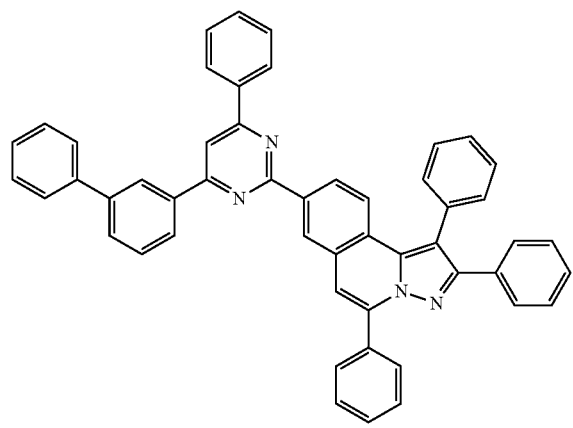
148
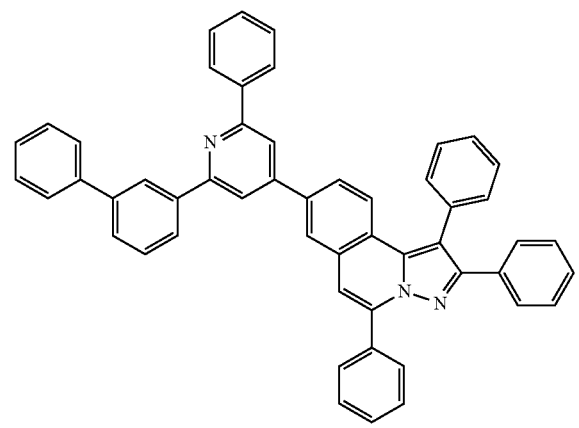

-continued
149
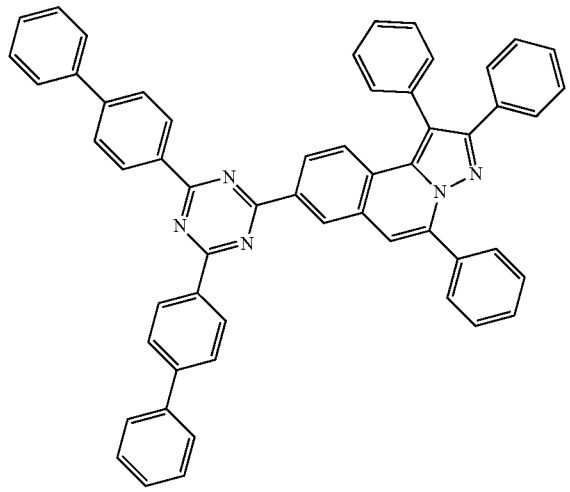
150
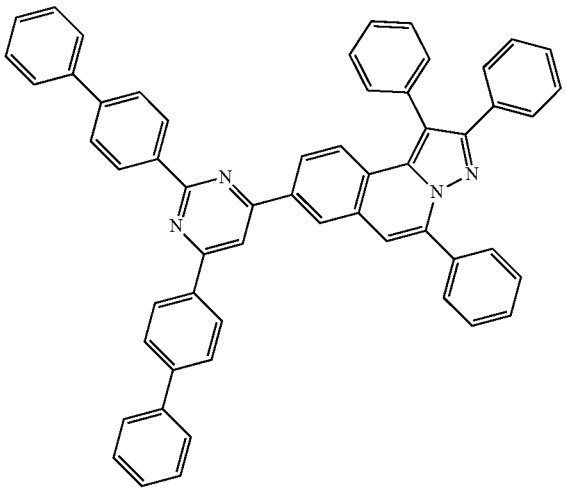
151
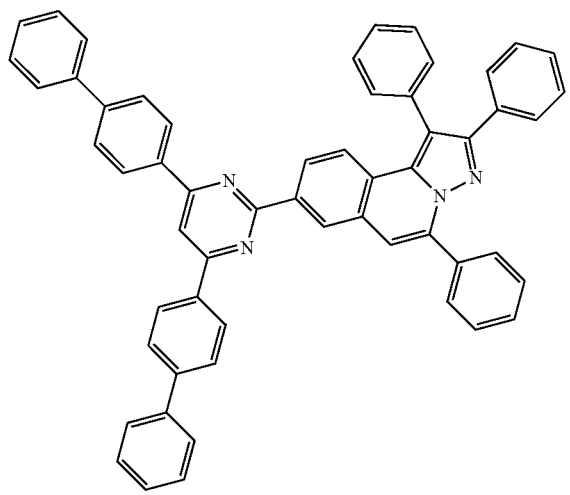
152
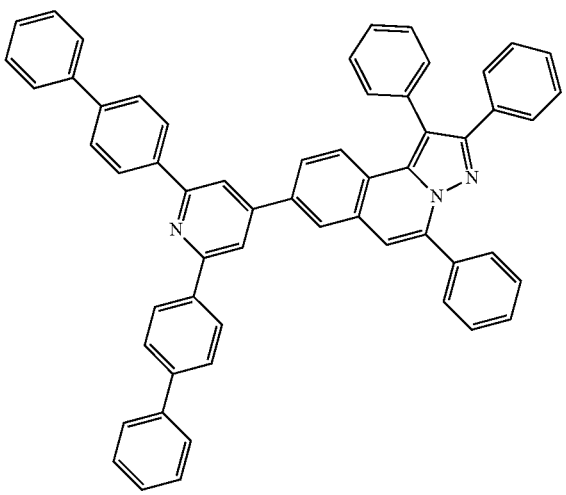
153
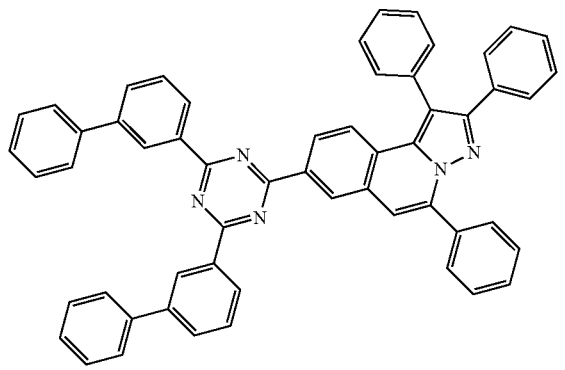
154
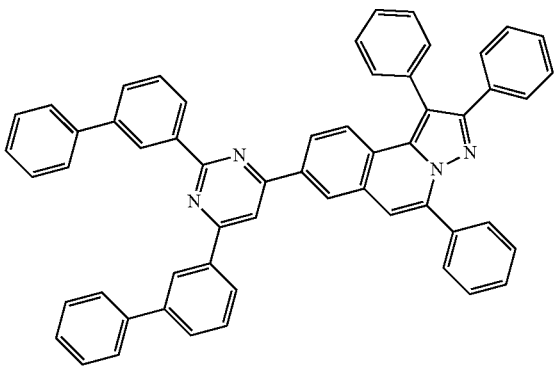

-continued
155
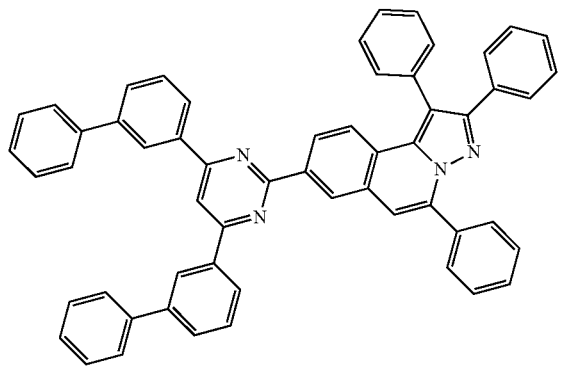
156
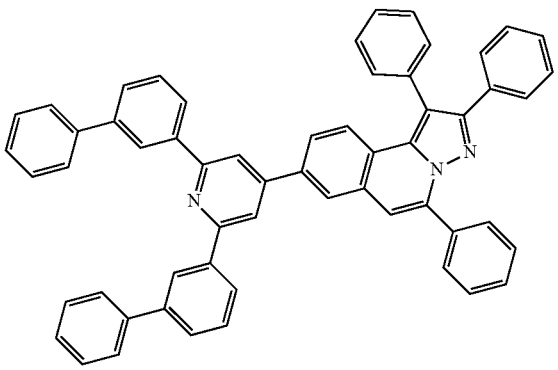
157
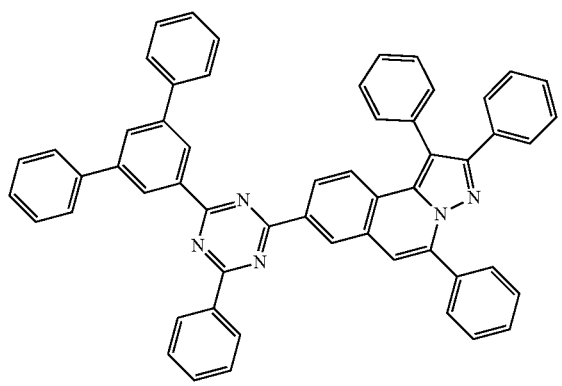
158
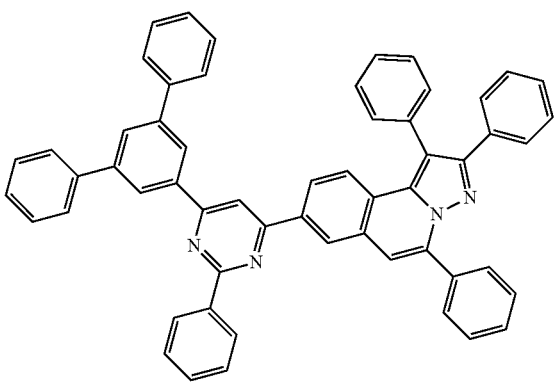
159
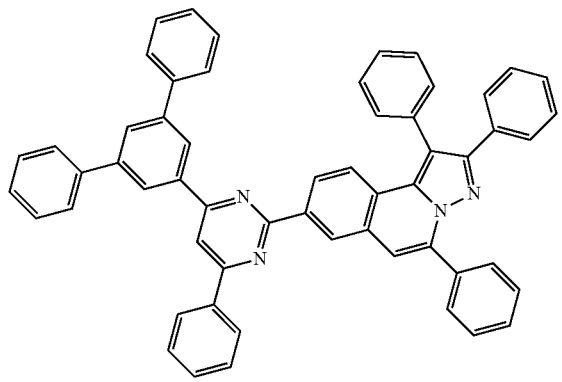
160
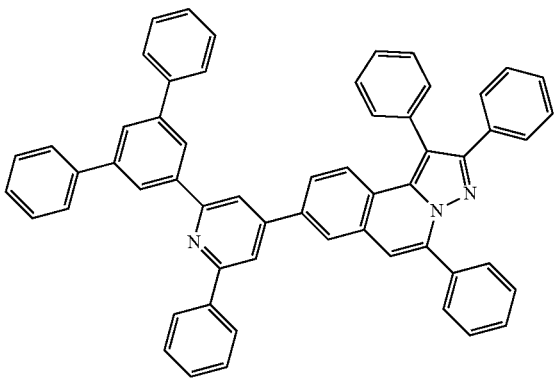
161
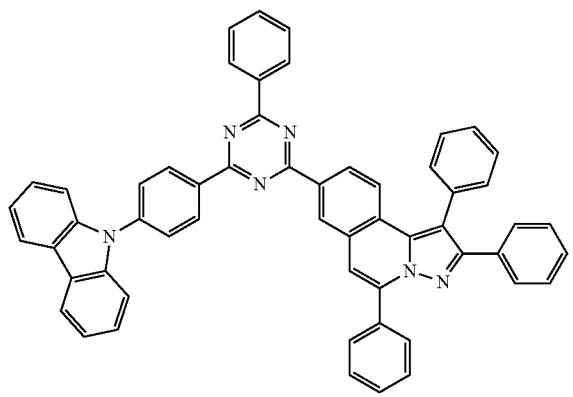
162
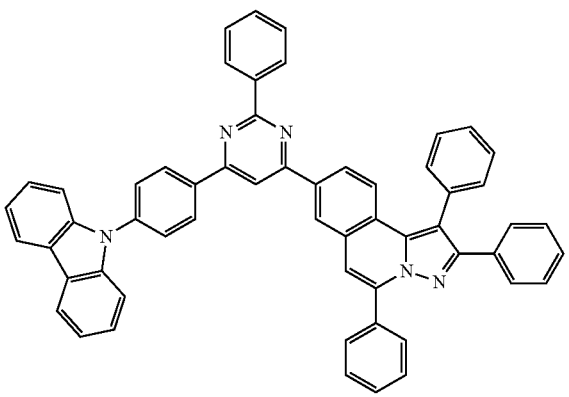

-continued
163
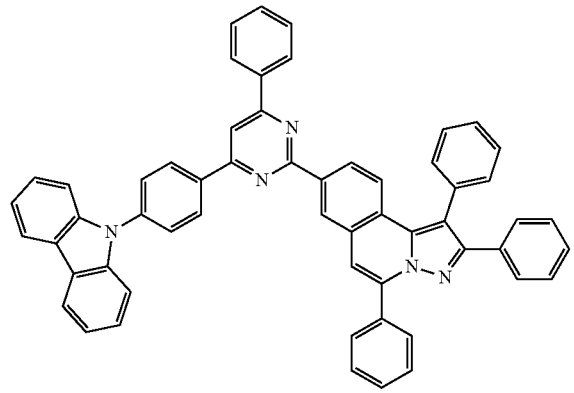
164
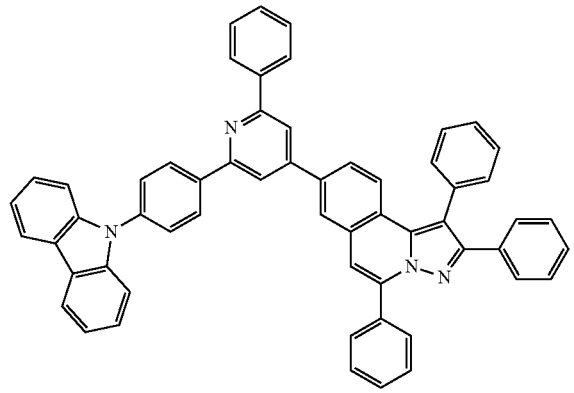
165
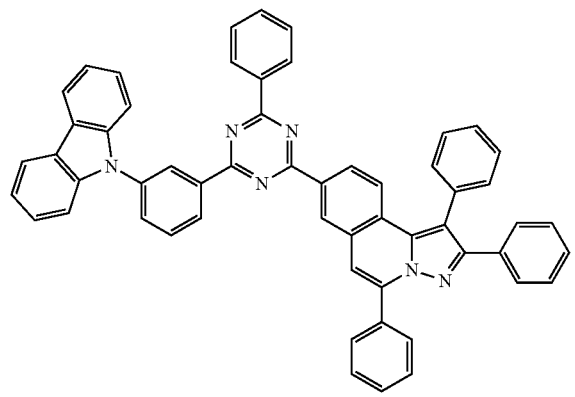
166
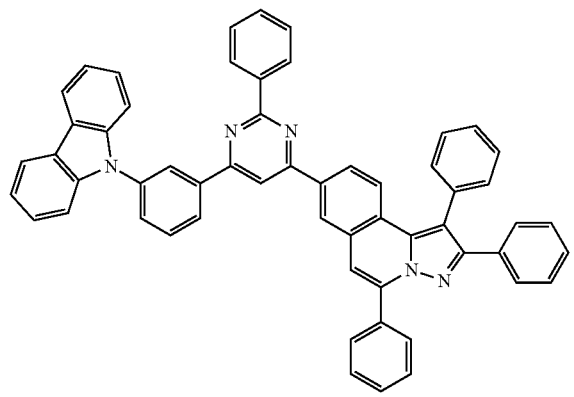
167
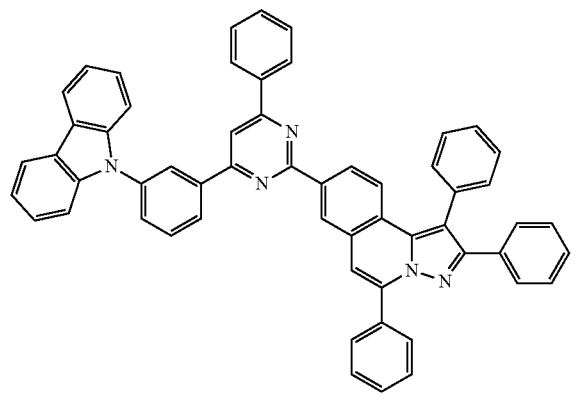
168
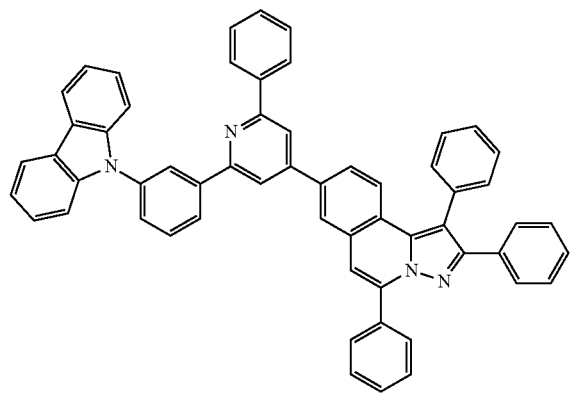

-continued
169
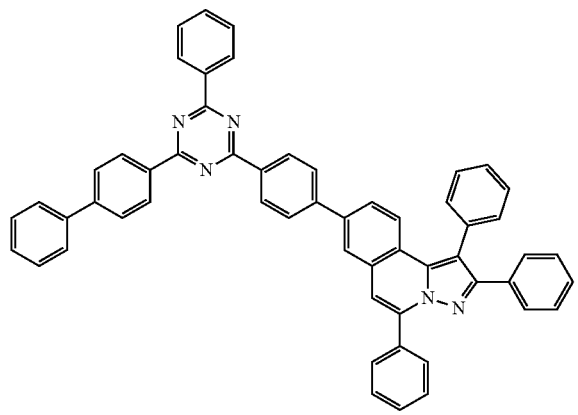
170
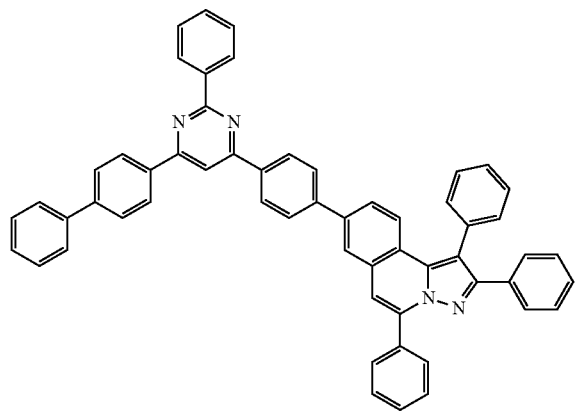
171
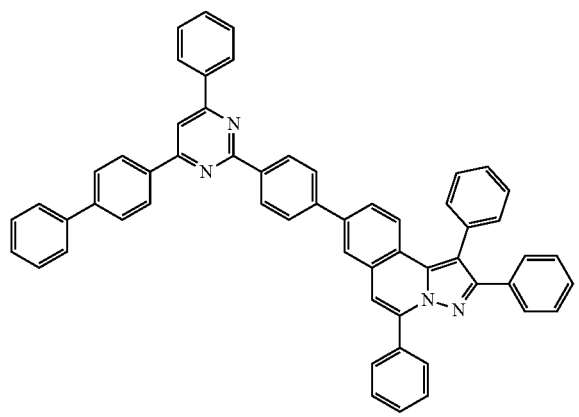
172
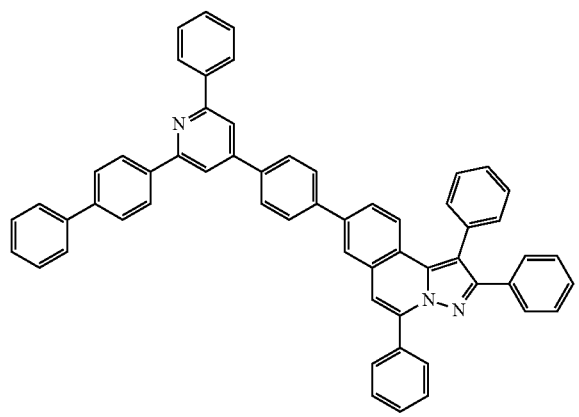
173
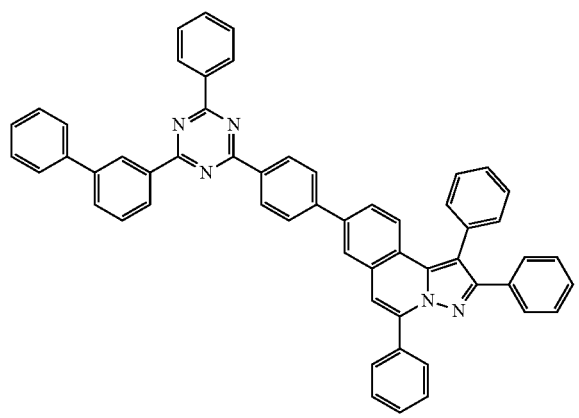
174
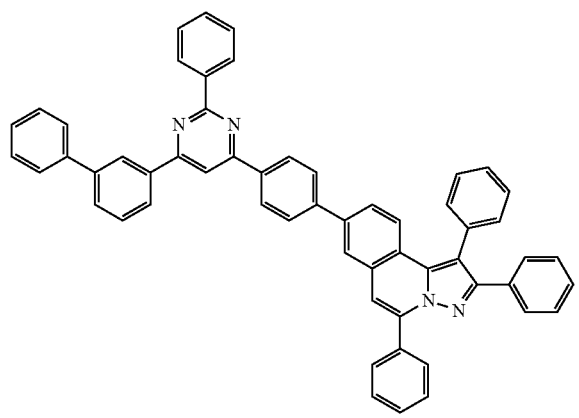

-continued
175
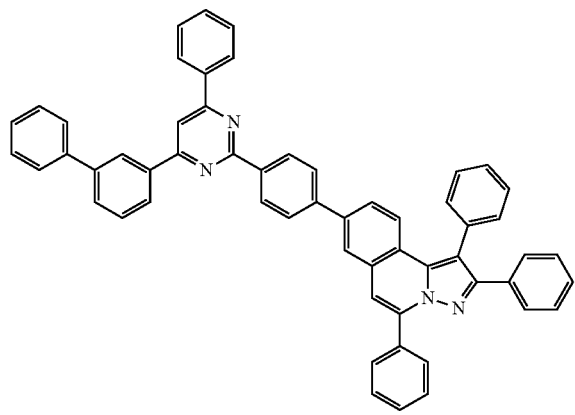
176
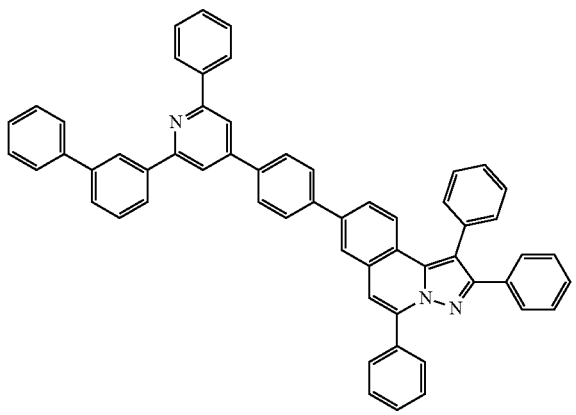
177
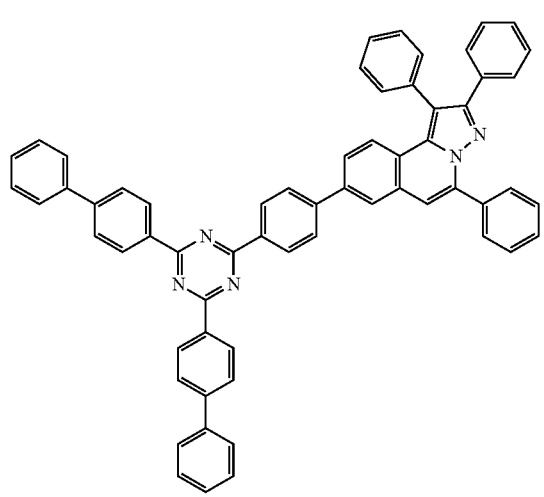
178
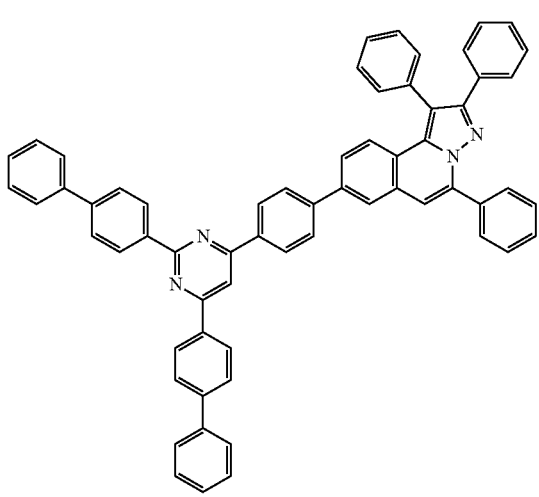
179
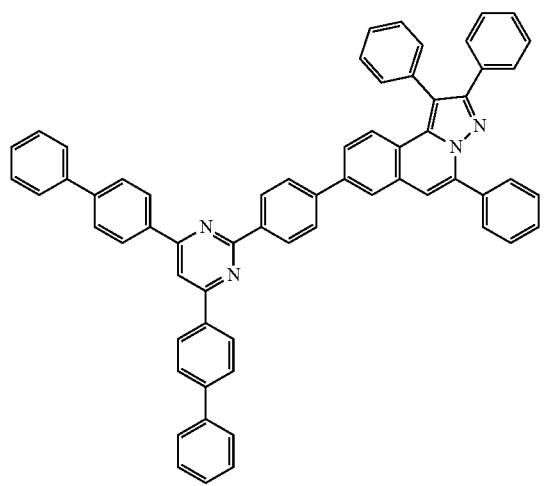
180
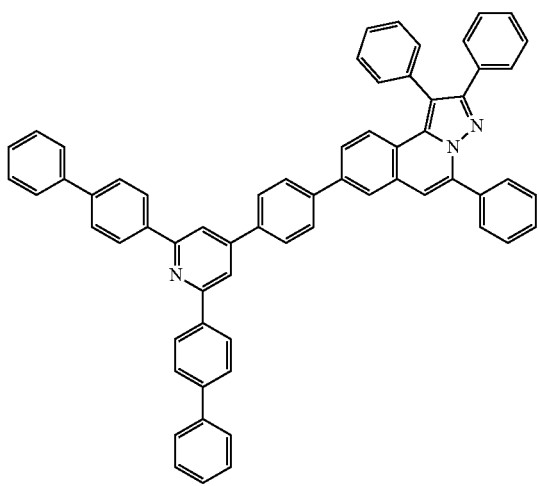

-continued
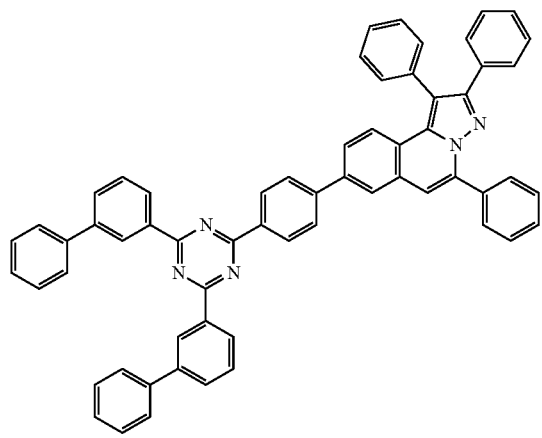
181
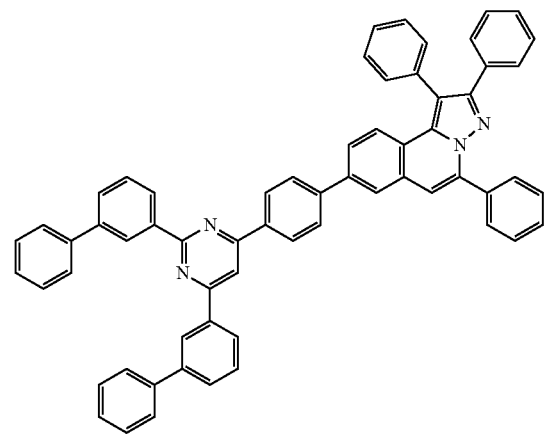
182
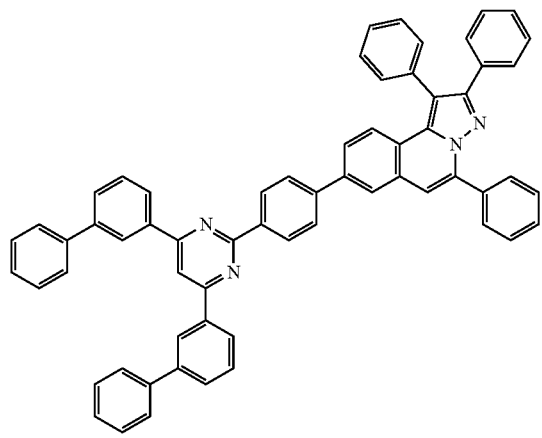
183
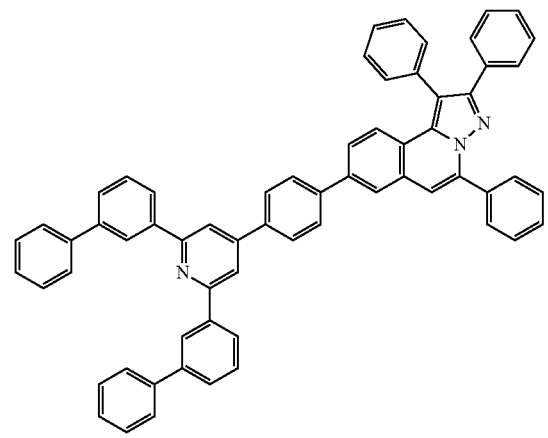
184
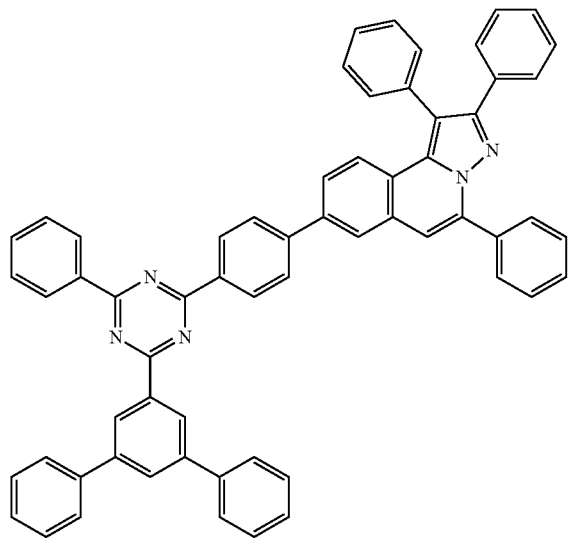
185
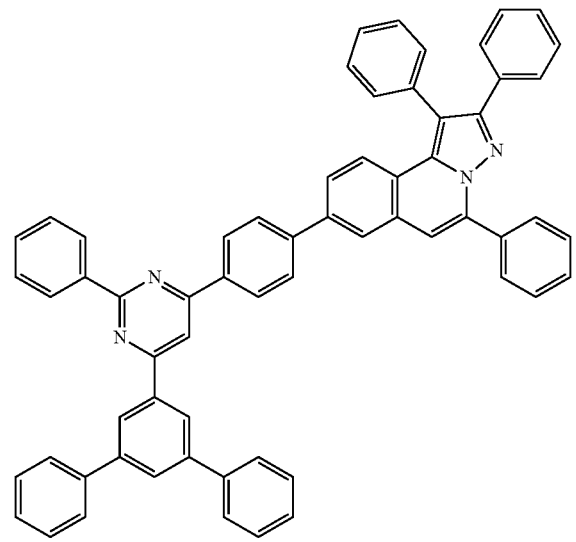
186

187
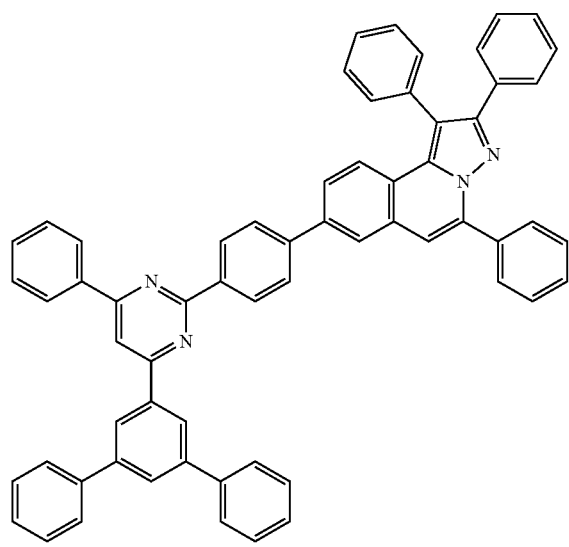
188
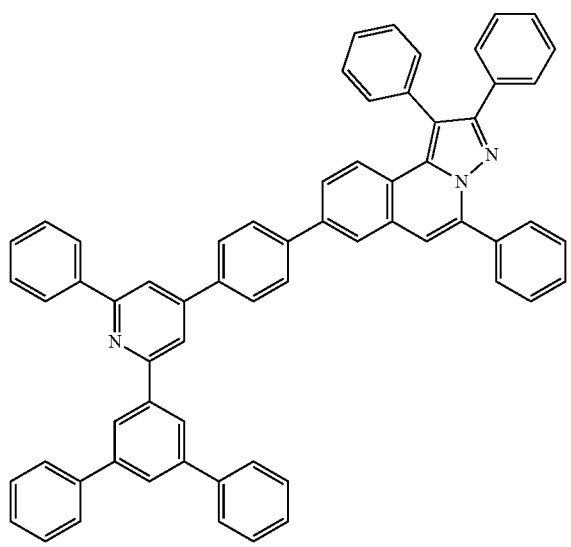
189
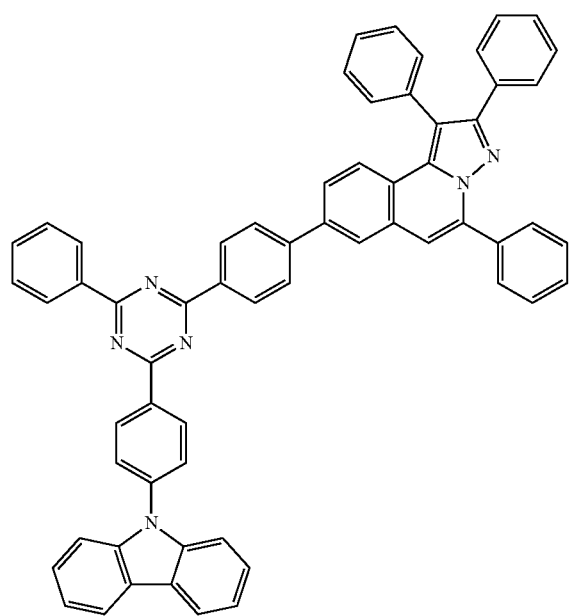
190
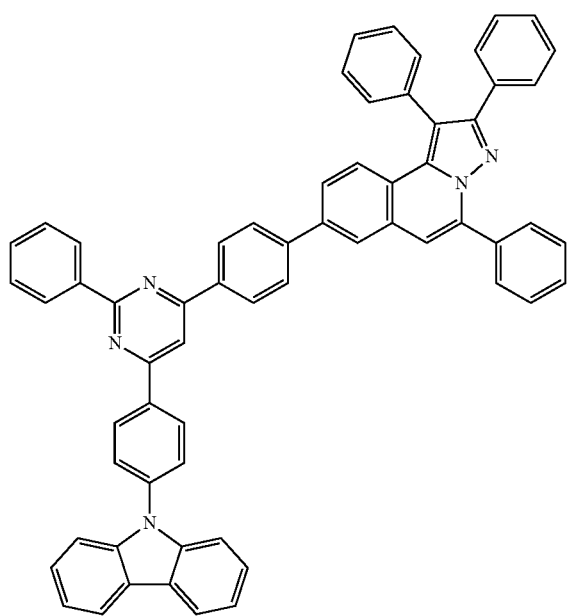

-continued
191
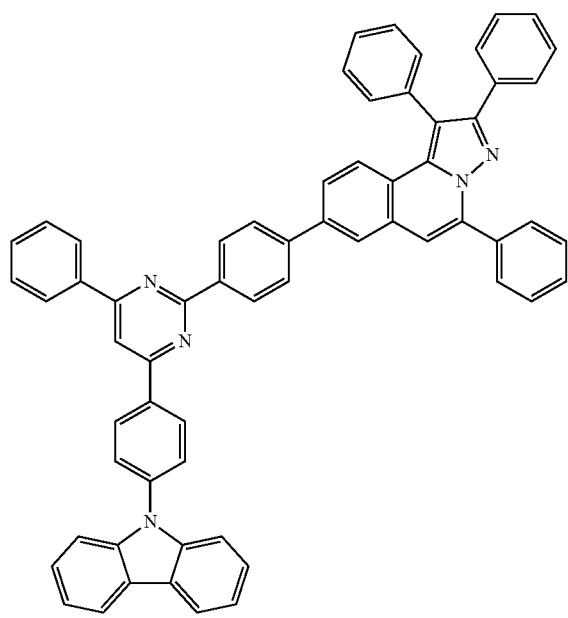
192
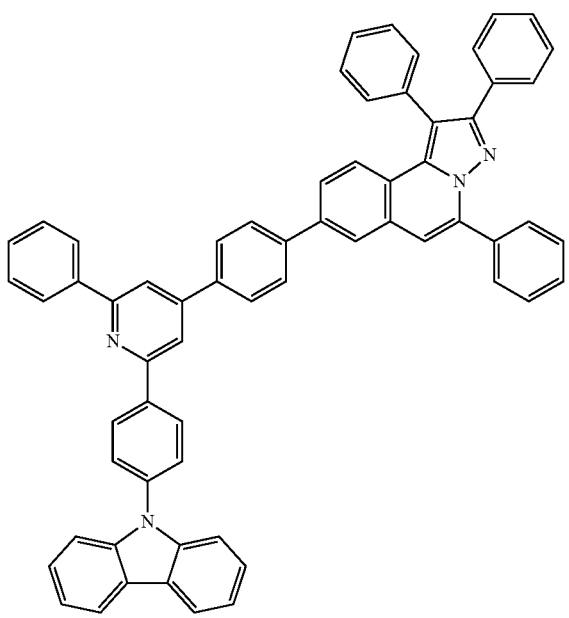
193
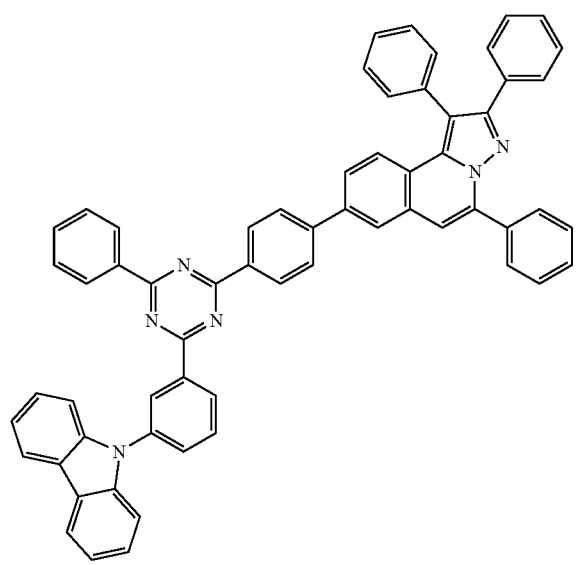
194
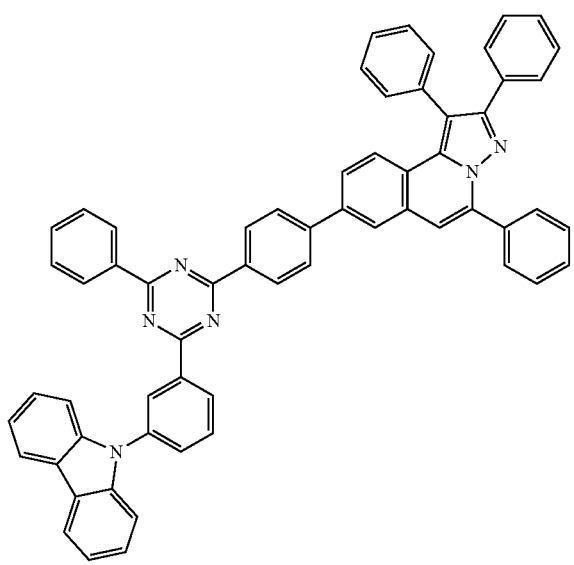

-continued
195
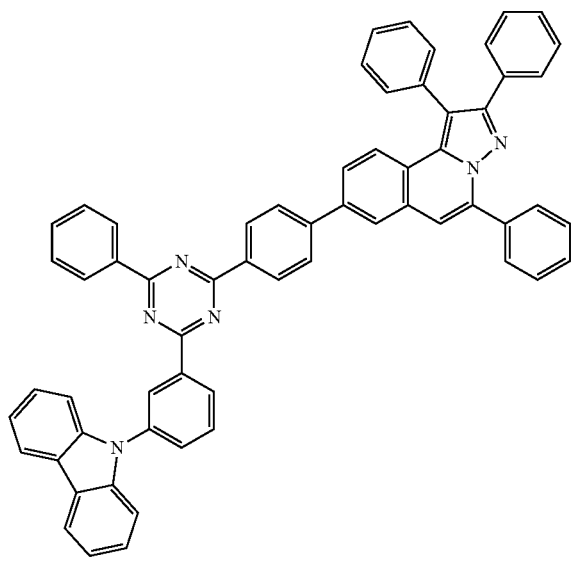
196
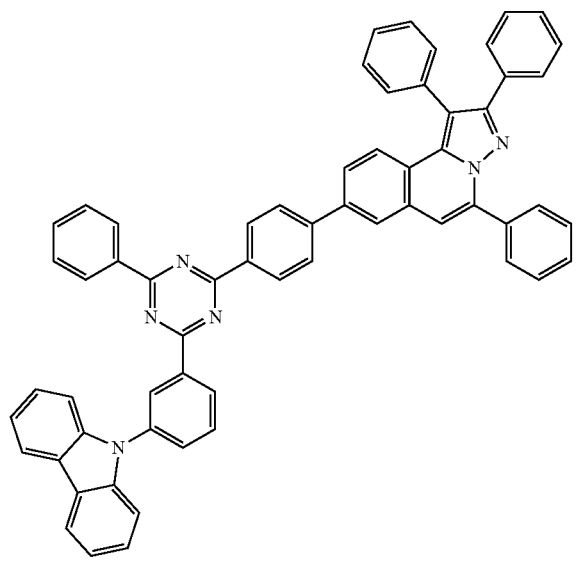
197
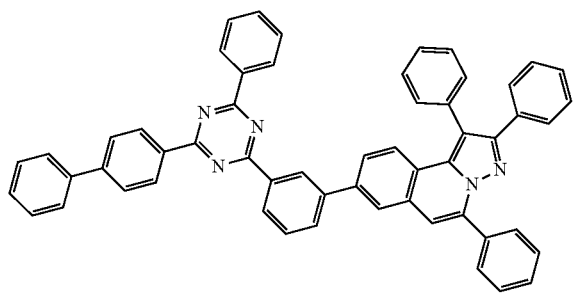
198
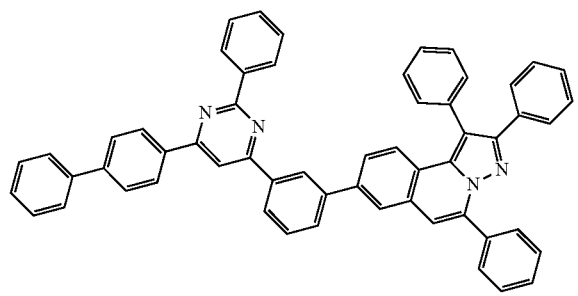
199
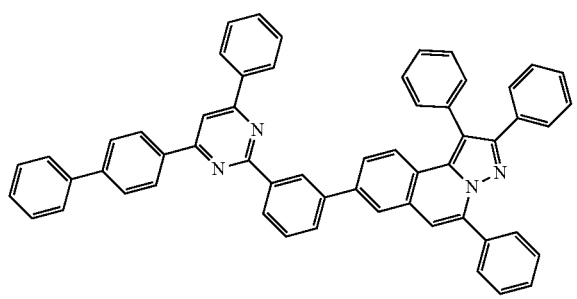
200
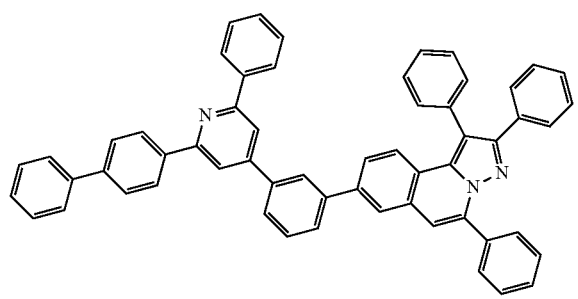
201
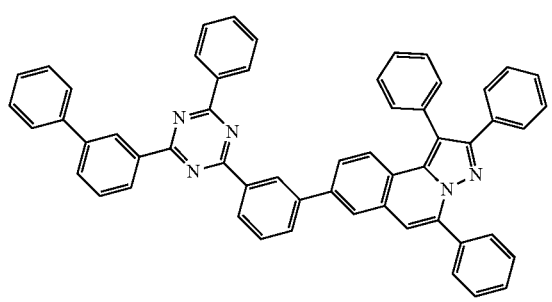
202
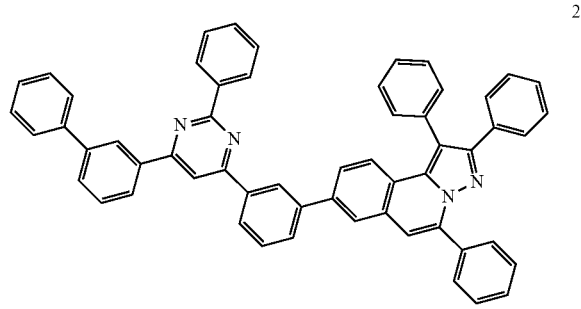

-continued
203
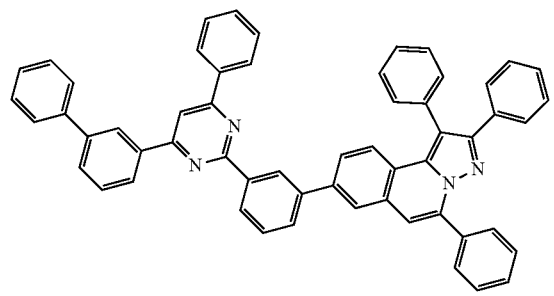
204
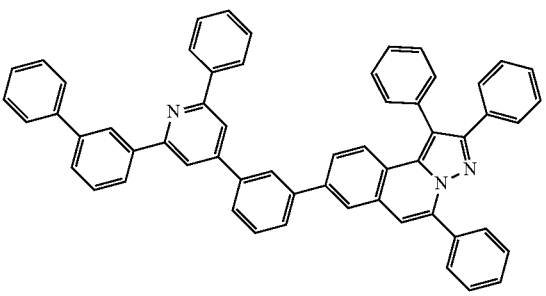
205
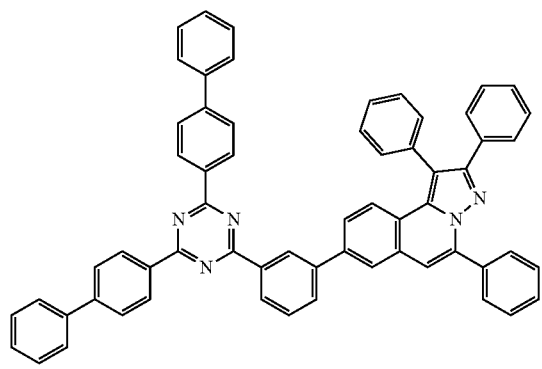
206
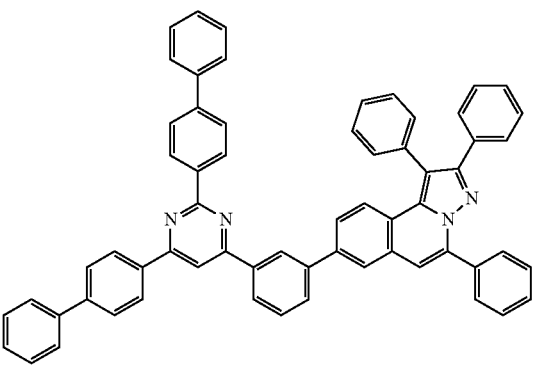
207
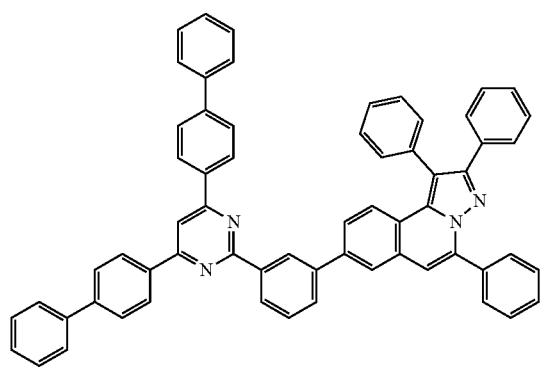
208
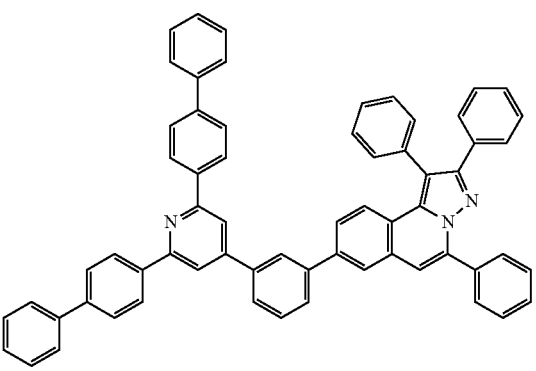
209
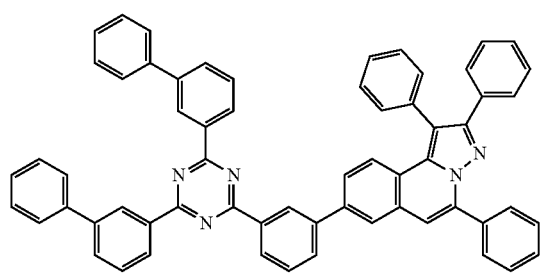
210
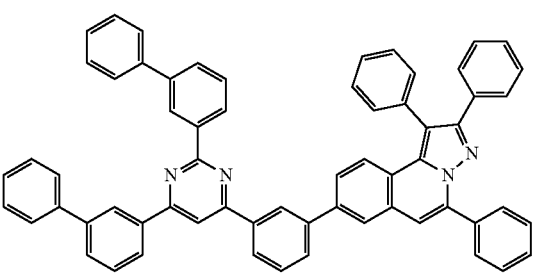
211
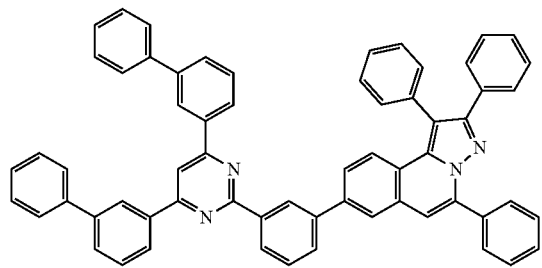
212
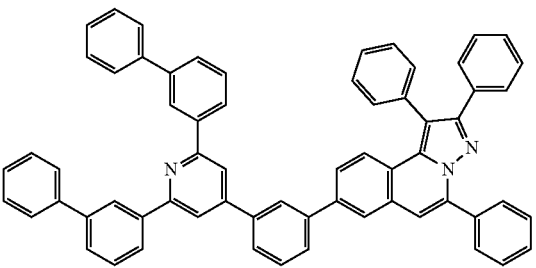

-continued
213
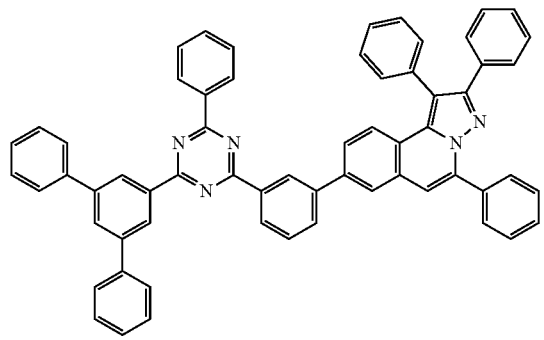
214
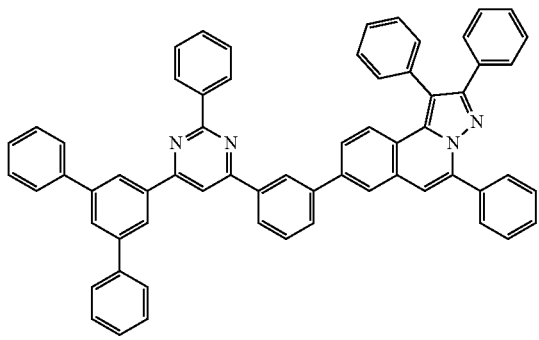
215
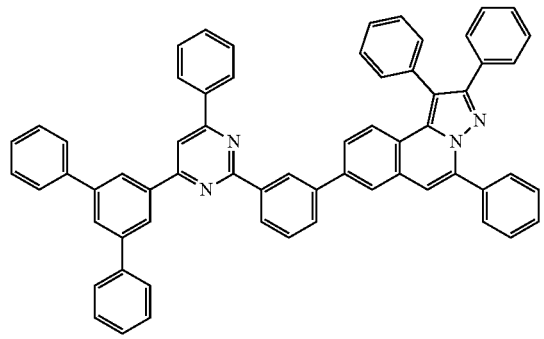
216
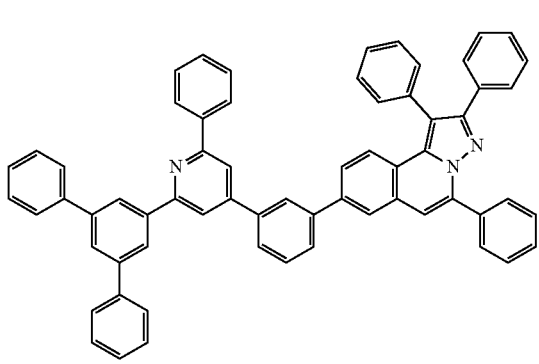
217
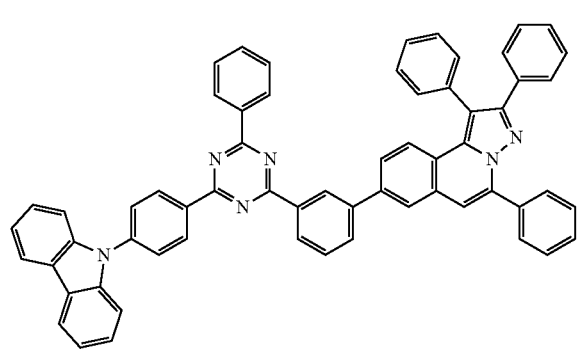
218
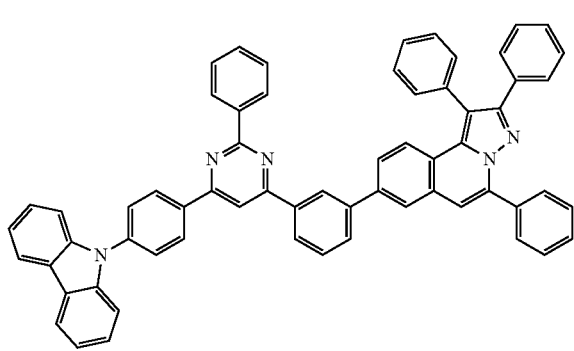
219
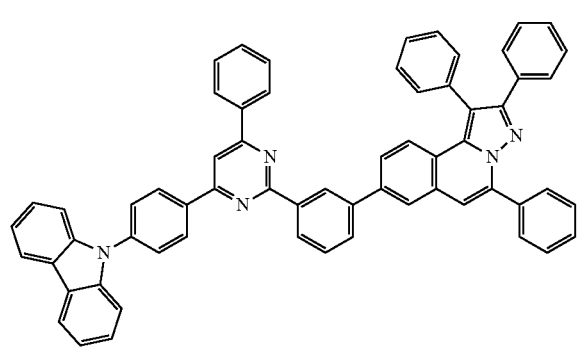
220
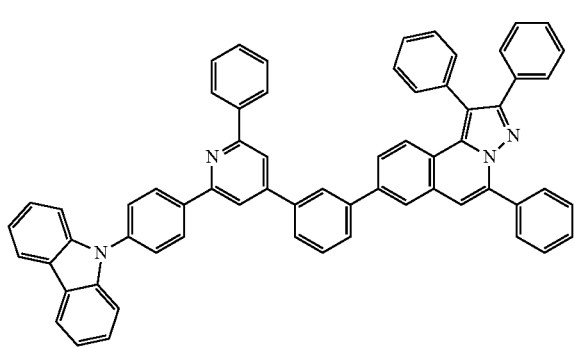

-continued
221
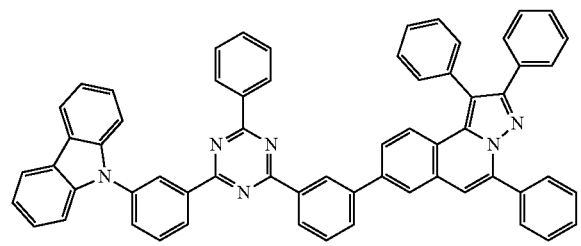
222
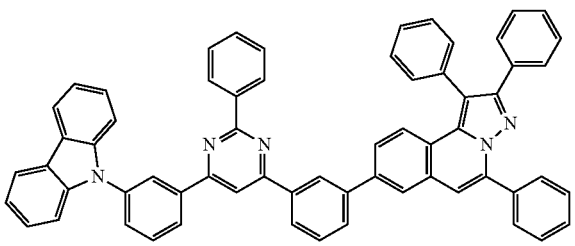
223
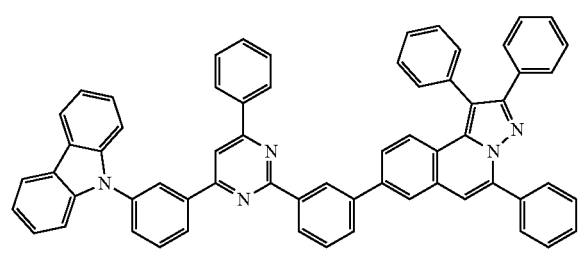
224
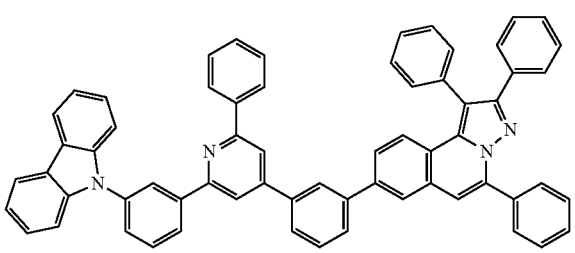
225
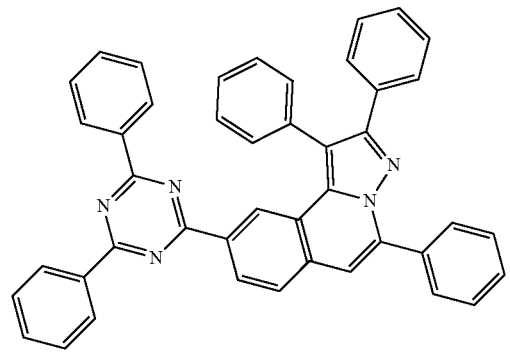
226
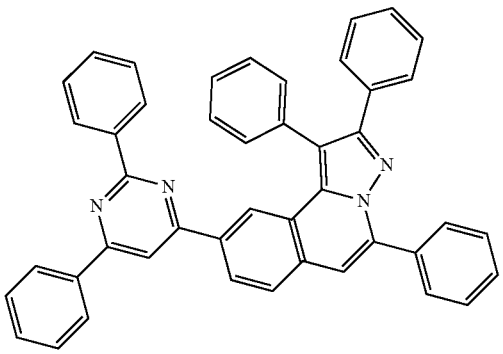
227
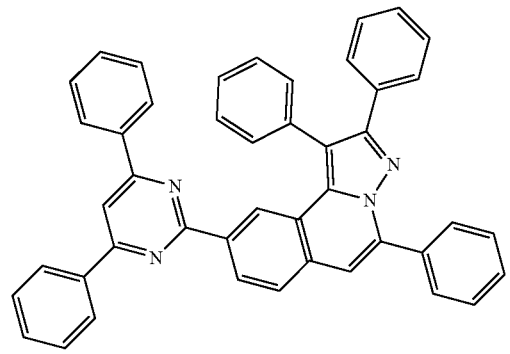
228
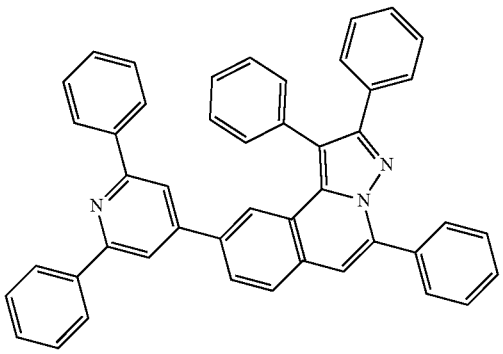
229
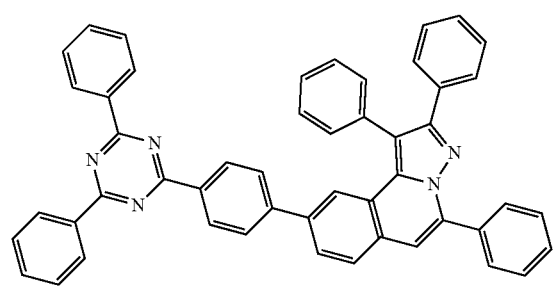
230
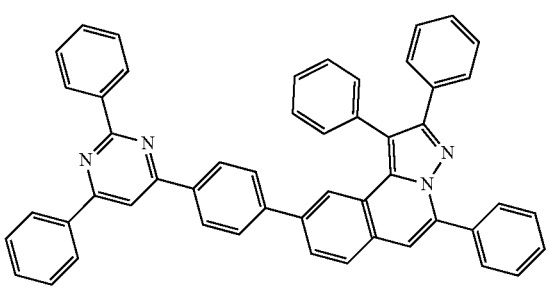

-continued
231
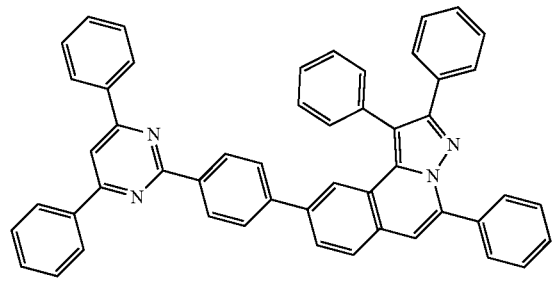
232
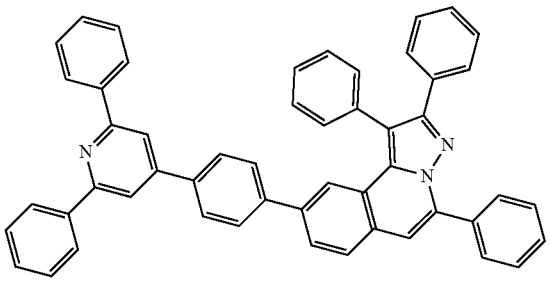
233
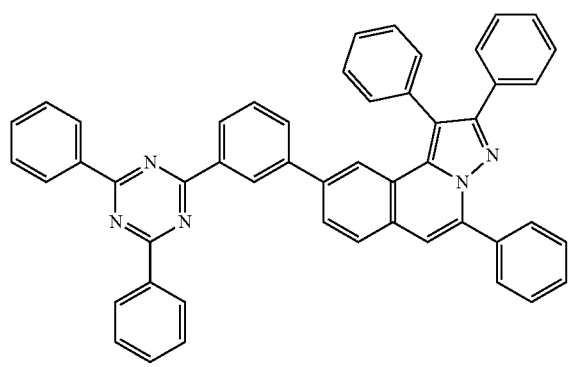
234
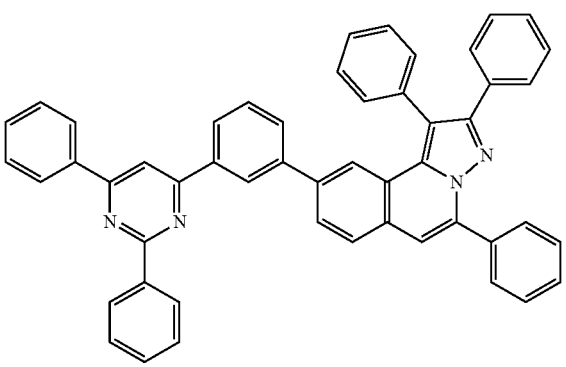
235
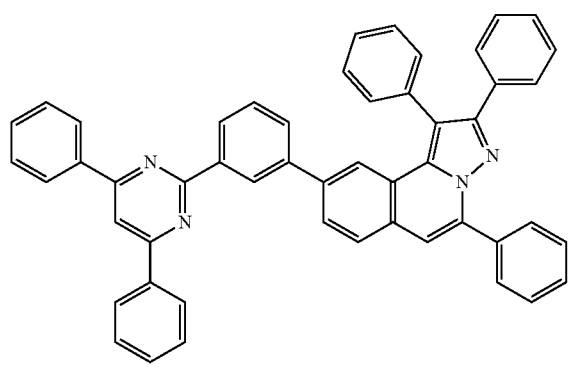
236
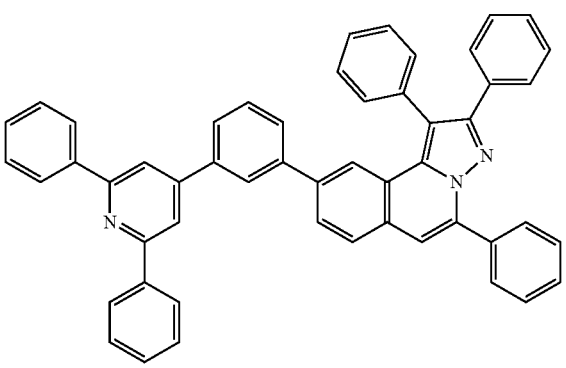
237
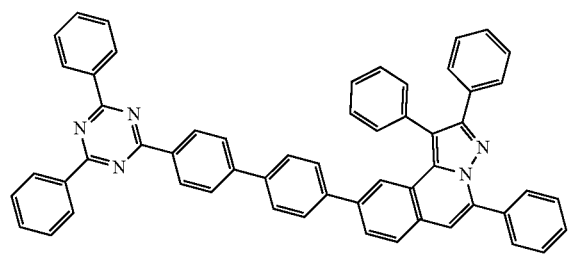
238
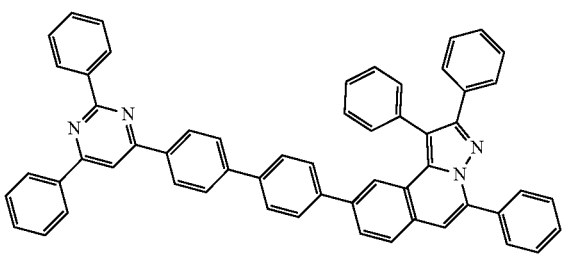

-continued
239
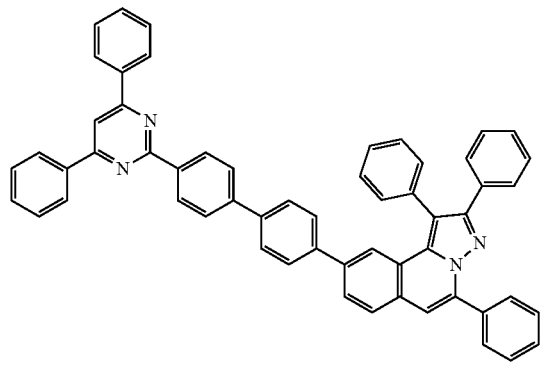
240
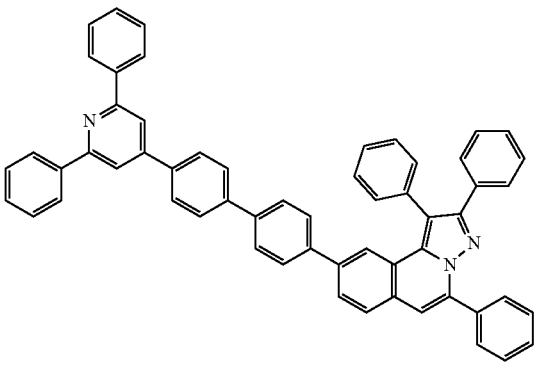
241 242
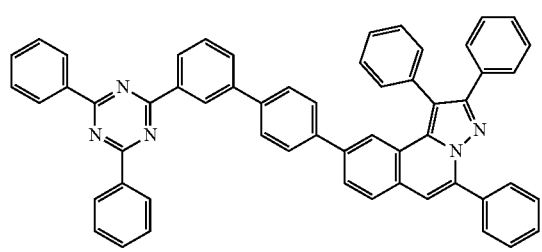
243 244
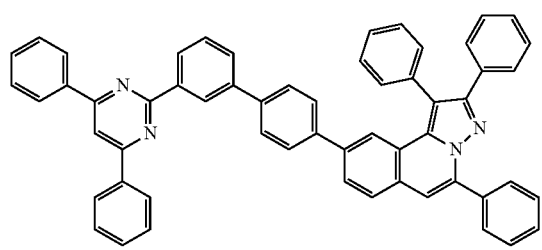
245 246
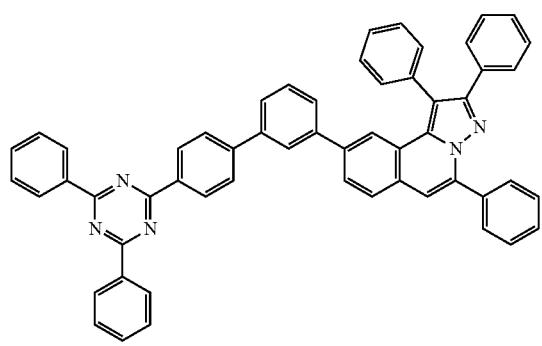
247
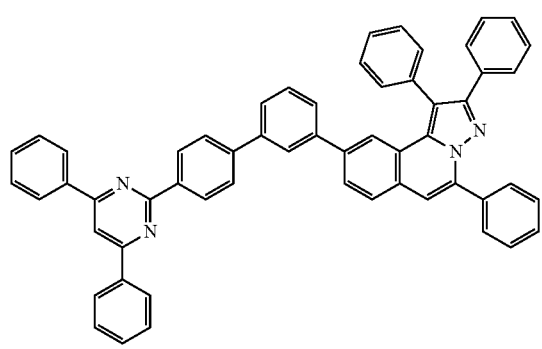
248
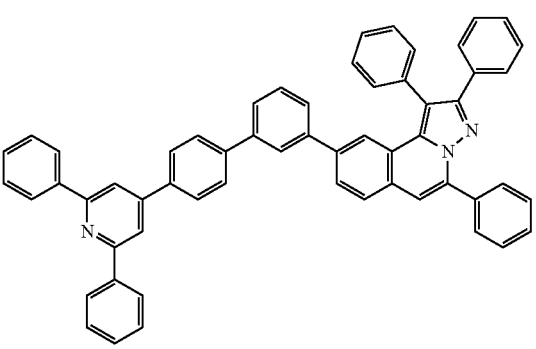

-continued
249
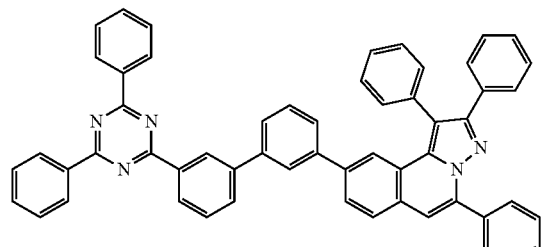
250
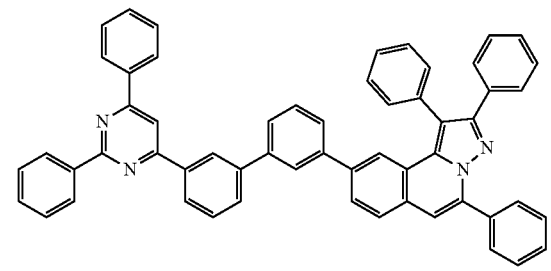
251
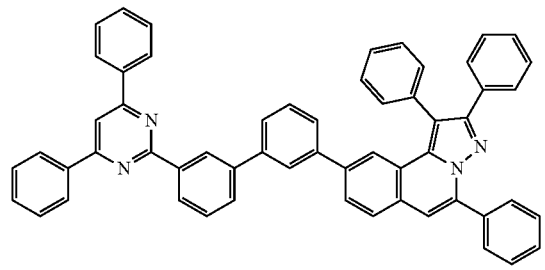
252
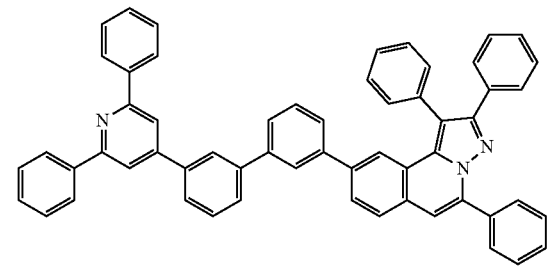
253
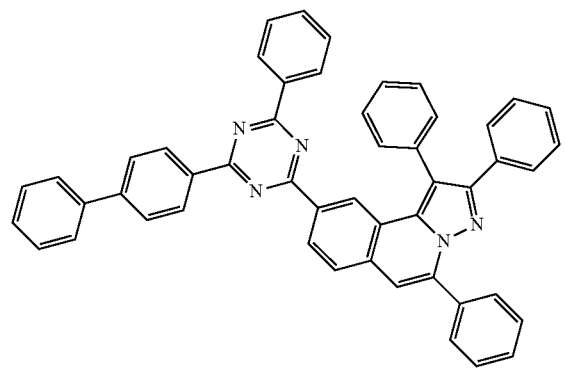
254
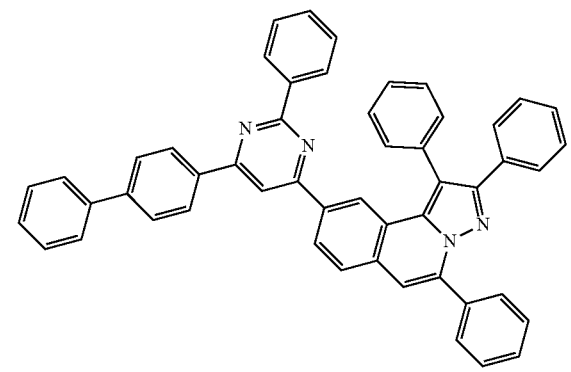
255
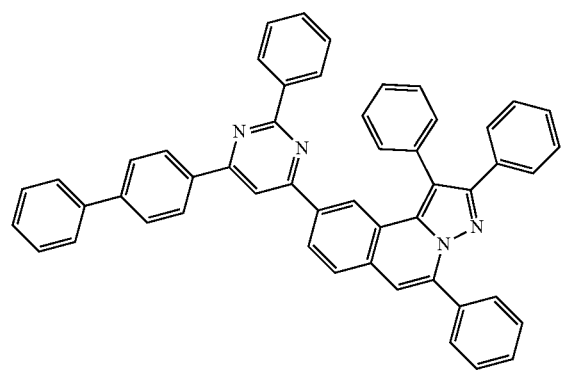
256
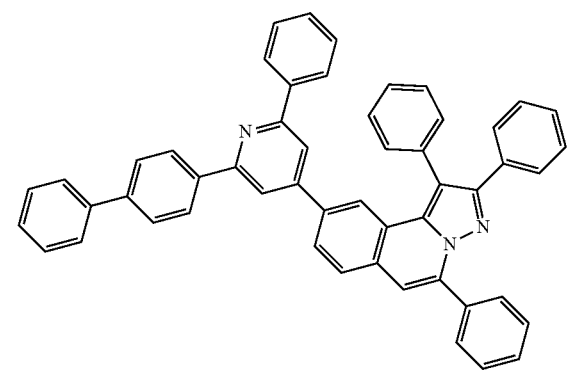

257 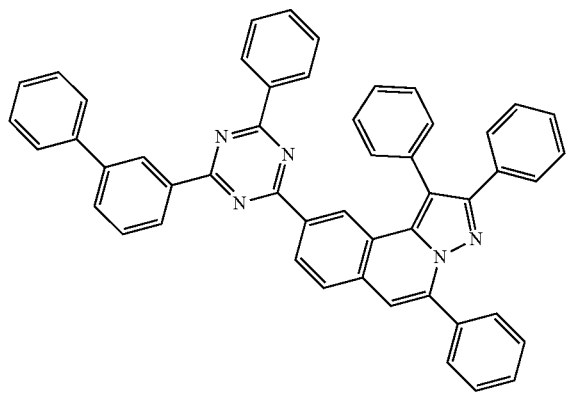
258 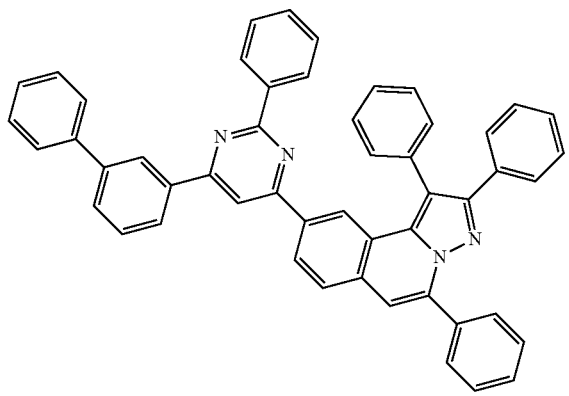
259 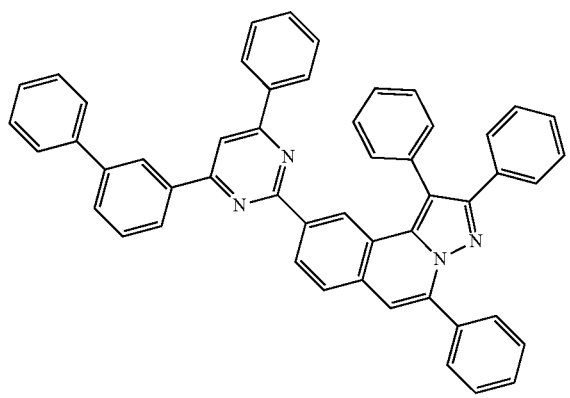
260 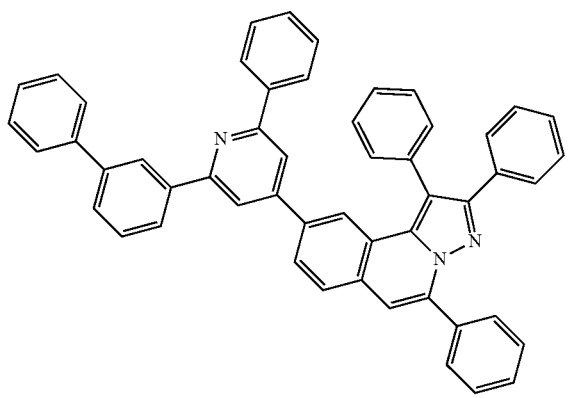
261 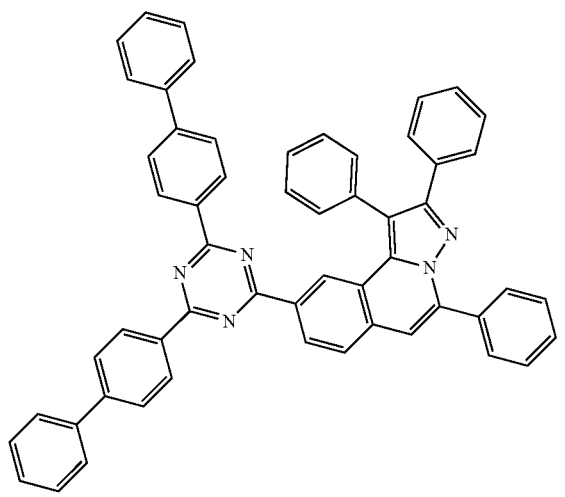
262 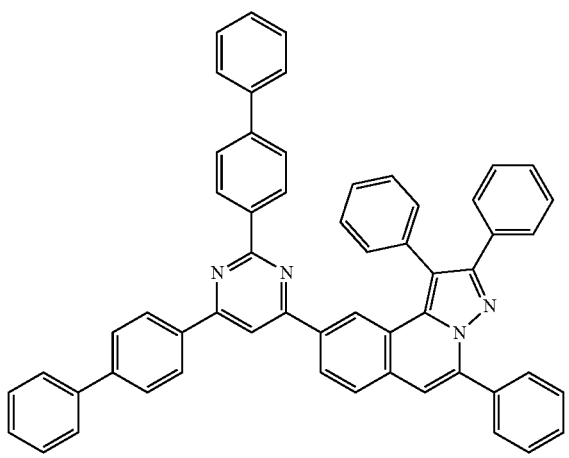

-continued
263
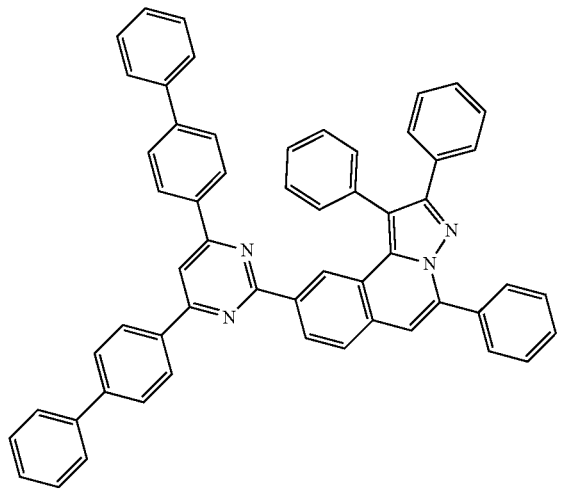
264
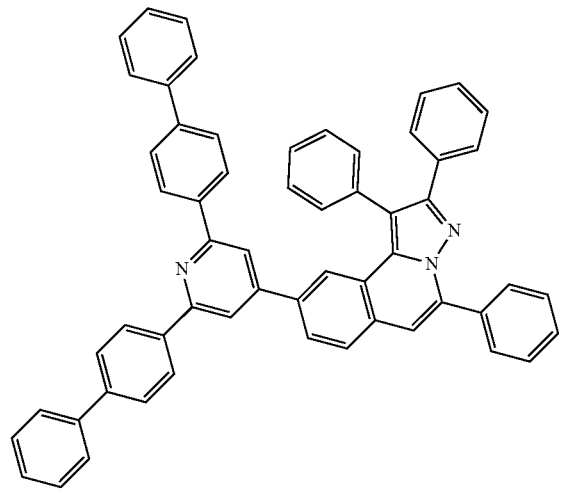
265
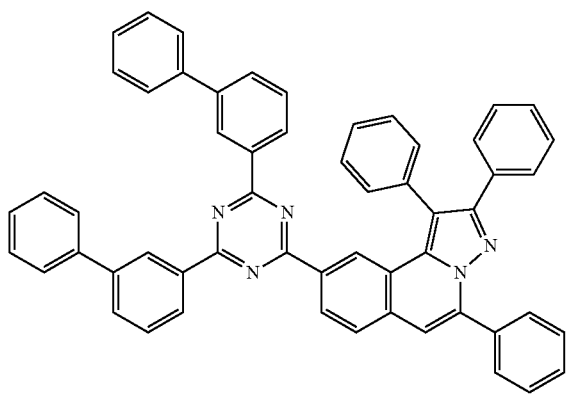
266
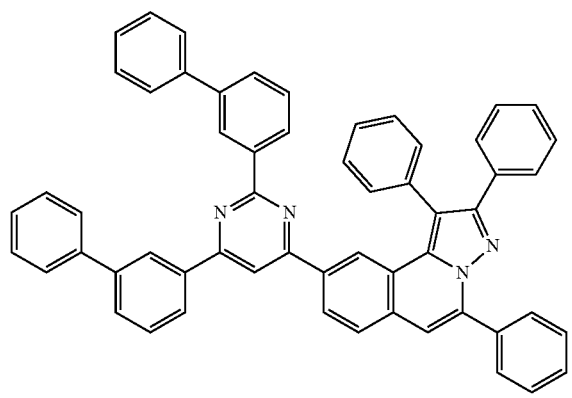
267
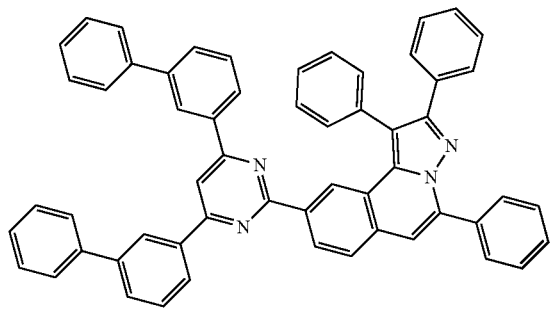
268
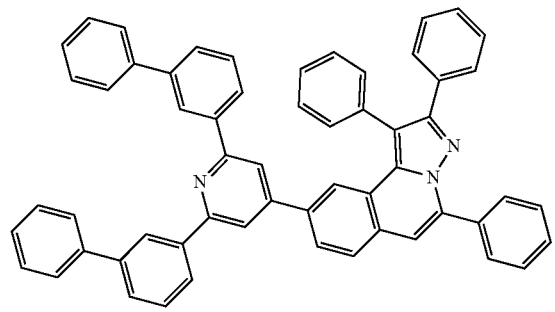
269
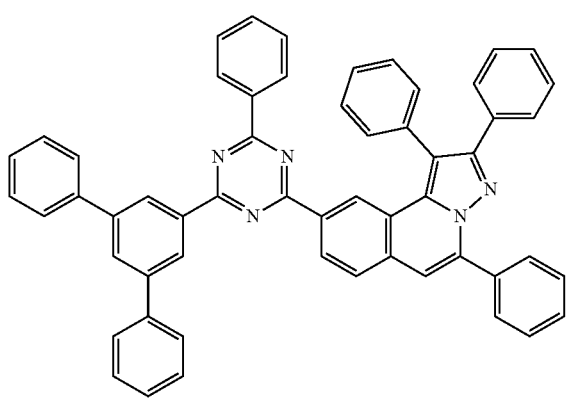
270
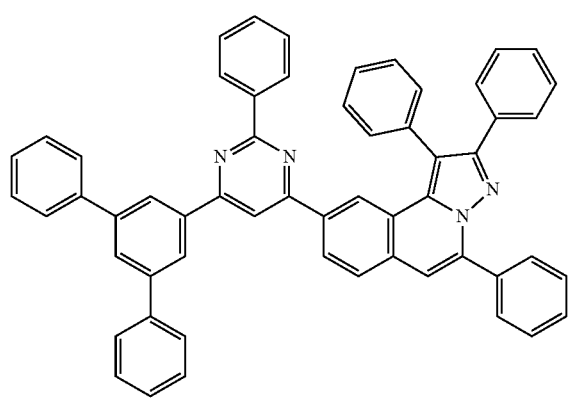

-continued
271
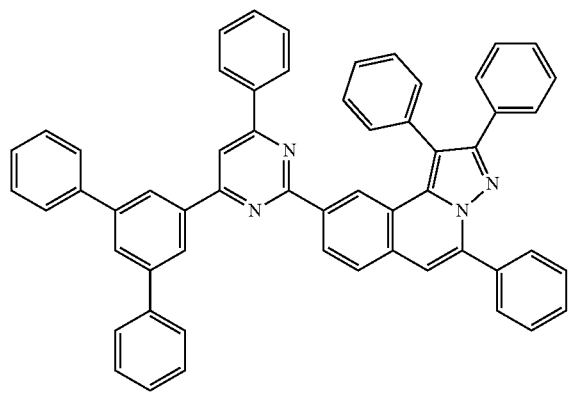
272
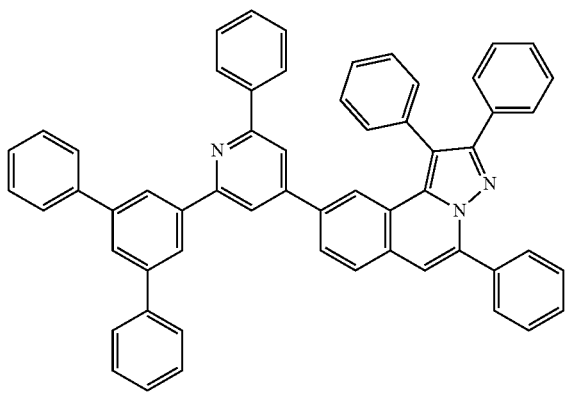
273
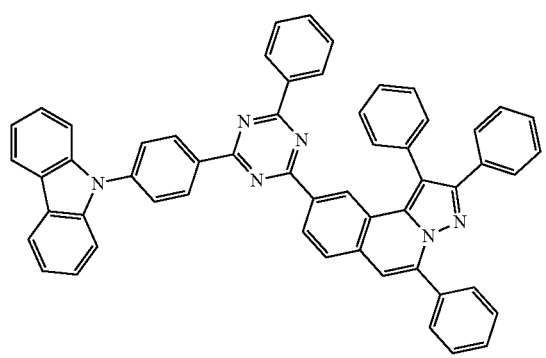
274
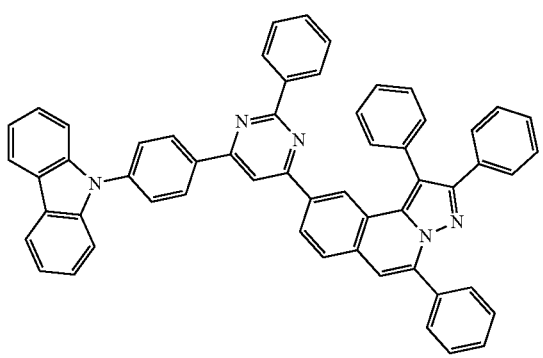
275
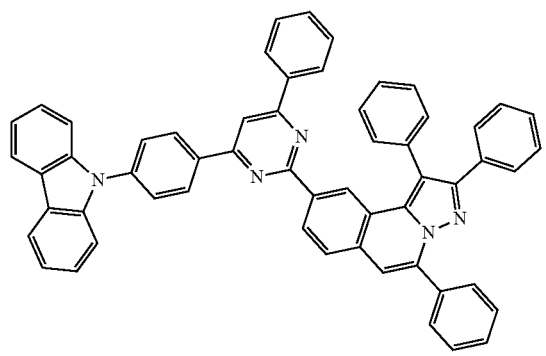
276
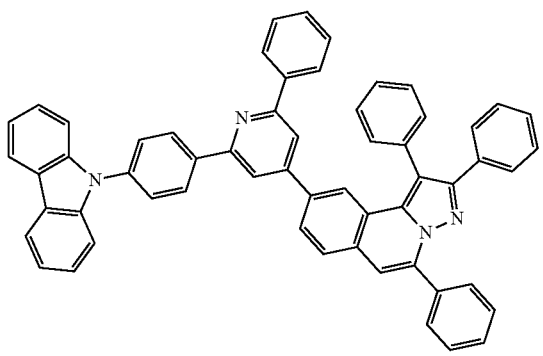
277
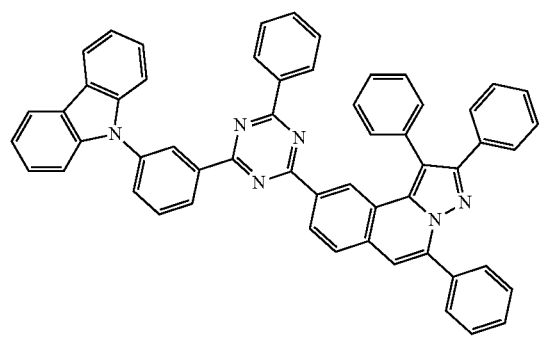
278
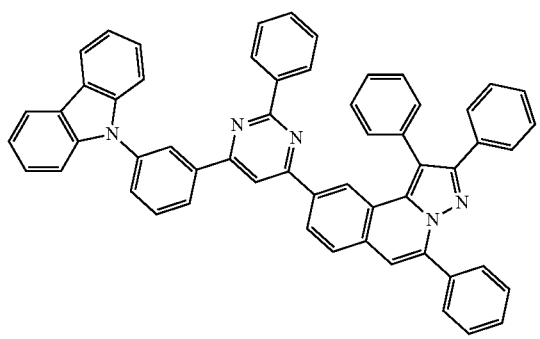

279
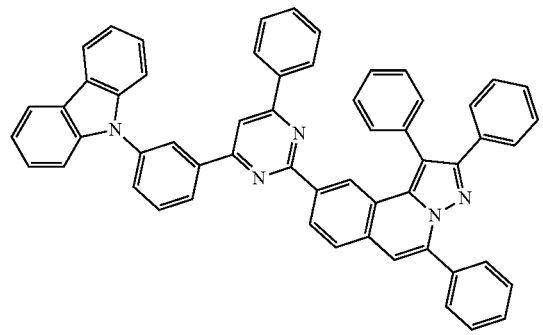
281
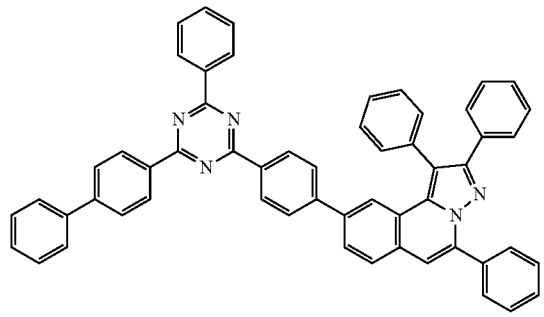
283
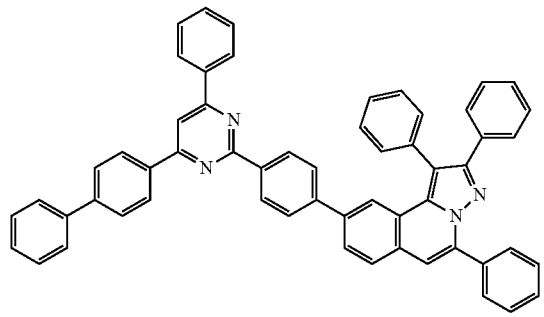
285
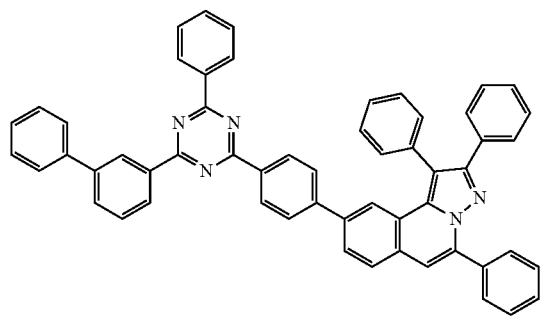
287
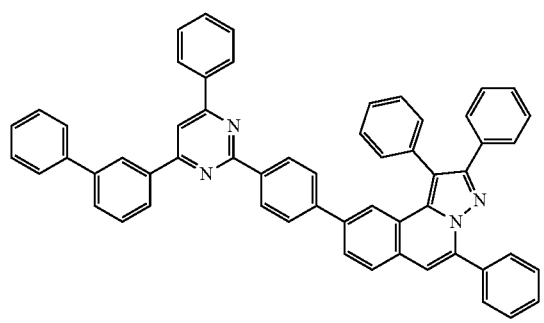
280
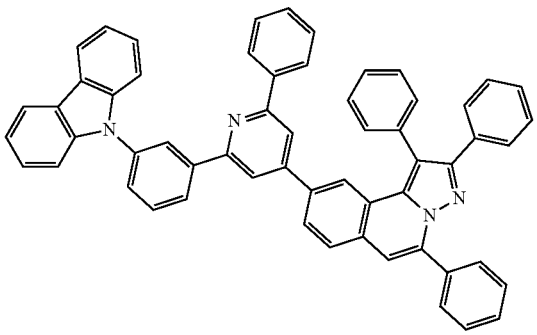
282
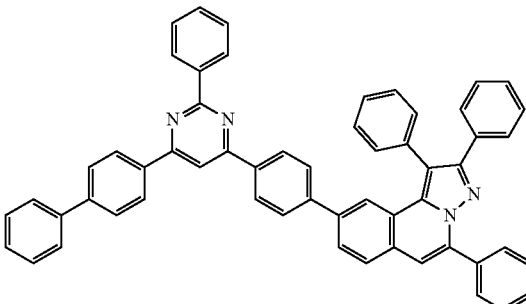
284
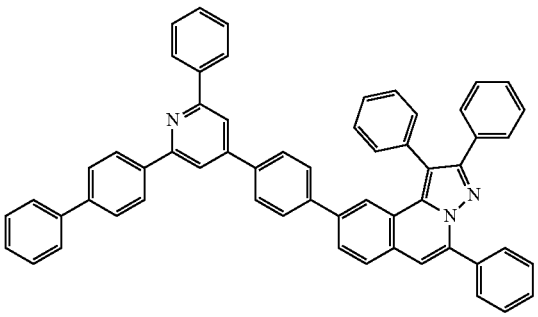
286
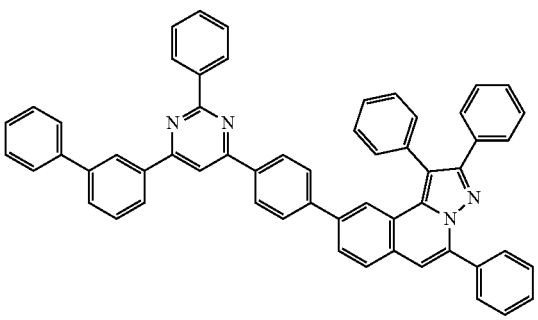
288
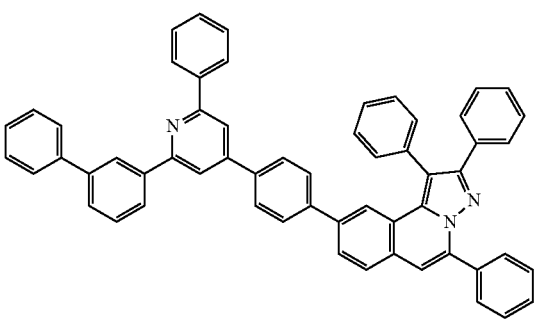

-continued
289
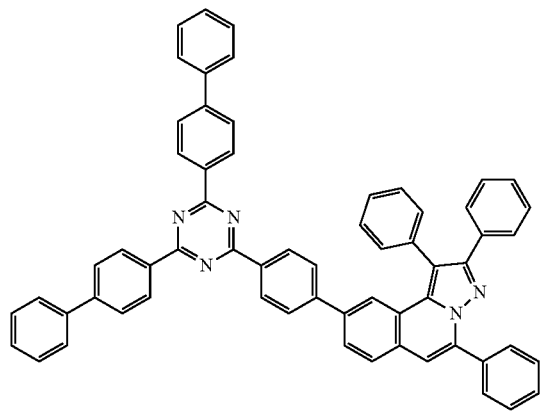
290
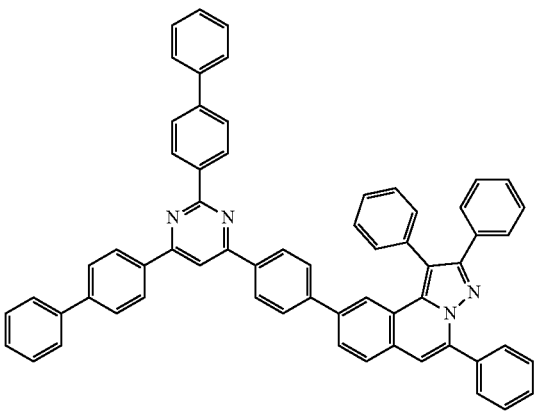
291
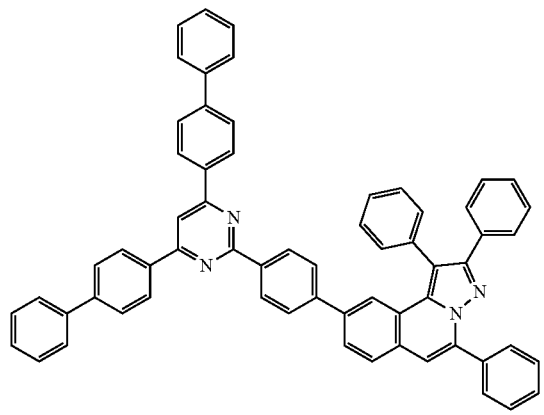
292
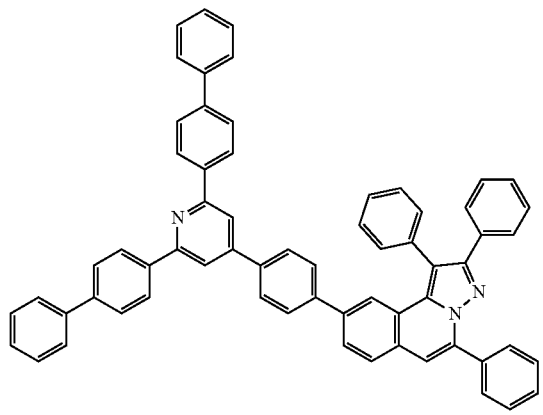
293
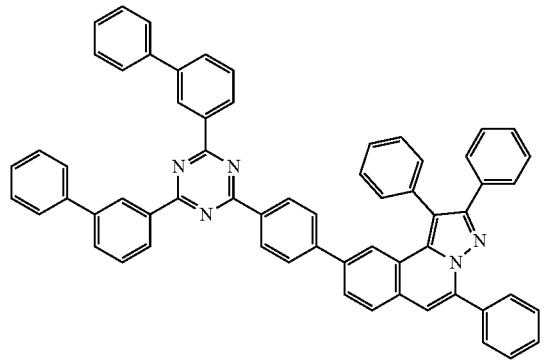
294
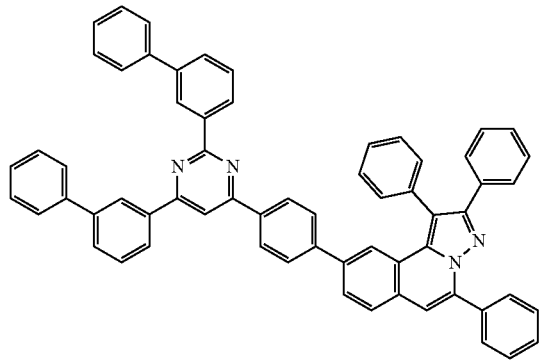
295
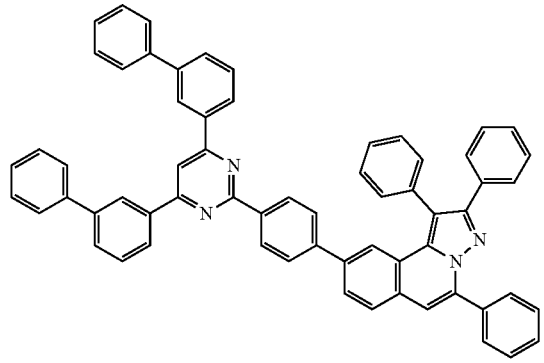
296
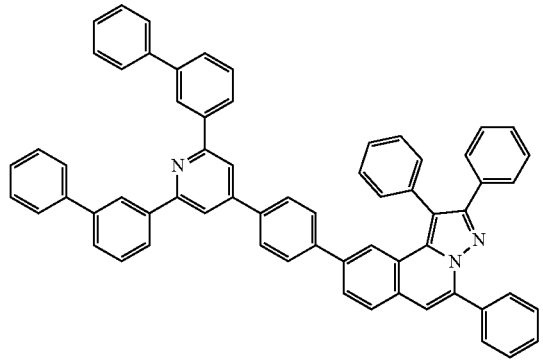

-continued
297
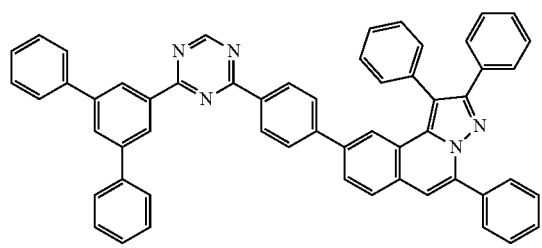
298
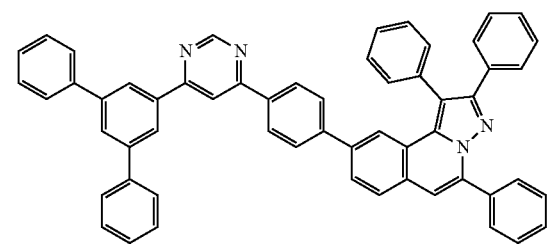
299
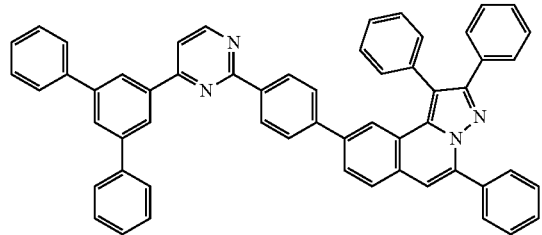
300
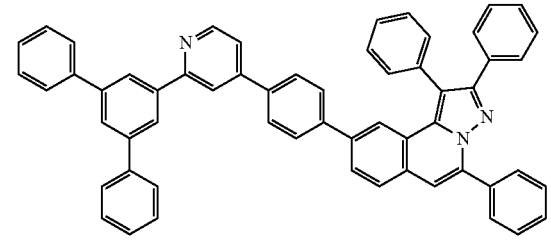
301
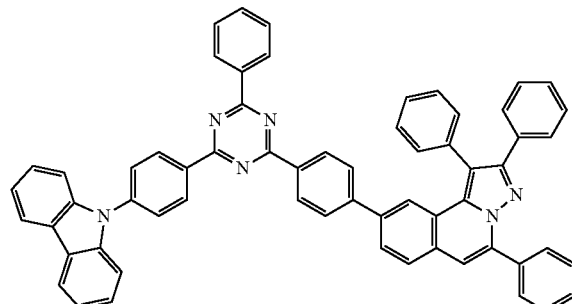
302
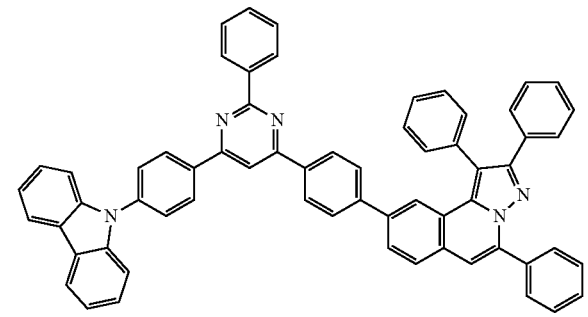
303
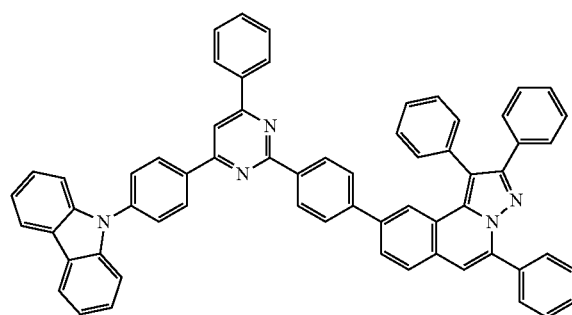
304
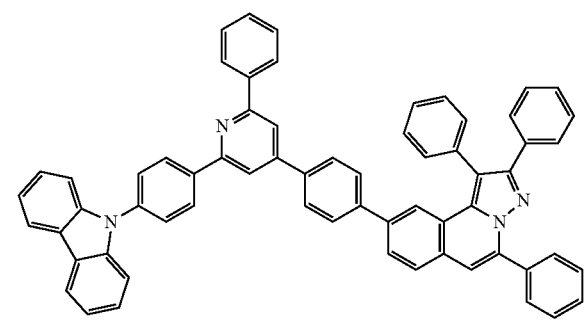
305
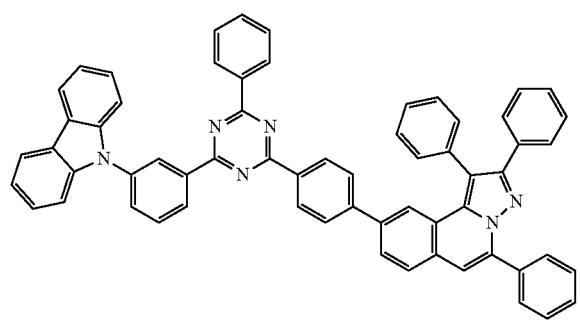
306
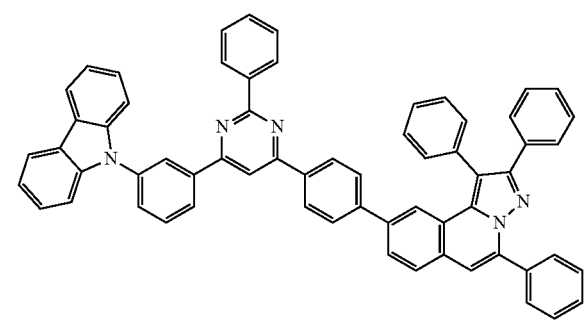

-continued
307
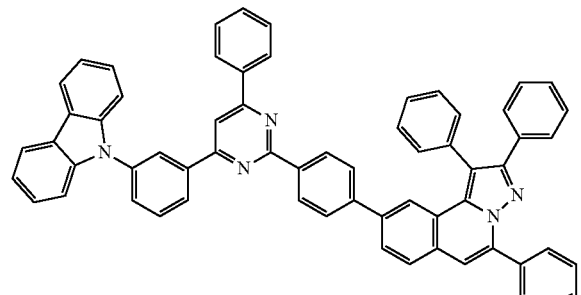
308
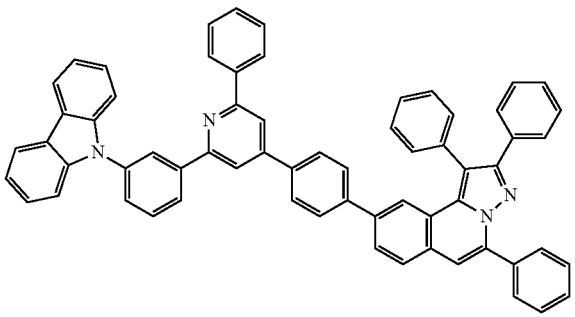
309
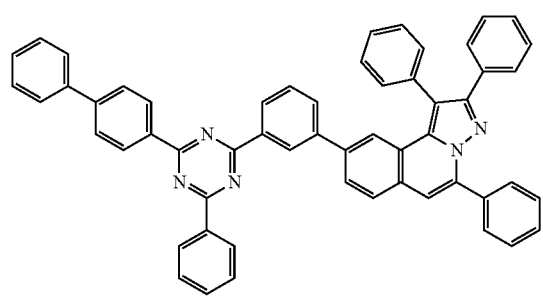
310
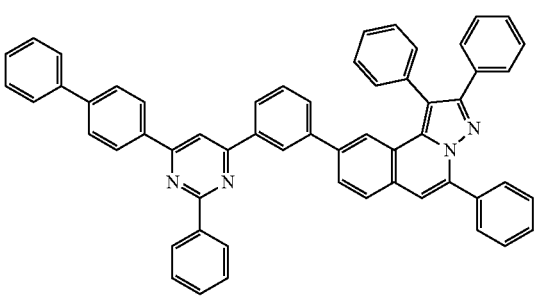
311
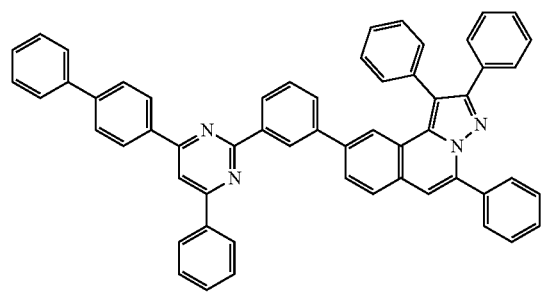
312
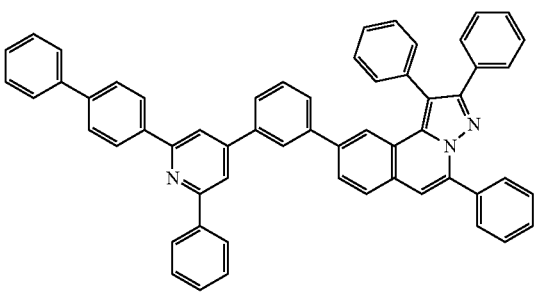
313
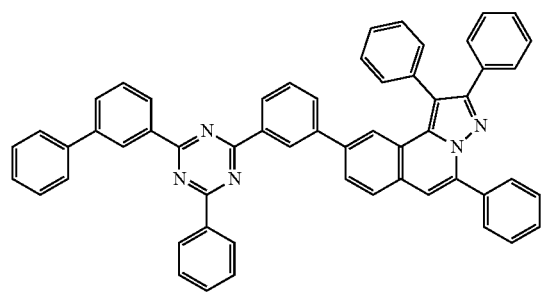
314
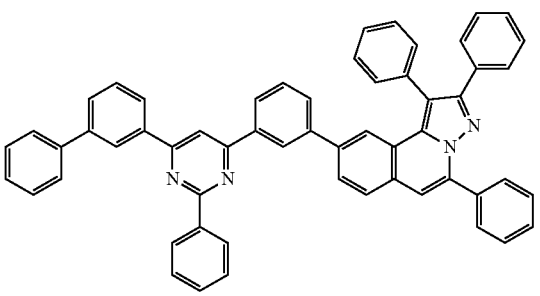
315
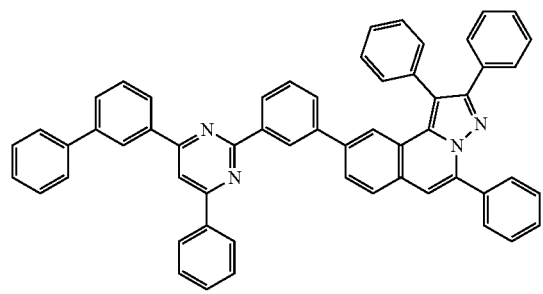
316
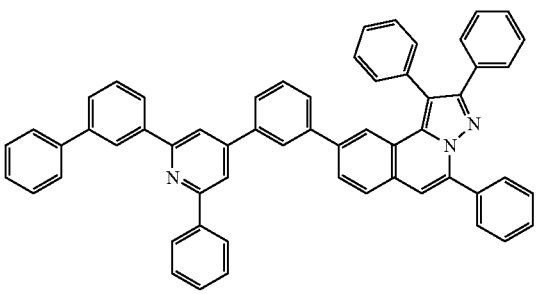

-continued
317
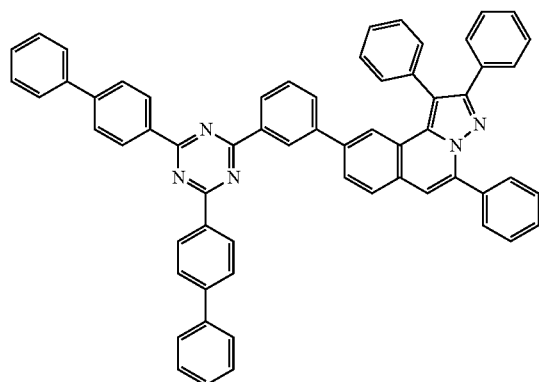
318
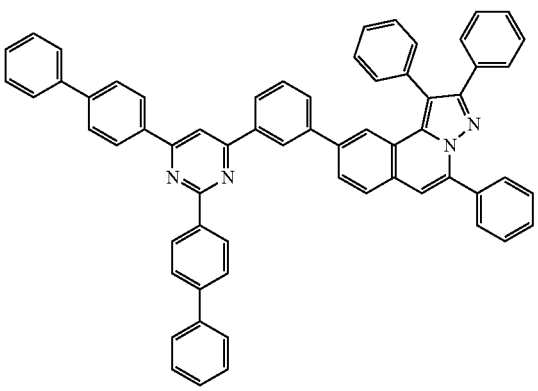
319
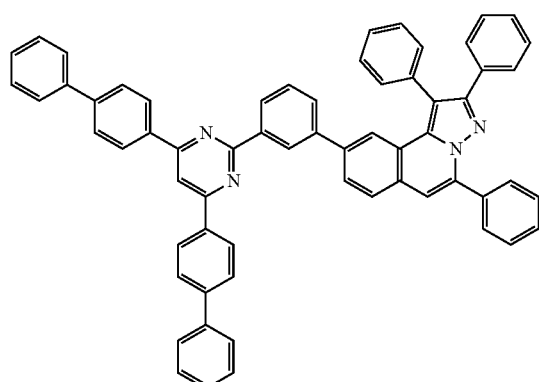
320
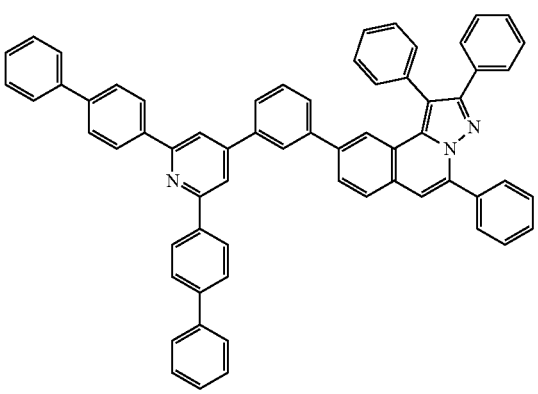
321
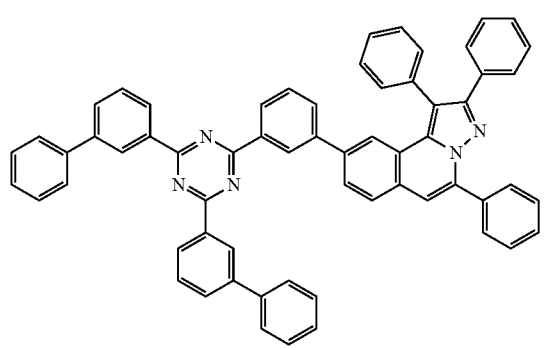
322
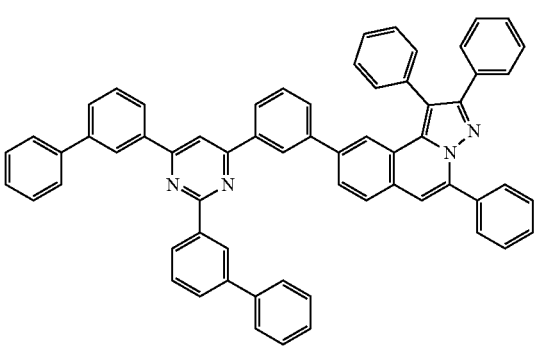
323
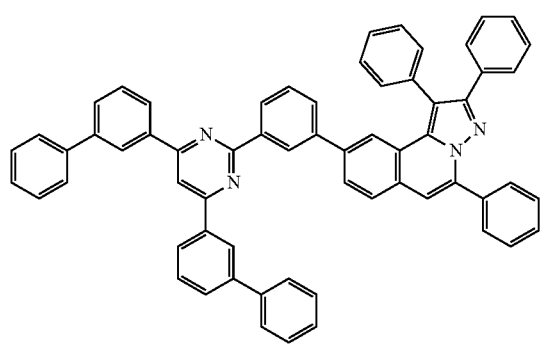
324
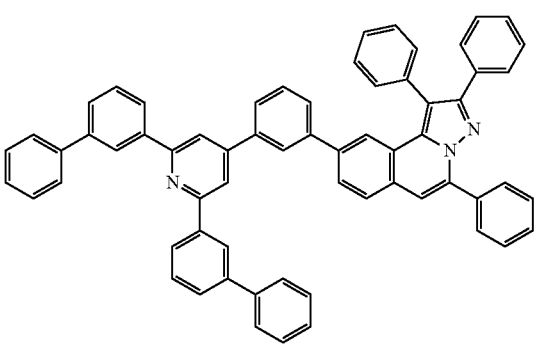

-continued
325
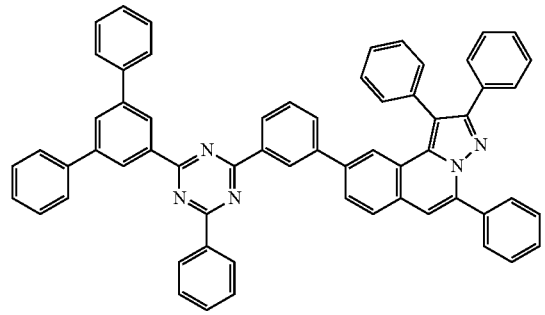
326
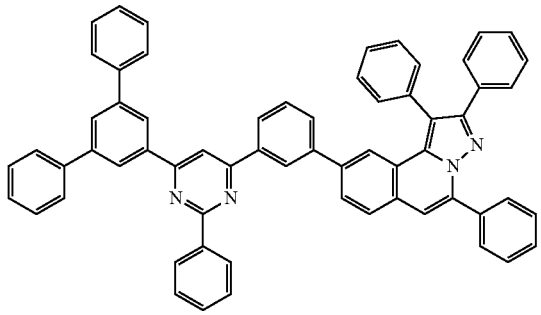
327
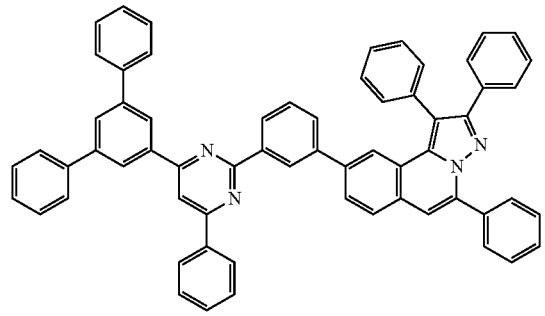
328
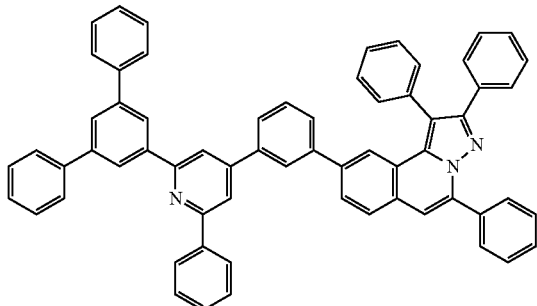
329
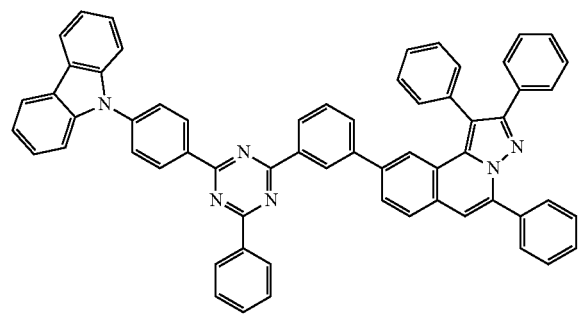
330
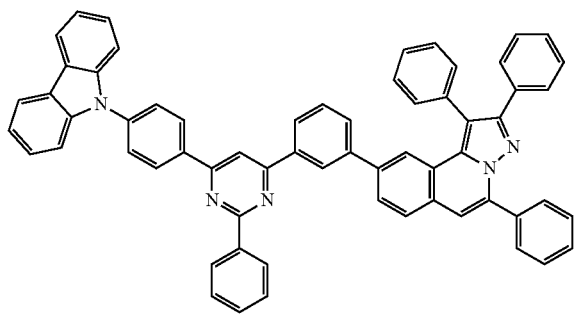
331
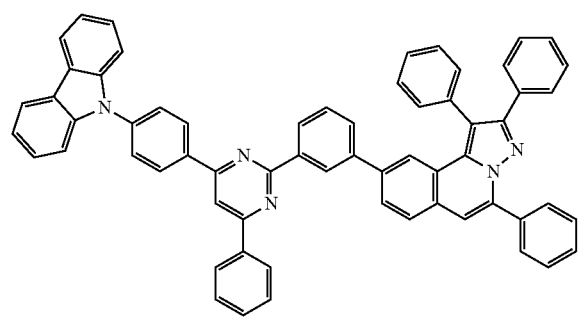
332
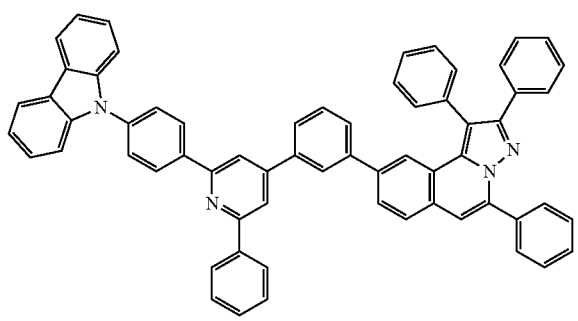
333
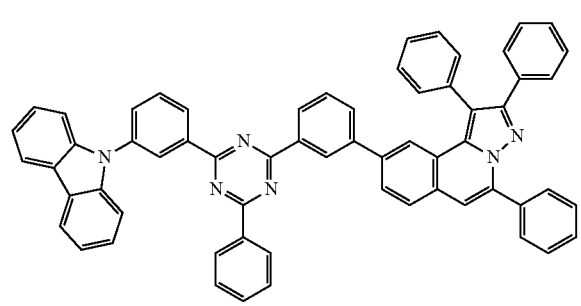
334
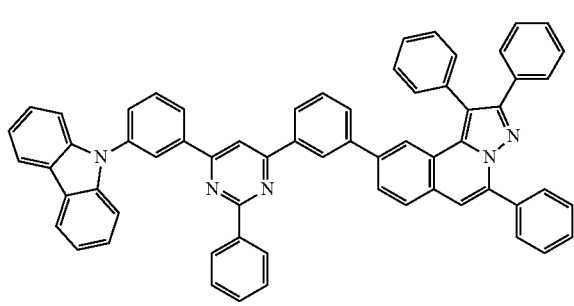

-continued
335
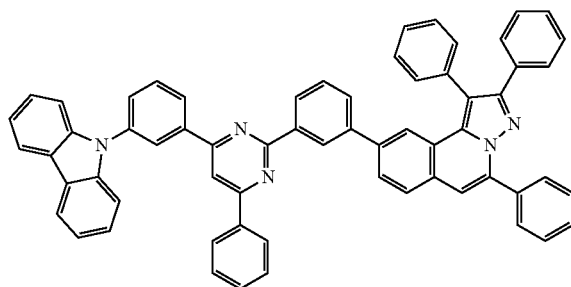
336
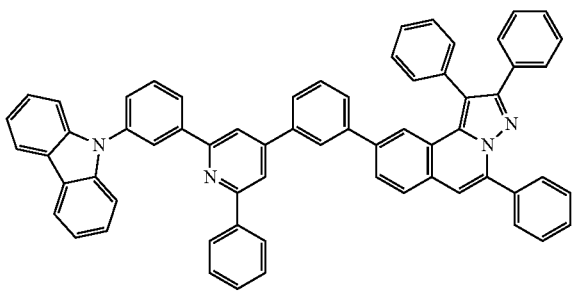
337
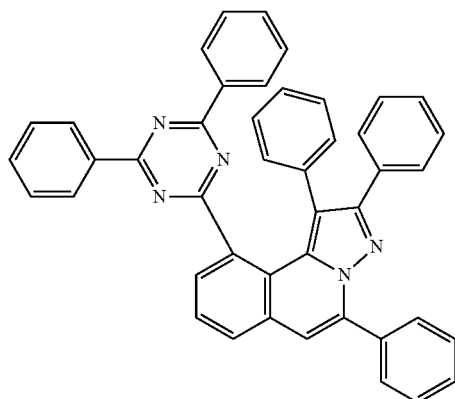
338
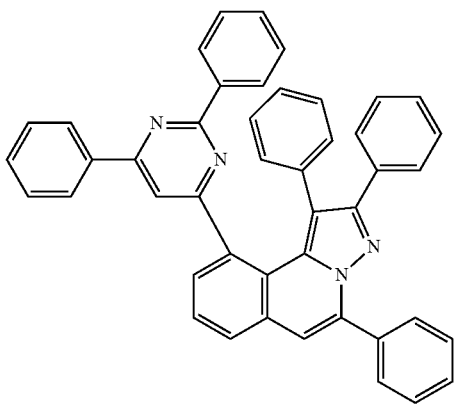
339
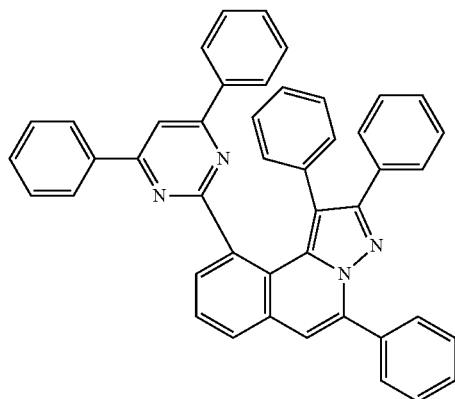
340
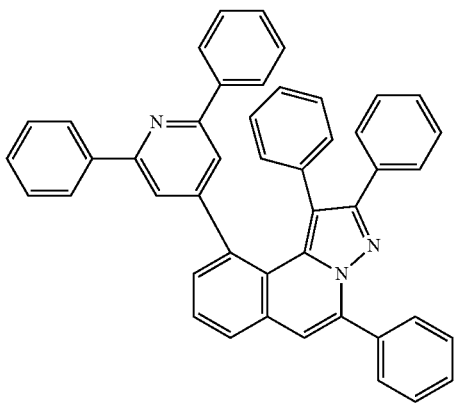
341
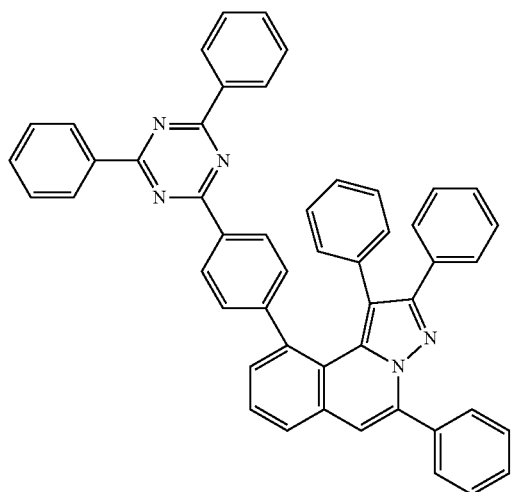
342
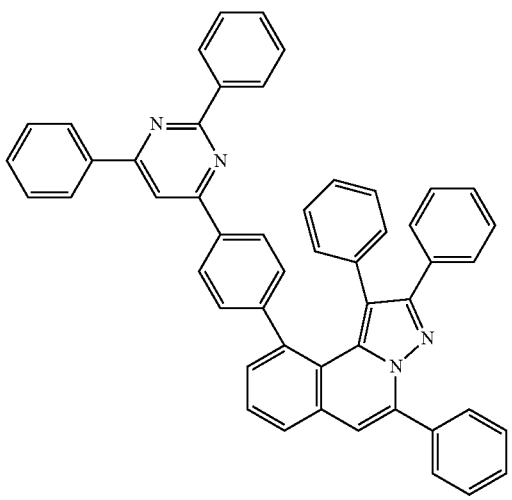

-continued
343
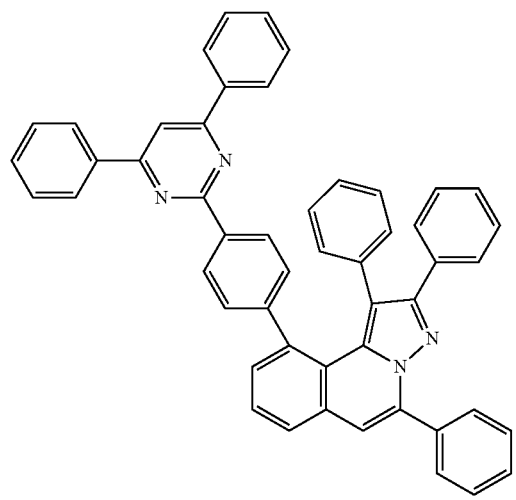
344
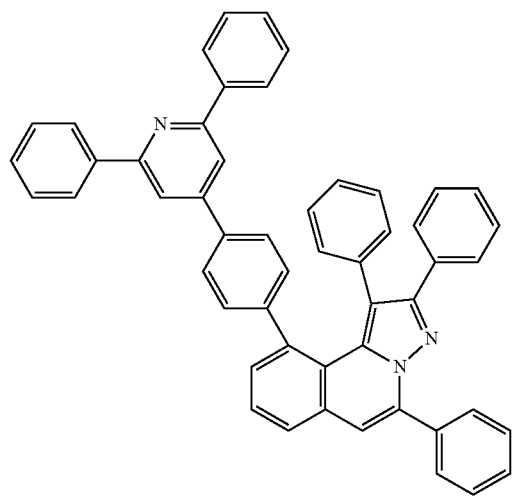
345
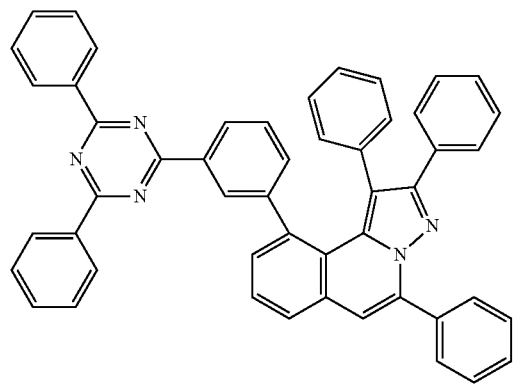
346
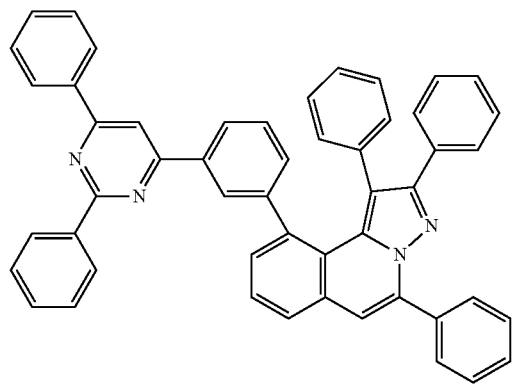
347
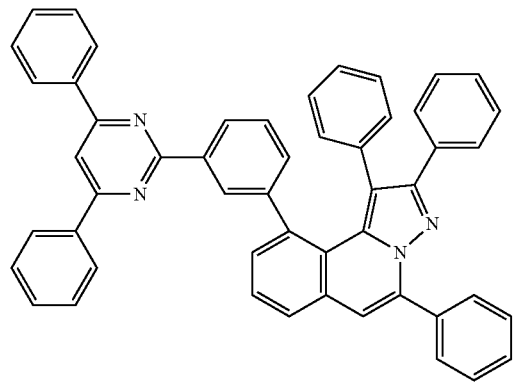
348
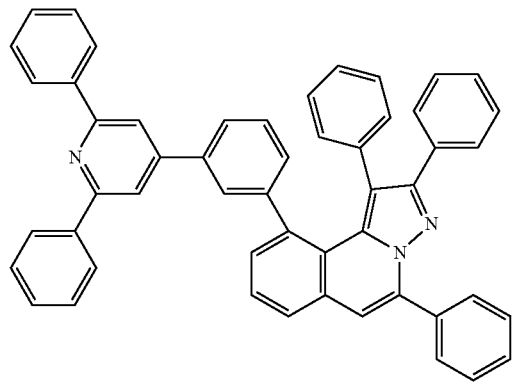

349
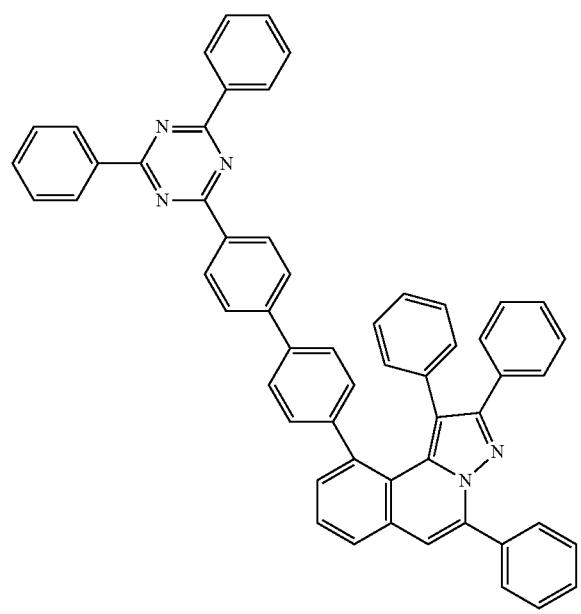
350
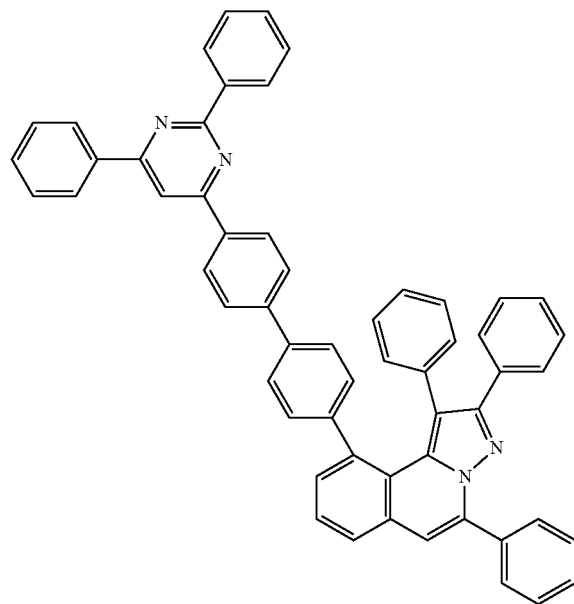
351
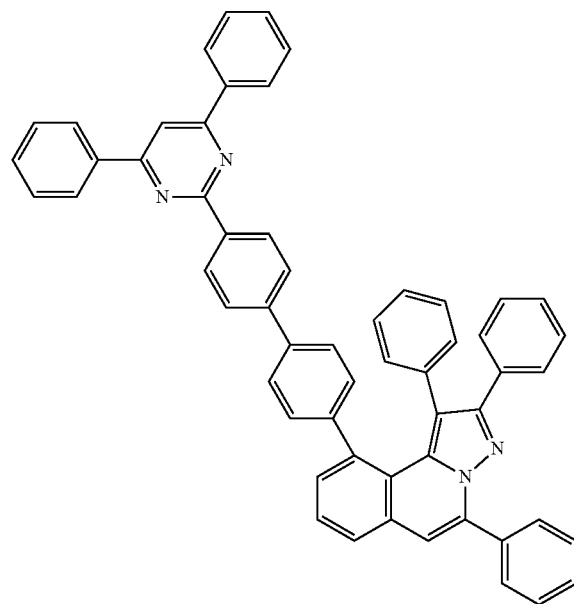
352
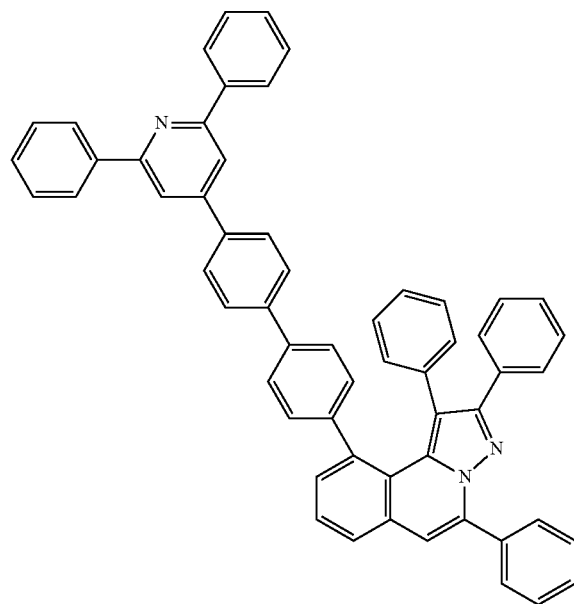

353
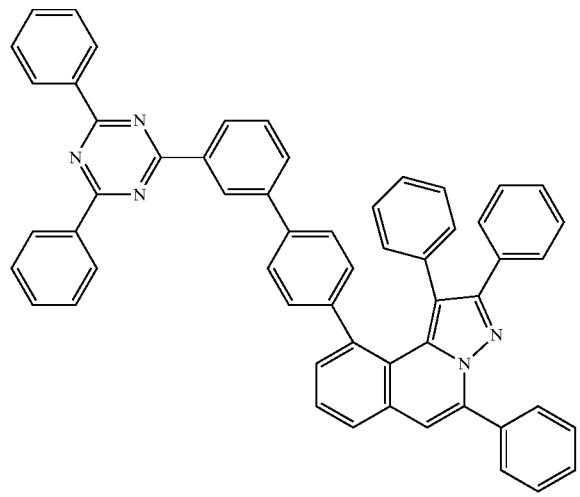
354
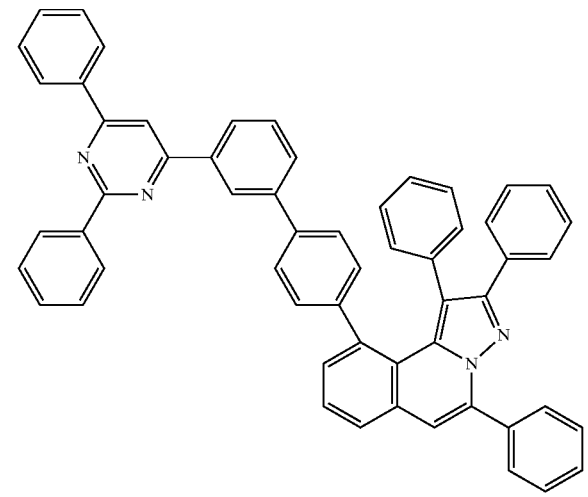
355
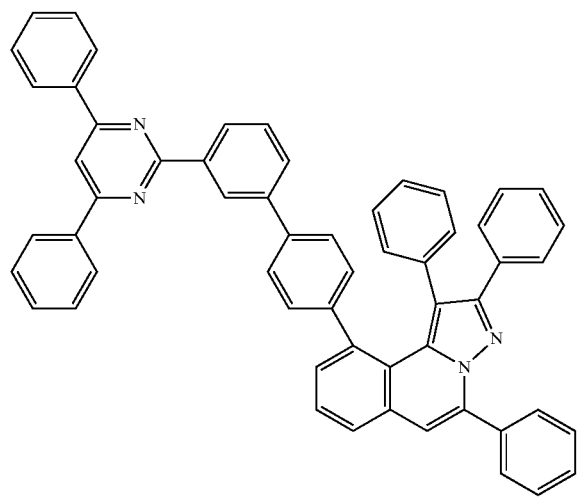
356
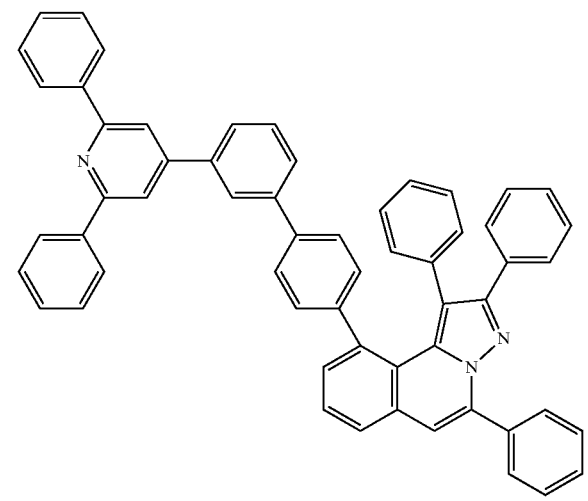
357
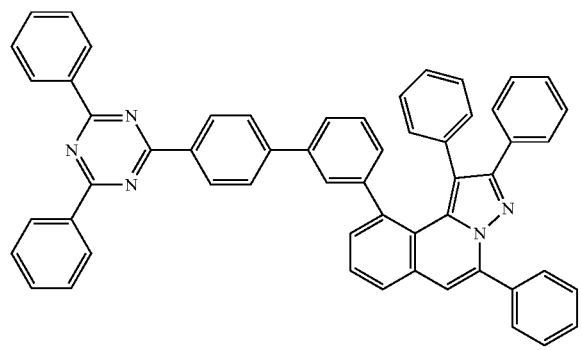
358
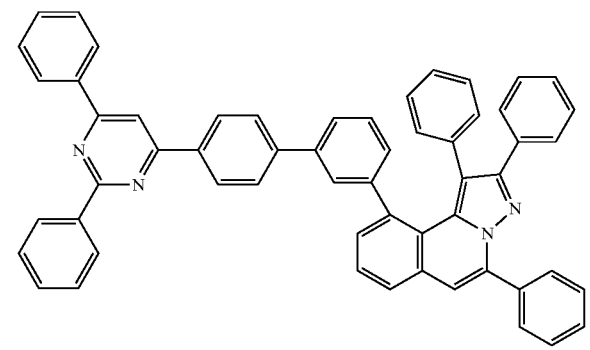

-continued
359
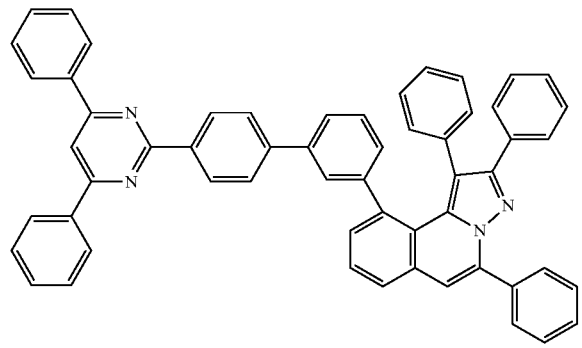
360
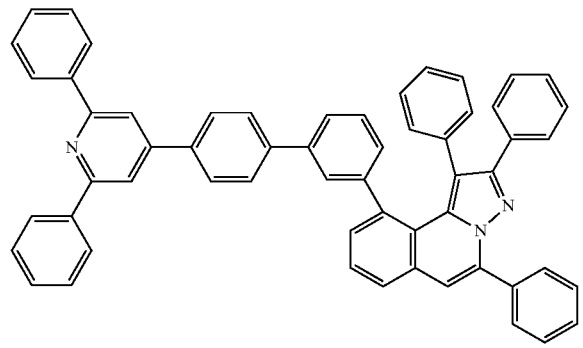
361
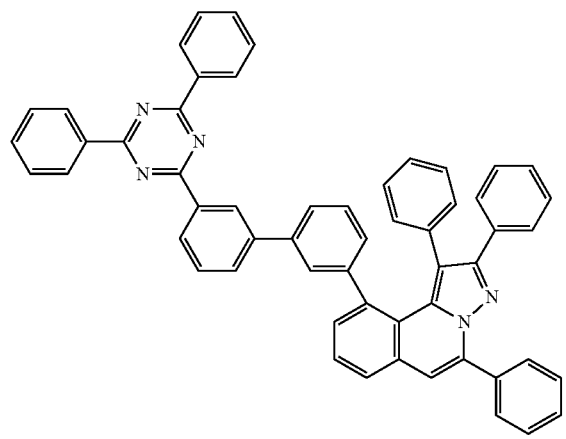
362
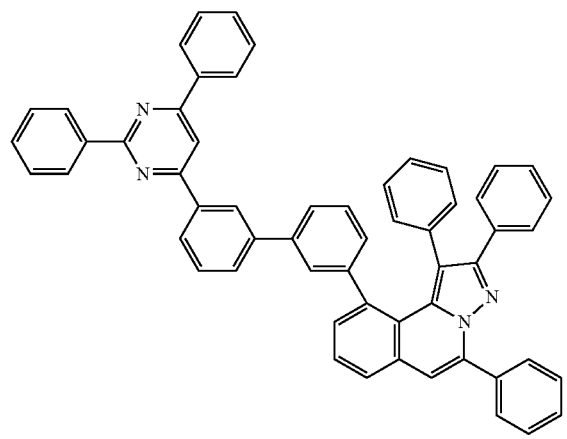
363
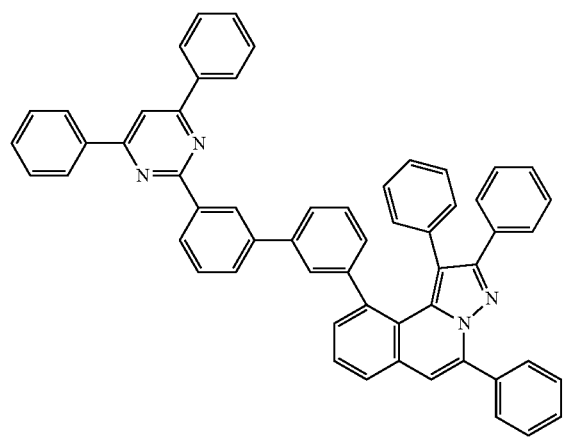
364
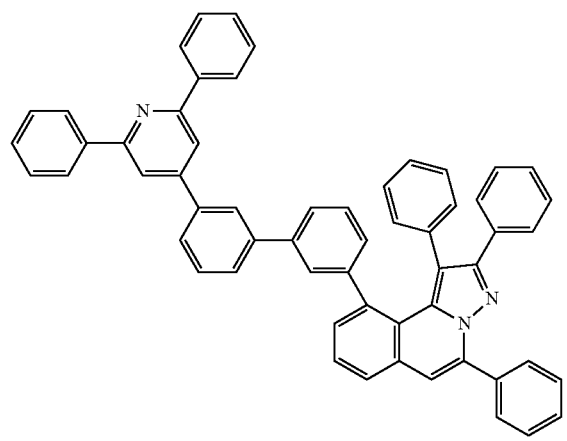

-continued
365
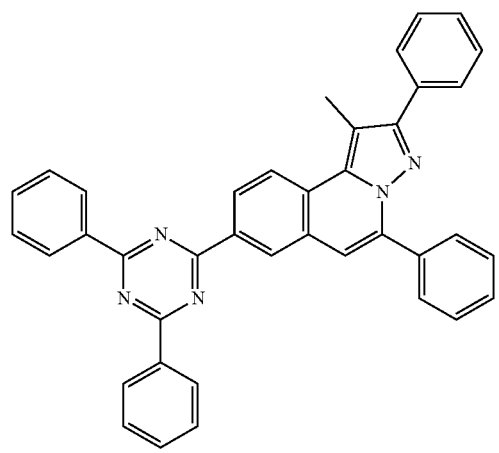
366
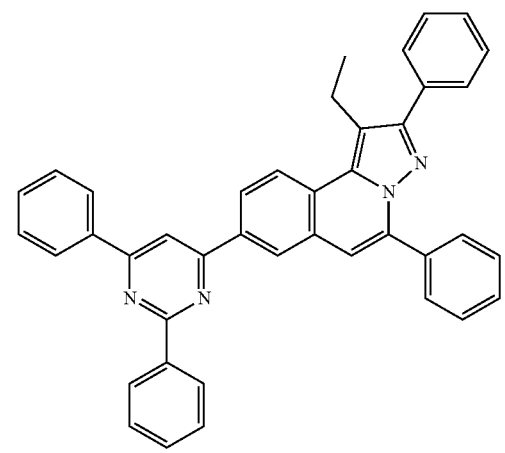
367
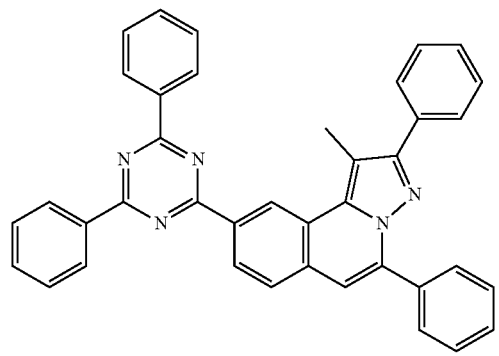
368
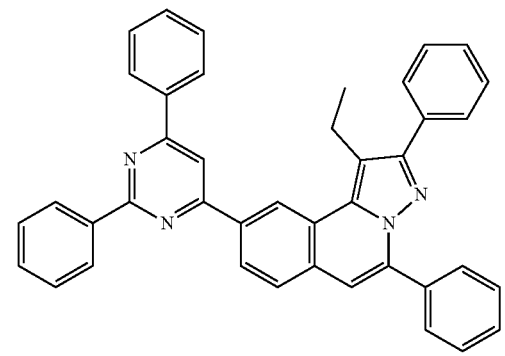
369
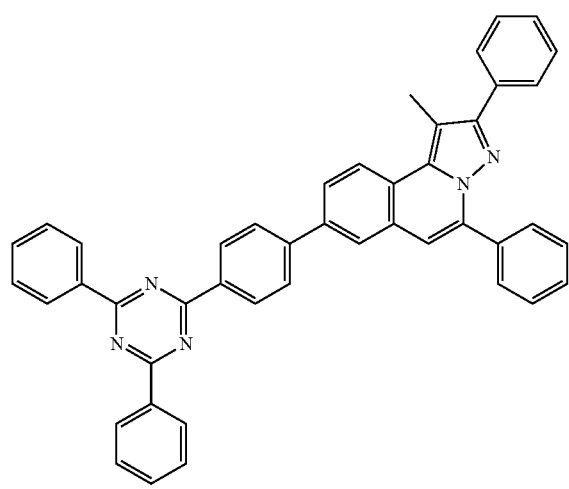
370
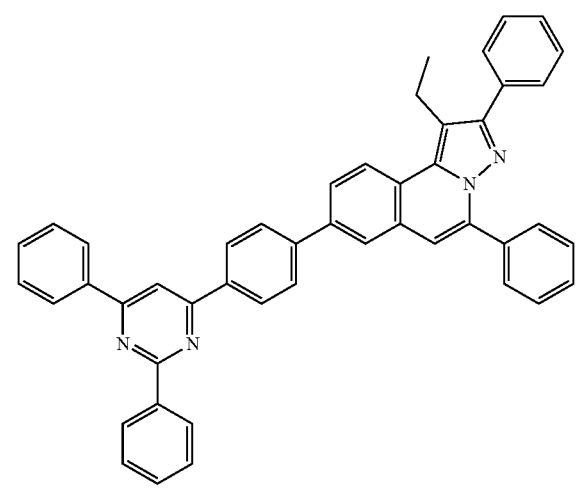

-continued
371
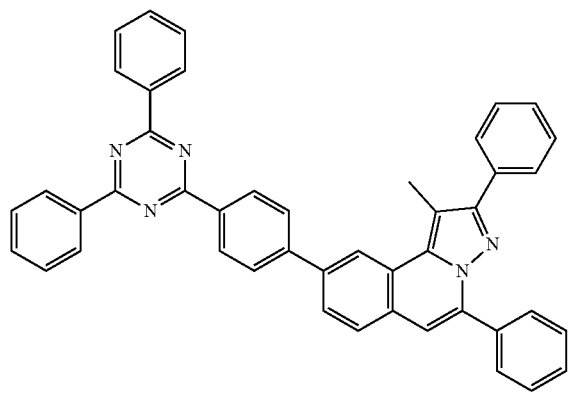
372
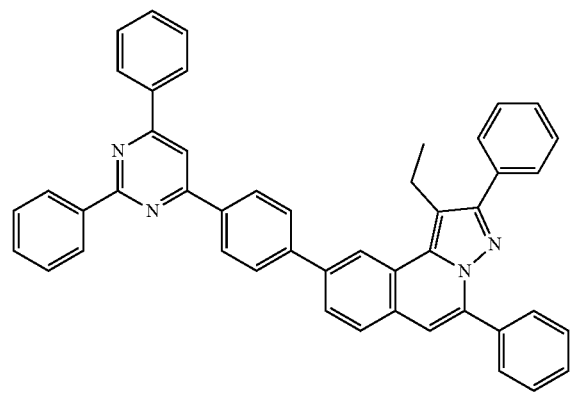
373
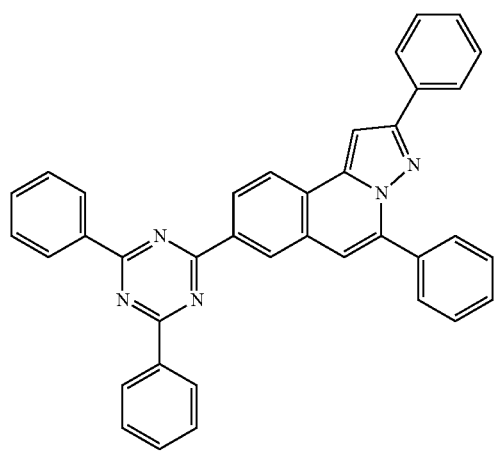
374
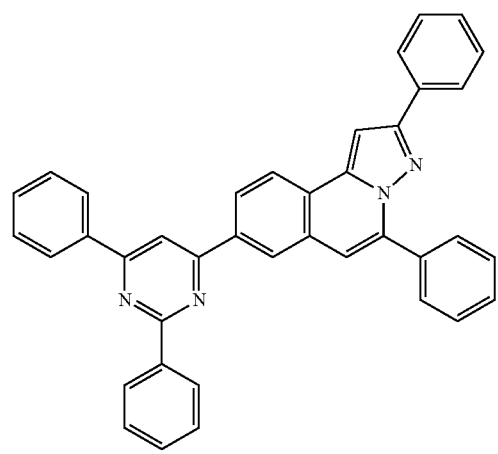
375
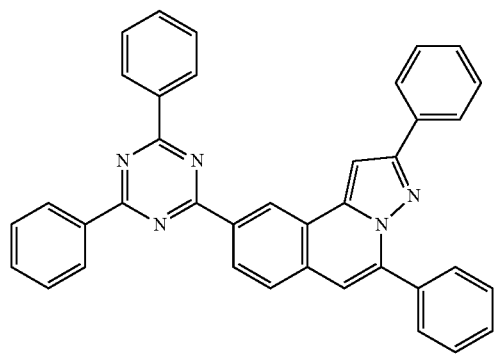
376
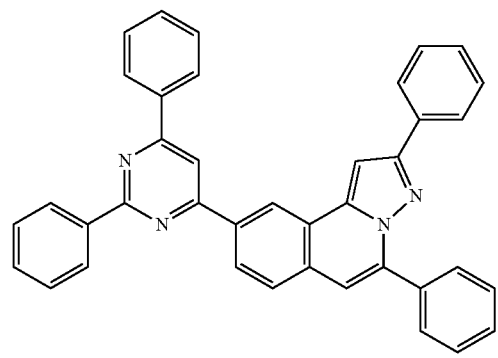

-continued
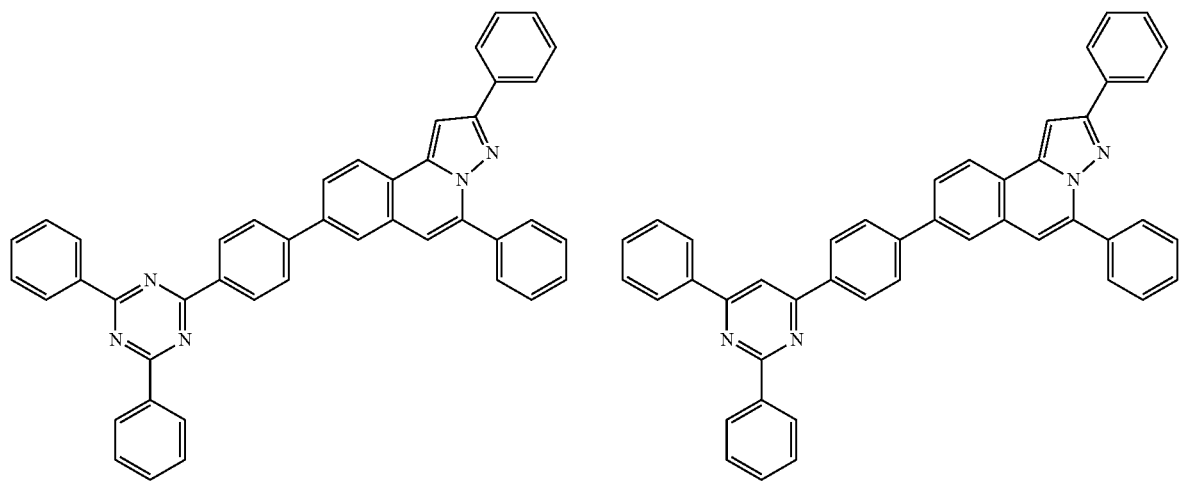
377
378
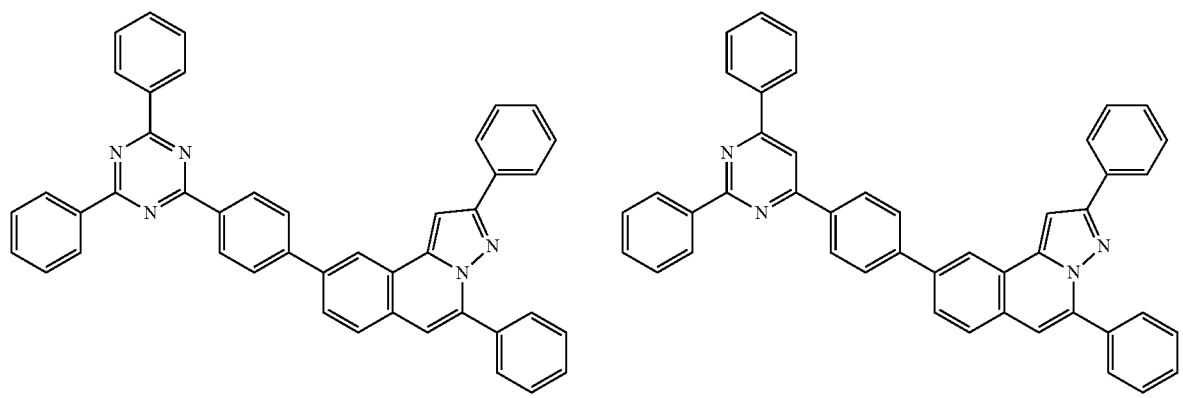
379
380
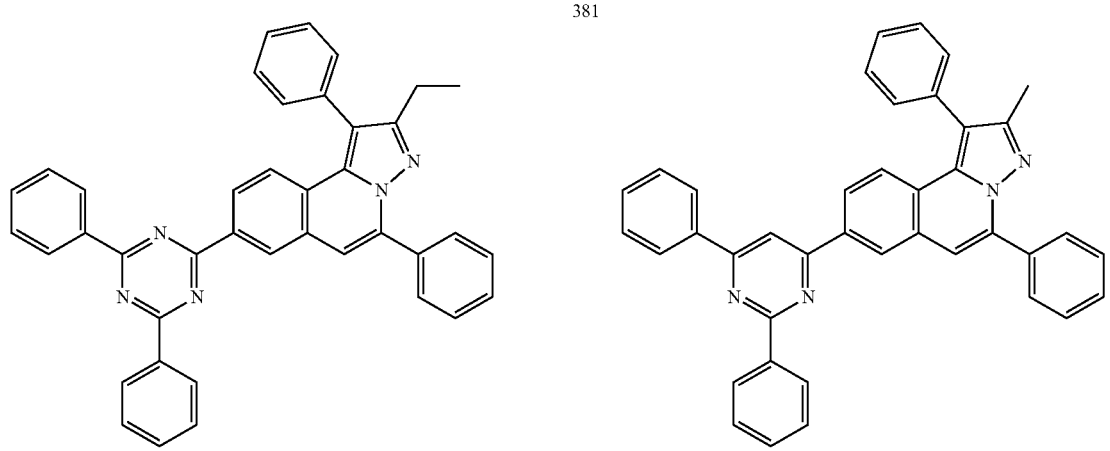
381
382

-continued
383
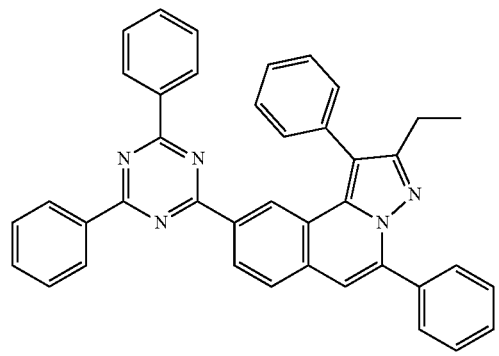
384
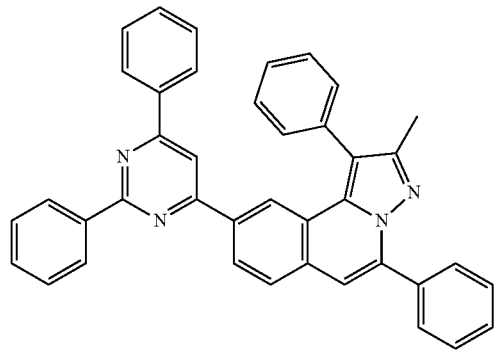
385
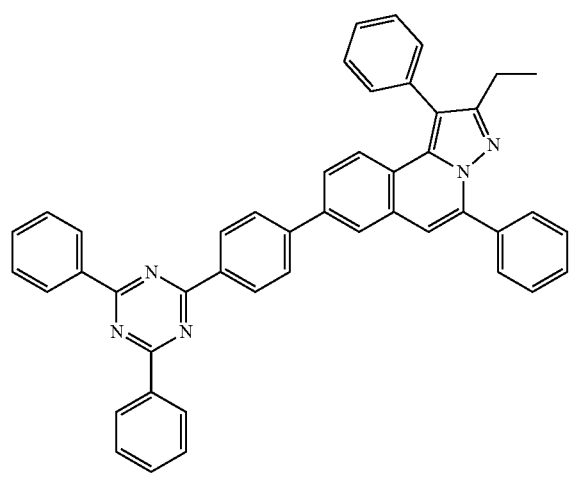
386
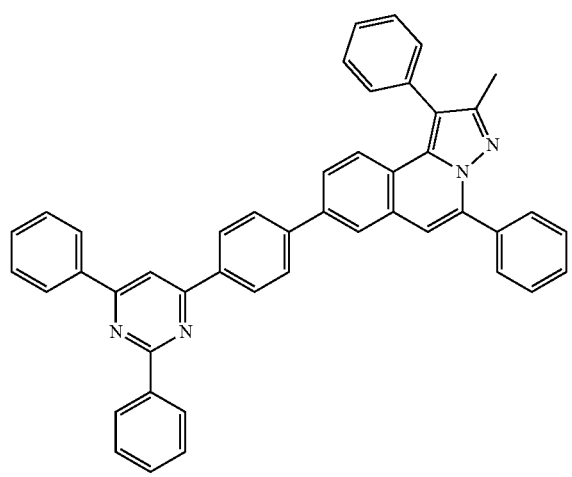
387
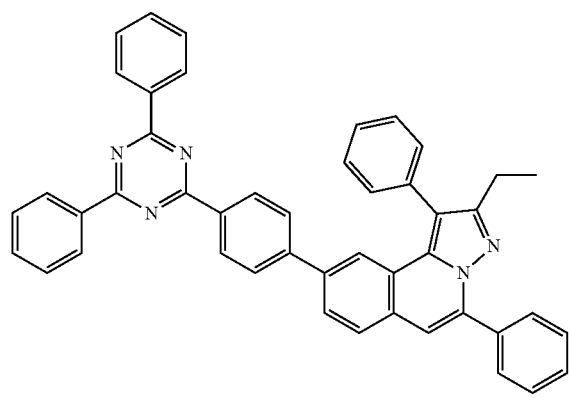
388
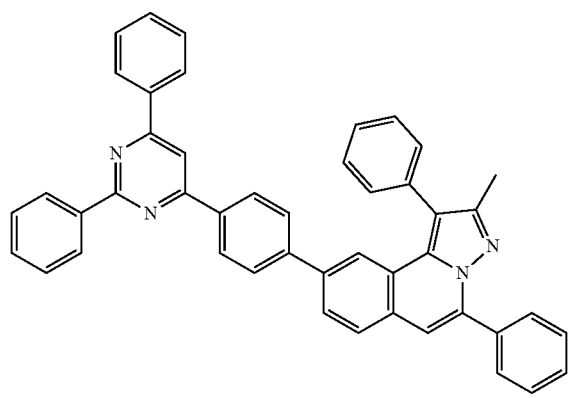

-continued
389
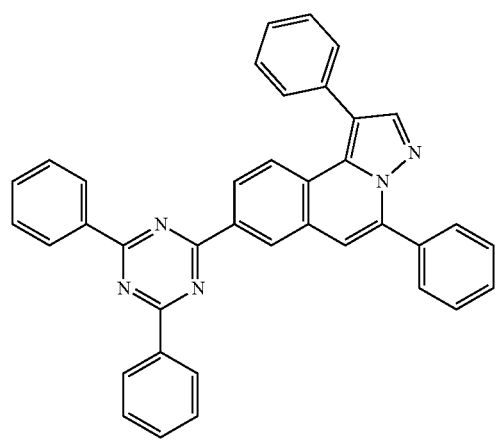
390
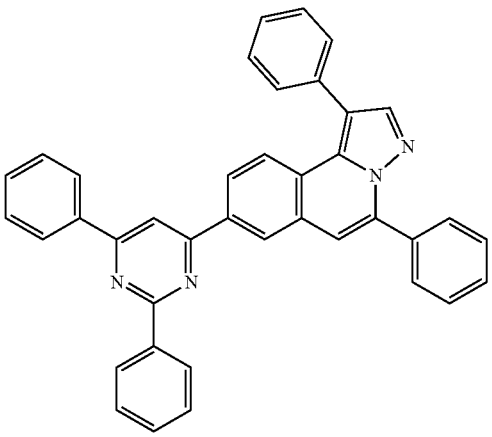
391
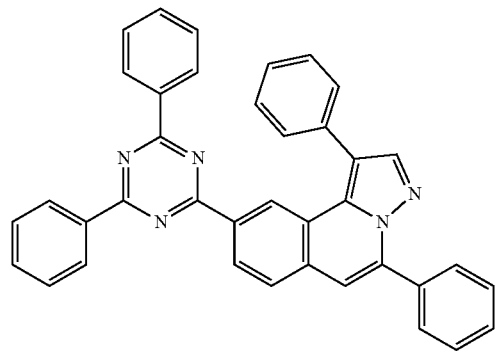
392
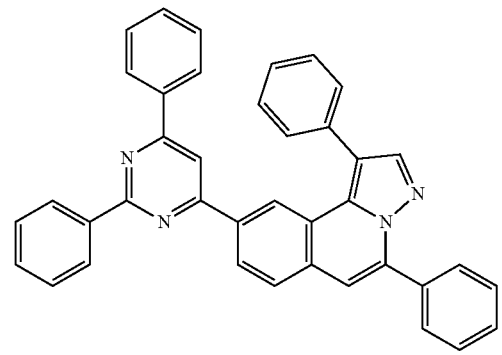
393
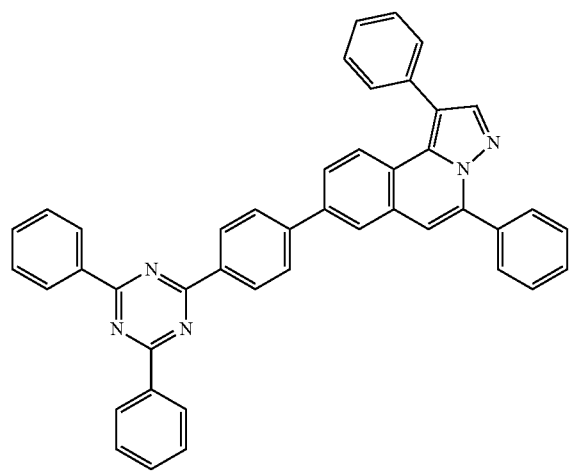
394
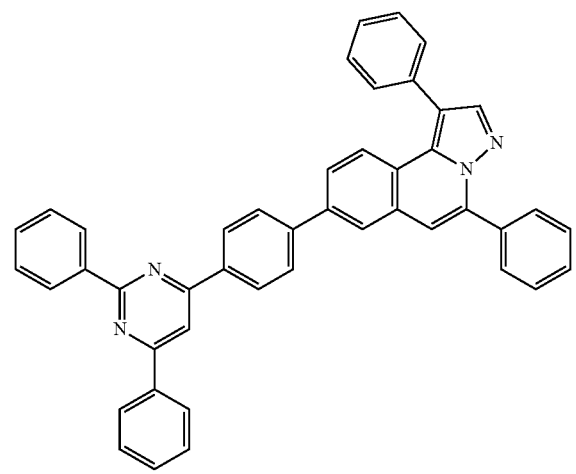

-continued
395
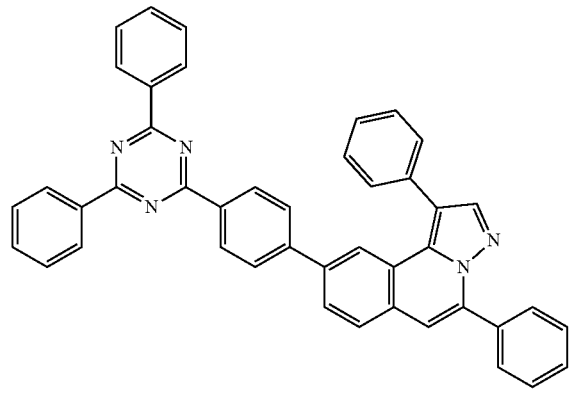
396
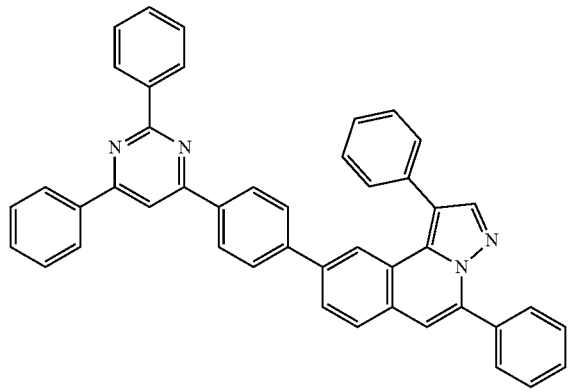
397
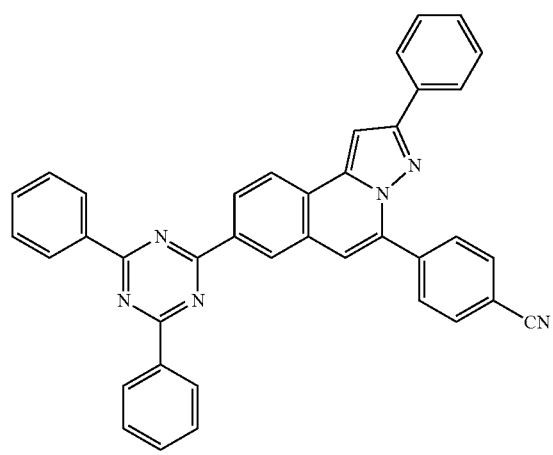
398
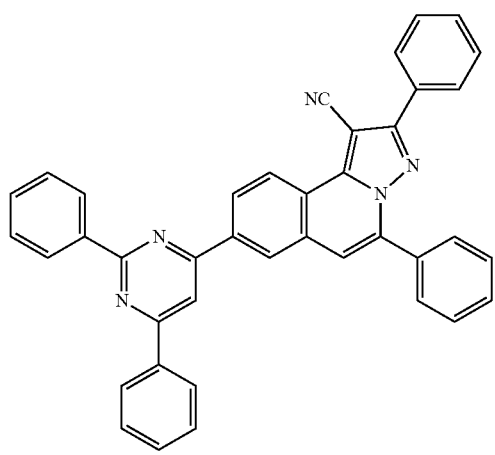
399
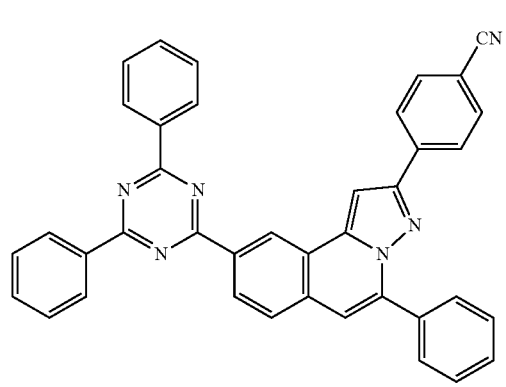
400
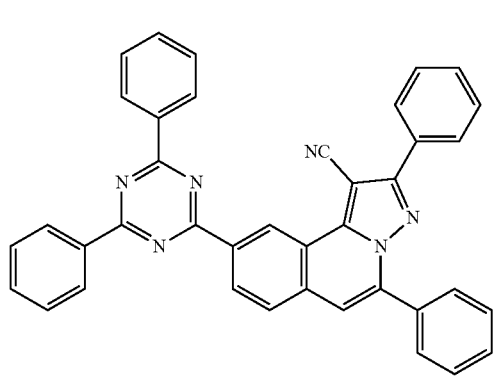

-continued
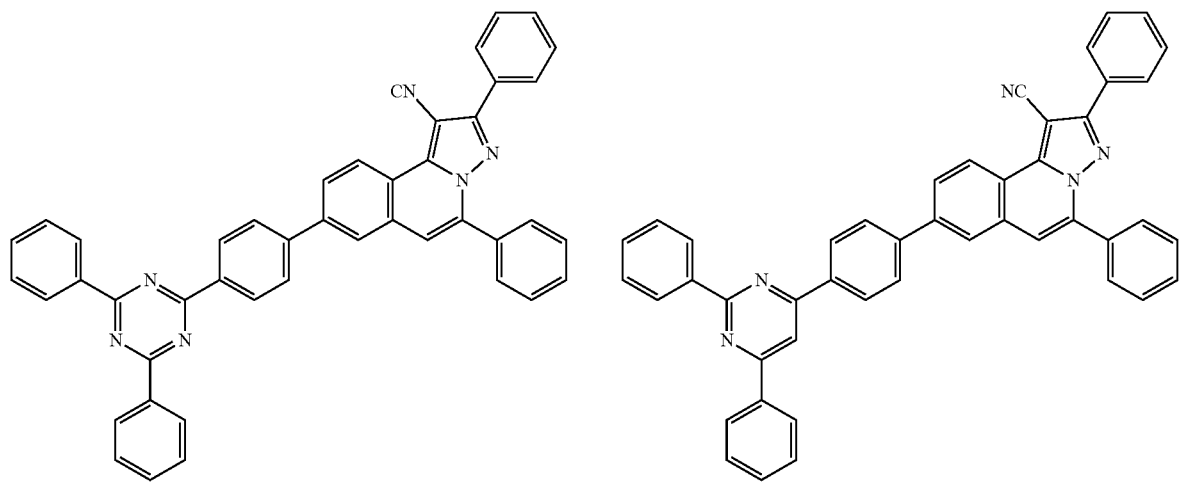
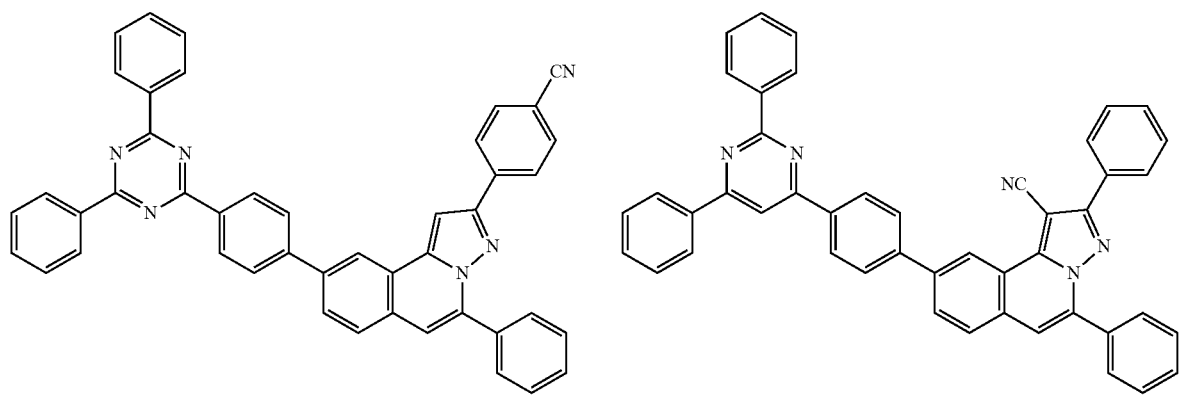
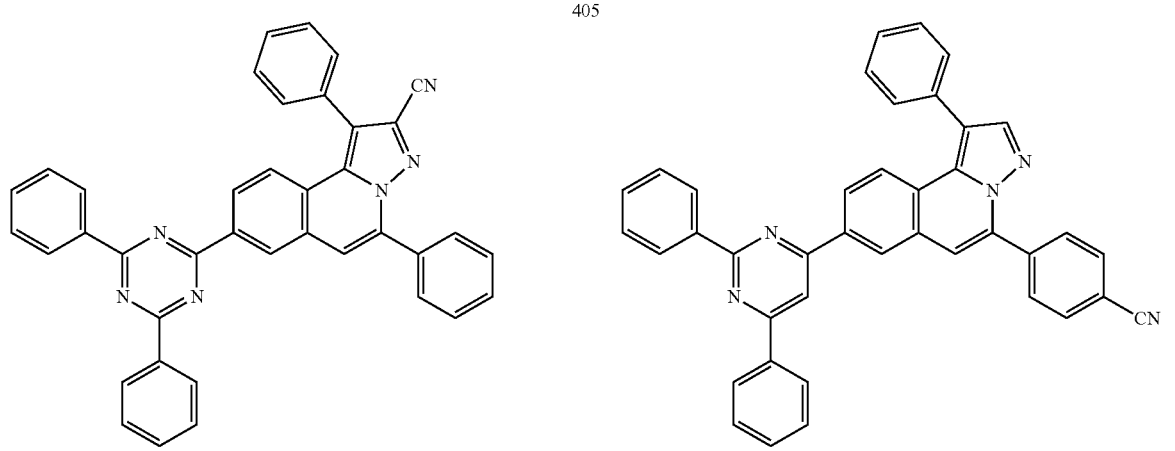

-continued
407
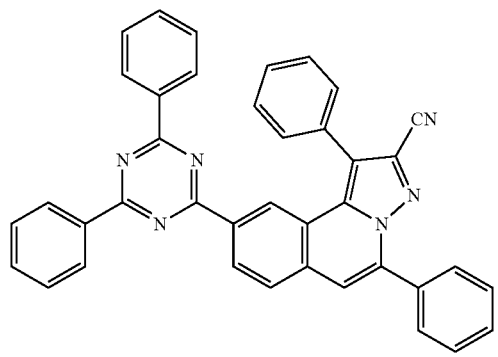
408
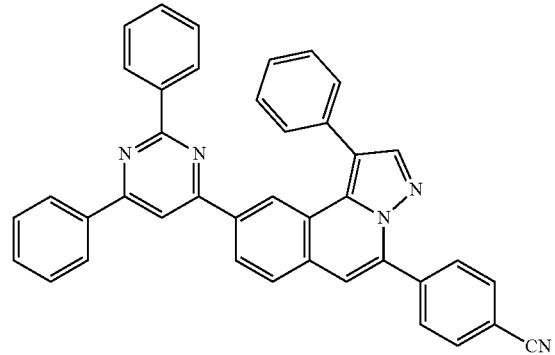
409
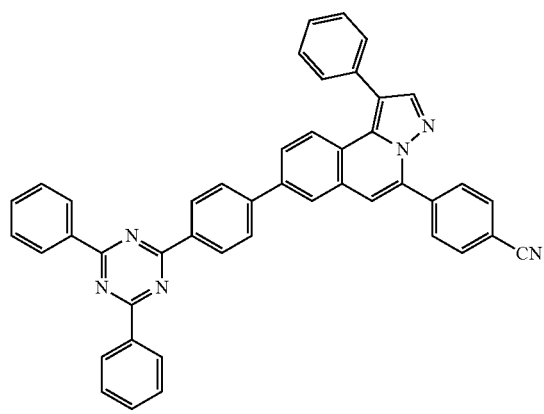
410
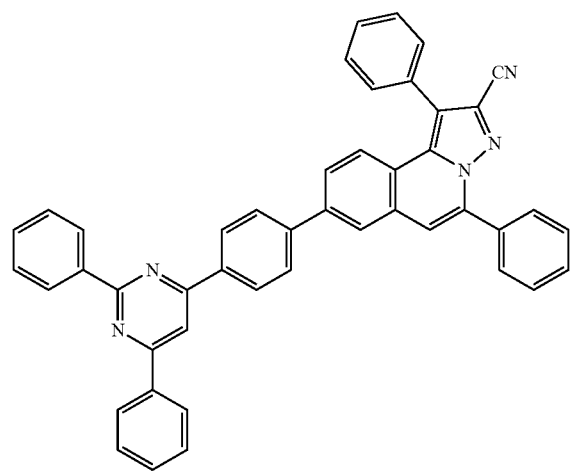
411
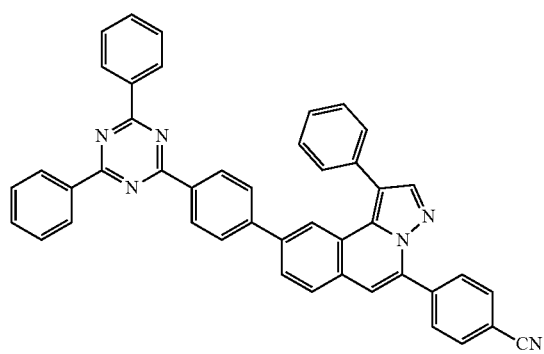
412
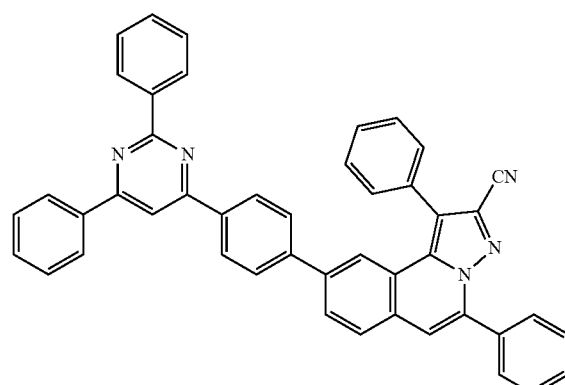

-continued
413
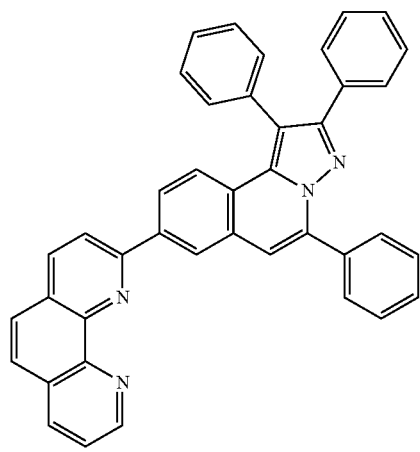
414
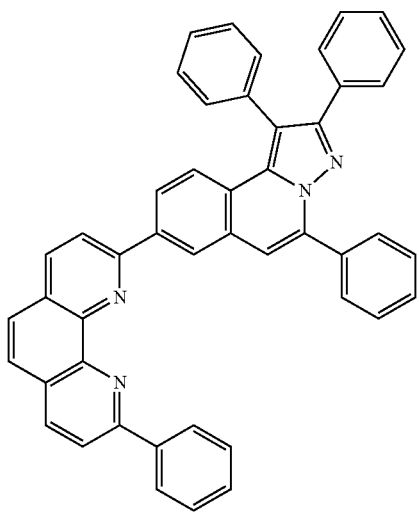
415
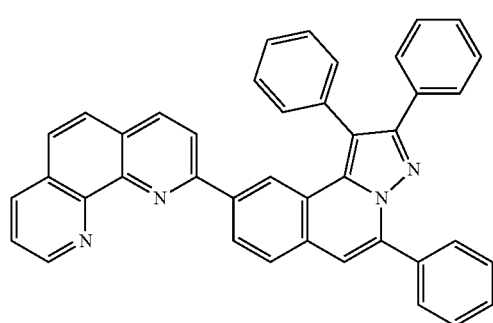
416
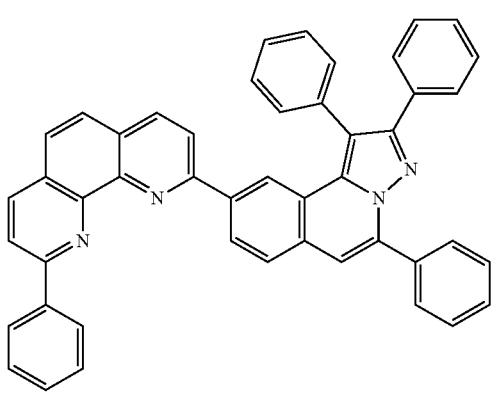
417
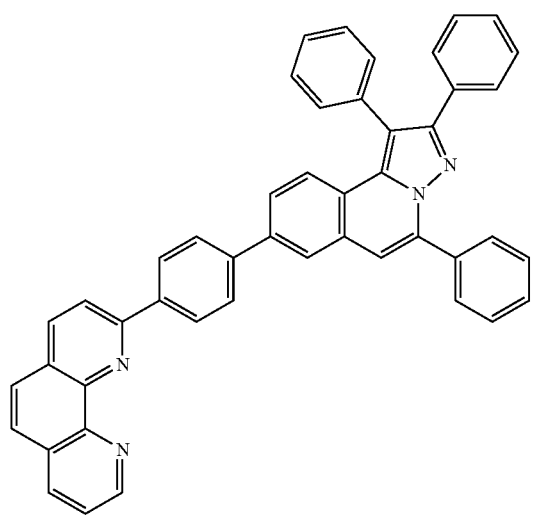
418
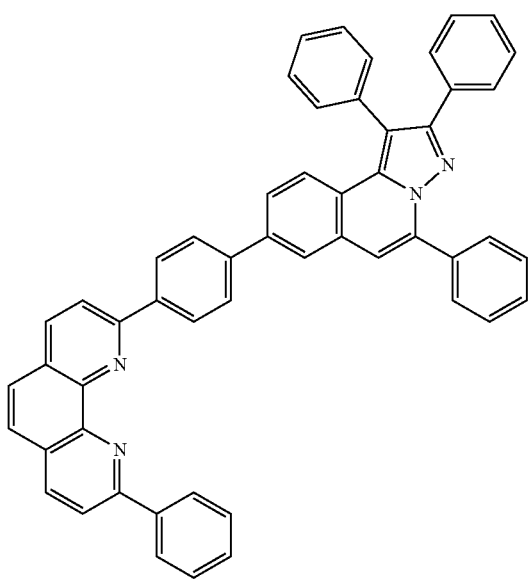

-continued
419
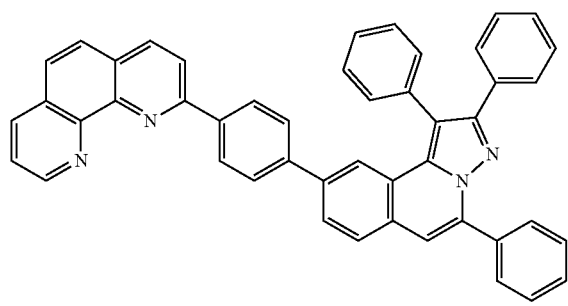
420
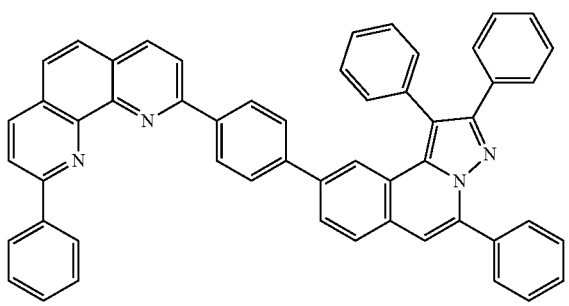
421
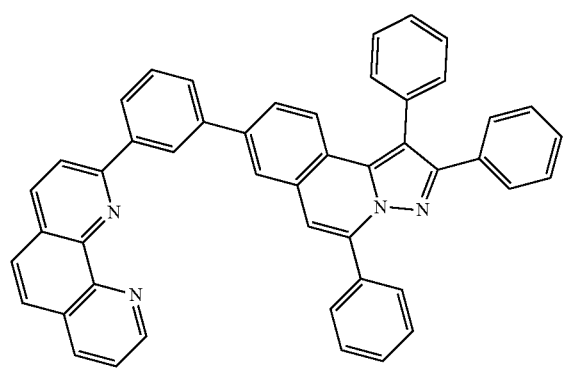
422
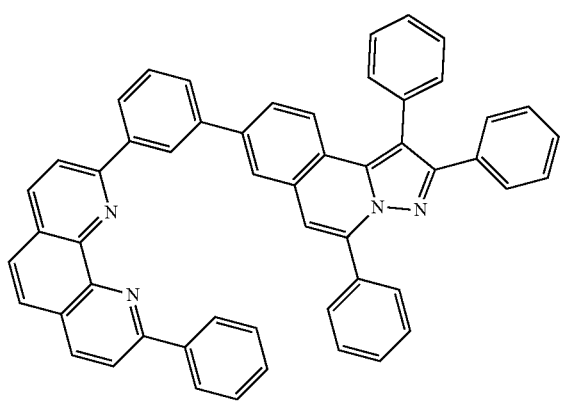
423
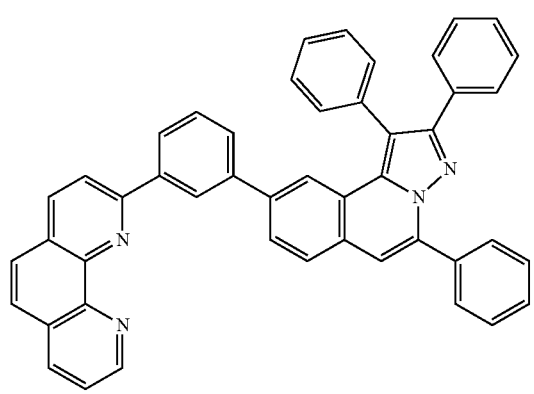
424
425
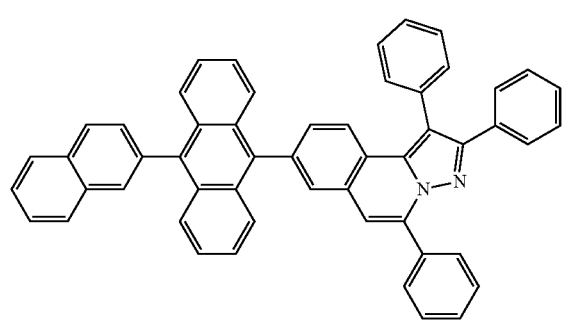
426
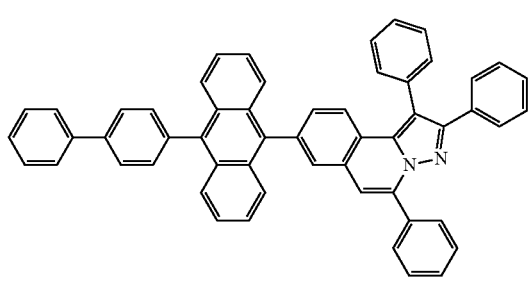

427

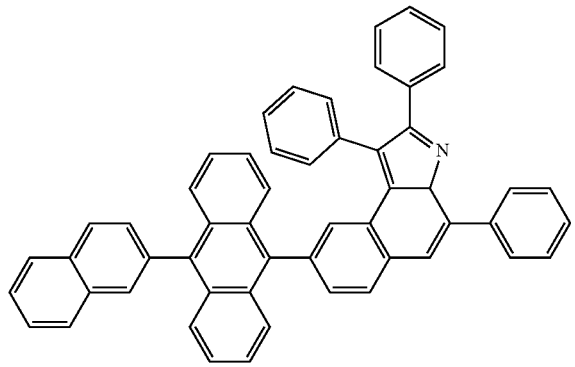

428

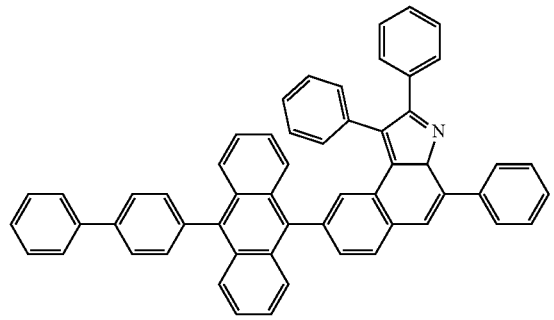

429

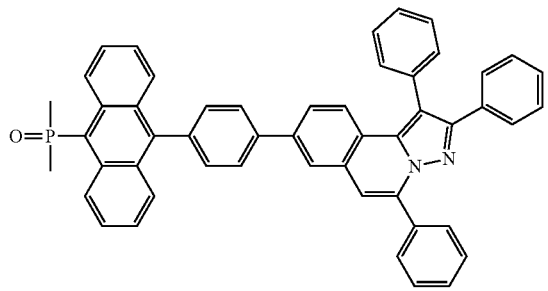

430

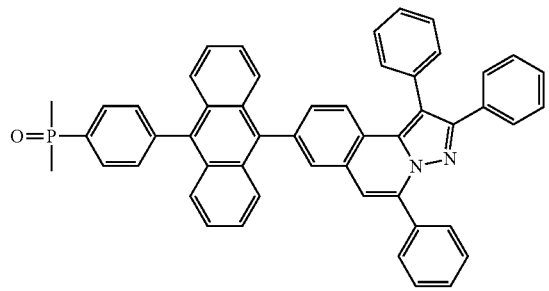

431

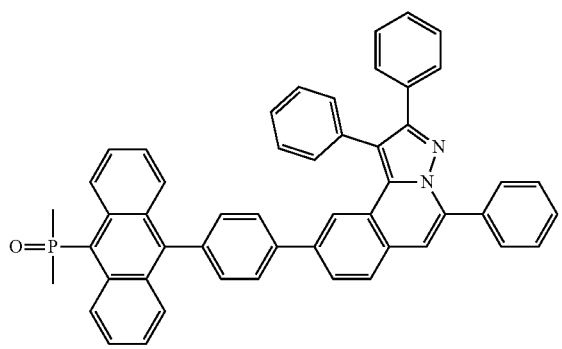

432

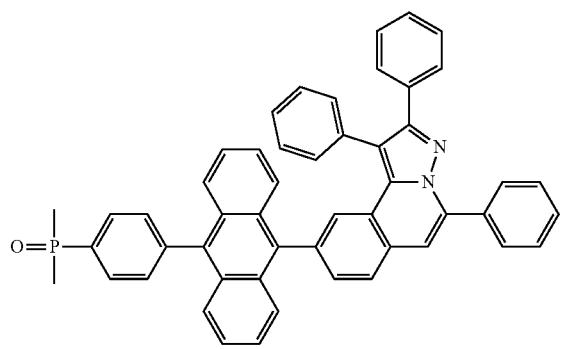

In addition, by introducing various substituents to the structure of Chemical Formula 1, compounds having unique properties of the introduced substituents may be synthesized. For example, by introducing substituents normally used as hole injection layer materials, hole transfer layer materials, light emitting layer materials, electron transfer layer materials and charge generation layer materials used for manufacturing an organic light emitting device to the core structure, materials satisfying conditions required for each organic material layer may be synthesized.

In addition, by introducing various substituents to the structure of Chemical Formula 1, the energy band gap may be finely controlled, and meanwhile, properties at interfaces between organic materials are enhanced, and material applications may become diverse.

One embodiment of the present specification provides an organic light emitting device including a first electrode; a second electrode; and one or more organic material layers provided between the first electrode and the second electrode, wherein one or more layers of the organic material layers include one or more types of the heterocyclic compound represented by Chemical Formula 1.

In one embodiment of the present specification, one or more layers of the organic material layers include one type of the heterocyclic compound represented by Chemical Formula 1.

In one embodiment of the present specification, the first electrode may be an anode, and the second electrode may be a cathode.

In another embodiment of the present specification, the first electrode may be a cathode, and the second electrode may be an anode.

In one embodiment of the present specification, the organic light emitting device may be a blue organic light emitting device, and the heterocyclic compound represented by Chemical Formula 1 may be used as a material of the blue organic light emitting device. For example, the heterocyclic compound represented by Chemical Formula 1 may be included in an electron transfer layer or a hole blocking layer of the blue organic light emitting device.

In one embodiment of the present specification, the organic light emitting device may be a green organic light emitting device, and the heterocyclic compound represented by Chemical Formula 1 may be used as a material of the green organic light emitting device. For example, the heterocyclic compound represented by Chemical Formula 1 may be included in an electron transfer layer or a hole blocking layer of the green organic light emitting device.

In one embodiment of the present specification, the organic light emitting device may be a red organic light emitting device, and the heterocyclic compound represented by Chemical Formula 1 may be used as a material of the red organic light emitting device. For example, the heterocyclic compound represented by Chemical Formula 1 may be included in an electron transfer layer or a hole blocking layer of the red organic light emitting device.

The organic light emitting device of the present specification may be manufactured using common organic light emitting device manufacturing methods and materials except that one or more of the organic material layers are formed using the heterocyclic compound described above.

The heterocyclic compound may be formed into an organic material layer through a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present specification may be formed in a single layer structure, but may be formed in a multilayer structure in which two or more organic material layers are laminated. For example, the organic light emitting device of the present disclosure may have a structure including a hole injection layer, a hole transfer layer, a light emitting layer, an electron transfer layer, an electron injection layer and the like as the organic material layer. However, the structure of the organic light emitting device is not limited thereto, and may include a smaller number of organic material layers.

In the organic light emitting device of the present specification, the organic material layer includes an electron transfer layer, and the electron transfer layer may include the heterocyclic compound represented by Chemical Formula 1.

In the organic light emitting device of the present specification, the organic material layer includes a hole blocking layer, and the hole blocking layer may include the heterocyclic compound represented by Chemical Formula 1.

The organic light emitting device of the present disclosure may further include one, two or more layers selected from the group consisting of a light emitting layer, a hole injection layer, a hole transfer layer, an electron injection layer, an electron transfer layer, an electron blocking layer and a hole blocking layer.

FIG. 1 to FIG. 5 illustrate a lamination order of electrodes and organic material layers of an organic light emitting device according to one embodiment of the present specification. However, the scope of the present application is not limited to these diagrams, and structures of organic light emitting devices known in the art may also be used in the present application.

FIG. 1 illustrates an organic light emitting device in which an anode (200), an organic material layer (300) and a cathode (400) are consecutively laminated on a substrate (100). However, the structure is not limited to such a structure, and as illustrated in FIG. 2, an organic light emitting device in which a cathode, an organic material layer and an anode are consecutively laminated on a substrate may also be obtained.

FIG. 3 and FIG. 4 illustrate cases of the organic material layer being a multilayer. The organic light emitting device according to FIG. 3 includes a hole injection layer (301), a hole transfer layer (302), a light emitting layer (303), an electron transfer layer (305) and an electron injection layer (306), and the organic light emitting device according to FIG. 4 includes a hole injection layer (301), a hole transfer layer (302), a light emitting layer (303), a hole blocking layer (304), an electron transfer layer (305) and an electron injection layer (306). However, the scope of the present application is not limited to such a lamination structure, and as necessary, layers other than the light emitting layer may not be included, and other necessary functional layers may be further added.

The organic material layer including the heterocyclic compound represented by Chemical Formula 1 may further include other materials as necessary.

In addition, the organic light emitting device according to one embodiment of the present specification includes an anode, a cathode, and two or more stacks provided between the anode and the cathode, wherein the two or more stacks each independently include a light emitting layer, a charge generation layer is included between the two or more stacks, and the charge generation layer includes the heterocyclic compound represented by Chemical Formula 1.

In addition, the organic light emitting device according to one embodiment of the present specification includes an anode, a first stack provided on the anode and including a first light emitting layer, a charge generation layer provided on the first stack, a second stack provided on the charge generation layer and including a second light emitting layer, and a cathode provided on the second stack. Herein, the charge generation layer may include the heterocyclic compound represented by Chemical Formula 1.

The organic light emitting device according to one embodiment of the present specification includes a first electrode; a first stack provided on the first electrode and including a first light emitting layer; a charge generation layer provided on the first stack; a second stack provided on the charge generation layer and including a second light emitting layer; and a second electrode provided on the second stack, wherein the charge generation layer may include the heterocyclic compound represented by Chemical Formula 1.

The organic light emitting device according to one embodiment of the present specification includes a first electrode; a second electrode; and an organic material layer provided between the first electrode and the second electrode, wherein the organic material layer includes two or more stacks, the two or more stacks each independently include a light emitting layer, a charge generation layer is included between the two or more stacks, and the charge generation layer may include the heterocyclic compound represented by Chemical Formula 1.

The organic light emitting device according to one embodiment of the present specification includes a first electrode; a second electrode; and an organic material layer provided between the first electrode and the second electrode, wherein the organic material layer includes a first stack including a first light emitting layer; a charge generation layer provided on the first stack; and a second stack provided on the charge generation layer and including a second light emitting layer, and the charge generation layer may include the heterocyclic compound represented by Chemical Formula 1.

In the organic light emitting device according to one embodiment of the present specification, the charge generation layer includes an N-type charge generation layer, and the N-type charge generation layer includes the heterocyclic compound represented by Chemical Formula 1.

In the organic light emitting device according to one embodiment of the present specification, the charge generation layer may further include a P-type charge generation layer.

As the organic light emitting device according to one embodiment of the present specification, an organic light emitting device having a 2-stack tandem structure is illustrated in FIG. 5.

Herein, the first electron blocking layer, the first hole blocking layer, the second hole blocking layer and the like described in FIG. 5 may not be included in some cases.

In the organic light emitting device according to one embodiment of the present specification, materials other than the heterocyclic compound represented by Chemical Formula 1 are illustrated below, however, these are for illustrative purposes only and not for limiting the scope of the present application, and may be replaced by materials known in the art.

As the anode material, materials having relatively large work function may be used, and transparent conductive oxides, metals, conductive polymers or the like may be used. Specific examples of the anode material include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having relatively small work function may be used, and metals, metal oxides, conductive polymers or the like may be used. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

As the hole injection material, known hole injection materials may be used, and for example, phthalocyanine compounds such as copper phthalocyanine disclosed in U.S. Pat. No. 4,356,429, or starburst-type amine derivatives such as tris(4-carbazoyl-9-ylphenyl)amine (TCTA), 4,4',4"-tri[phenyl(m-tolyl)amino]triphenylamine (m-MTDATA) or 1,3,5-tris[4-(3-methylphenylphenylamino)phenyl]benzene (m-MTDAPB) described in the literature [Advanced Material, 6, p.677 (1994)], polyaniline/dodecylbenzene sulfonic acid, poly(3,4-ethylenedioxythiophene)/poly(4-styrenesulfonate), polyaniline/camphor sulfonic acid or polyaniline/poly(4-styrenesulfonate) that are conductive polymers having solubility, and the like, may be used.

As the hole transfer material, pyrazoline derivatives, arylamine-based derivatives, stilbene derivatives, triphenyldiamine derivatives and the like may be used, and low molecular or high molecular materials may also be used.

As the electron transfer material, metal complexes of oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and derivatives thereof, and the like, may be used, and high molecular materials may also be used as well as low molecular materials.

As examples of the electron injection material, LiF is typically used in the art, however, the present application is not limited thereto.

As the light emitting material, red, green or blue light emitting materials may be used, and as necessary, two or more light emitting materials may be mixed and used. Herein, two or more light emitting materials may be used by being deposited as individual sources of supply or by being premixed and deposited as one source of supply. In addition, fluorescent materials may also be used as the light emitting material, however, phosphorescent materials may also be used. As the light emitting material, materials emitting light by bonding electrons and holes injected from an anode and a cathode, respectively, may be used alone, however, materials having a host material and a dopant material involving in light emission together may also be used.

When mixing light emitting material hosts, same series hosts may be mixed, or different series hosts may be mixed. For example, any two or more types of materials among N-type host materials or P-type host materials may be selected and used as a host material of a light emitting layer.

The organic light emitting device according to one embodiment of the present specification may be a top-emission type, a bottom-emission type or a dual-emission type depending on the materials used.

The compound according to one embodiment of the present specification may also be used in an organic electronic device including an organic solar cell, an organic photo conductor, an organic transistor and the like under a similar principle used in the organic light emitting device.

Hereinafter, the present specification will be described in more detail with reference to examples, however, these are for illustrative purposes only, and the scope of the present application is not limited thereto.

[Preparation Example 1] Preparation of Compound 9

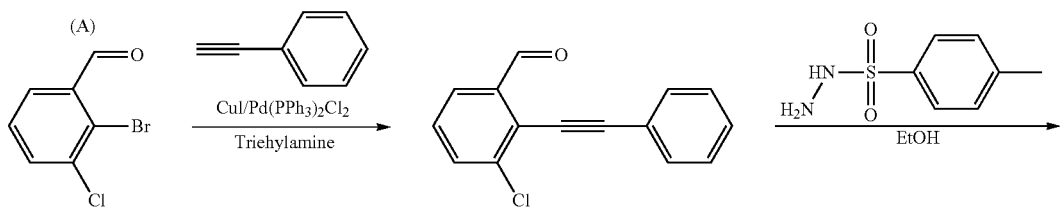

(A)

[Preparation Example 1] Preparation of Compound 9

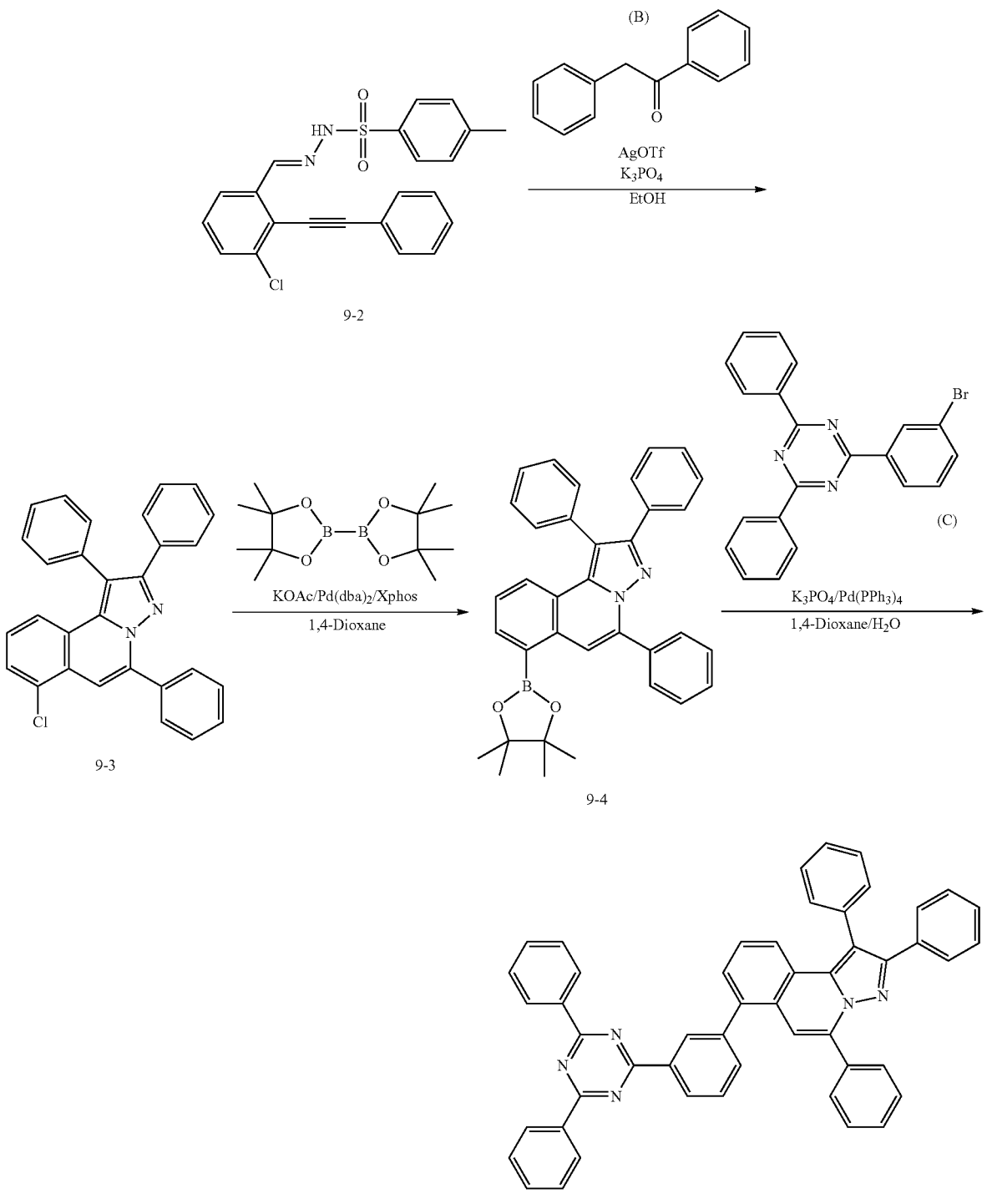

1) Preparation of Compound 9-1

After introducing triethylamine (1000 ml) to 2-bromo-3-chlorobenzaldehyde (A) (100 g, 0.45 mol, 1 eq.), ethynylbenzene (51.2 g, 0.50 mol, 1.1 eq.), Pd(PPh$_3$)$_2$Cl$_2$ (bis(triphenylphosphine)palladium(0) dichloride) (6.4 g, 0.009 mol, 0.02 eq.) and CuI (0.86 g, 0.0045 mol, 0.01 eq.), the mixture was stirred for 5 hours at 60° C. The reaction was terminated by introducing water thereto, and the result was extracted using methylene chloride (MC) and water. After that, moisture was removed with anhydrous Na$_2$CO$_3$. The result was separated using a silica gel column to obtain Compound 9-1 (85 g) in a 77% yield.

2) Preparation of Compound 9-2

After introducing Compound 9-1 (170 g, 0.70 mol, 1 eq.) and TsNHNH$_2$ (p-toluenesulfonyl hydrazide) (144 g, 0.77 mol, 1.1 eq.) to ethanol (EtOH) (3400 ml), the mixture was stirred for 1 hour at room temperature (RT). Produced solids were filtered and dried to obtain Compound 9-2 (174 g) in a 60% yield.

3) Preparation of Compound 9-3

After introducing Compound 9-2 (40 g, 0.097 mol, 1 eq.) and AgOTf (silver trifluoromethanesulfonic acid salt) (3.8 g, 0.014 mol, 0.15 eq.) to EtOH (800 ml), the mixture was stirred for 2 hours at 70° C. 1,2-Diphenylethanone (B) (38.4 g, 0.19 mol, 2 eq.) and K$_3$PO$_4$ (62.3 g, 0.29 mol, 3 eq.) were introduced thereto, and the result was stirred for 7 hours at 70° C. The reaction was terminated by introducing water thereto, and the result was extracted using MC and water. After that, moisture was removed with anhydrous Na$_2$CO$_3$. The result was separated using a silica gel column to obtain Compound 9-3 (62 g) in a 34% yield.

4) Preparation of Compound 9-4

After introducing Compound 9-3 (10 g, 0.023 mol, 1 eq.), 4,4,4',4',5,5,5',5'-octamethyl-2,2'-bi(1,3,2-dioxaborolane) (5.9 g, 0.035 mol, 1.5 eq.), KOAc (potassium acetate) (6.8 g, 0.069 mol, 3 eq.), Pd(dba)$_2$ (bis(dibenzylideneacetone) palladium(0)) (1.3 g, 0.0023 mol, 0.1 eq.), Xphos (2-dicyclohexylphosphino-2',4',6'-triisopropylbiphenyl) (2.2 g, 0.0046 mol, 0.2 eq.) to 1,4-dioxane (100 ml), the mixture was stirred for 6 hours at 80° C. The reaction was terminated by introducing water thereto, and the result was extracted using MC and water. After that, moisture was removed with anhydrous Na$_2$CO$_3$. The result was separated using a silica gel column to obtain Compound 9-4 (9 g) in a 74% yield.

5) Preparation of Compound 9

After introducing Compound 9-4 (10 g, 0.019 mol, 1 eq.), 2-(3-bromophenyl)-4,6-diphenyl-1,3,5-triazine (C) (7.4 g, 0.019 mol, 1 eq.), K$_3$PO$_4$ (8.1 g, 0.038 mol, 2 eq.) and Pd(PPh$_3$)$_4$ (tetrakis(triphenylphosphine)palladium(0)) (11.1 g, 0.0009 mol, 0.05 eq.) to 1,4-dioxane (100 ml) and H$_2$O (25 ml), the mixture was stirred for 6 hours at 80° C. Produced solids were filtered and dried to obtain Compound 9 (11 g) in a 81% yield.

Compounds were synthesized in the same manner as in Preparation Example 1 except that Intermediate A of the following Table 1 was used instead of 2-bromo-3-chlorobenzaldehyde (A), Intermediate B of the following Table 1 was used instead of 1,2-diphenylethanone (B), and Intermediate C of the following Table 1 was used instead of 2-(3-bromophenyl)-4,6-diphenyl-1,3,5-triazine (C).

TABLE 1

| Compound No. | Intermediate A | Intermediate B | Intermediate C | Yield |
|---|---|---|---|---|
| 12 | | | | 66% |
| 25 | | | | 56% |

TABLE 1-continued

| Compound No. | Intermediate A | Intermediate B | Intermediate C | Yield |
|---|---|---|---|---|
| 30 | 2-bromo-3-chlorobenzaldehyde | 1,2-diphenylethan-1-one | 4-chloro-2-phenyl-6-(4-biphenyl)pyrimidine | 57% |
| 35 | 2-bromo-3-chlorobenzaldehyde | 1,2-diphenylethan-1-one | 2-chloro-4-phenyl-6-(3-biphenyl)pyrimidine | 55% |
| 36 | 2-bromo-3-chlorobenzaldehyde | 1,2-diphenylethan-1-one | 4-bromo-2-phenyl-6-(3-biphenyl)pyridine | 60% |
| 86 | 2-bromo-3-chlorobenzaldehyde | 1,2-diphenylethan-1-one | 4-(3-bromophenyl)-2-phenyl-6-(4-biphenyl)pyrimidine | 56% |

TABLE 1-continued

| Compound No. | Intermediate A | Intermediate B | Intermediate C | Yield |
|---|---|---|---|---|
| 103 | 2-bromo-3-chlorobenzaldehyde | 1,2-diphenylethanone | 2-(3-bromophenyl)-4-(3,5-diphenylphenyl)-6-phenylpyrimidine | 69% |
| 113 | 2-bromo-4-chlorobenzaldehyde | 1,2-diphenylethanone | 2-chloro-4,6-diphenyl-1,3,5-triazine | 50% |
| 114 | 2-bromo-4-chlorobenzaldehyde | 1,2-diphenylethanone | 4-chloro-2,6-diphenylpyrimidine | 54% |
| 165 | 2-bromo-4-chlorobenzaldehyde | 1,2-diphenylethanone | 2-(3-(9H-carbazol-9-yl)phenyl)-4-chloro-6-phenyl-1,3,5-triazine | 50% |

TABLE 1-continued

| Compound No. | Intermediate A | Intermediate B | Intermediate C | Yield |
|---|---|---|---|---|
| 167 | 2-bromo-4-chlorobenzaldehyde | 1,2-diphenylethanone | 2-chloro-4-(3-(9H-carbazol-9-yl)phenyl)-6-phenylpyrimidine | 67% |
| 230 | 2-bromo-5-chlorobenzaldehyde | 1,2-diphenylethanone | 4-(4-bromophenyl)-2,6-diphenylpyrimidine | 56% |
| 237 | 2-bromo-5-chlorobenzaldehyde | 1,2-diphenylethanone | 2-(4'-bromo-[1,1'-biphenyl]-4-yl)-4,6-diphenyl-1,3,5-triazine | 53% |
| 253 | 2-bromo-5-chlorobenzaldehyde | 1,2-diphenylethanone | 2-chloro-4-([1,1'-biphenyl]-4-yl)-6-phenyl-1,3,5-triazine | 64% |

TABLE 1-continued

| Compound No. | Intermediate A | Intermediate B | Intermediate C | Yield |
|---|---|---|---|---|
| 258 | | | | 60% |
| 272 | | | | 63% |
| 309 | | | | 51% |
| 365 | | | | 59% |

TABLE 1-continued

| Compound No. | Intermediate A | Intermediate B | Intermediate C | Yield |
| --- | --- | --- | --- | --- |
| 374 | 2-bromo-4-chlorobenzaldehyde | acetophenone | 4-chloro-2,6-diphenylpyrimidine | 64% |
| 391 | 2-bromo-5-chlorobenzaldehyde | phenylacetaldehyde | 2-chloro-4,6-diphenyl-1,3,5-triazine | 62% |
| 410 | 2-bromo-4-chlorobenzaldehyde | phenylacetonitrile | 4-(4-bromophenyl)-2,6-diphenylpyrimidine | 57% |
| 414 | 2-bromo-4-chlorobenzaldehyde | 1,2-diphenylethanone | 2-bromo-9-phenyl-1,10-phenanthroline | 51% |

Compounds were prepared in the same manner as in the preparation examples, and the synthesis identification results are shown in Table 2 and Table 3. Table 2 shows measurement values of $^1$H NMR (CDCl$_3$, 200 Mz), and Table 3 shows measurement values of FD-mass spectrometry (FD-MS: field desorption mass spectrometry).

TABLE 2

| Compound | $^1$H NMR (CDCl$_3$, 200 Mz) |
|---|---|
| 9 | δ = 8.28 (5H, m), 7.84 (4H, m), 7.70 (1H, s), 7.48 (1H, s), 7.59~7.41 (22H, m), |
| 12 | δ = 8.30 (4H, m), 8.20 (2H, s), 7.84 (4H, m), 7.70 (1H, s), 7.48 (1H, s), 7.59~7.41 (23H, m), |
| 25 | δ = 8.28 (5H, m), 7.84 (4H, m), 7.70 (2H, s), 7.48 (1H, s), 7.59~7.41 (25H, m), |
| 30 | δ = 8.28 (4H, m), 8.23 (1H, s), 7.85 (6H, m), 7.66 (1H, s), 7.59~7.41 (22H, m), |
| 35 | δ = 8.23 (1H, s), 7.79 (7H, m), 7.70 (1H, s), 7.66 (1H, s), 7.59~7.41 (24H, m), |
| 36 | δ = 8.30 (4H, m), 8.20 (2H, s), 7.84 (4H, m), 7.66 (1H, s), 7.59~7.41 (24H, m), |
| 86 | δ = 8.28 (4H, m), 8.23 (1H, s), 7.84 (7H, m), 7.70 (1H, s), 7.66 (1H, s), 7.59~7.41 (24H, m), |
| 103 | δ = 8.24 (1H, d), 8.23 (1H, s), 7.79 (6H, m), 7.70 (1H, s), 7.66 (4H, s), 7.59~7.41 (29H, m), |
| 113 | δ = 8.28 (4H, m), 7.98 (1H, d), 7.93 (1H, s), 7.77 (3H, m), 7.66 (1H, s), 7.59~7.41 (19H, m) |
| 114 | δ = 8.28 (2H, dd), 8.23 (1H, s), 7.98 (1H, d), 7.93 (1H, s), 7.77 (5H, m), 7.66 (1H, s), 7.59~7.41 (19H, m) |
| 165 | δ = 8.55 (1H, d), 8.28 (3H, m), 8.12 (1H, d), 8.09 (1H, s), 7.94 (3H, m), 7.77 (3H, m), 7.66 (1H, s), 7.59~7.25 (23H, m) |
| 167 | δ = 8.55 (1H, d), 8.23 (1H, s), 8.12 (1H, d), 8.09 (1H, s), 7.94 (3H, m), 7.79 (6H, m), 7.66 (1H, s), 7.59~7.25 (23H, m) |
| 230 | δ = 8.30 (4H, m), 8.23 (1H, s), 8.09 (1H, s), 7.94 (8H, m), 7.66 (1H, s), 7.59~7.41 (19H, m) |
| 237 | δ = 8.28 (4H, m), 8.09 (1H, s), 7.85 (6H, m), 7.66 (1H, s), 7.59~7.41 (19H, m), 7.25 (6H, m) |
| 253 | δ = 8.28 (2H, m), 8.09 (1H, s), 7.85 (6H, m), 7.66 (1H, s), 7.59~7.41 (21H, m), 7.25 (2H, dd) |
| 258 | δ = 8.28 (2H, dd), 8.23 (1H, s), 8.09 (1H, s), 7.75 (5H, m), 7.70 (1H, s), 7.66 (1H, s), 7.59~7.41 (23H, m) |
| 272 | δ = 8.30 (2H, d), 8.20 (2H, s), 8.17 (2H, s), 8.09 (1H, s), 7.79 (4H, m), 7.72 (1H, m), 7.66 (1H, s), 7.59~7.41 (26H, m) |
| 309 | δ = 8.24 (3H, m), 8.09 (1H, s), 7.82 (6H, m), 7.70 (1H, s), 7.66 (1H, s), 7.59~7.41 (23H, m), 7.25 (2H, dd) |
| 365 | δ = 8.28 (4H, m), 7.98 (1H, d), 7.93 (1H, s), 7.71 (3H, m), 7.66 (1H, s), 7.59~7.41 (14H, m), 2.04 (3H, s) |
| 374 | δ = 8.28 (2H, d), 8.23 (1H, s), 8.05 (2H, dd), 7.98 (1H, d), 7.93 (1H, s), 7.77 (3H, m), 7.66 (1H, s), 7.59~7.41 (14H, m), 6.66 (1H, s) |
| 391 | δ = 8.65 (1H, s), 8.28 (4H, m), 8.09 (1H, s), 7.82 (2H, m), 7.66 (1H, s), 7.59~7.41 (16H, m) |
| 410 | δ = 8.30 (4H, m), 8.23 (1H, s), 7.98 (1H, d), 7.93 (1H, s), 7.85 (5H, m), 7.66 (1H, s), 7.59~7.41 (16H, m), |
| 414 | δ = 8.44 (1H, s), 8.28 (3H, m), 8.01 (4H, m), 7.81 (3H, m), 7.66 (1H, s), 7.59~7.41 (18H, m), |

TABLE 3

| Compound | FD-MS | Compound | FD-MS |
|---|---|---|---|
| 9 | m/z = 703.83 (C50H33N5 = 703.27) | 12 | m/z = 701.85 (C52H35N3 = 701.28) |
| 25 | m/z = 779.93 (C56H37N5 = 779.30) | 30 | m/z = 702.84 (C51H34N4 = 702.28) |
| 35 | m/z = 702.84 (C51H34N4 = 702.28) | 36 | m/z = 701.85 (C52H35N3 = 701.28) |
| 86 | m/z = 778.94 (C57H38N4 = 778.31) | 103 | m/z = 855.03 (C63H42N4 = 854.34) |
| 113 | m/z = 627.73 (C44H29N5 = 627.24) | 114 | m/z = 626.75 (C45H30N4 = 626.25) |
| 165 | m/z = 792.30 (C56H36N6 = 792.93) | 167 | m/z = 791.94 (C57H37N5 = 791.30) |
| 230 | m/z = 702.84 (C51H34N4 = 702.28) | 237 | m/z = 779.93 (C56H37N5 = 779.30) |
| 253 | m/z = 703.83 (C50H33N5 = 703.27) | 258 | m/z = 702.84 (C51H34N4 = 702.28) |
| 272 | m/z = 777.95 (C58H39N3 = 777.31) | 309 | m/z = 779.93 (C56H37N5 = 779.30) |
| 365 | m/z = 565.67 (C39H27N5 = 565.23) | 374 | m/z = 550.65 (C39H26N4 = 550.22) |
| 391 | m/z = 551.64 (C38H25N5 = 551.21) | 410 | m/z = 651.76 (C46H29N5 = 651.24) |
| 414 | m/z = 650.77 (C47H30N4 = 650.25) | | |

Experimental Example

Experimental Example 1

1) Manufacture of Organic Light Emitting Device

Comparative Example 1

A transparent indium tin oxide (ITO) electrode thin film obtained from glass for an OLED (manufactured by Samsung-Corning Co., Ltd.) was ultrasonic cleaned using trichloroethylene, acetone, ethanol and distilled water consecutively for 5 minutes each, stored in isopropanol, and used. Next, the ITO substrate was installed in a substrate folder of a vacuum deposition apparatus, and the following 4,4',4''-tris(N,N-(2-naphthyl)-phenylamino)triphenylamine (2-TNATA) was introduced to a cell in the vacuum deposition apparatus.

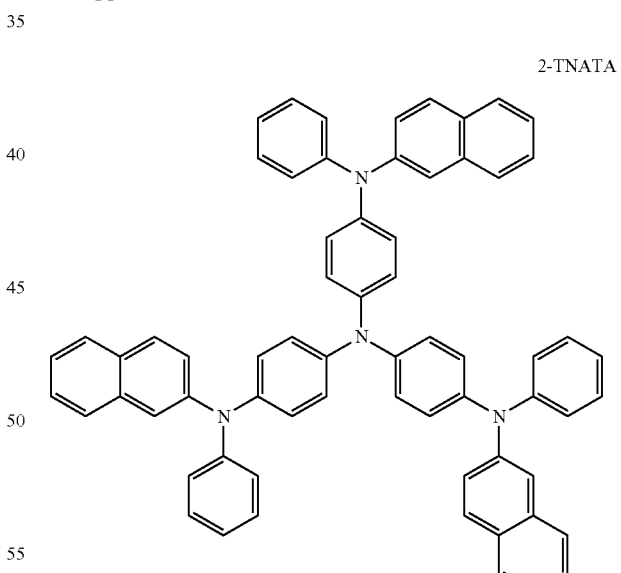

2-TNATA

Subsequently, the chamber was evacuated until the degree of vacuum therein reached $10^{-6}$ torr, and then 2-TNATA was evaporated by applying a current to the cell to deposit a hole injection layer having a thickness of 600 Å on the ITO substrate. To another cell in the vacuum deposition apparatus, the following N,N'-bis(α-naphthyl)-N,N'-diphenyl-4,4'-diamine (NPB) was introduced, and evaporated by applying a current to the cell to deposit a hole transfer layer having a thickness of 300 Å on the hole injection layer.

NPB

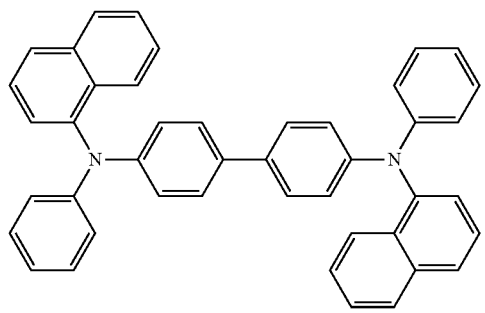

E1

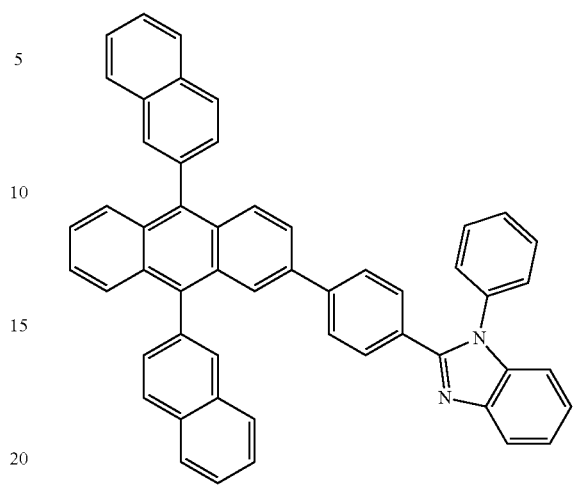

After forming the hole injection layer and the hole transfer layer as above, a blue light emitting material having a structure as below was deposited thereon as a light emitting layer. Specifically, in one side cell in the vacuum deposition apparatus, H1, a blue light emitting host material, was vacuum deposited to a thickness of 200 Å, and D1, a blue light emitting dopant material, was vacuum deposited thereon by 5% with respect to the host material.

H1

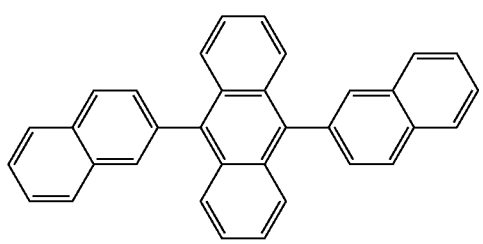

E2

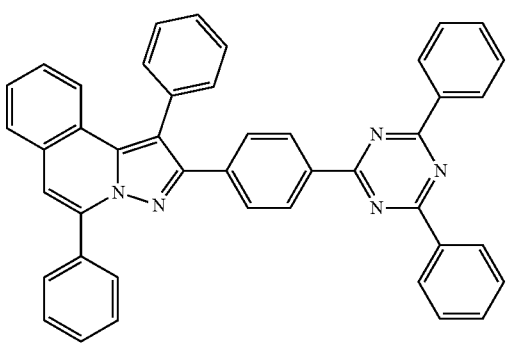

E3

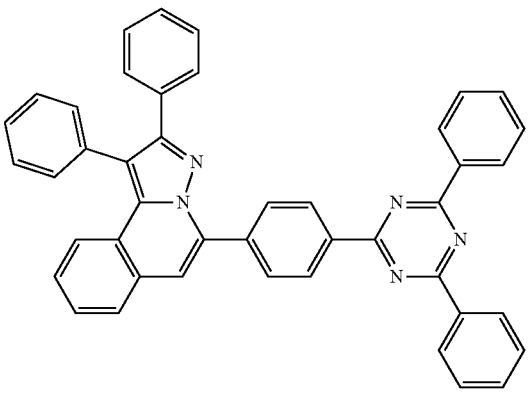

D1

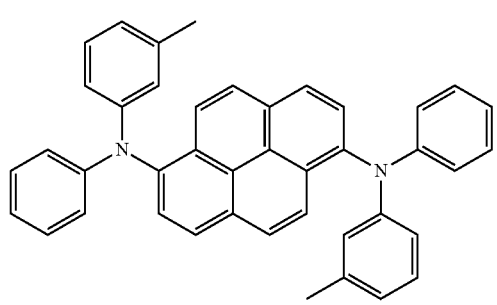

E4

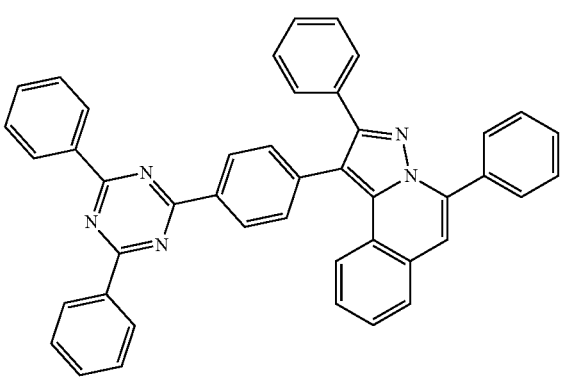

Subsequently, a compound of the following Structural Formula E1 was deposited to a thickness of 300 Å as an electron transfer layer.

E5

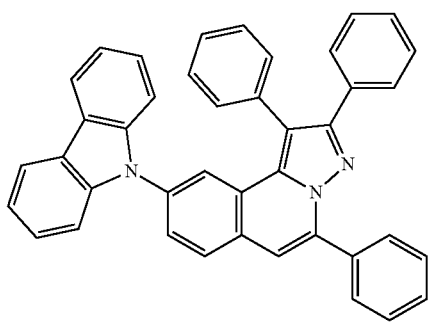

As an electron injection layer, lithium fluoride (LiF) was deposited to a thickness of 10 Å, and an Al cathode was employed to a thickness of 1,000 Å, and as a result, an OLED was manufactured.

Meanwhile, all the organic compounds required to manufacture the OLED were vacuum sublimation purified under $10^{-8}$ torr to $10^{-6}$ torr by each material to be used in the OLED manufacture.

Examples 1 to 23 and Comparative Examples 2 to 5

Organic electroluminescent devices were manufactured in the same manner as in Comparative Example 1 except that compounds shown in Table 4 were used instead of E1 used when forming the electron transfer layer.

2) Evaluation on Organic Light Emitting Device

Results of measuring driving voltage, light emission efficiency, color coordinate (CIE) and lifetime of the blue organic light emitting devices manufactured according to the present disclosure are as shown in Table 4.

TABLE 4

| Compound | Driving Voltage (V) | Efficiency (cd/A) | CIE (x, y) | Lifetime ($T_{95}$) |
|---|---|---|---|---|
| Example 1 | 9 | 5.00 | 6.39 | (0.134, 0.101) | 47 |
| Example 2 | 12 | 5.02 | 6.32 | (0.134, 0.101) | 42 |
| Example 3 | 25 | 5.06 | 6.36 | (0.134, 0.100) | 44 |
| Example 4 | 30 | 4.87 | 6.58 | (0.134, 0.100) | 51 |
| Example 5 | 35 | 4.90 | 6.39 | (0.134, 0.102) | 53 |
| Example 6 | 36 | 4.96 | 6.45 | (0.134, 0.102) | 51 |
| Example 7 | 86 | 4.93 | 6.53 | (0.134, 0.101) | 50 |
| Example 8 | 103 | 4.83 | 6.54 | (0.134, 0.100) | 47 |
| Example 9 | 113 | 4.87 | 6.70 | (0.134, 0.101) | 52 |
| Example 10 | 114 | 4.98 | 6.45 | (0.134, 0.101) | 44 |
| Example 11 | 165 | 5.01 | 6.18 | (0.134, 0.100) | 48 |
| Example 12 | 167 | 5.04 | 6.20 | (0.134, 0.101) | 40 |
| Example 13 | 230 | 5.00 | 6.27 | (0.134, 0.100) | 42 |
| Example 14 | 237 | 5.02 | 6.23 | (0.134, 0.100) | 47 |
| Example 15 | 253 | 4.91 | 6.73 | (0.134, 0.100) | 52 |
| Example 16 | 258 | 4.89 | 6.86 | (0.134, 0.101) | 51 |
| Example 17 | 272 | 4.96 | 6.70 | (0.134, 0.100) | 50 |
| Example 18 | 309 | 4.98 | 6.73 | (0.134, 0.101) | 50 |
| Example 19 | 365 | 4.94 | 6.64 | (0.134, 0.100) | 51 |
| Example 20 | 374 | 4.98 | 6.63 | (0.134, 0.101) | 42 |
| Example 21 | 391 | 5.08 | 6.47 | (0.134, 0.101) | 46 |
| Example 22 | 410 | 5.01 | 6.58 | (0.134, 0.100) | 40 |
| Example 23 | 414 | 5.13 | 6.40 | (0.134, 0.100) | 40 |
| Comparative Example 1 | E1 | 5.77 | 5.88 | (0.134, 0.100) | 30 |
| Comparative Example 2 | E2 | 5.78 | 5.94 | (0.134, 0.101) | 30 |
| Comparative Example 3 | E3 | 5.70 | 5.99 | (0.134, 0.100) | 31 |
| Comparative Example 4 | E4 | 5.71 | 5.89 | (0.134, 0.100) | 32 |
| Comparative Example 5 | E5 | 5.84 | 5.77 | (0.134, 0.101) | 28 |

As seen from the results of Table 4, the organic light emitting device using the electron transfer layer material of the blue organic light emitting device of the present disclosure had lower driving voltage and significantly improved light emission efficiency and lifetime compared to Comparative Examples 1 to 5.

Such a result is considered to be due to the fact that, when using the disclosed compound having proper length and strength, and flatness as an electron transfer layer, a compound in an excited state is made by receiving electrons under a specific condition, and particularly when an excited state is formed in the hetero-skeleton site of the compound, excited energy will move to a stable state before the excited hetero-skeleton site goes through other reactions, and as a result, the relatively stabilized compound is capable of efficiently transferring electrons without the compound being decomposed or destroyed. For reference, those that are stable when excited are considered to be aryl or acene-based compounds or polycyclic hetero-compounds.

Accordingly, it is considered that the compound of the present disclosure brings excellence in all aspects of driving, efficiency and lifetime by enhancing enhanced electron-transfer properties or improved stability.

Experimental Example 2

1) Manufacture of Organic Light Emitting Device

Comparative Example 6

A transparent indium tin oxide (ITO) electrode thin film obtained from glass for an OLED (manufactured by Samsung-Corning Co., Ltd.) was ultrasonic cleaned using trichloroethylene, acetone, ethanol and distilled water consecutively for 5 minutes each, stored in isopropanol, and used. Next, the ITO substrate was installed in a substrate folder of a vacuum deposition apparatus, and the following 4,4',4"-tris(N,N-(2-naphthyl)-phenylamino)triphenylamine (2-TNATA) was introduced to a cell in the vacuum deposition apparatus.

2-TNATA

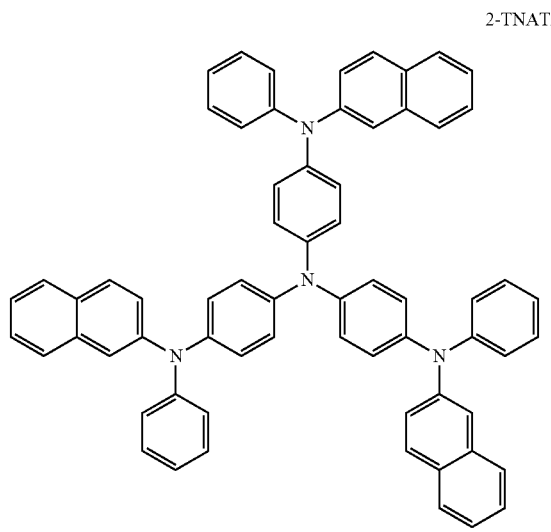 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

Subsequently, the chamber was evacuated until the degree of vacuum therein reached $10^{-6}$ torr, and then 2-TNATA was evaporated by applying a current to the cell to deposit a hole injection layer having a thickness of 600 Å on the ITO substrate. To another cell in the vacuum deposition apparatus, the following N,N'-bis(α-naphthyl)-N,N'-diphenyl-4,4'-diamine (NPB) was introduced, and evaporated by applying a current to the cell to deposit a hole transfer layer having a thickness of 300 Å on the hole injection layer.

NPB

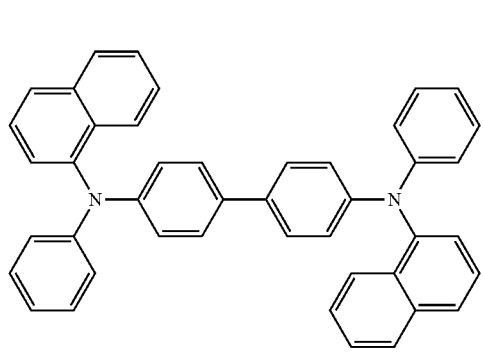

After forming the hole injection layer and the hole transfer layer as above, a blue light emitting material having a structure as below was deposited thereon as a light emitting layer. Specifically, in one side cell in the vacuum deposition apparatus, H1, a blue light emitting host material, was vacuum deposited to a thickness of 200 Å, and D1, a blue light emitting dopant material, was vacuum deposited thereon by 5% with respect to the host material.

H1

D1

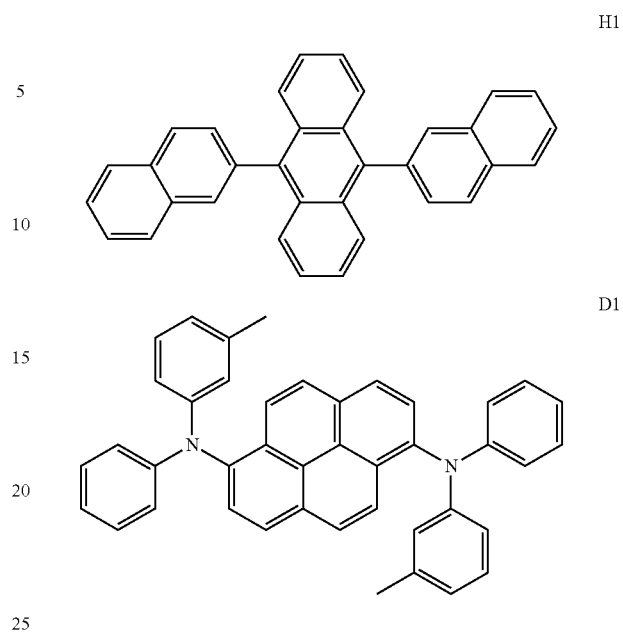

Subsequently, a compound of the following Structural Formula E1 was deposited to a thickness of 300 Å as an electron transfer layer.

E1

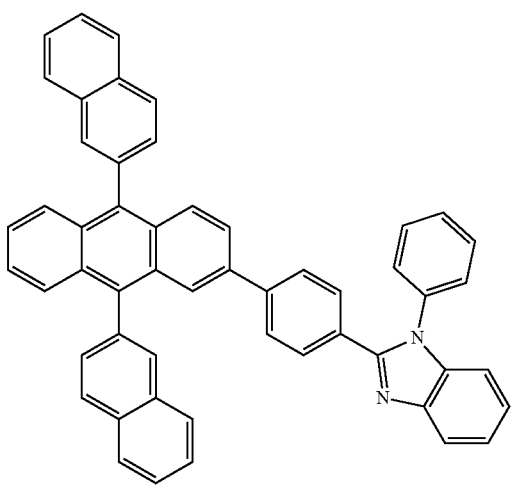

E2

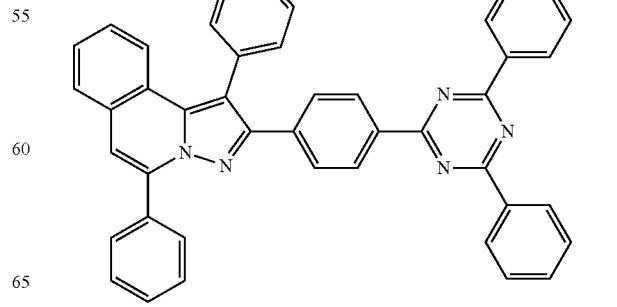

E3

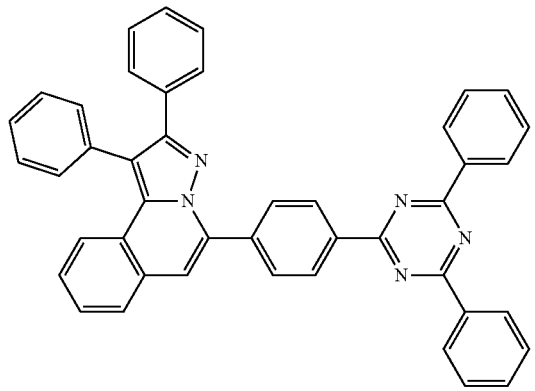

E4

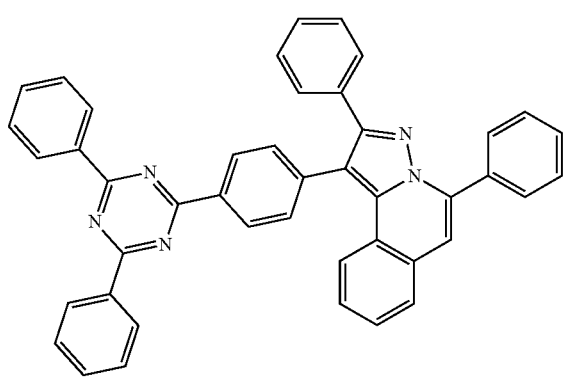

E5

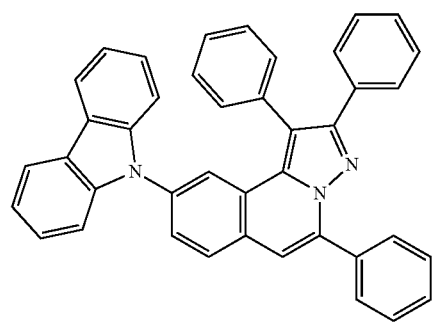

As an electron injection layer, lithium fluoride (LiF) was deposited to a thickness of 10 Å, and an Al cathode was employed to a thickness of 1,000 Å, and as a result, an OLED was manufactured. Meanwhile, all the organic compounds required to manufacture the OLED were vacuum sublimation purified under $10^{-8}$ torr to $10^{-6}$ torr by each material to be used in the OLED manufacture.

Examples 24 to 46 and Comparative Examples 7 to 10

Organic electroluminescent devices were manufactured in the same manner as in Comparative Example 6 except that, after forming the electron transfer layer E1 to a thickness of 250 Å, a hole blocking layer was formed to a thickness of 50 Å on the electron transfer layer using compounds shown in Table 5.

2) Evaluation on Organic Light Emitting Device

Results of measuring driving voltage, light emission efficiency, color coordinate (CIE) and lifetime of the blue organic light emitting devices manufactured according to the present disclosure are as shown in Table 5.

TABLE 5

| | Compound | Driving Voltage (V) | Efficiency (cd/A) | CIE (x, y) | Lifetime ($T_{95}$) |
|---|---|---|---|---|---|
| Example 24 | 9 | 4.89 | 6.54 | (0.134, 0.101) | 49 |
| Example 25 | 12 | 4.80 | 6.67 | (0.134, 0.100) | 48 |
| Example 26 | 25 | 4.88 | 6.51 | (0.134, 0.100) | 54 |
| Example 27 | 30 | 4.70 | 6.60 | (0.134, 0.101) | 54 |
| Example 28 | 35 | 4.69 | 6.53 | (0.134, 0.100) | 57 |
| Example 29 | 36 | 4.61 | 6.55 | (0.134, 0.101) | 56 |
| Example 30 | 86 | 4.66 | 6.56 | (0.134, 0.101) | 51 |
| Example 31 | 103 | 4.70 | 6.60 | (0.134, 0.102) | 57 |
| Example 32 | 113 | 4.75 | 6.57 | (0.134, 0.100) | 56 |
| Example 33 | 114 | 4.82 | 6.49 | (0.134, 0.101) | 55 |
| Example 34 | 165 | 4.77 | 6.62 | (0.134, 0.100) | 53 |
| Example 35 | 167 | 4.80 | 6.38 | (0.134, 0.100) | 57 |
| Example 36 | 230 | 4.75 | 6.35 | (0.134, 0.102) | 58 |
| Example 37 | 237 | 4.66 | 6.40 | (0.134, 0.101) | 59 |
| Example 38 | 253 | 4.75 | 6.62 | (0.134, 0.101) | 57 |
| Example 39 | 258 | 4.72 | 6.50 | (0.134, 0.100) | 59 |
| Example 40 | 272 | 4.78 | 6.61 | (0.134, 0.100) | 50 |
| Example 41 | 309 | 4.73 | 6.55 | (0.134, 0.101) | 53 |
| Example 42 | 365 | 4.70 | 6.69 | (0.134, 0.100) | 51 |
| Example 43 | 374 | 4.59 | 6.66 | (0.134, 0.101) | 49 |
| Example 44 | 391 | 4.87 | 6.69 | (0.134, 0.101) | 50 |
| Example 45 | 410 | 4.83 | 6.75 | (0.134, 0.101) | 51 |
| Example 46 | 414 | 4.90 | 6.33 | (0.134, 0,101) | 48 |
| Comparative Example 6 | E1 | 5.40 | 5.75 | (0.134, 0.100) | 39 |
| Comparative Example 7 | E2 | 5.38 | 5.65 | (0.134, 0.101) | 36 |
| Comparative Example 8 | E3 | 5.37 | 5.72 | (0.134, 0.100) | 39 |
| Comparative Example 9 | E4 | 5.44 | 5.63 | (0.134, 0.101) | 38 |
| Comparative Example 10 | E5 | 5.30 | 5.50 | (0.134, 0.100) | 37 |

As seen from the results of Table 5, the organic light emitting device using the hole blocking layer material of the blue organic light emitting device of the present disclosure had lower driving voltage and significantly improved light emission efficiency and lifetime compared to Comparative Examples 6 to 10.

Such a result is considered to be due to the fact that, when holes pass through an electron transfer layer and reach an anode without binding in a light emitting layer, efficiency and lifetime decrease in an OLED. When using a compound having a deep HOMO level as a hole blocking layer in order to prevent such a phenomenon, the holes trying to pass through the light emitting layer and reach the cathode are blocked by an energy barrier of the hole blocking layer.

As a result, it is considered that probability of the holes and electrons forming excitons increases, and possibility of being emitted as light in the light emitting layer increases, and the compound of the present disclosure brings excellence in all aspects of driving, efficiency and lifetime.

Experimental Example 3

1) Manufacture of Organic Light Emitting Device

Examples 47 to 69 and Comparative Examples 11 to 15

A glass substrate on which ITO was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), organic materials were formed in a 2-stack white organic light emitting device (WOLED) structure. As for the first stack, TAPC was the al vacuum deposited first to a thickness of 300 Å to form a hole transfer layer. After forming the hole transfer layer, a light emitting layer was thermal vacuum deposited thereon as follows. As the light emitting layer, TCz1, a host, was doped with FIrpic, a blue phosphorescent dopant, by 8%, and deposited to 300 Å. After forming an electron transfer layer to 400 Å using TmPyPB, a compound described in the following Table 6 was doped with $Cs_2CO_3$ by 20% to form as a charge generation layer to 100 Å.

As for the second stack, $MoO_3$ was thermal vacuum deposited first to a thickness of 50 Å to form a hole injection layer. A hole transfer layer, a common layer, was formed to 100 Å by doping $MoO_3$ to TAPC by 20%, and then depositing TAPC to 300 Å. A light emitting layer was foiled thereon by doping $Ir(ppy)_3$, a green phosphorescent dopant, to TCz1, a host, by 8%, and depositing the result to 300 Å, and then an electron transfer layer was formed to 600 Å using TmPyPB. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic light emitting device was manufactured.

Meanwhile, all the organic compounds required to manufacture the OLED were vacuum sublimation purified under $10^{-8}$ torr to $10^{-6}$ torr for each material to be used in the OLED manufacture.

-continued

TCz1

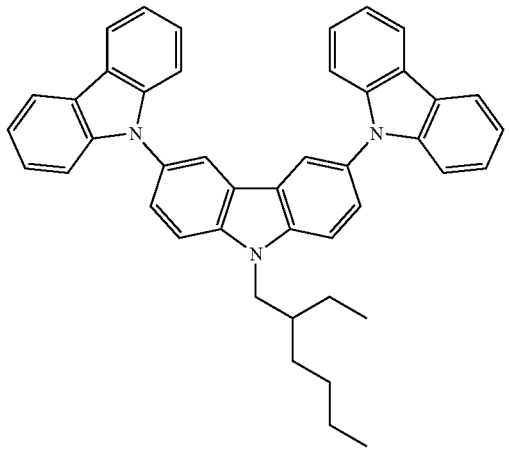

FIrpic

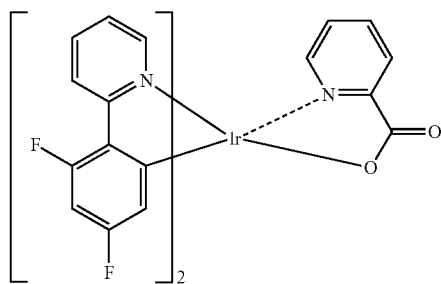

Ir(ppy)3

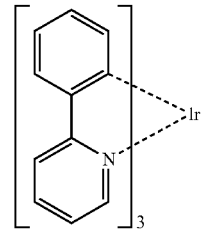

TAPC

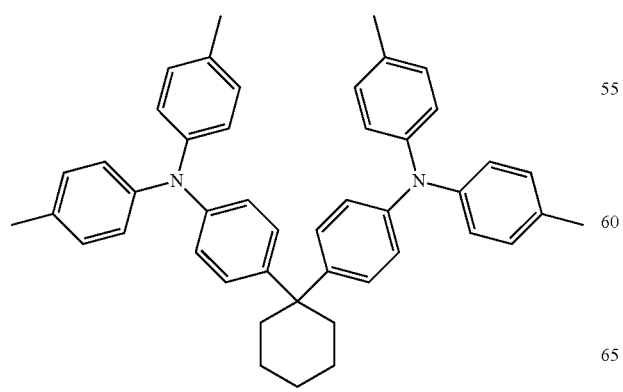

TmPyPB

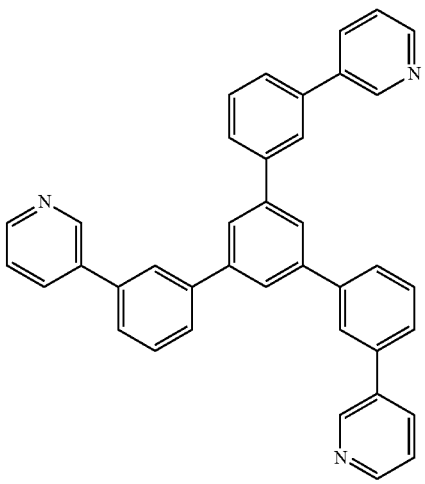

-continued

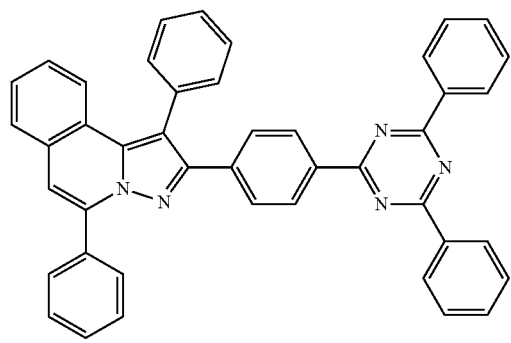
E2

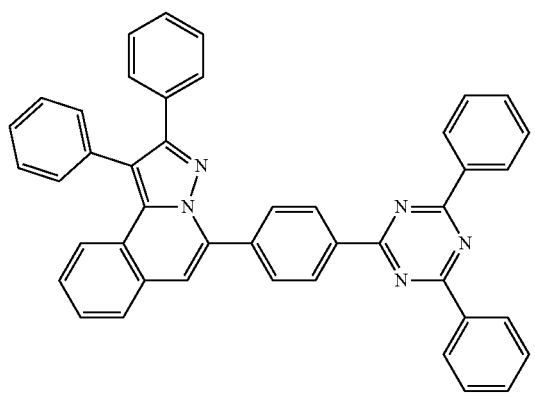
E3

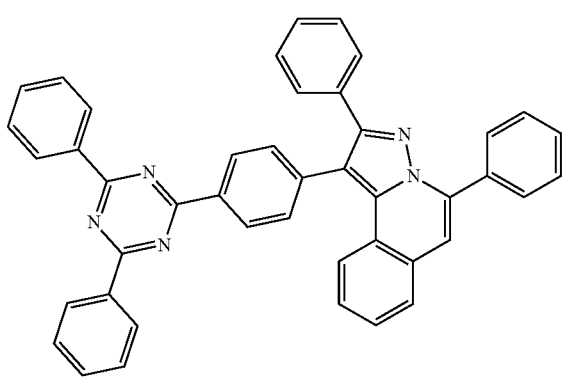
E4

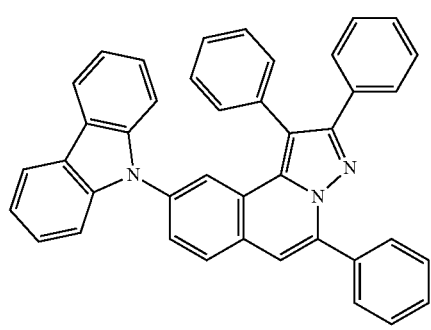
E5

2) Driving Voltage and Light Emission Efficiency of Organic Light Emitting Device For each of the organic light emitting devices manufactured as above, electroluminescent (EL) properties were measured using M7000 manufactured by McScience Inc., and with the measurement results, $T_{95}$ was measured when standard luminance was 3,500 cd/m² through a lifetime measurement system (M6000) manufactured by McScience Inc. Results of measuring driving voltage, light emission efficiency, external quantum efficiency and color coordinate (CIE) of the white organic light emitting devices manufactured according to the present disclosure are as shown in Table 6.

TABLE 6

| | Compound | Driving Voltage (V) | Efficiency (cd/A) | CIE (x, y) | Lifetime ($T_{95}$) |
|---|---|---|---|---|---|
| Example 47 | 9 | 7.13 | 63.67 | (0.220, 0.434) | 155 |
| Example 48 | 12 | 7.01 | 62.44 | (0.219, 0.430) | 163 |
| Example 49 | 25 | 7.10 | 63.40 | (0.219, 0.429) | 160 |
| Example 50 | 30 | 7.18 | 61.55 | (0.218, 0.427) | 167 |
| Example 51 | 35 | 7.05 | 59.45 | (0.218, 0.431) | 148 |
| Example 52 | 36 | 7.22 | 63.80 | (0.209, 0.421) | 131 |
| Example 53 | 86 | 7.17 | 62.77 | (0.210, 0.431) | 149 |
| Example 54 | 103 | 7.10 | 63.89 | (0.209, 0.422) | 167 |
| Example 55 | 113 | 7.25 | 60.77 | (0.212, 0.420) | 148 |
| Example 56 | 114 | 7.24 | 62.70 | (0.208, 0,420) | 165 |
| Example 57 | 165 | 7.14 | 58.99 | (0.212, 0.418) | 159 |
| Example 58 | 167 | 7.11 | 59.50 | (0.203, 0.415) | 160 |
| Example 59 | 230 | 7.12 | 58.81 | (0.219, 0.410) | 144 |
| Example 60 | 237 | 7.14 | 61.08 | (0.217, 0.420) | 129 |
| Example 61 | 253 | 7.22 | 62.01 | (0.216, 0.427) | 145 |
| Example 62 | 258 | 7.17 | 62.18 | (0.221, 0.423) | 170 |
| Example 63 | 272 | 7.19 | 60.98 | (0.219, 0.411) | 138 |
| Example 64 | 309 | 7.18 | 59.11 | (0.210, 0.422) | 140 |
| Example 65 | 365 | 7.22 | 59.55 | (0.211, 0.415) | 155 |
| Example 66 | 374 | 7.16 | 61.33 | (0.218, 0.410) | 133 |
| Example 67 | 391 | 7.20 | 60.88 | (0.210, 0.420) | 130 |
| Example 68 | 410 | 7.19 | 59.96 | (0.211, 0.417) | 137 |
| Example 69 | 414 | 7.06 | 64.33 | (0.209, 0.419) | 185 |
| Comparative Example 11 | TmPyPB | 7.81 | 52.51 | (0.233, 0.432) | 109 |
| Comparative Example 12 | E2 | 7.84 | 51.07 | (0.234, 0.439) | 106 |
| Comparative Example 13 | E3 | 7.90 | 50.88 | (0.229, 0.423) | 116 |
| Comparative Example 14 | E4 | 7.98 | 51.00 | (0.228, 0.435) | 109 |
| Comparative Example 15 | E5 | 7.89 | 50.84 | (0.226, 0.434) | 107 |

As seen from the results of Table 6, the organic light emitting device using the charge generation layer material of the 2-stack white organic light emitting device of the present disclosure had lower driving voltage and improved light emission efficiency compared to Comparative Examples 11 to 15.

Such a result is considered to be due to the fact that the compound of the present disclosure used as an N-type charge generation layer formed with the disclosed skeleton having proper length and strength, and flatness and a proper hetero-compound capable of binding to metals forms a gap state in the N-type charge generation layer by doping an alkali metal or an alkaline earth metal thereto, and electrons produced from a P-type charge generation layer are readily injected into an electron transfer layer through the gap state produced in the N-type charge generation layer. Accordingly, the P-type charge generation layer may favorably inject and transfer electrons to the N-type charge generation layer, and as a result, driving voltage was lowered, and efficiency and lifetime were improved in the organic light emitting device.

The invention claimed is:

1. A heterocyclic compound represented by the following Chemical Formula 1:

[Chemical Formula 1]

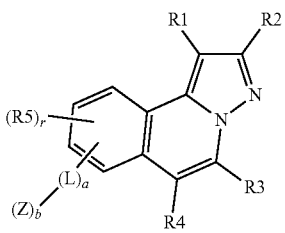

wherein, in Chemical Formula 1,

R1 to R5 are each independently hydrogen; deuterium; a halogen group; a cyano group; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms;

L is a direct bond; a substituted or unsubstituted arylene group having 6 to 60 carbon atoms; or a substituted or unsubstituted heteroarylene group having 2 to 60 carbon atoms; and Z is a substituted or unsubstituted aryl group having 10 to 60 carbon atoms; or a substituted or unsubstituted phosphine oxide group, or represented by the following Chemical Formula 2;

[Chemical Formula 2]

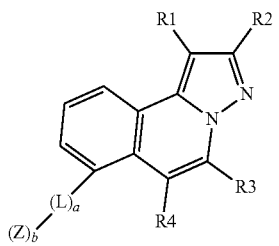

in Chemical Formula 2,

X1 to X3 are each CR or N, and at least one thereof is N;

R, R21 and R22 are each independently hydrogen; deuterium; a substituted or unsubstituted alkyl group having 1 to 60 carbon atoms; a substituted or unsubstituted aryl group having 6 to 60 carbon atoms; or a substituted or unsubstituted heteroaryl group having 2 to 60 carbon atoms;

adjacent groups among X1 to X3, R21 and R22 may bond to each other to form a substituted or unsubstituted ring;

r is an integer of 0 to 3;

a and b are each an integer of 1 to 5; and when r, a and b are each 2 or greater, substituents in the parentheses are the same as or different from each other.

2. The heterocyclic compound of claim 1, wherein Chemical Formula 1 is represented by any one of the following Chemical Formulae 1-1 to 1-4:

[Chemical Formula 1-1]

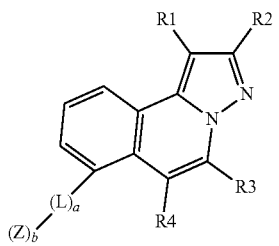

[Chemical Formula 1-2]

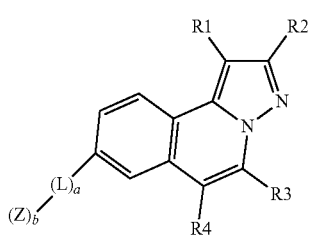

[Chemical Formula 1-3]

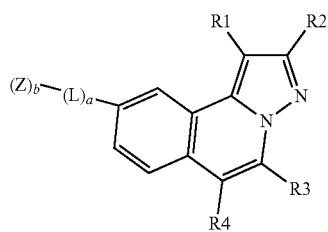

[Chemical Formula 1-4]

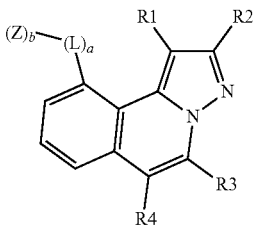

in Chemical Formulae 1-1 to 1-4, each substituent has the same definition as in Chemical Formula 1.

3. The heterocyclic compound of claim 1, wherein Z is a substituted or unsubstituted anthracenyl group; or a phosphine oxide group unsubstituted or substituted with an alkyl group, or represented by Chemical Formula 2.

4. The heterocyclic compound of claim 1, wherein Chemical Formula 2 is any one selected from among the following structural formulae:

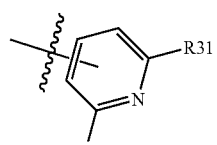

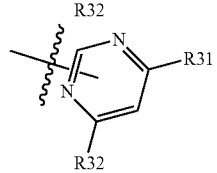

-continued

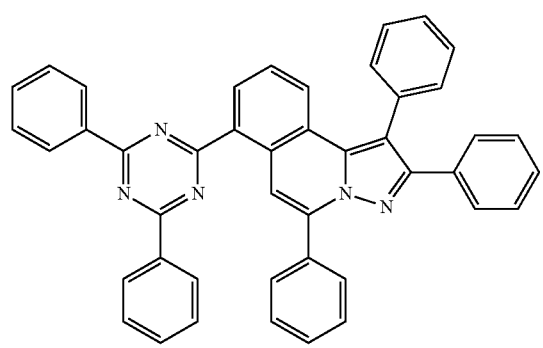

in the structural formulae,

R31 and R32 are each independently a substituted or unsubstituted alkyl group having 1 to 20 carbon atoms; a substituted or unsubstituted aryl group having 6 to 60 carbon atoms; or a substituted or unsubstituted heteroaryl group having 2 to 60 carbon atoms, and R33 is hydrogen; deuterium; or a substituted or unsubstituted aryl group having 6 to 60 carbon atoms.

5. The heterocyclic compound of claim 1, wherein at least two of R1 to R3 are each independently a cyano group; a substituted or unsubstituted alkyl group having 1 to 10 carbon atoms; or a substituted or unsubstituted aryl group having 6 to 20 carbon atoms.

6. The heterocyclic compound of claim 1, wherein Chemical Formula 1 is represented by any one of the following compounds:

1

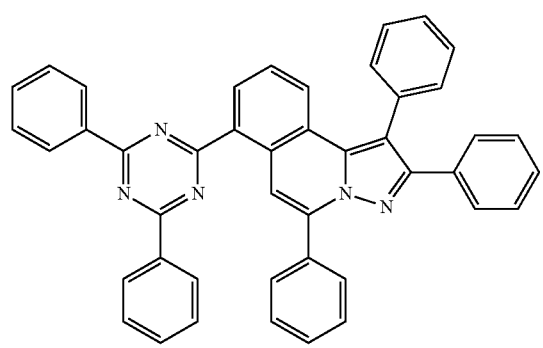

2

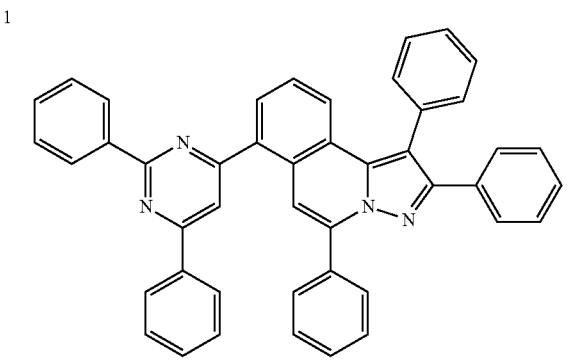

3

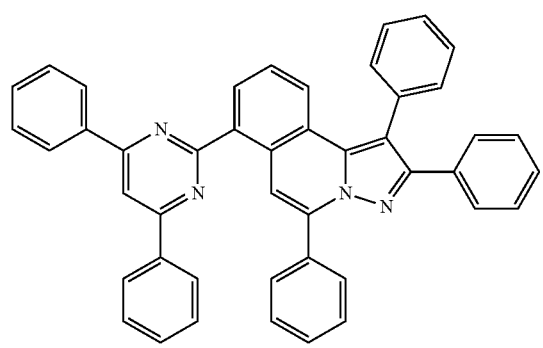

4

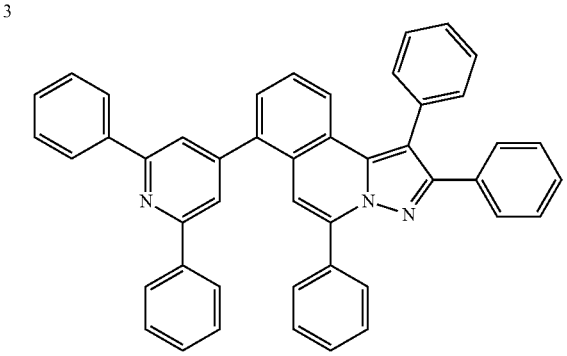

5

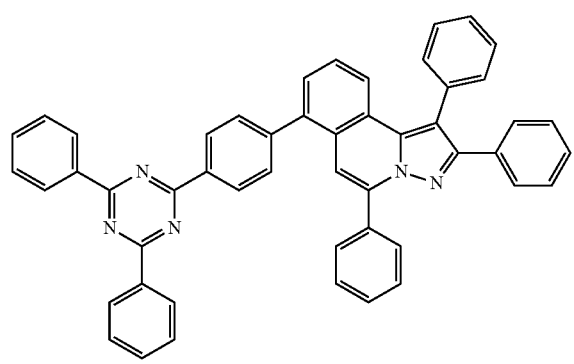

6

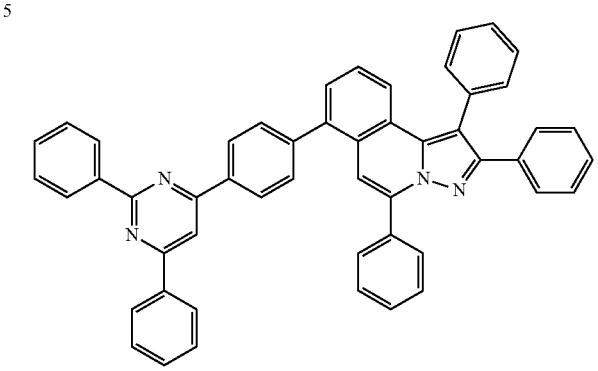

-continued
7
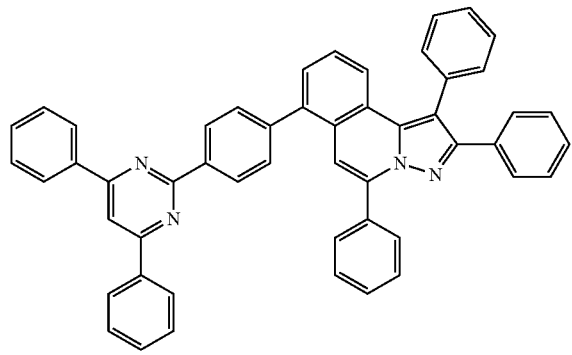
8
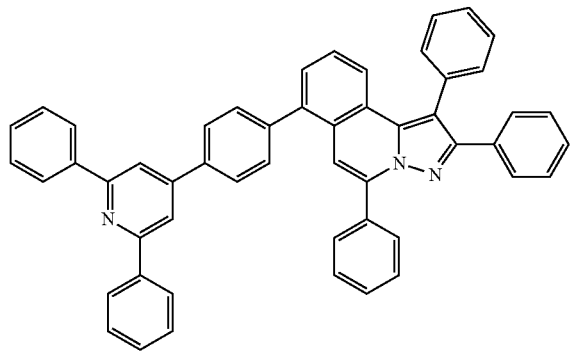
9
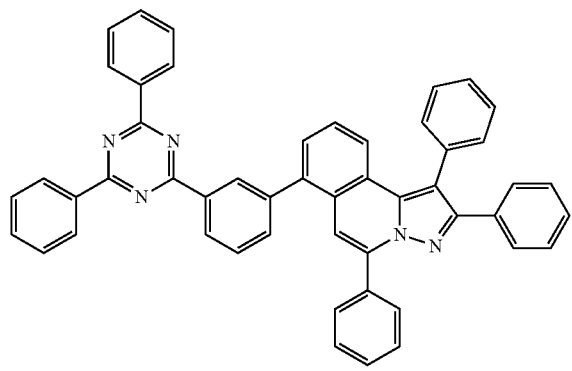
10
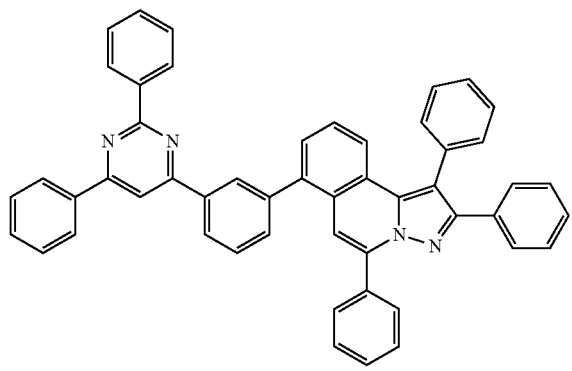
11
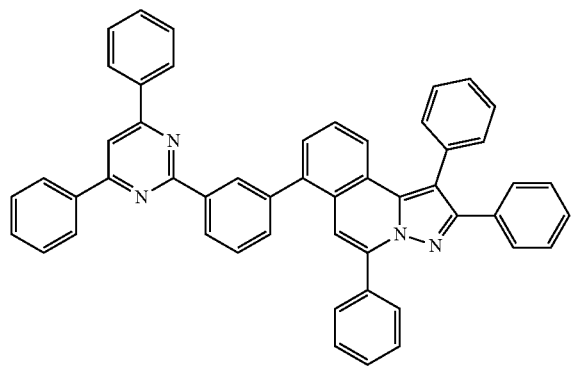
12
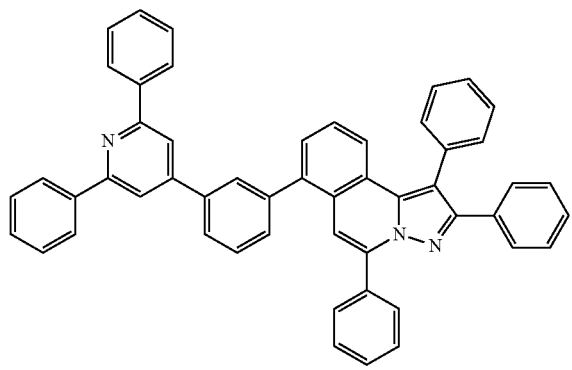
13
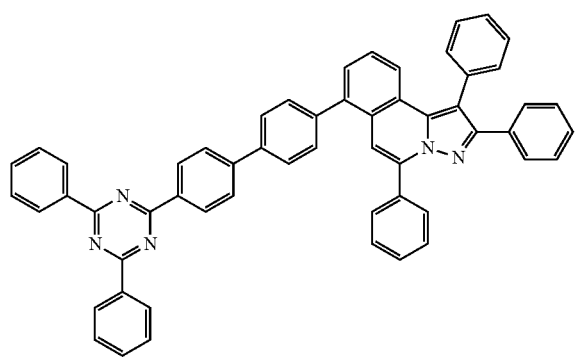
14
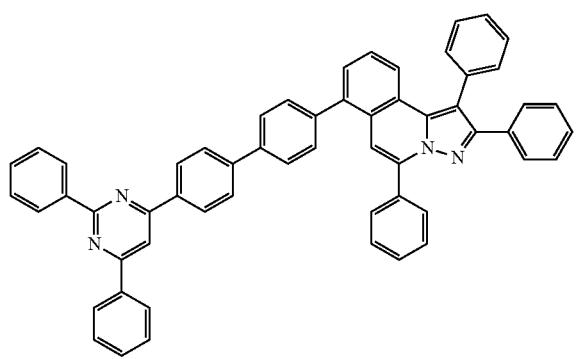

-continued
15
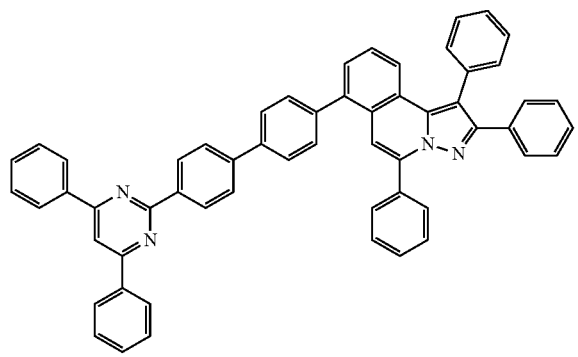
16
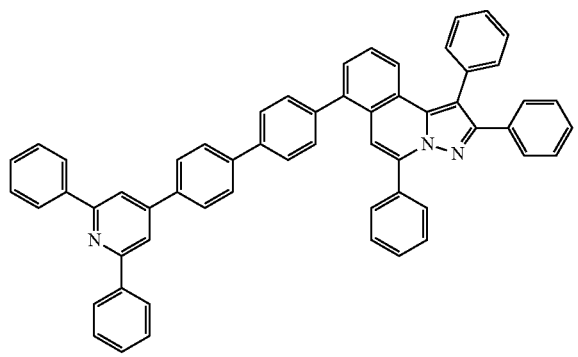
17
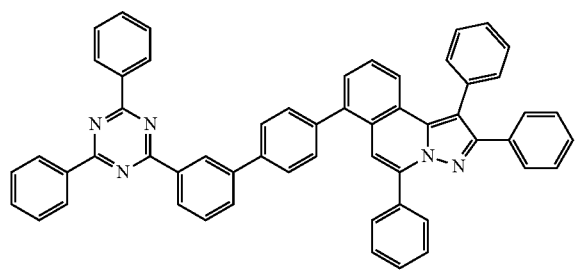
18
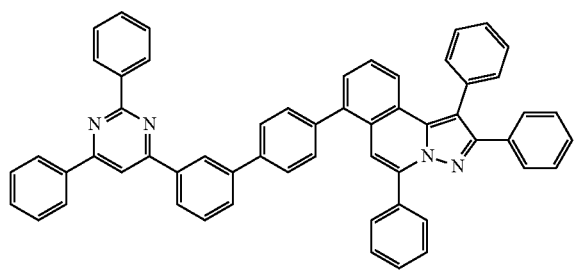
19
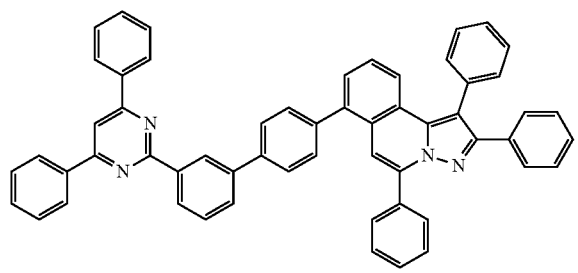
20
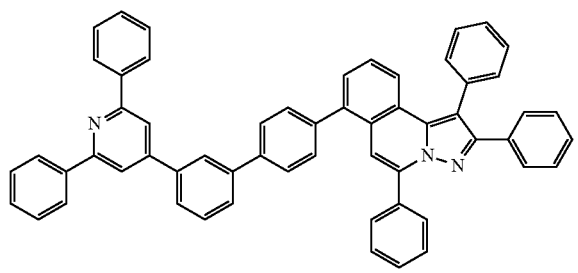
21
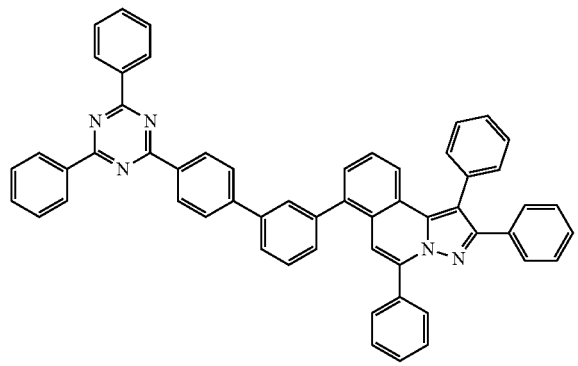
22
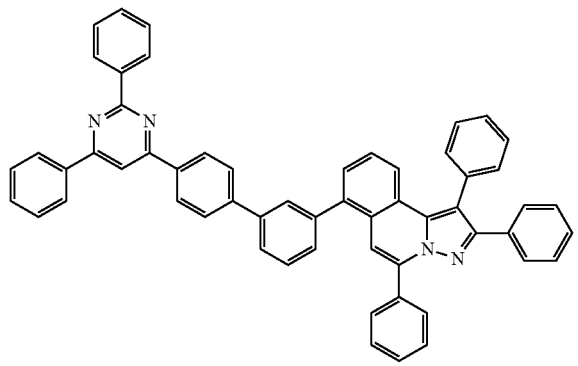

-continued
23
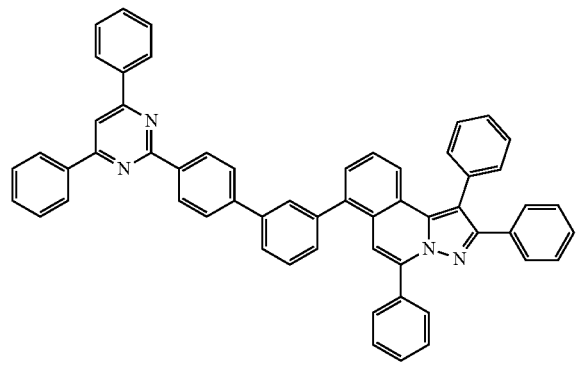
24
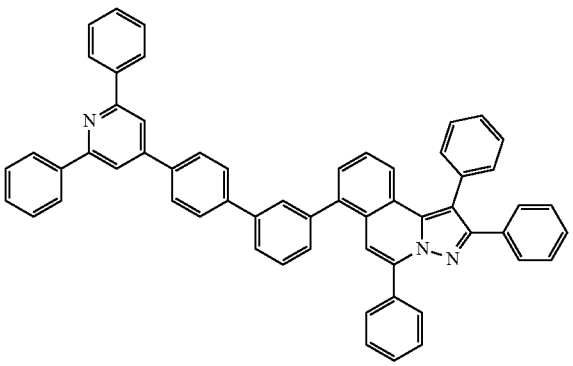
25
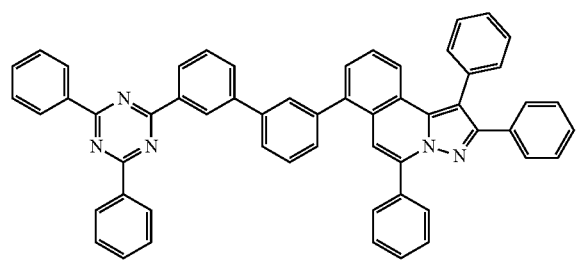
26
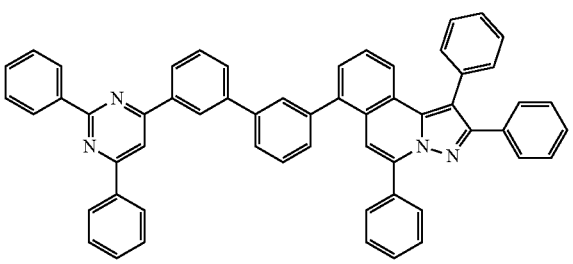
27
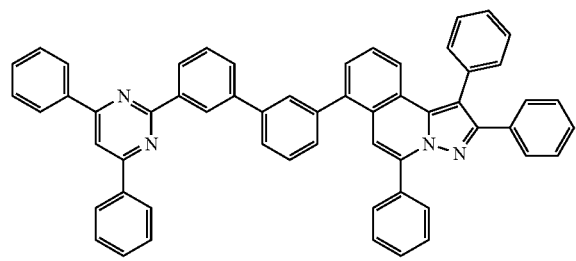
28
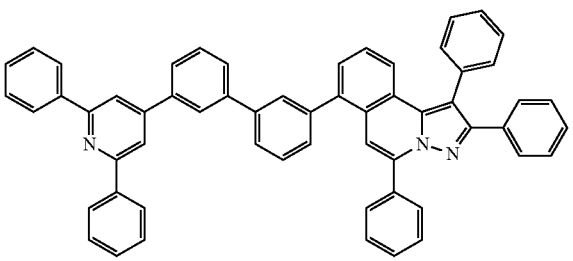
29
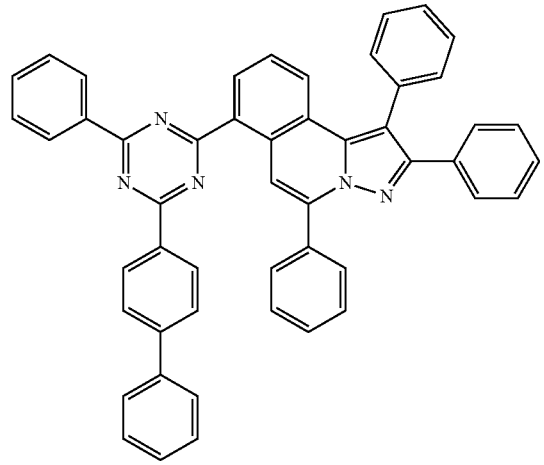
30
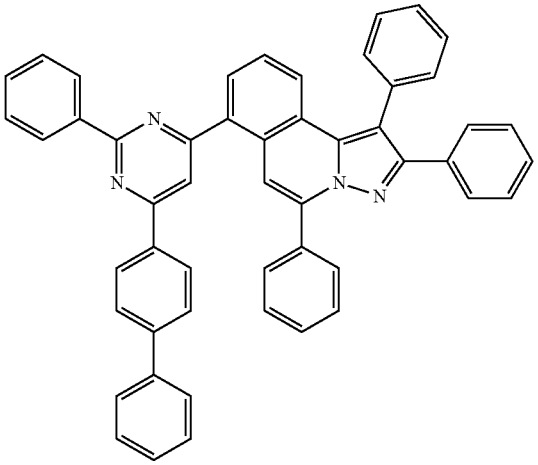

-continued
31
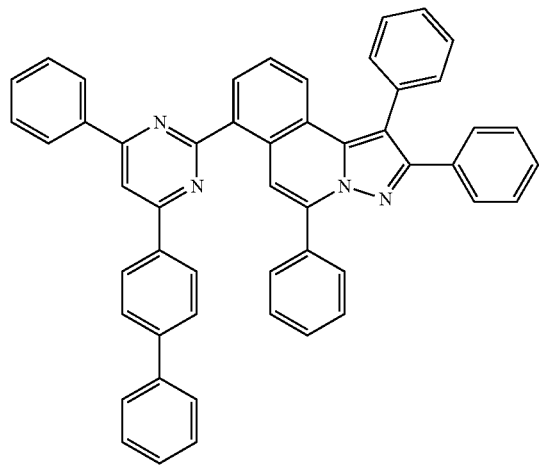
32
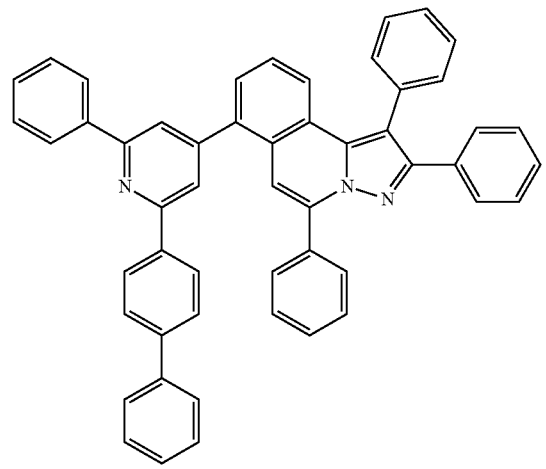
33
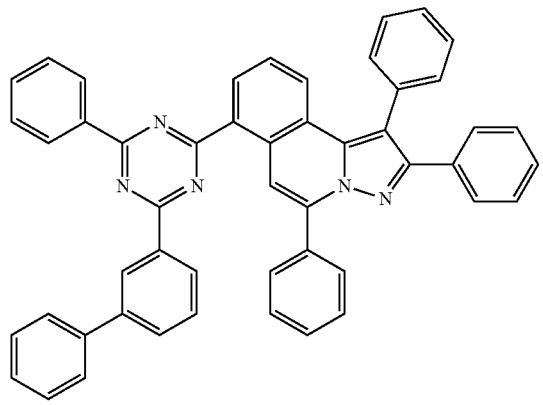
34
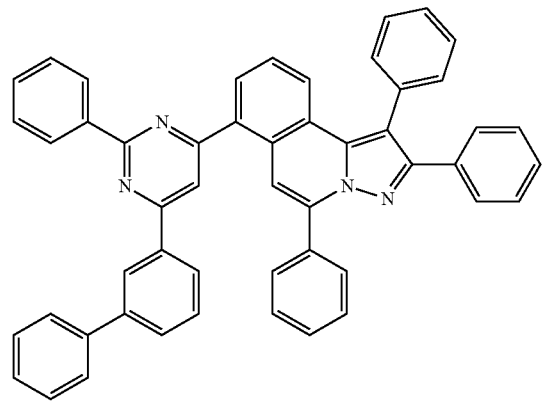
35
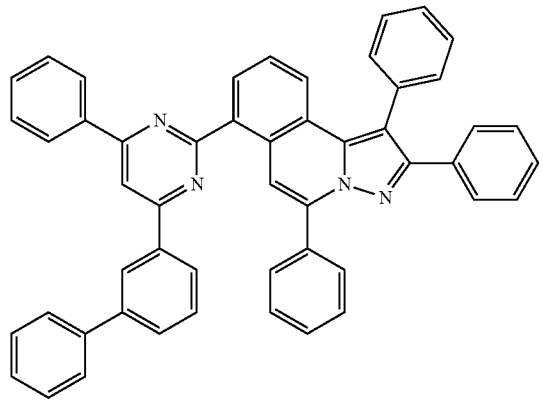
36
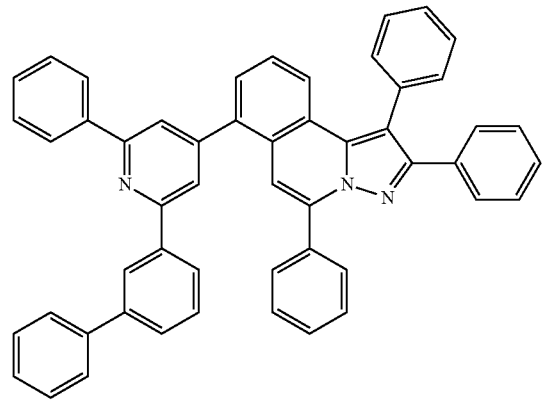

-continued
37
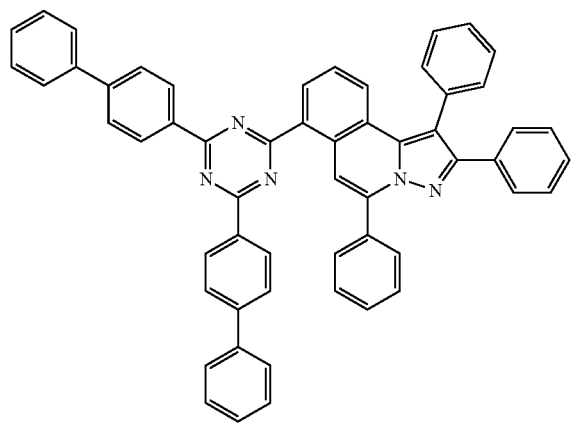
38
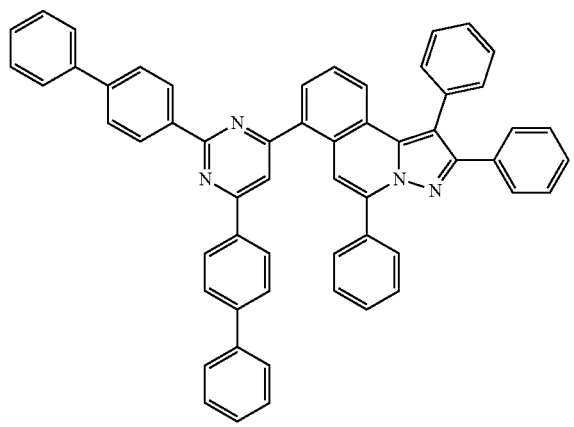
39
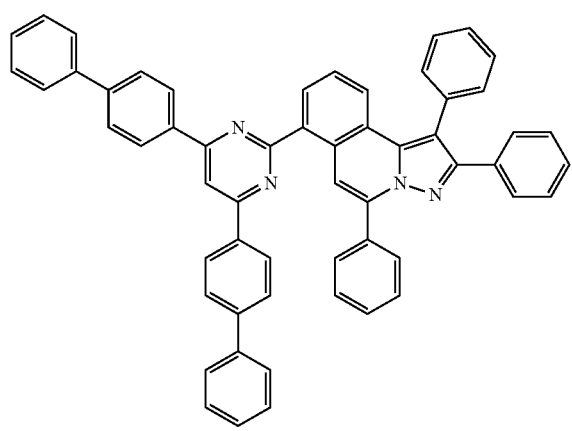
40
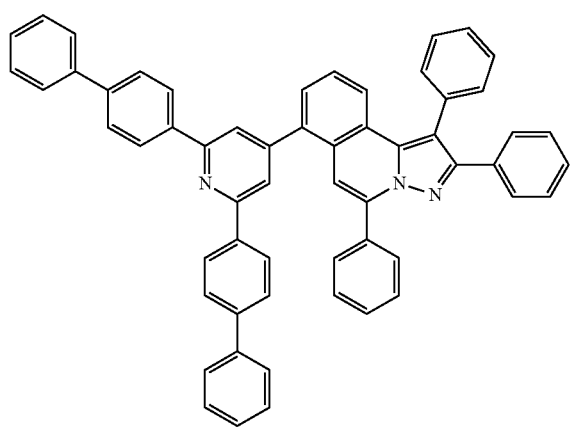
41
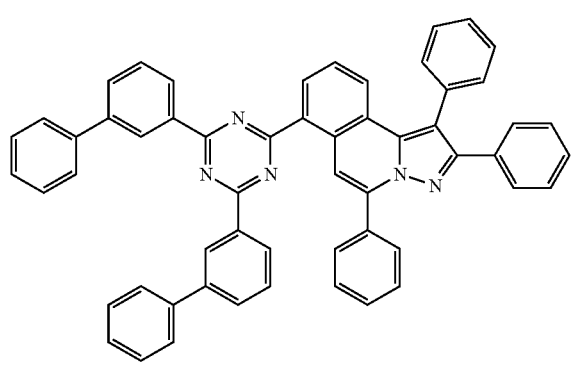
42
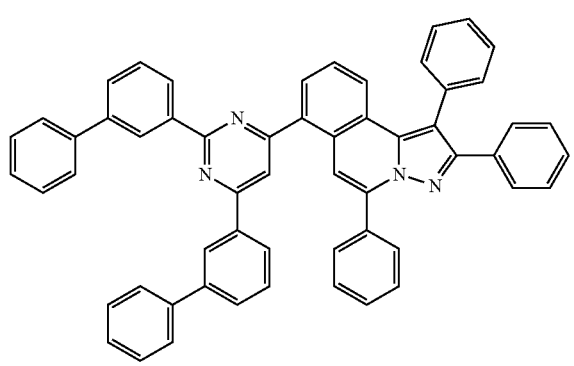
43
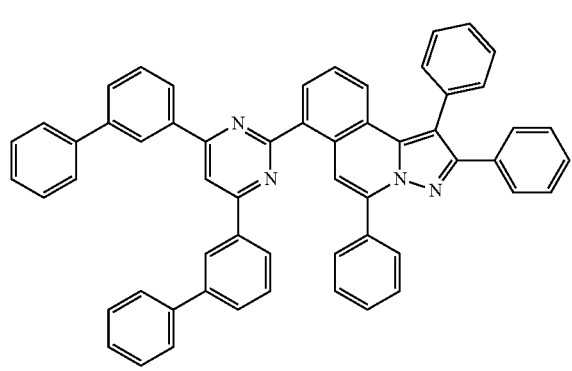
44
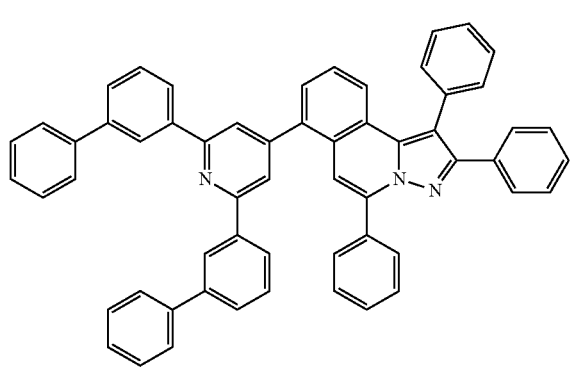

45
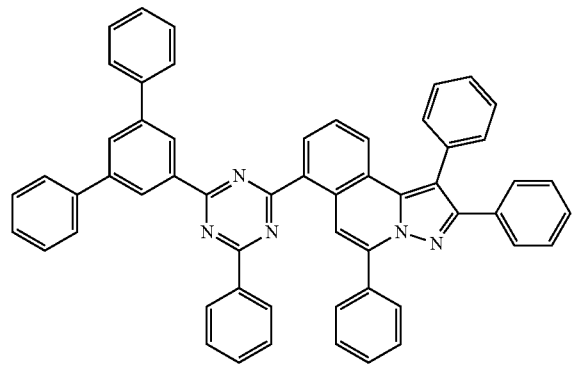
46
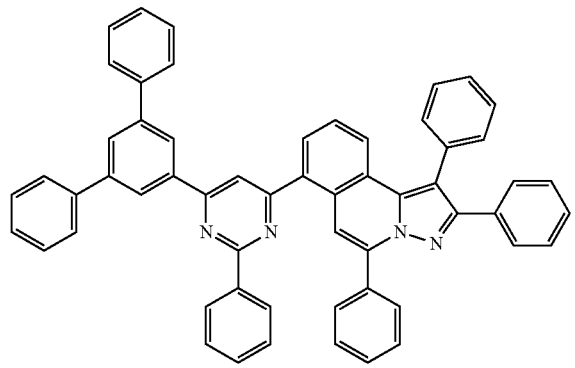
47
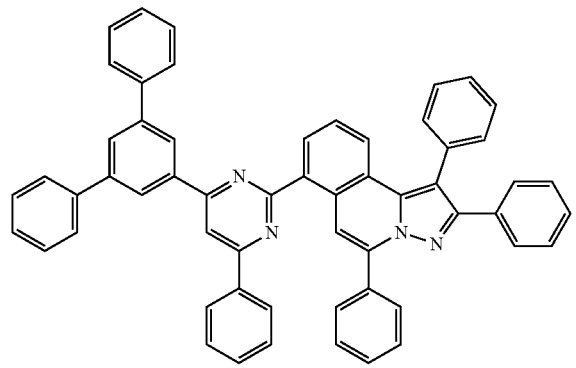
48
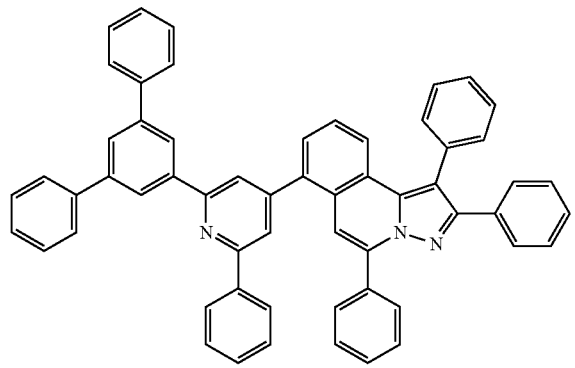
49
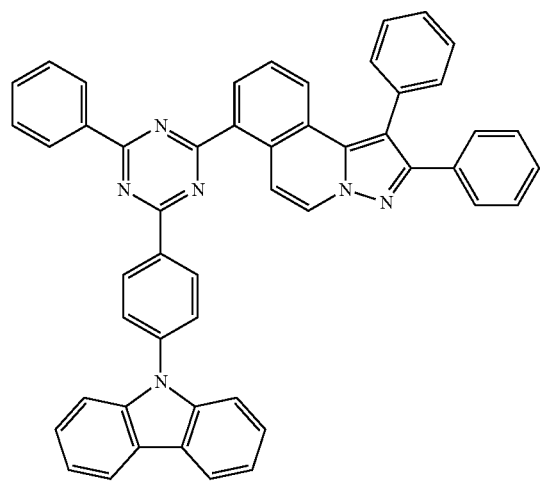
50
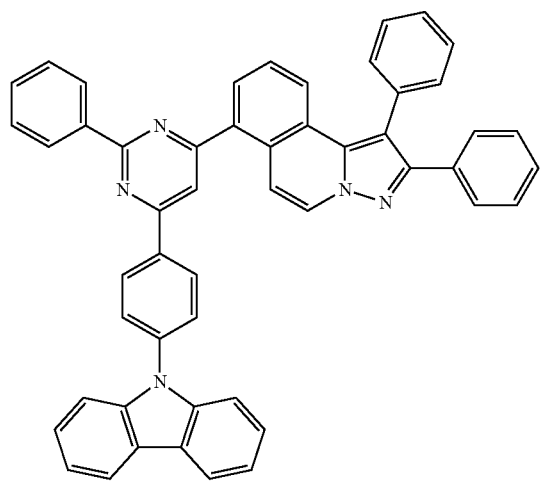

-continued
51
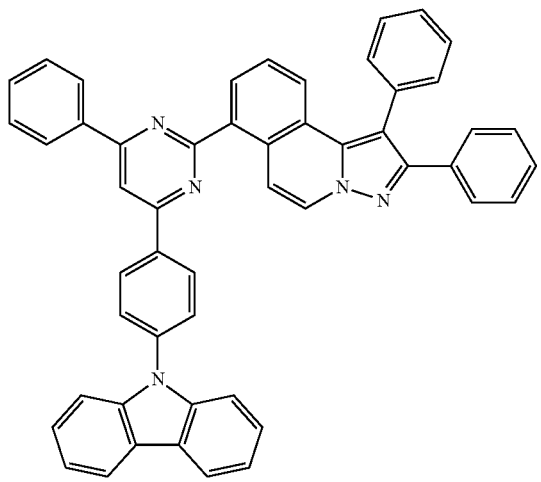
52
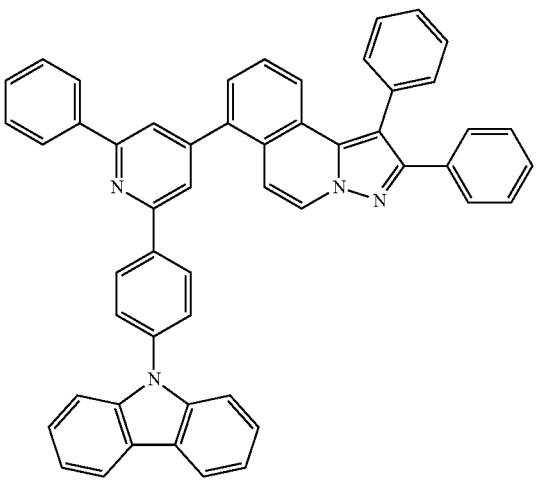
53
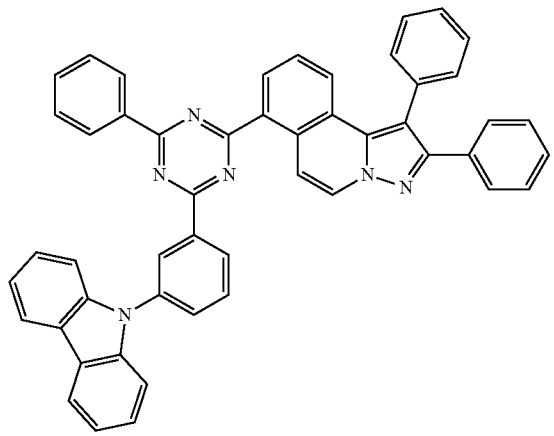
54
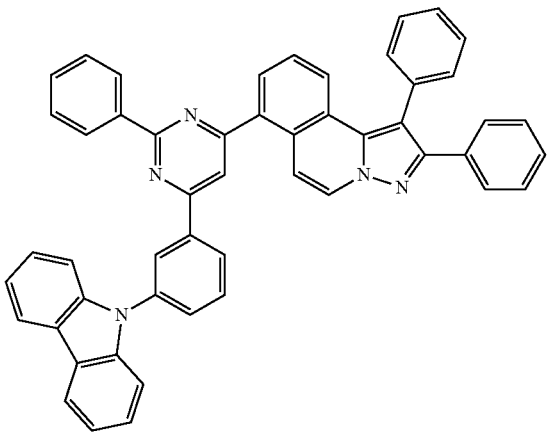
55
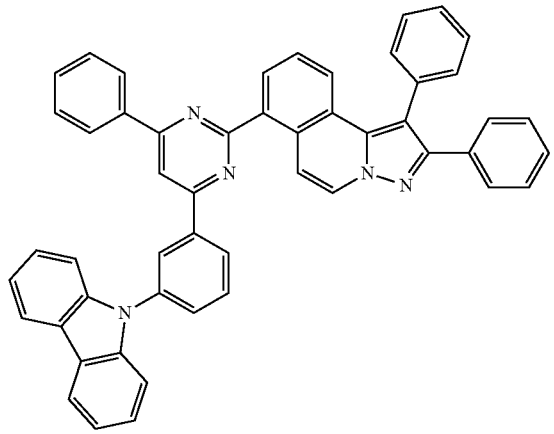
56
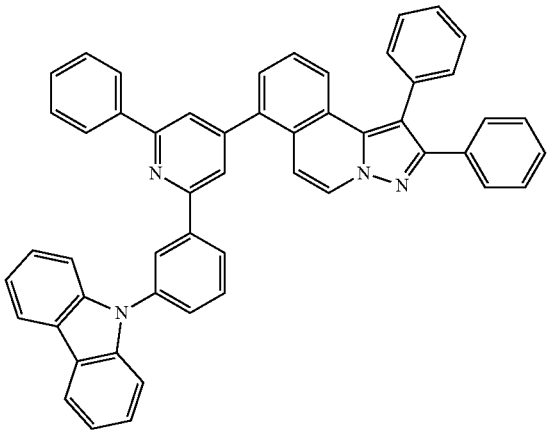

57
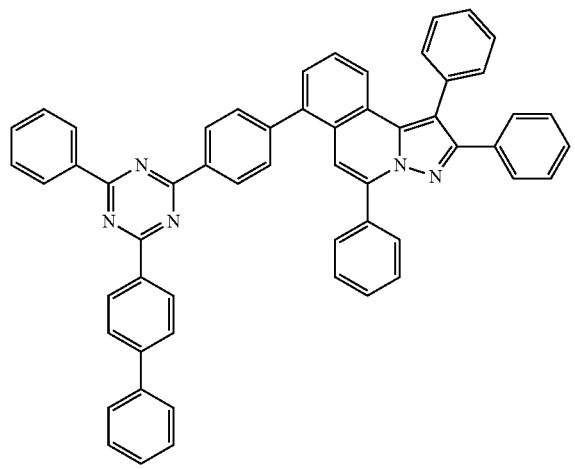
58
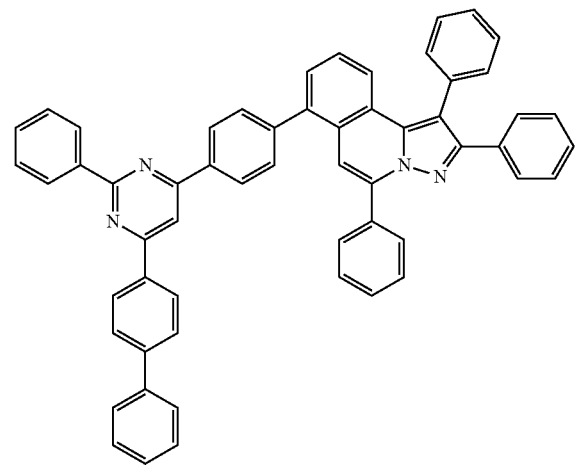
59
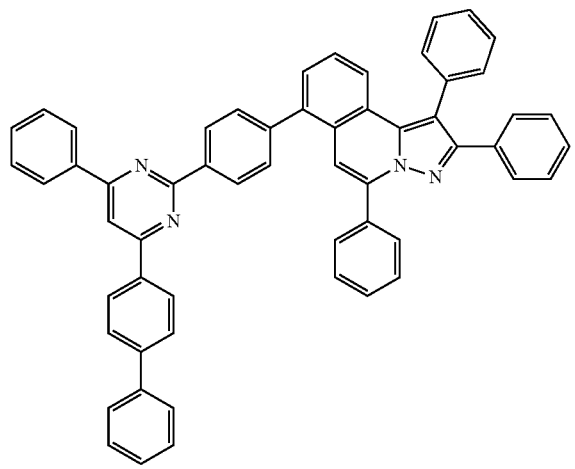
60
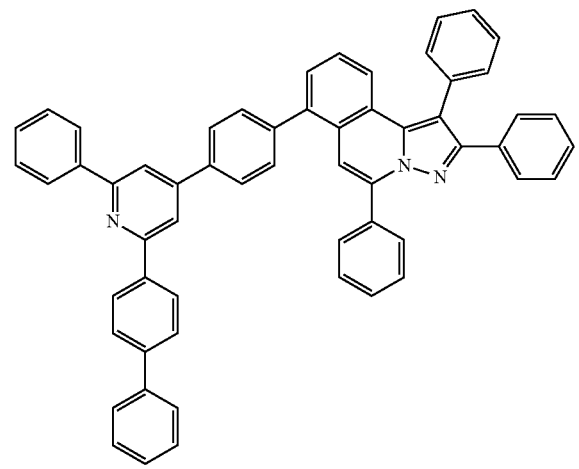
61
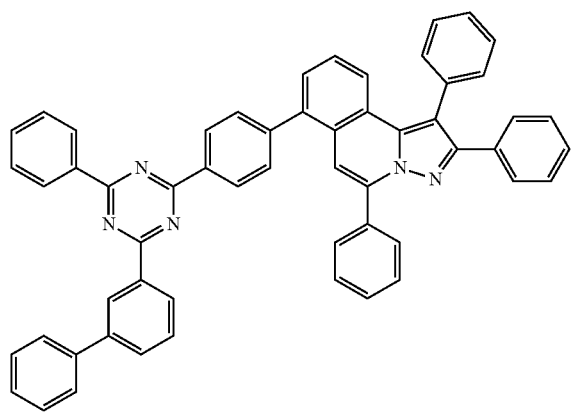
62
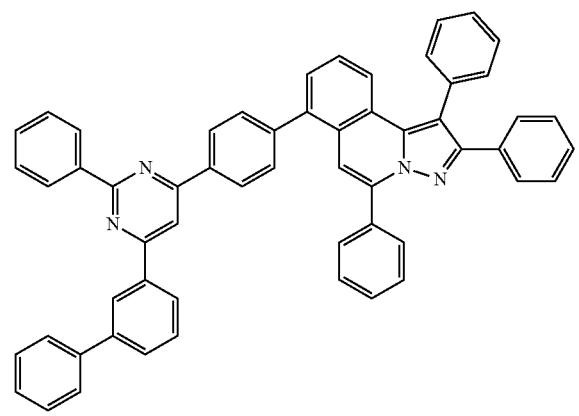

-continued
63
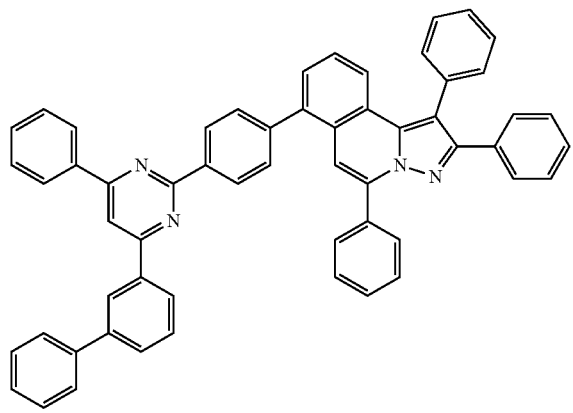
64
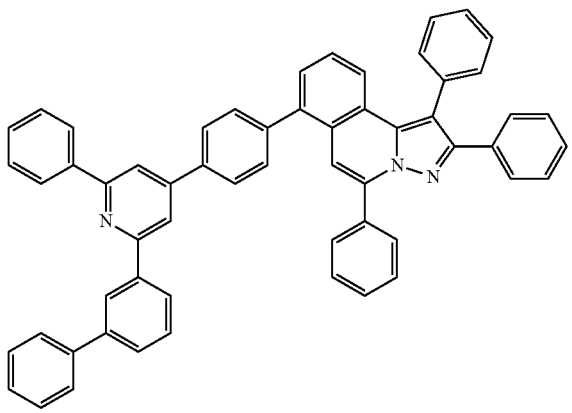
65
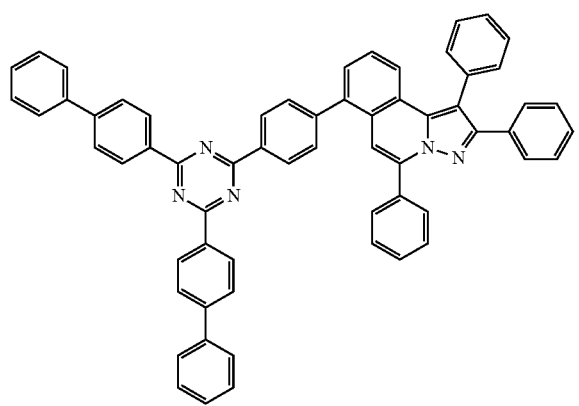
66
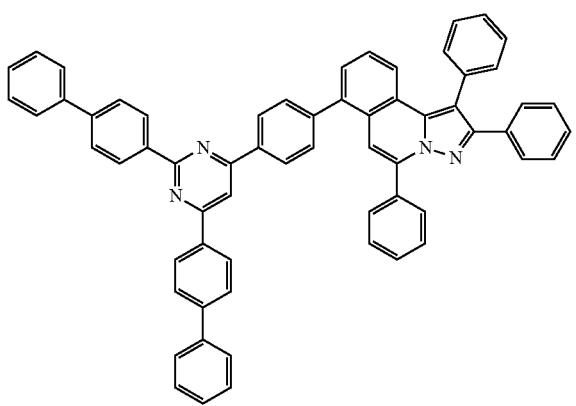
67
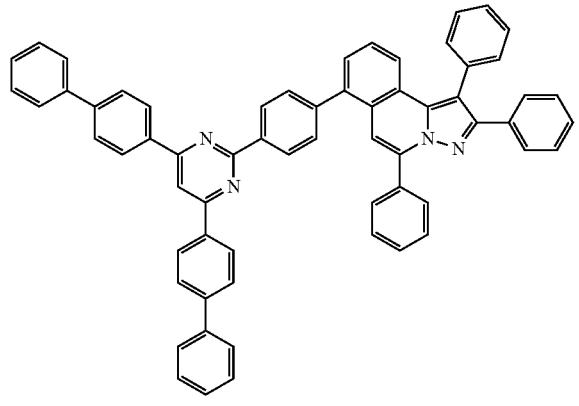
68
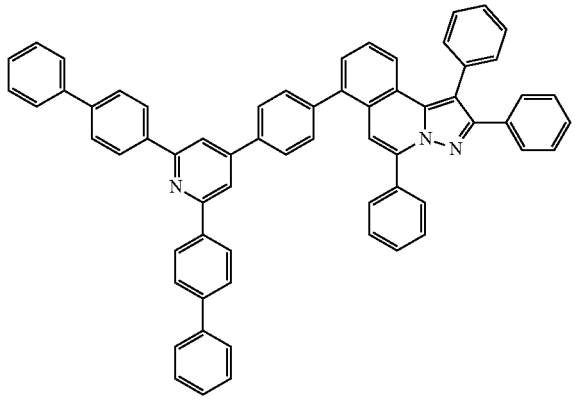
69
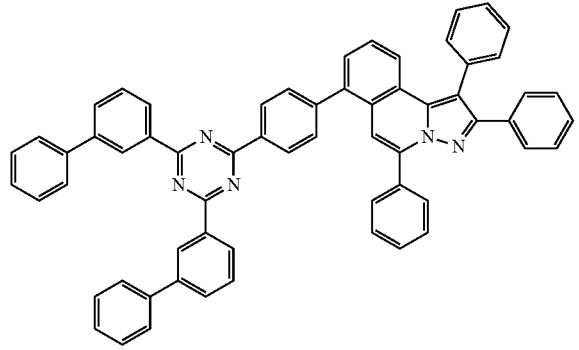
70
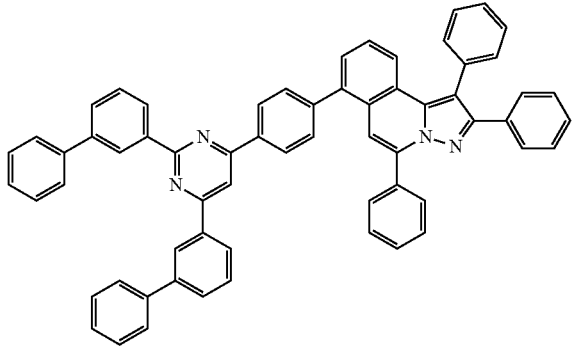

71
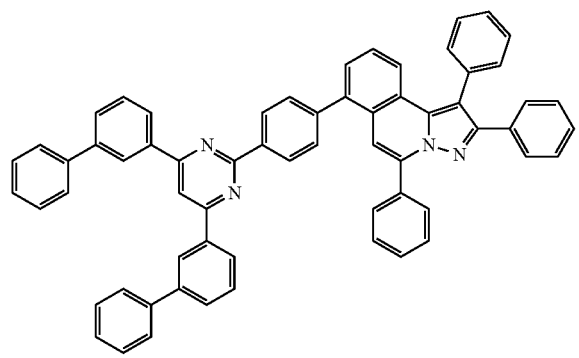
72
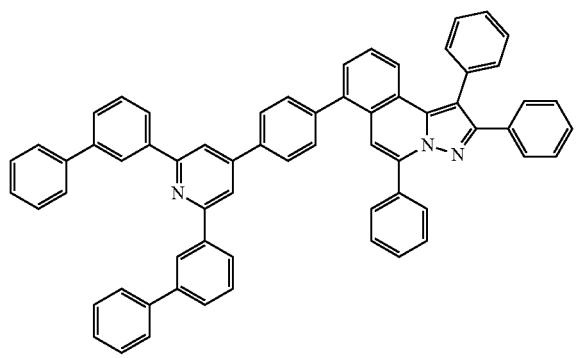
73
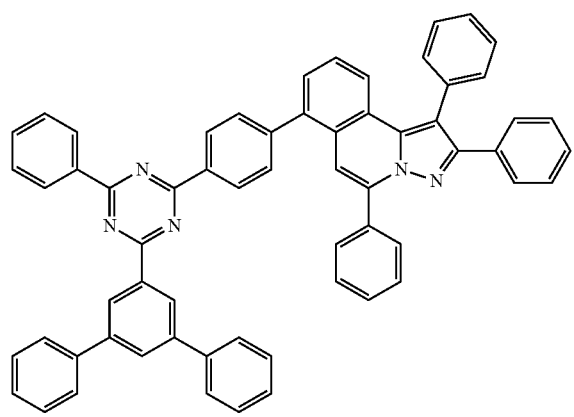
74
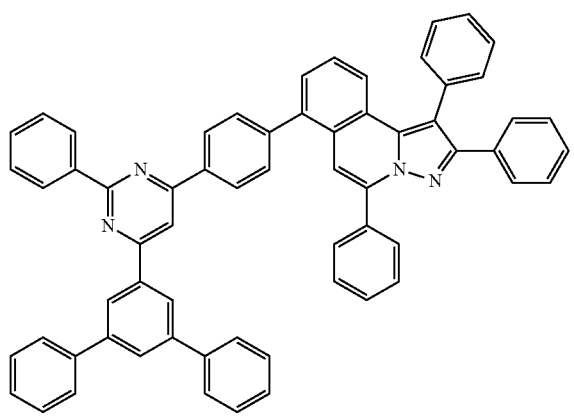
75
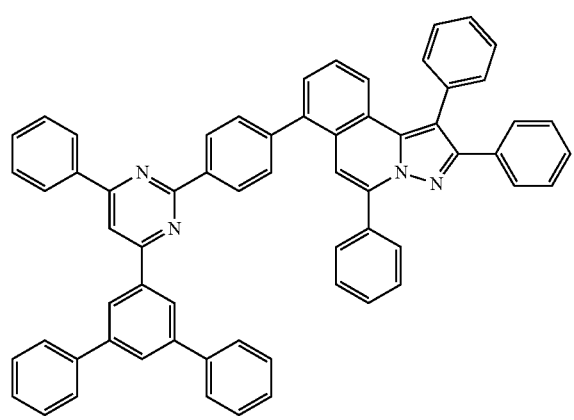
76
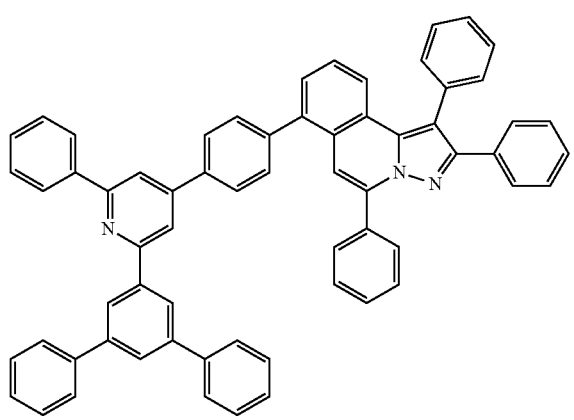

-continued
77 78
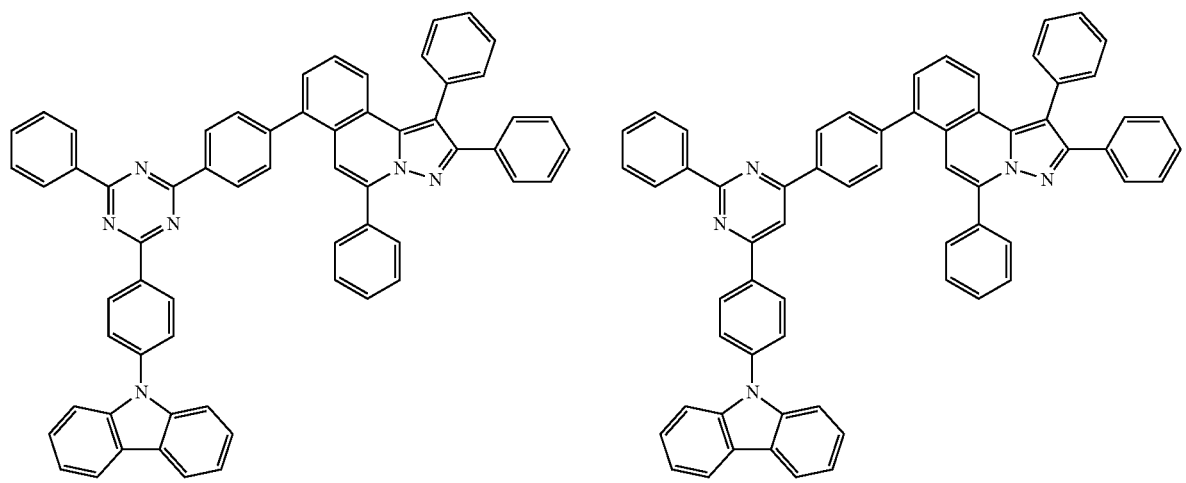
79 80
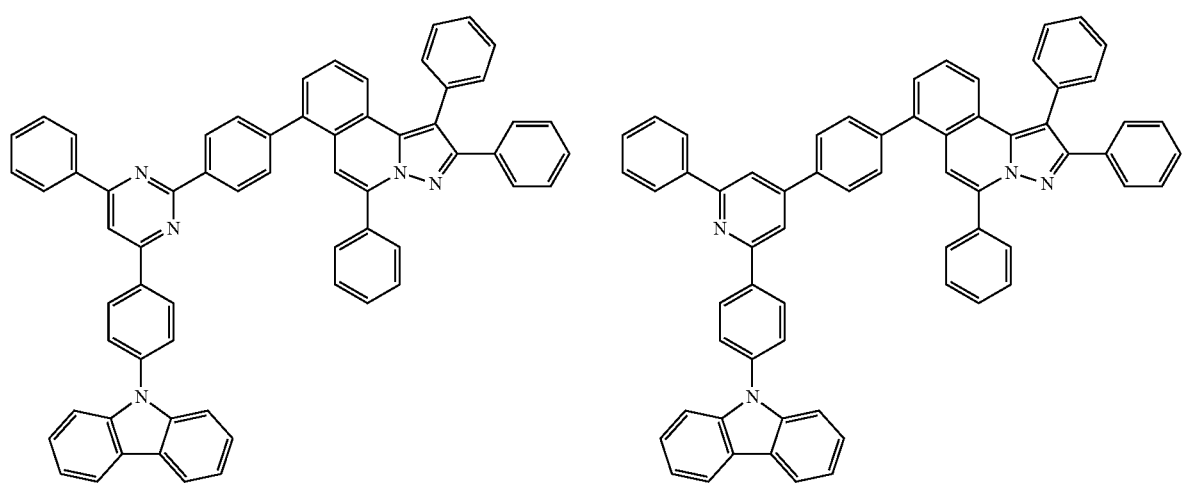
81 82
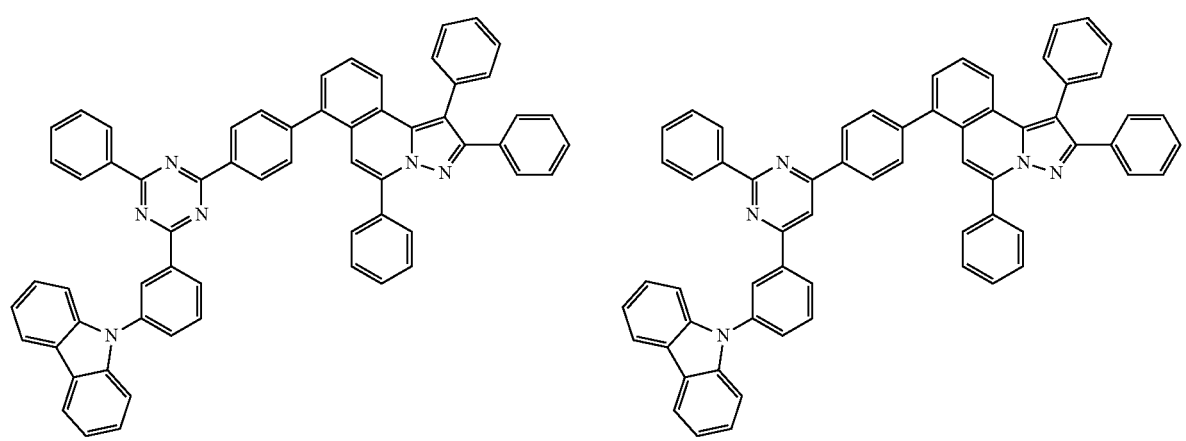

-continued
83
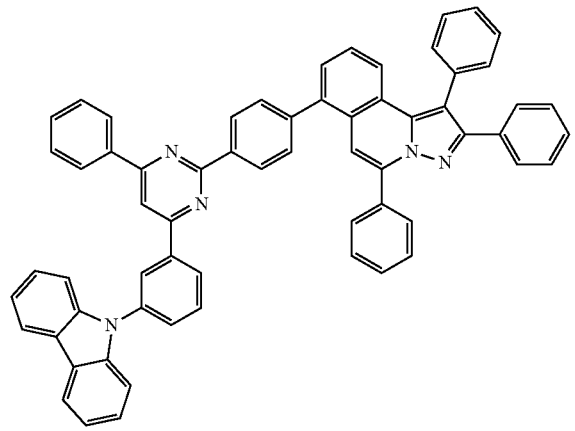
84
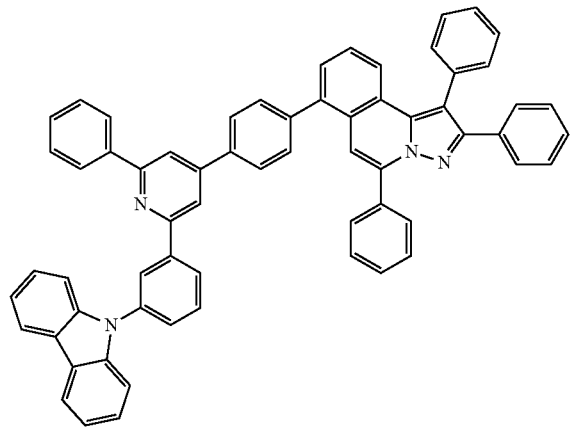
85
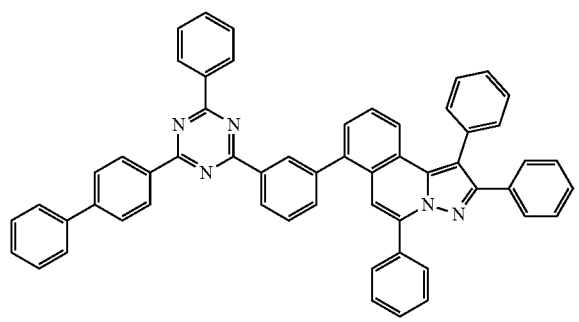
86
87
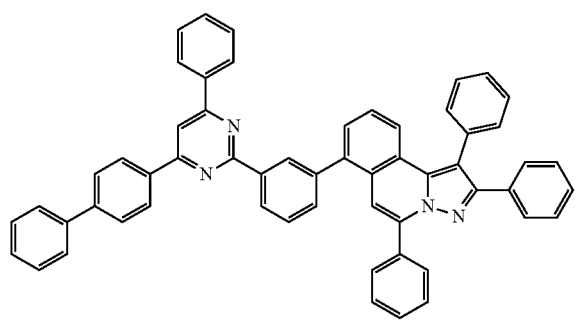
88
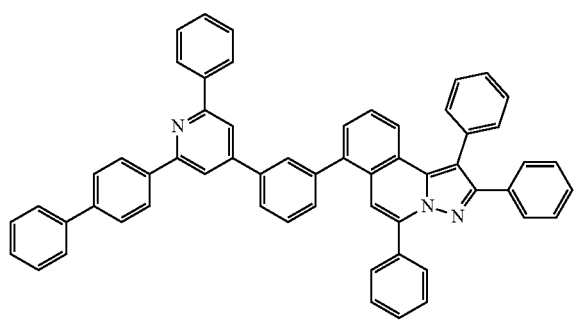
89
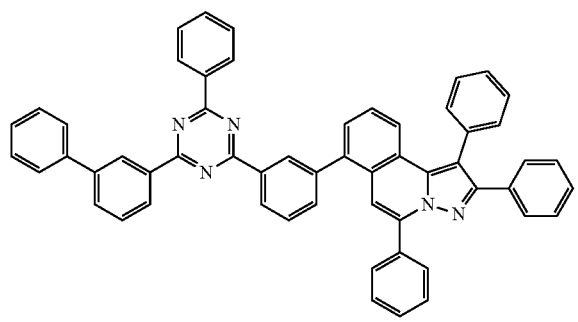
90
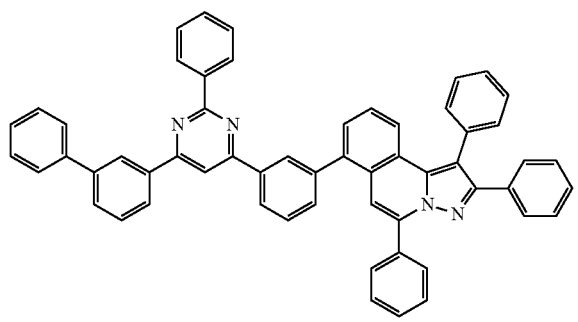

-continued
91
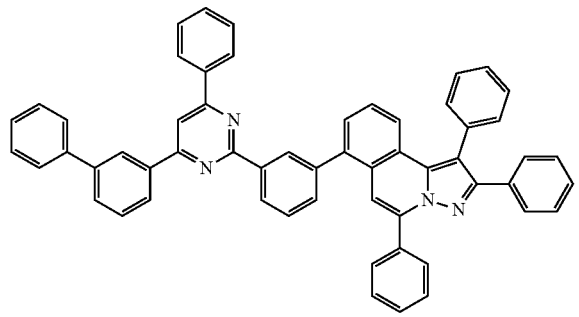
92
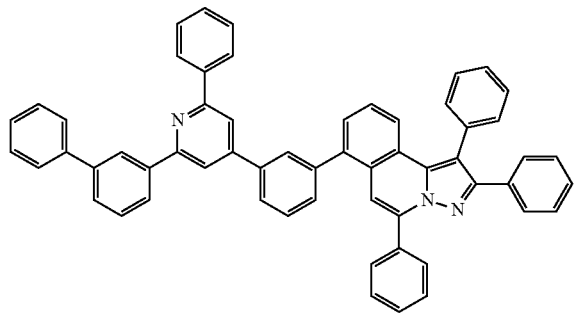
93
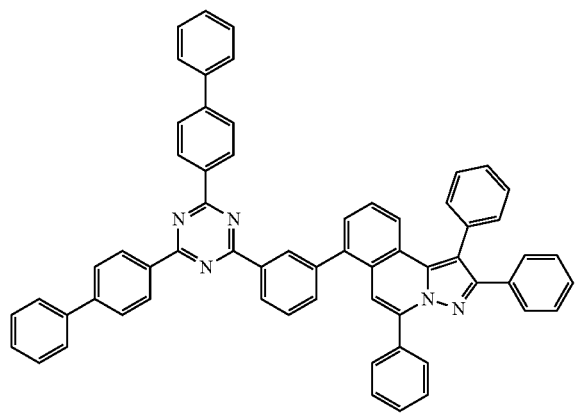
94
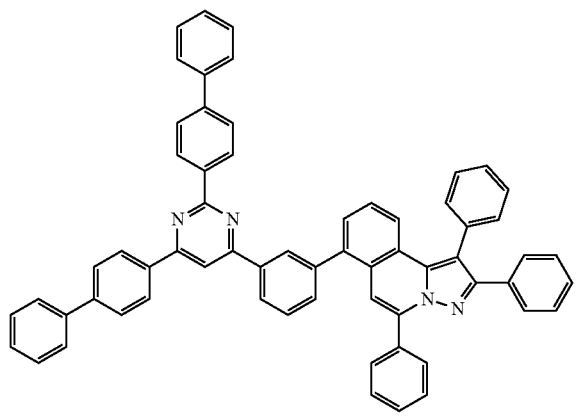
95
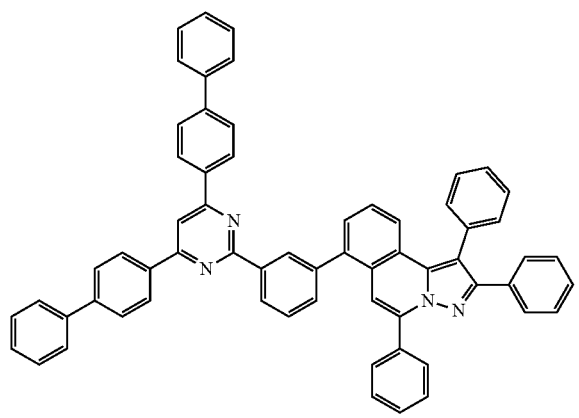
96
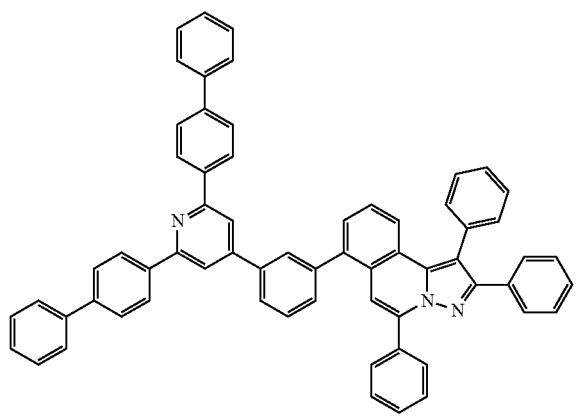
97
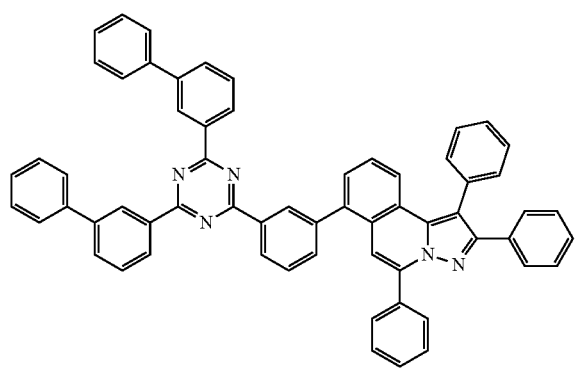
98
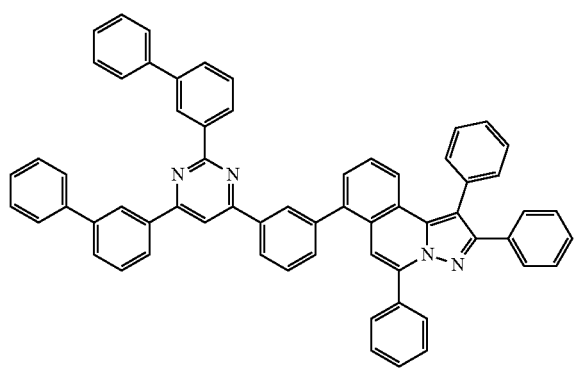

99
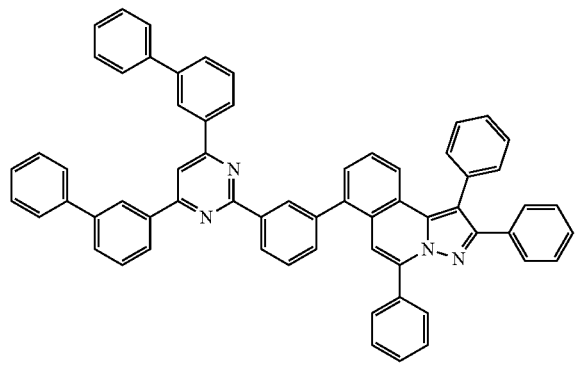
100
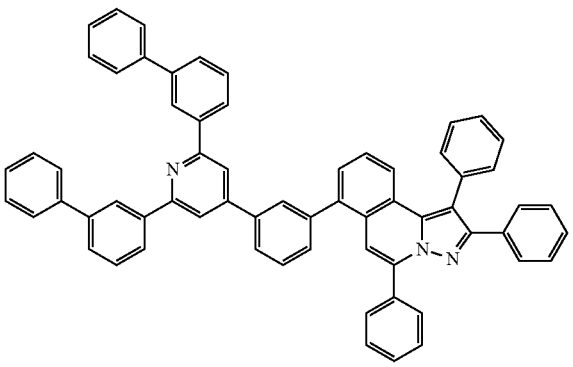
101
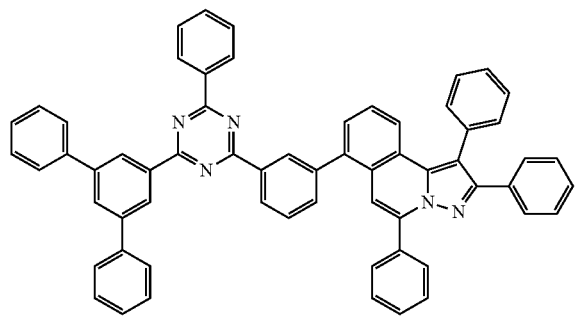
102
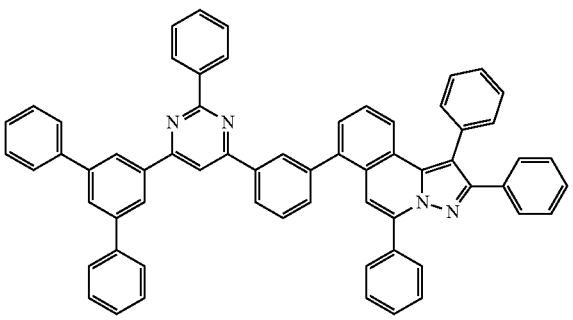
103
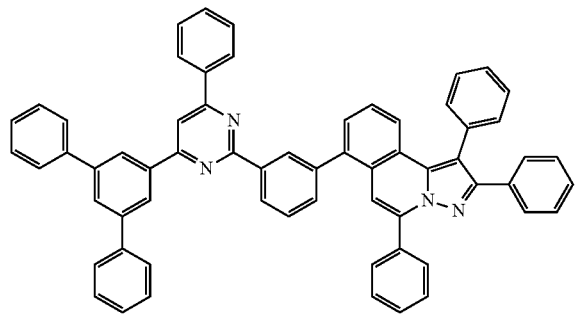
104
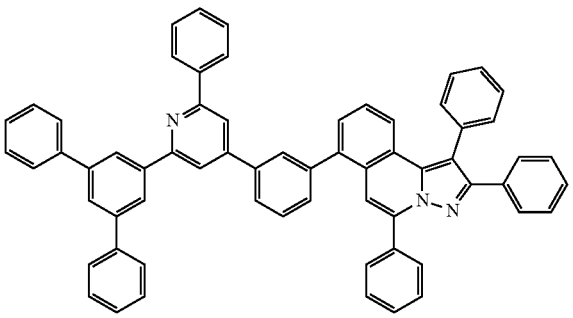
105
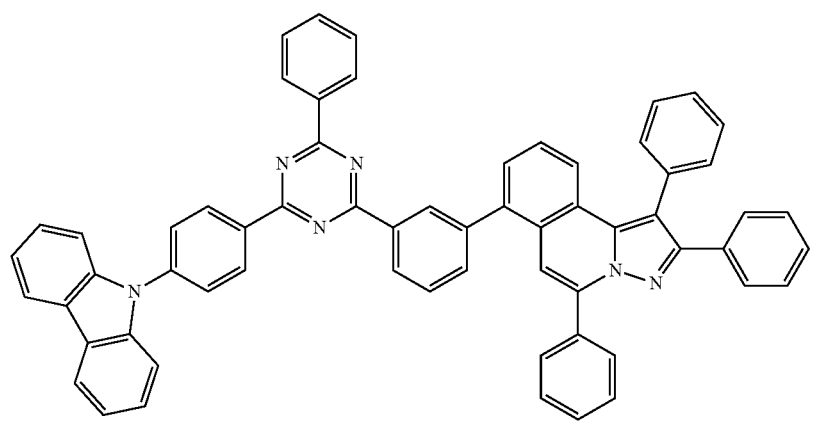

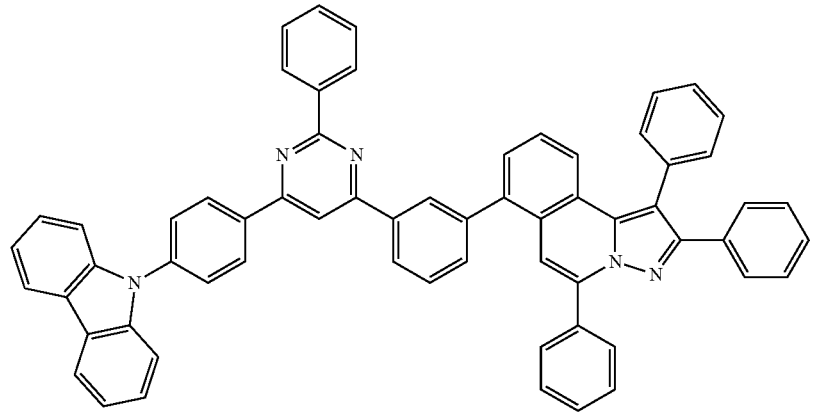
106
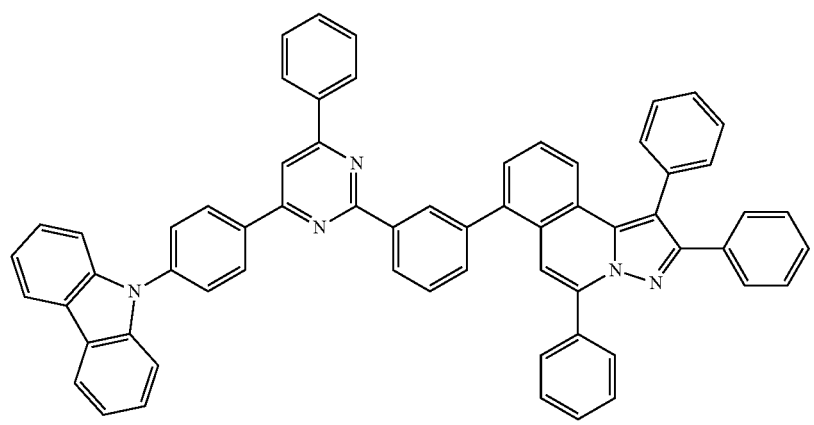
107
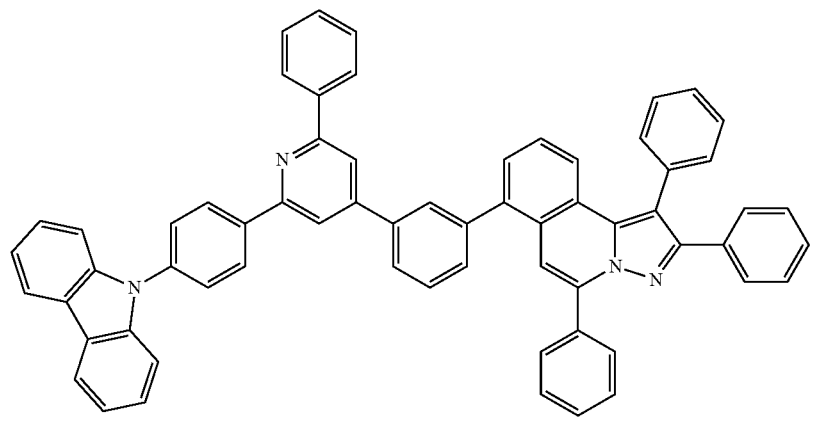
108

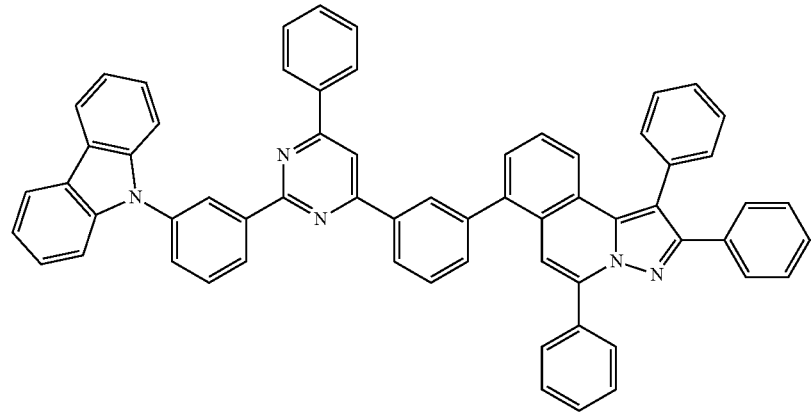
109
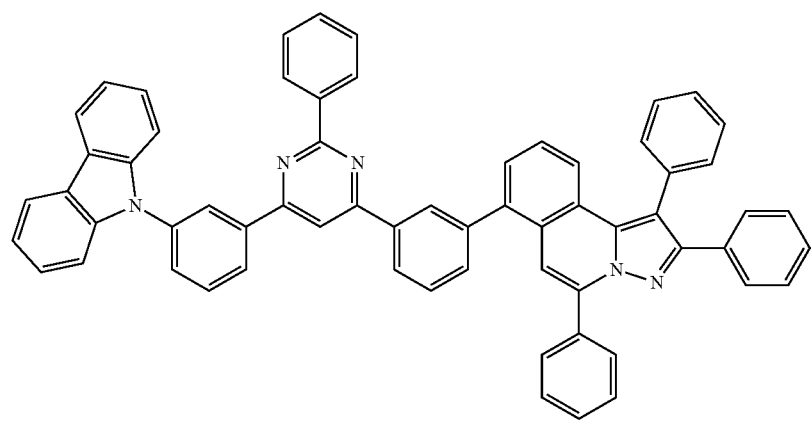
110
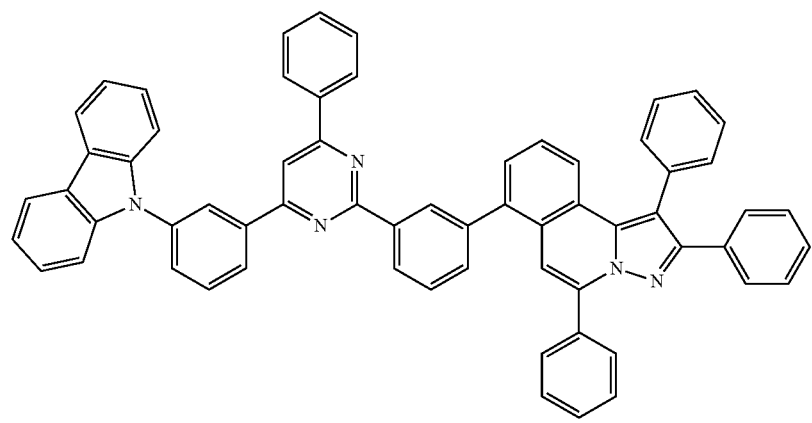
111

112
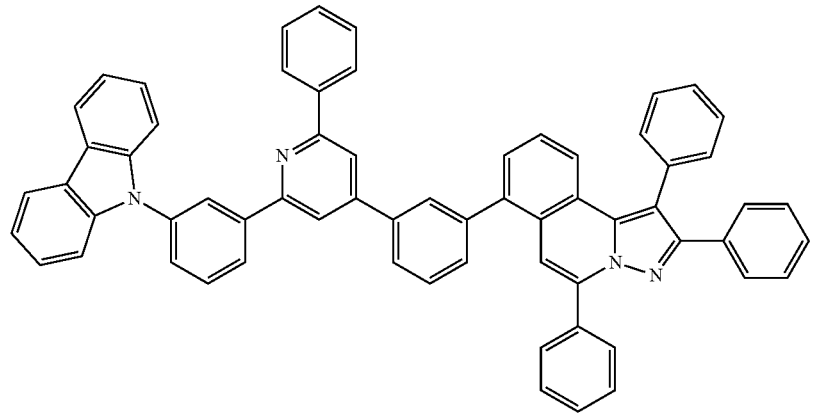
113
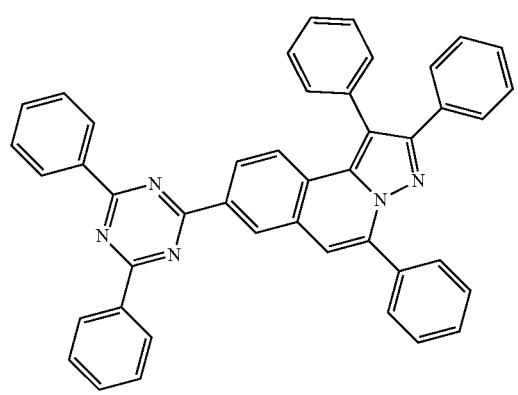
114
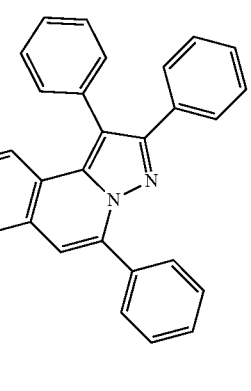
115
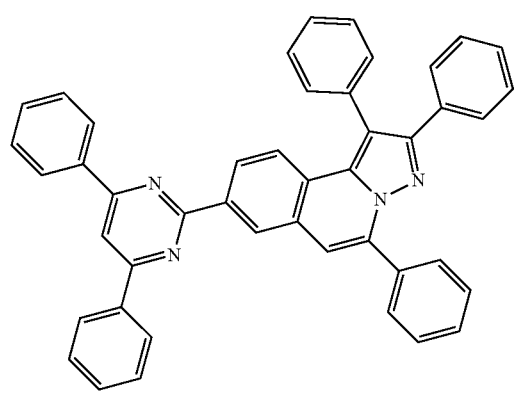
116
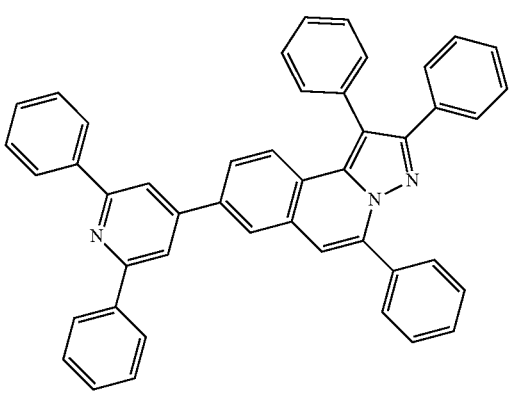
117
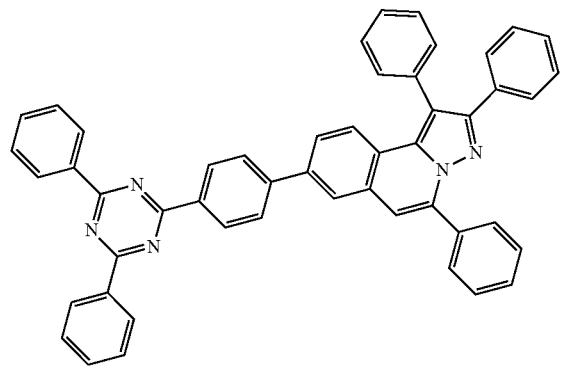
118
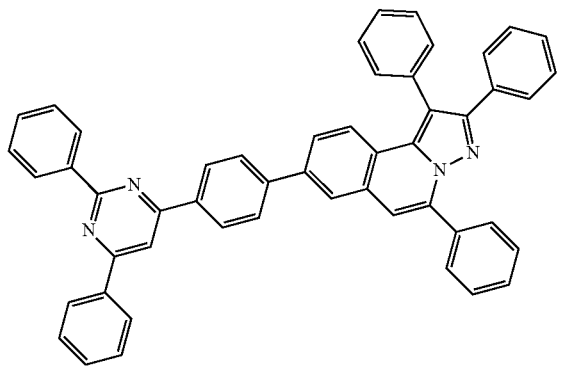

-continued
119
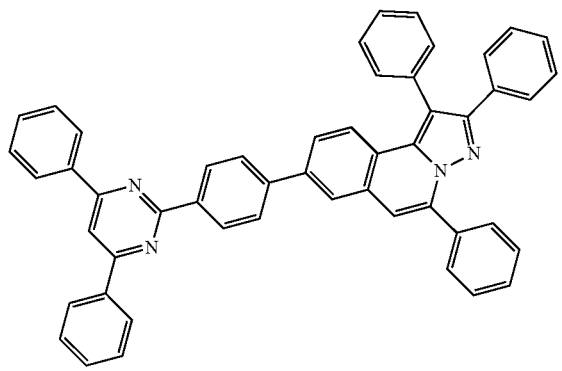
120
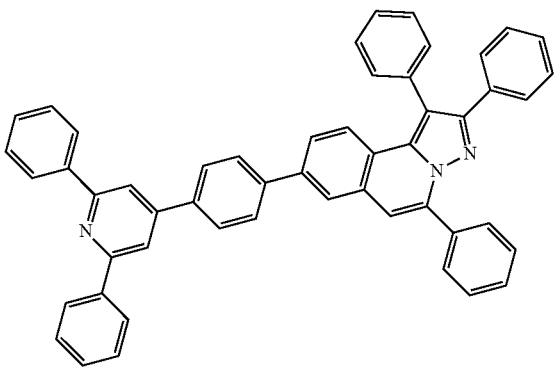
121
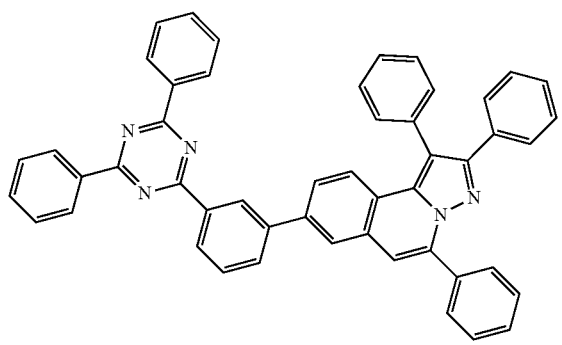
122
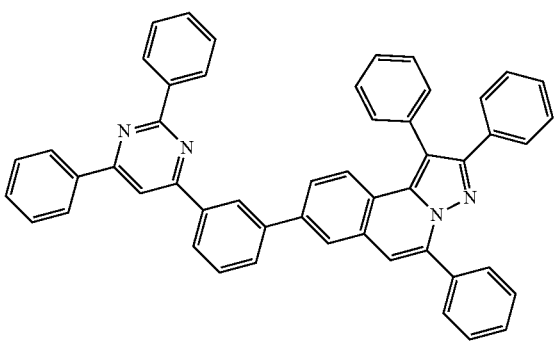
123
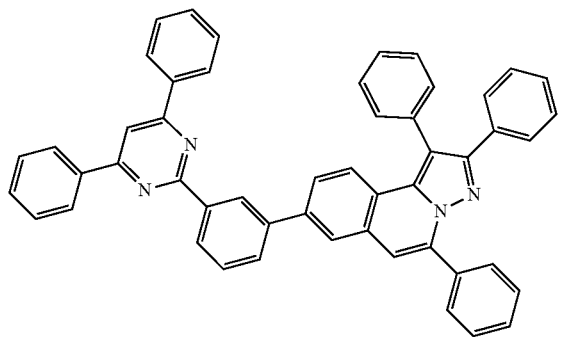
124
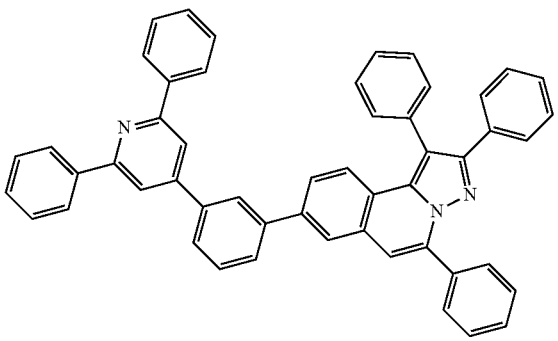
125
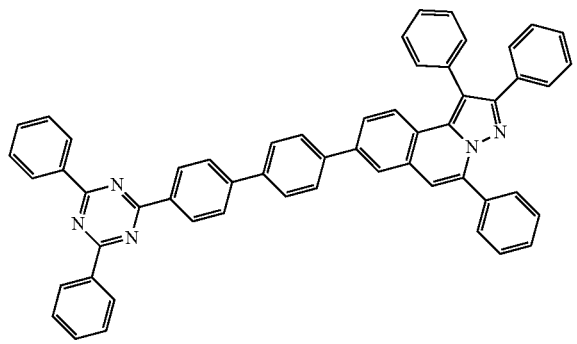
126
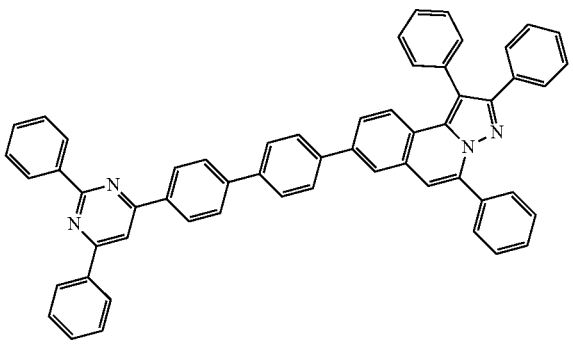

-continued
127
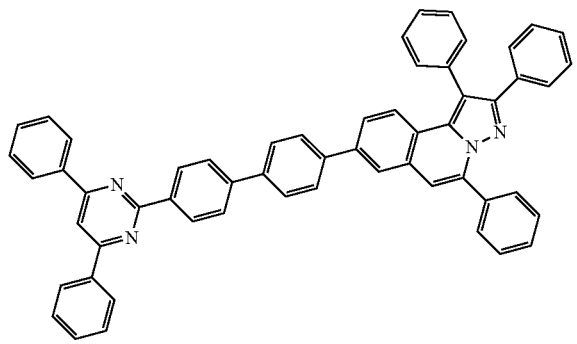
128
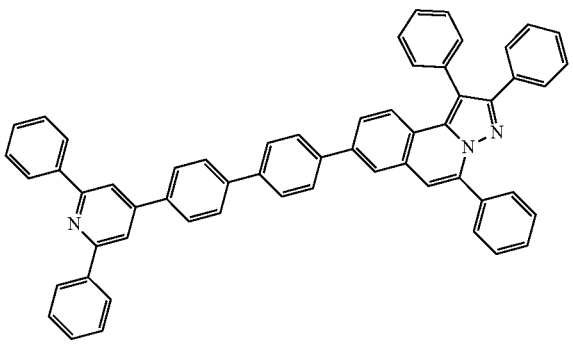
129
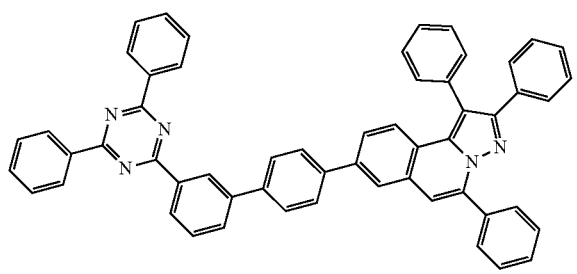
130
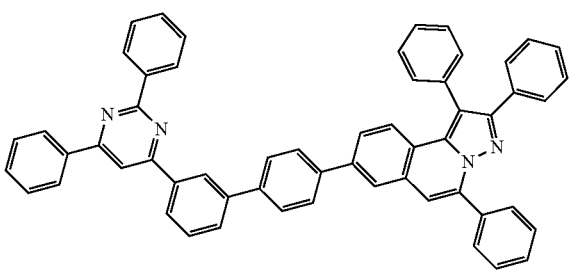
131
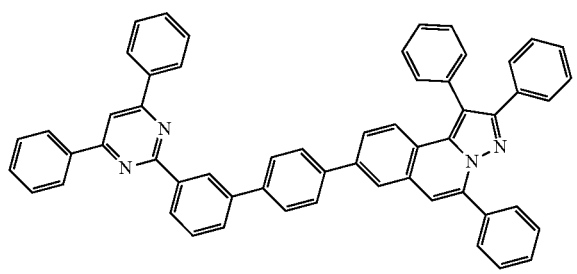
132
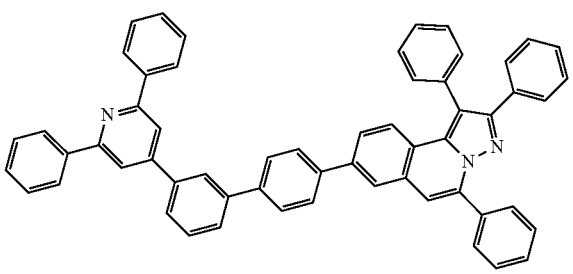
133
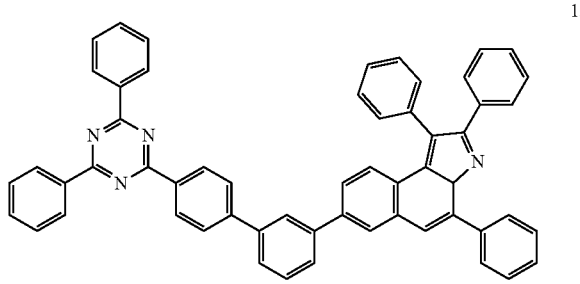
134
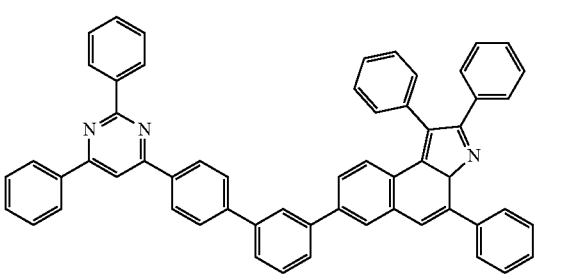
135
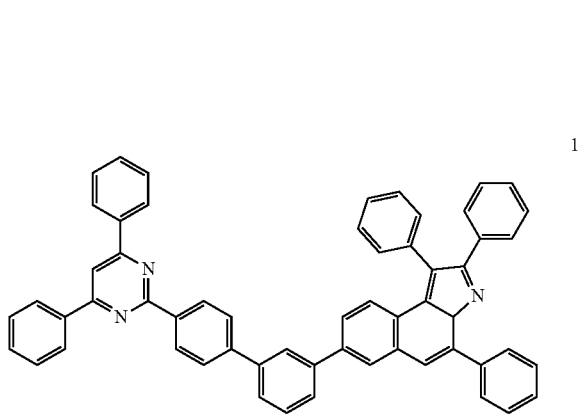
136
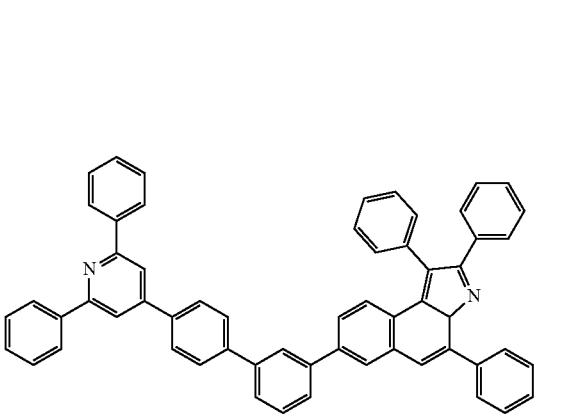

-continued
137
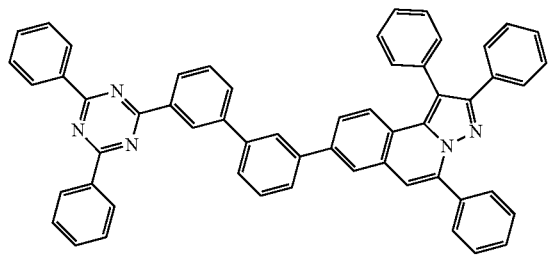
138
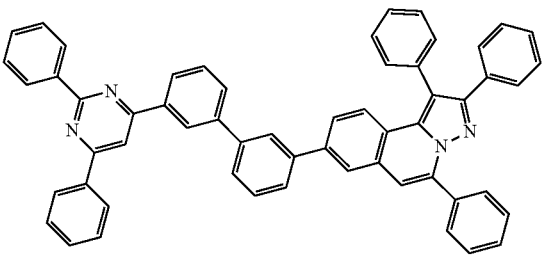
139
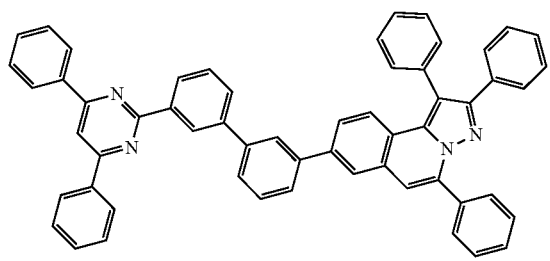
140
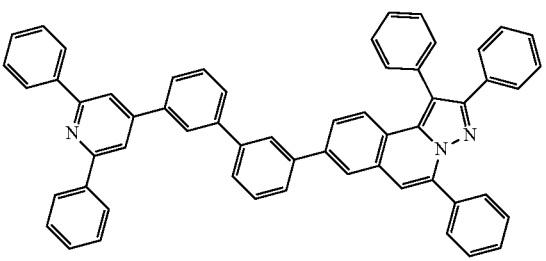
141
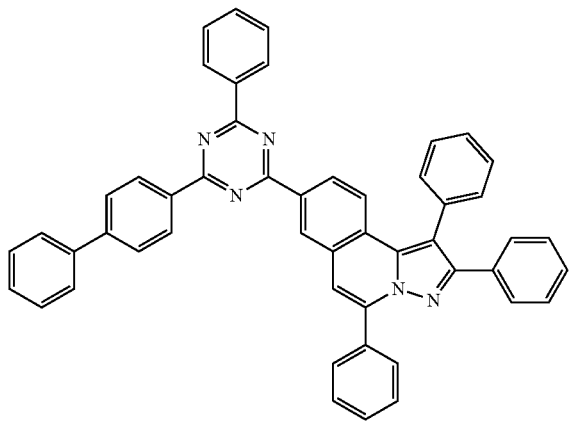
142
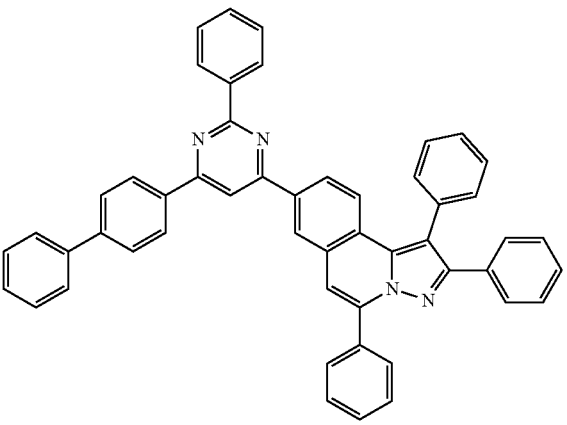
143
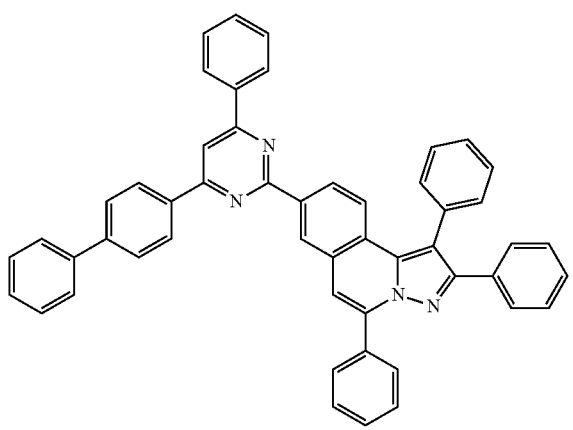
144
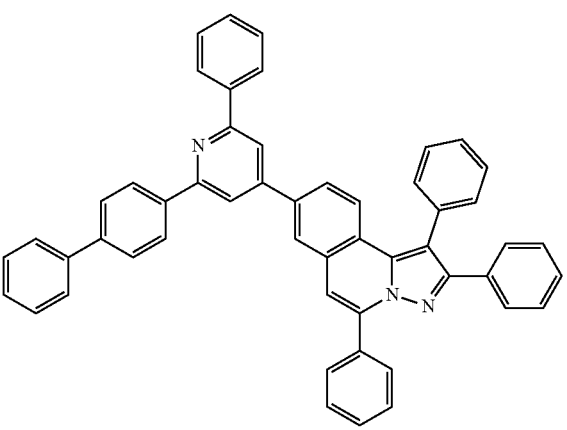

-continued
145
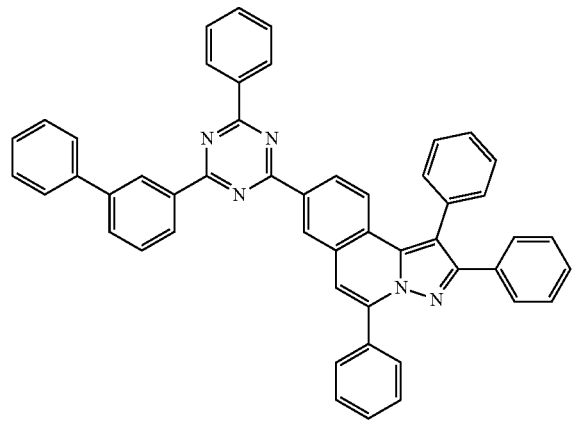
146
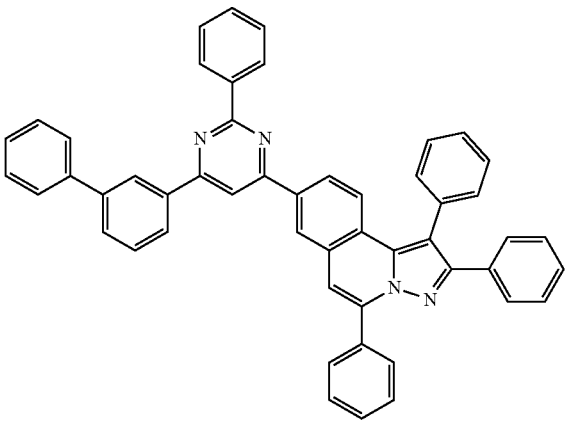
147
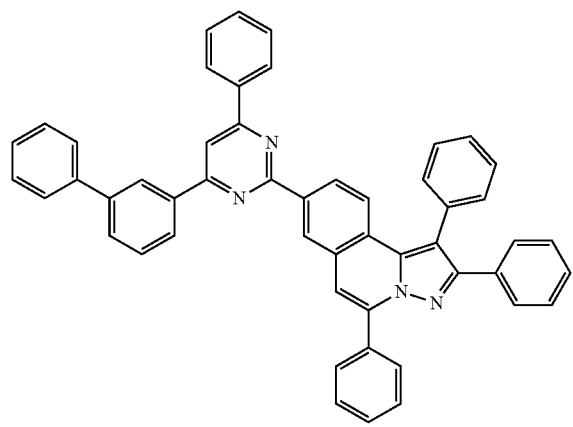
148
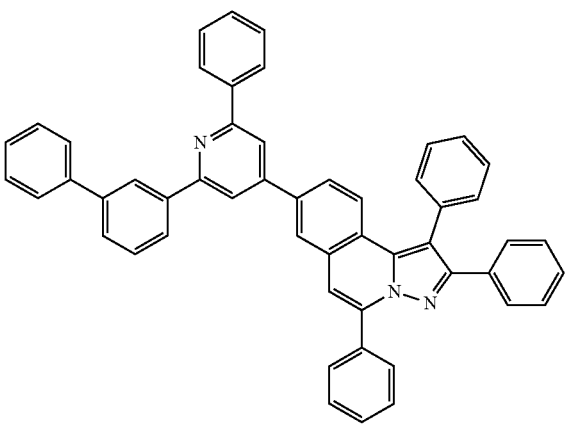
149
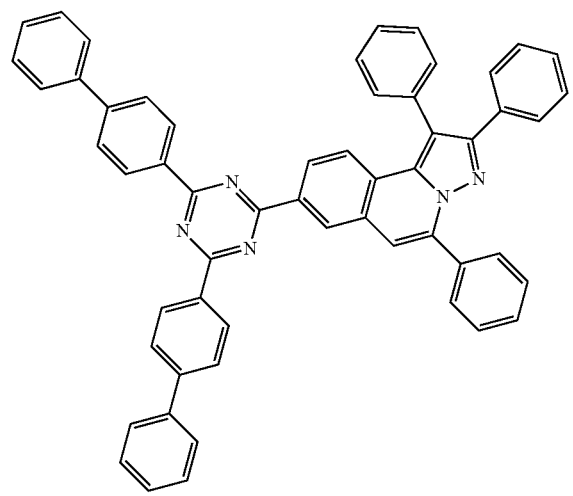
150
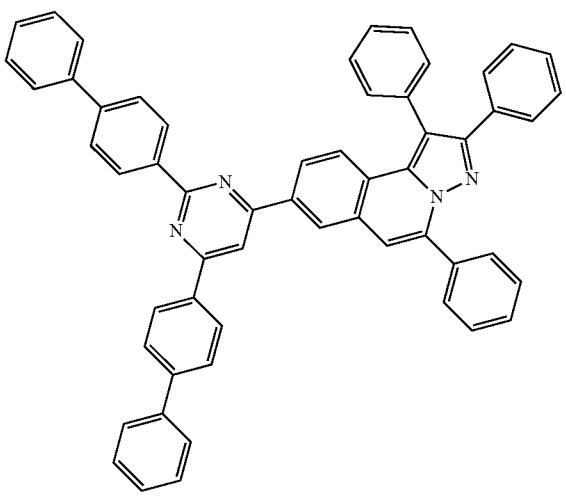

-continued
151
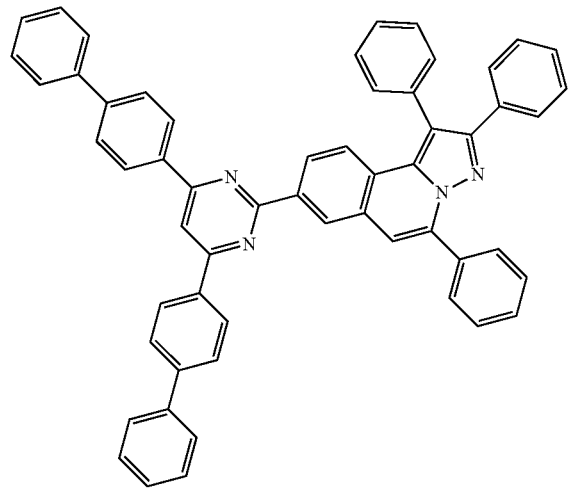
152
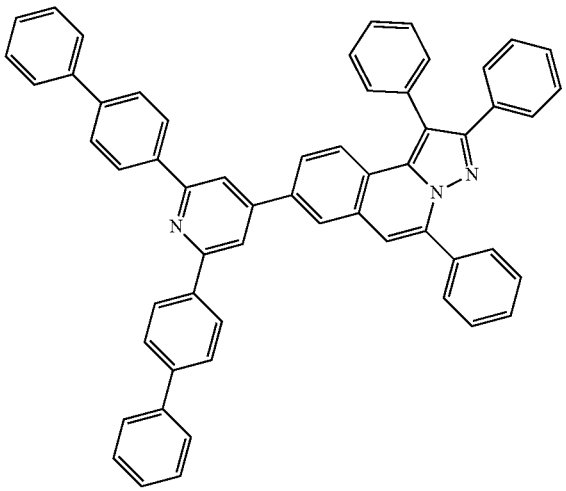
153
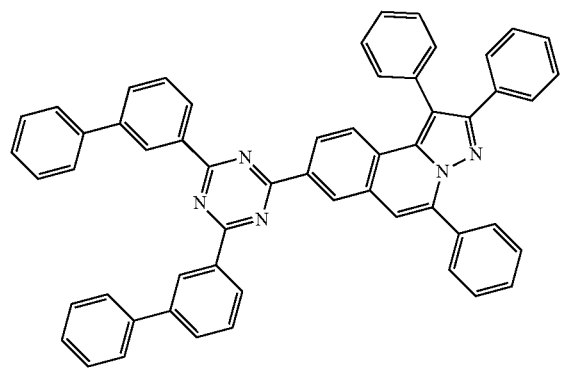
154
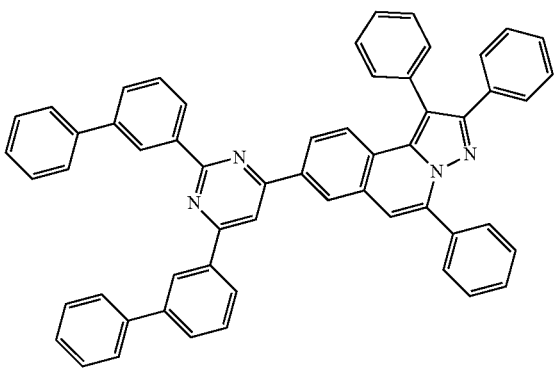
155
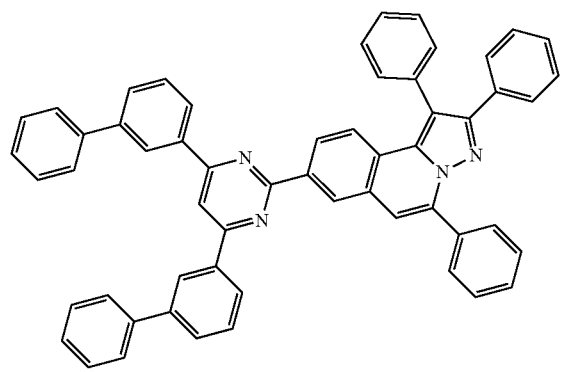
156
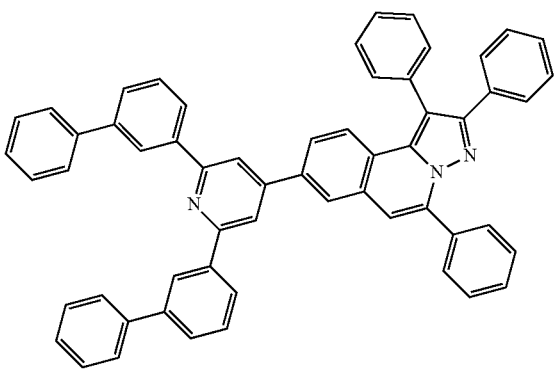

-continued
157
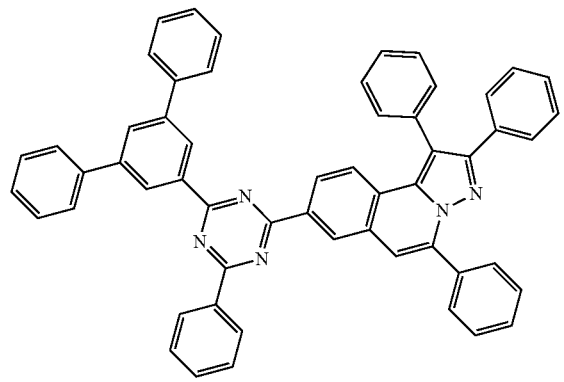
158
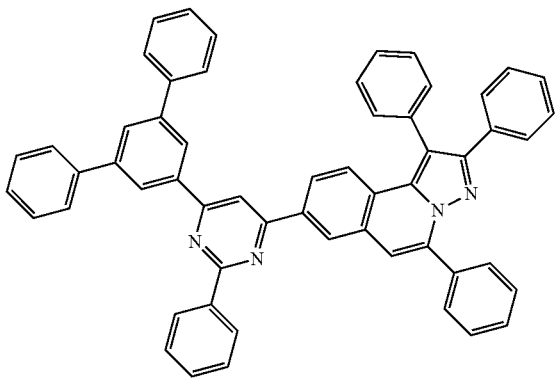
159
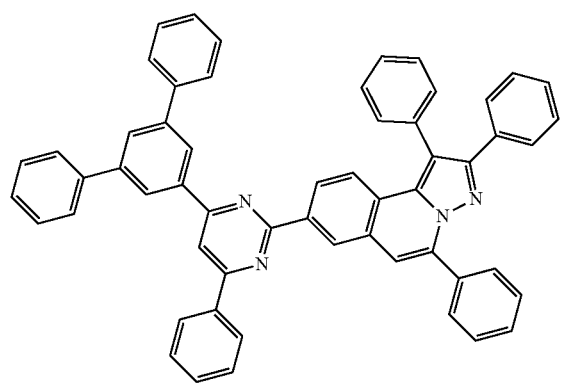
160
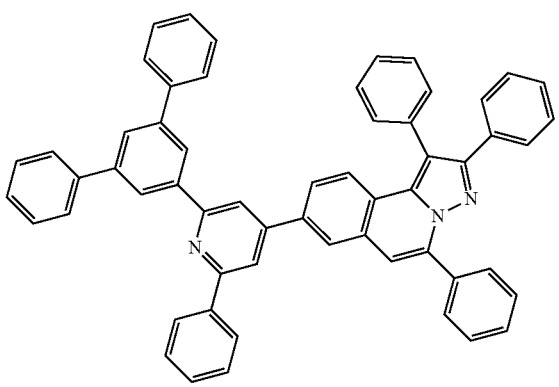
161
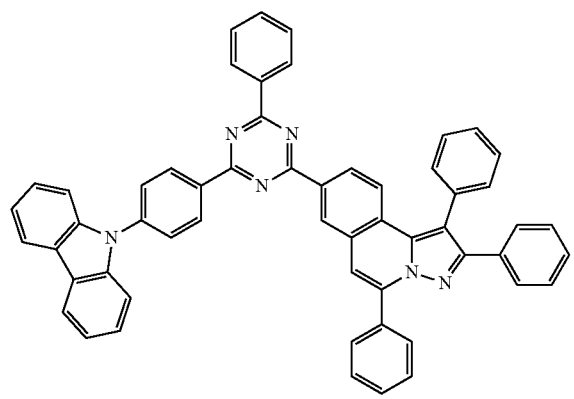
162
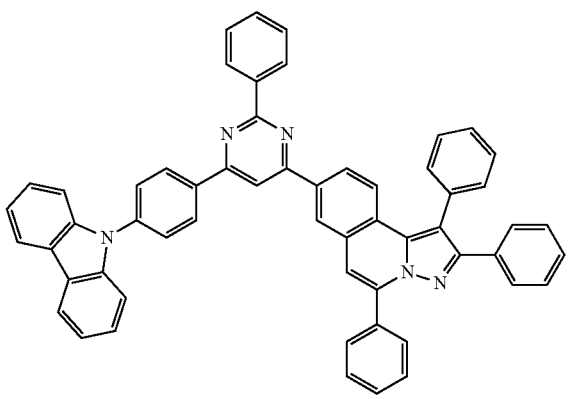
163
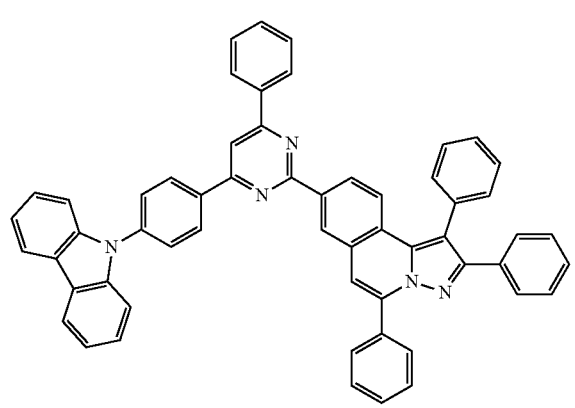
164
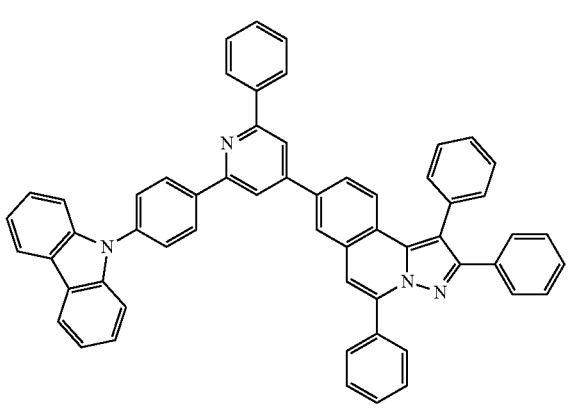

165
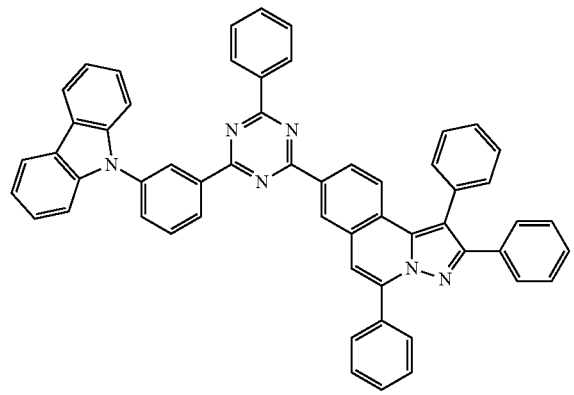
166
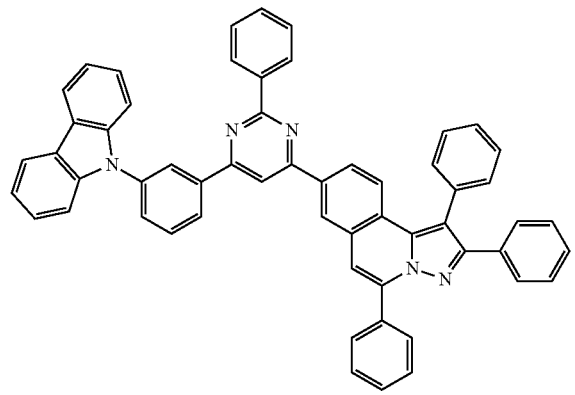
167
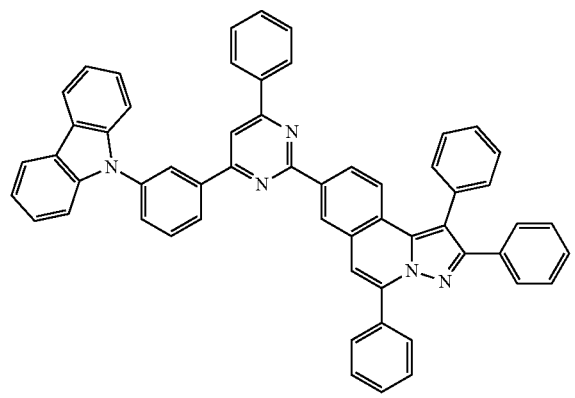
168
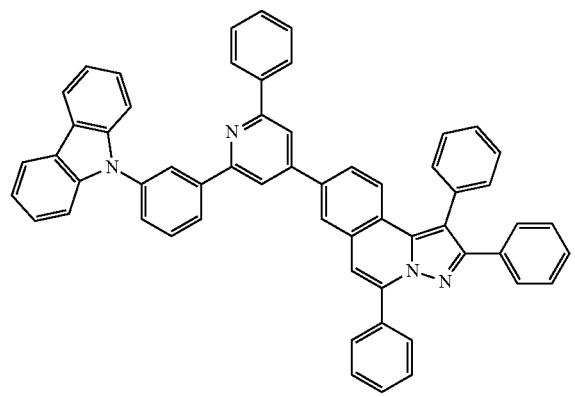
169
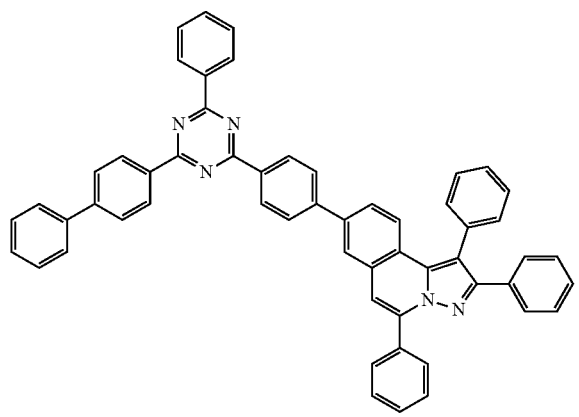
170
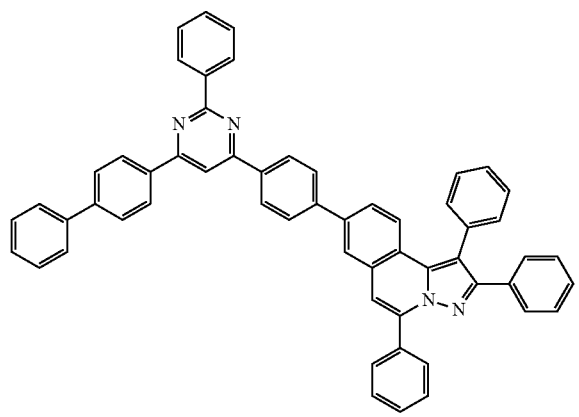

-continued
171
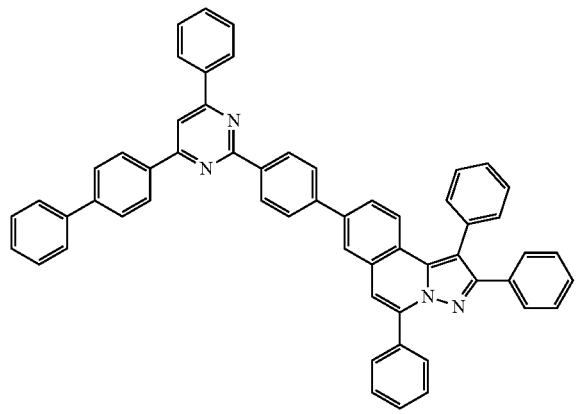
172
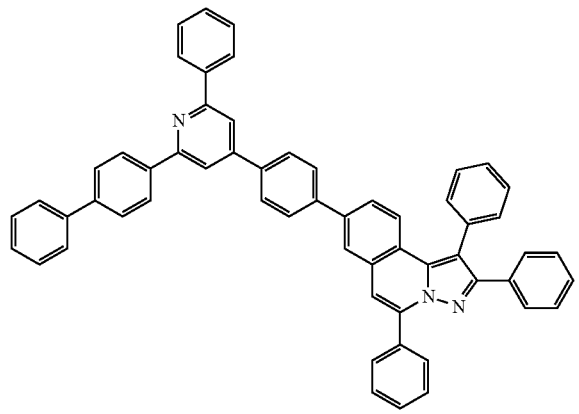
173
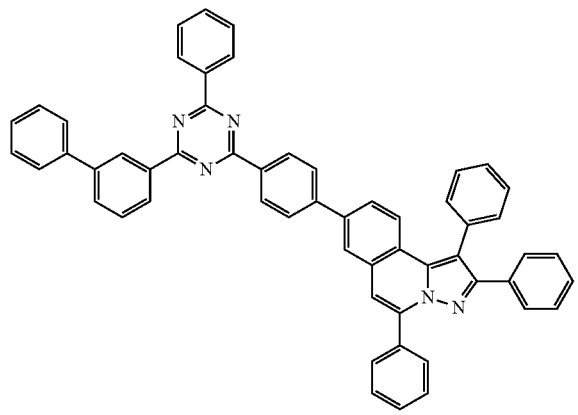
174
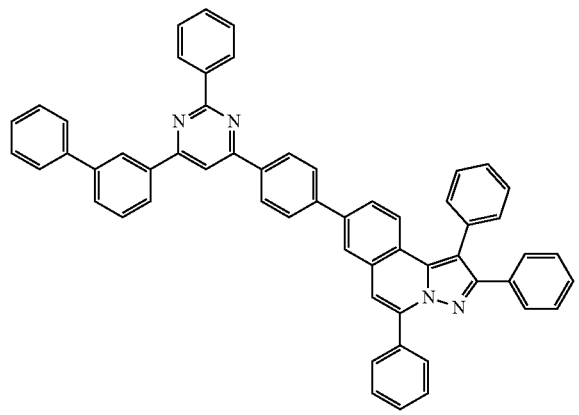
175
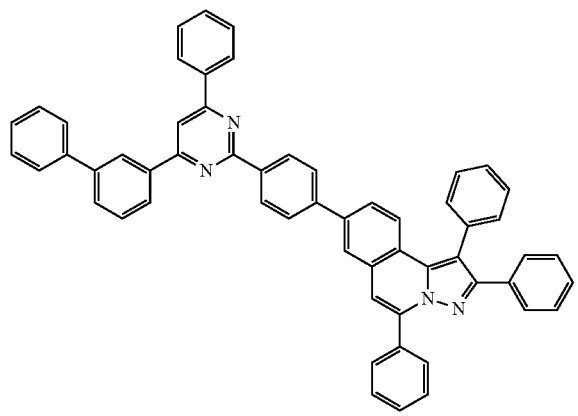
176
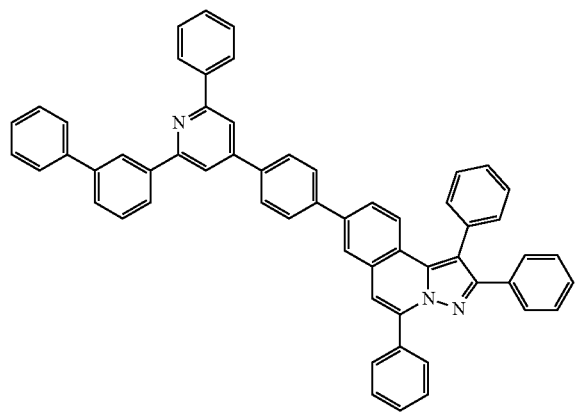

-continued
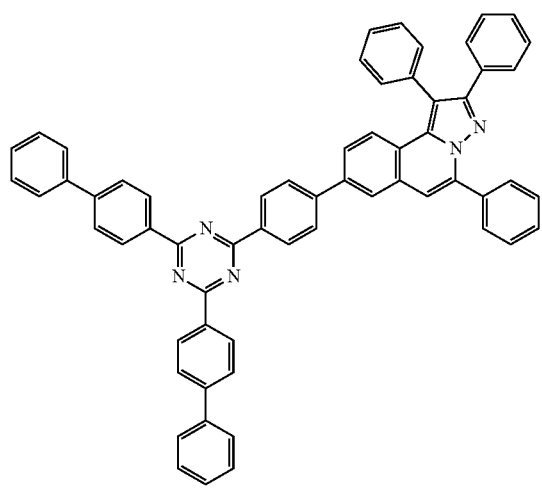
177
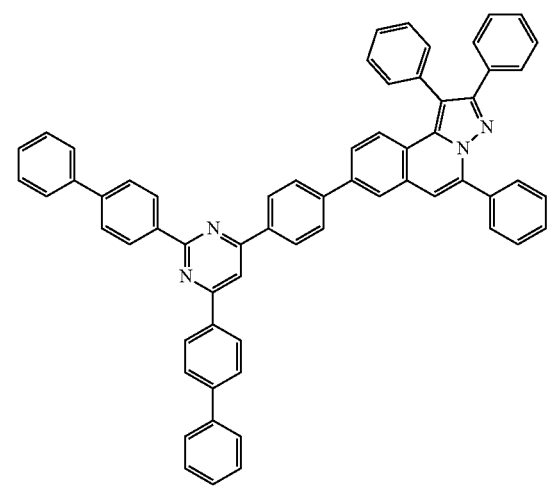
178
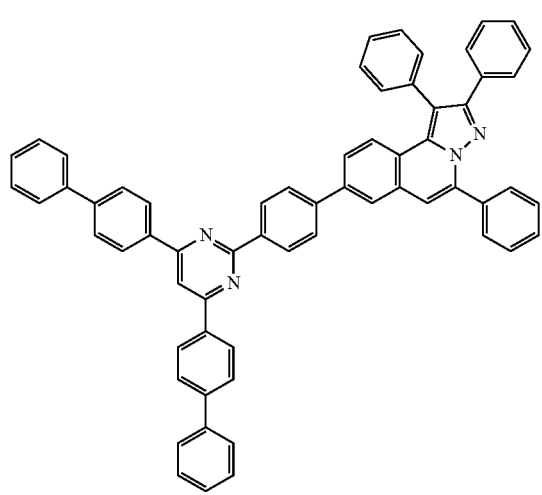
179
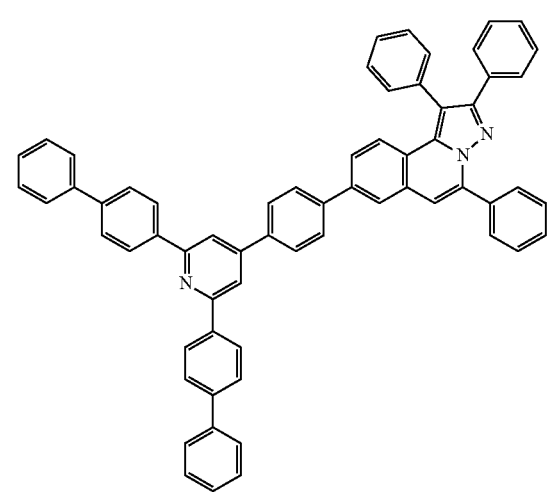
180
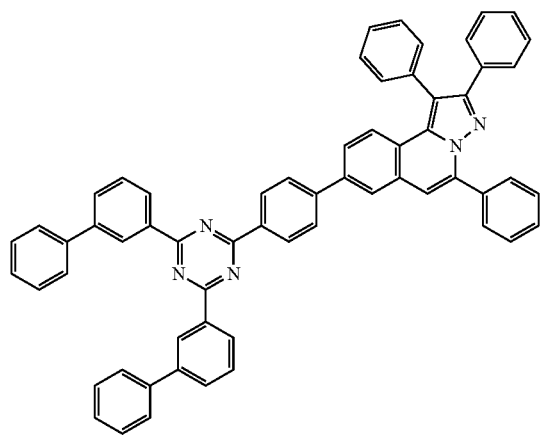
181
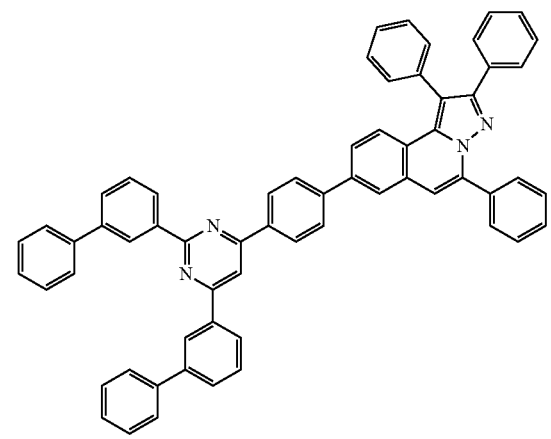
182

-continued
183
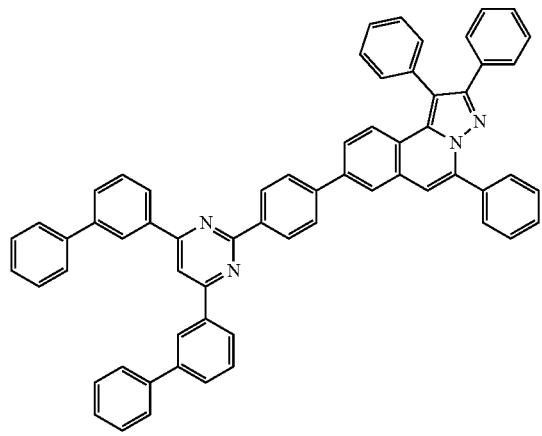
184
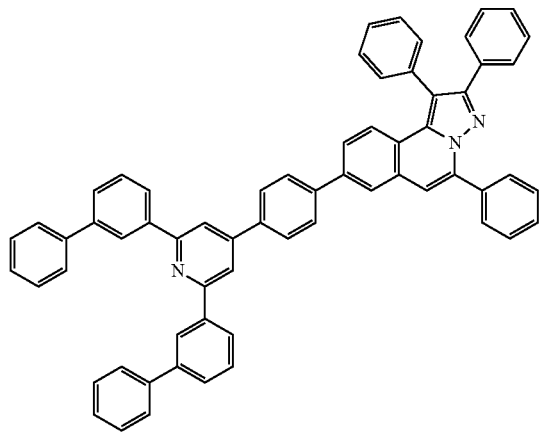
185
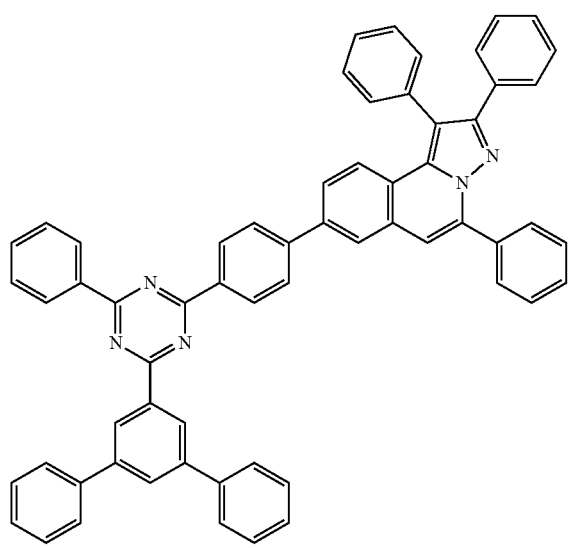
186
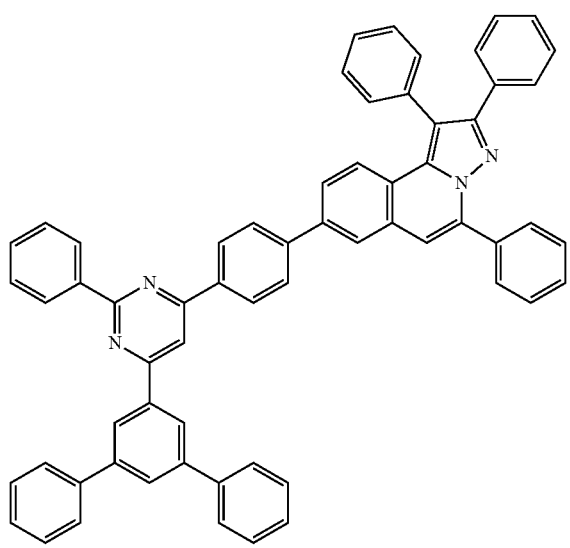
187
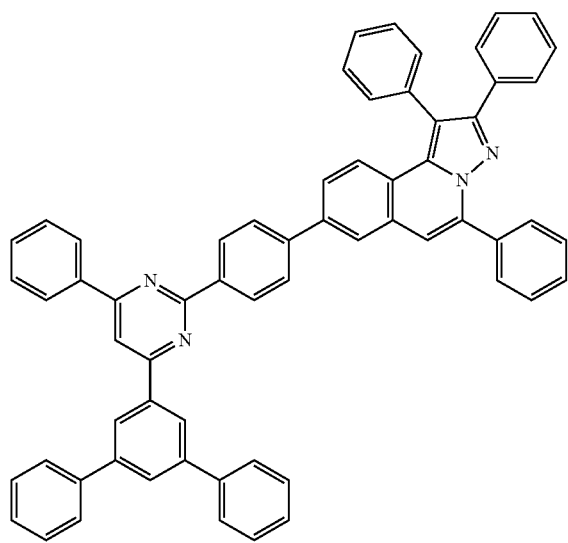
188
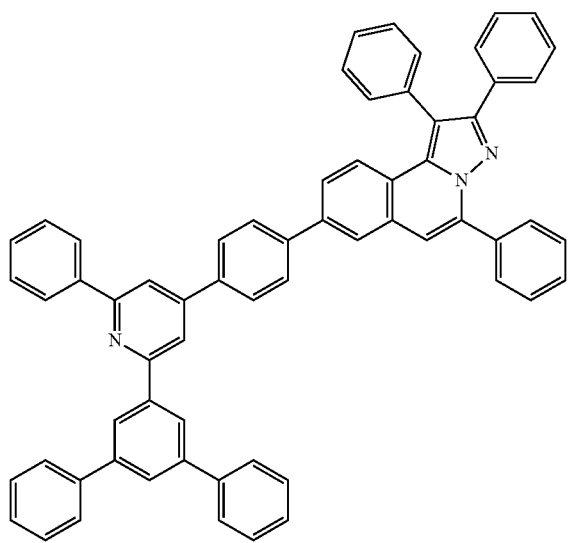

189
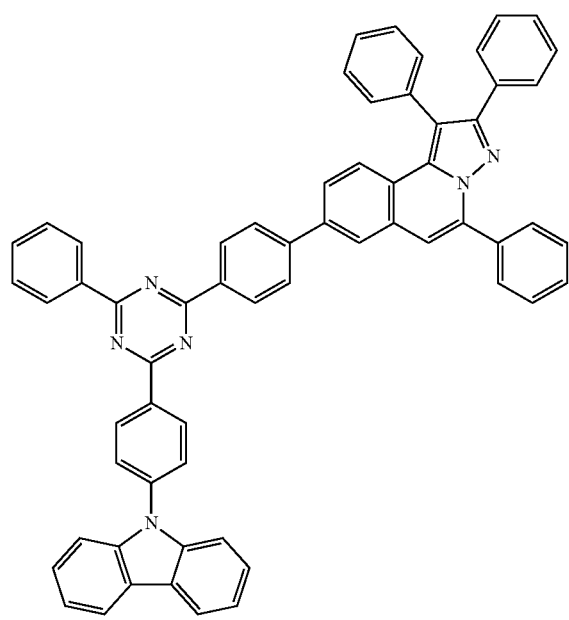
190
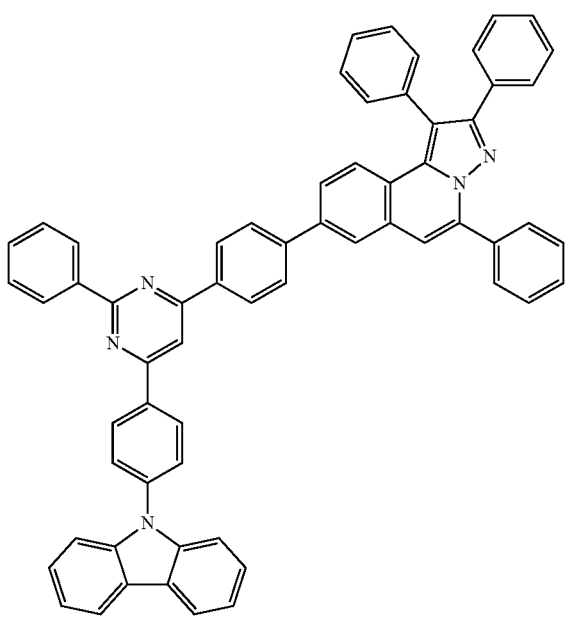
191
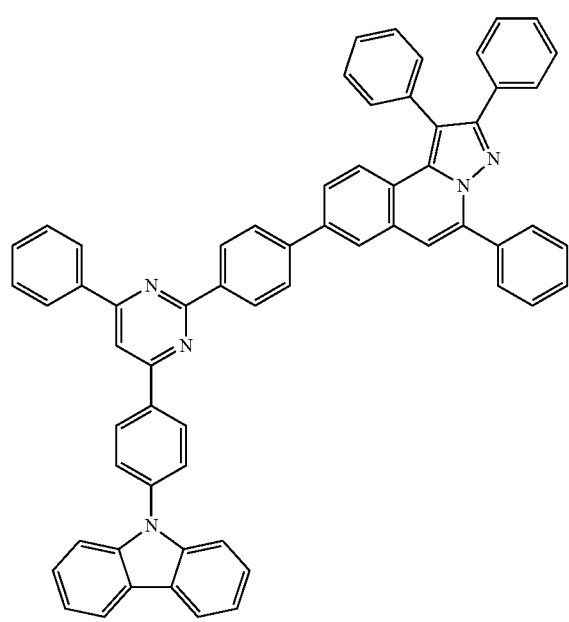
192
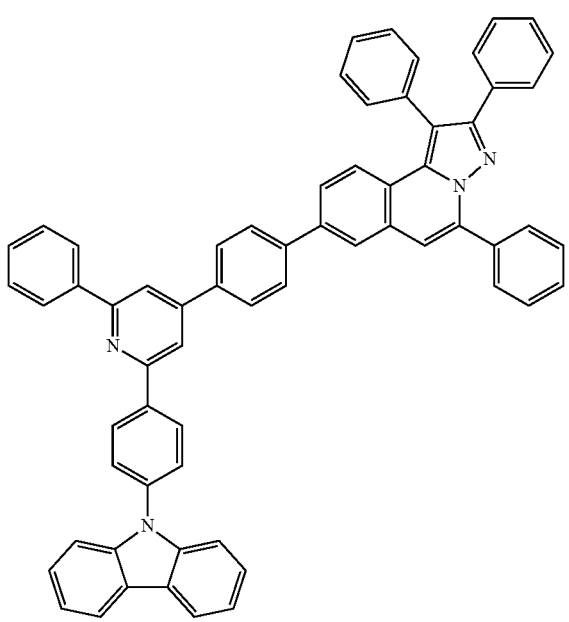

-continued
193
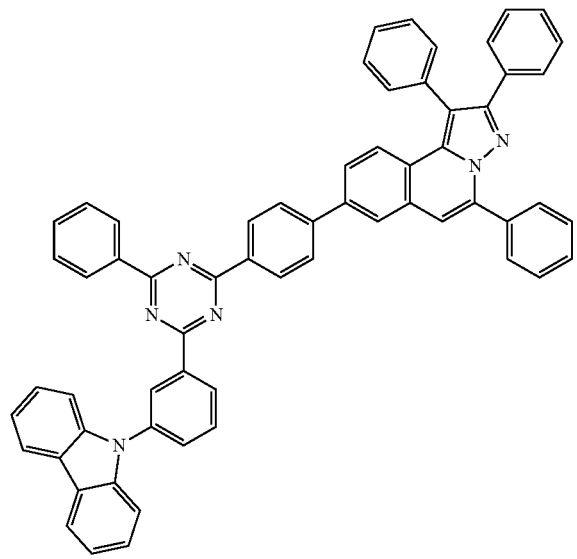
194
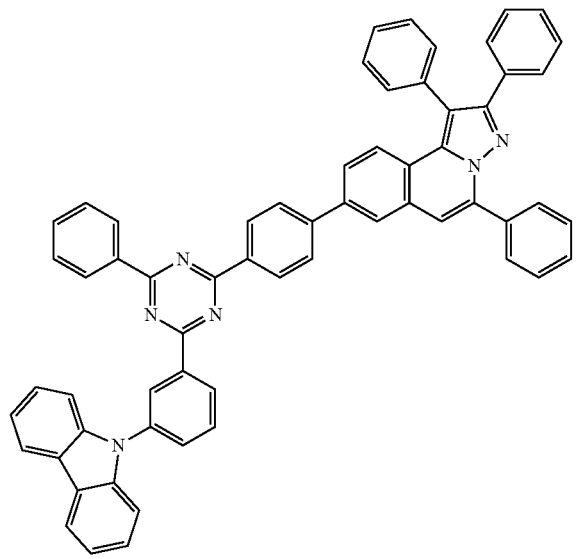
195
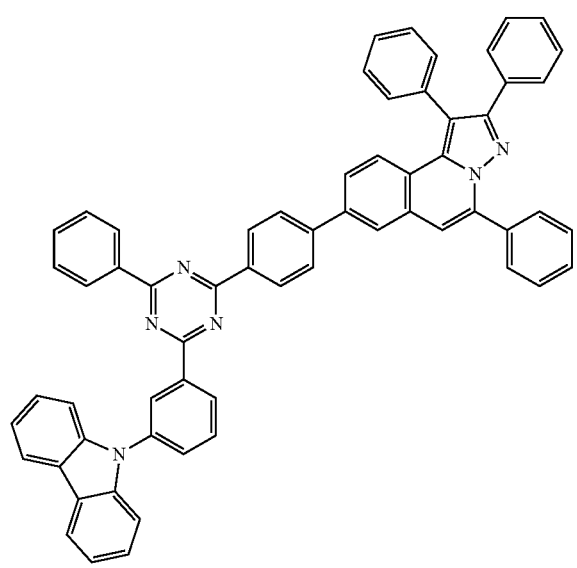
196
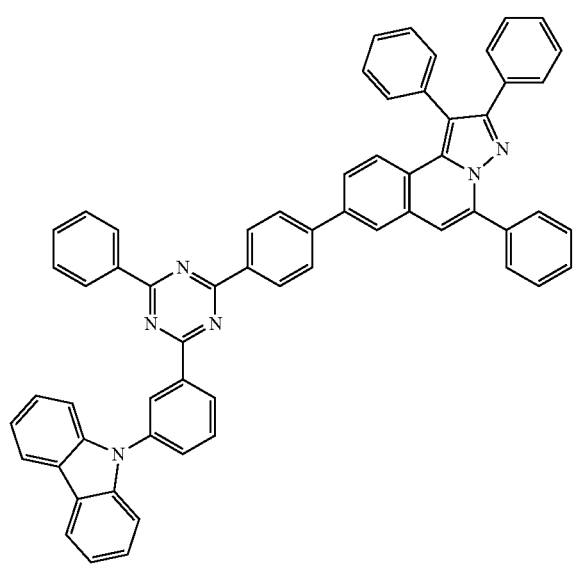
197
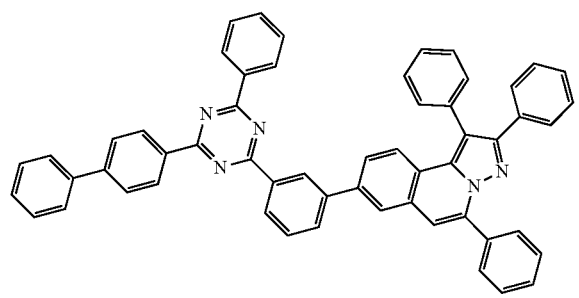
198
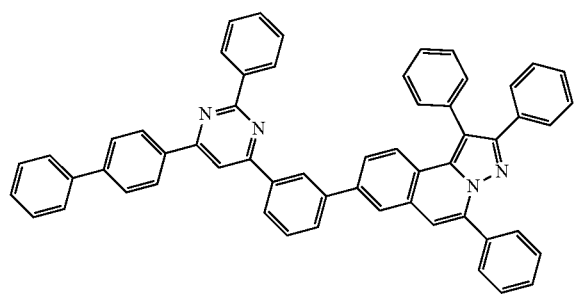

-continued
199
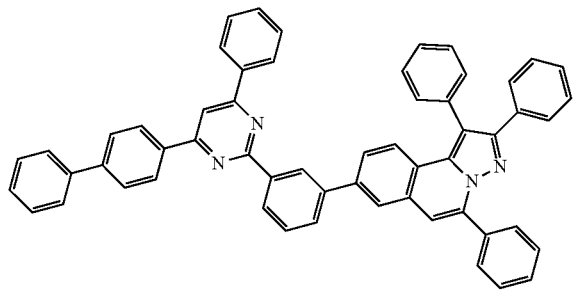
200
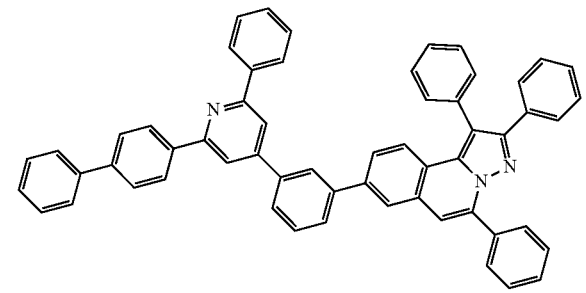
201
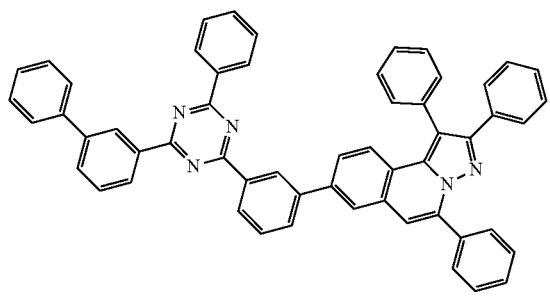
202
203
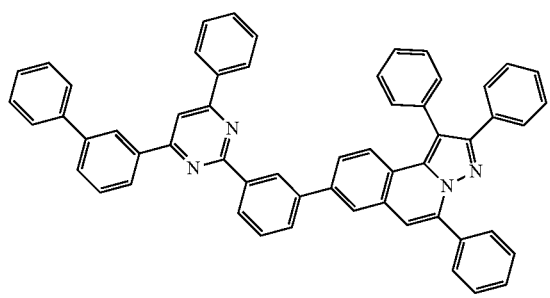
204
205
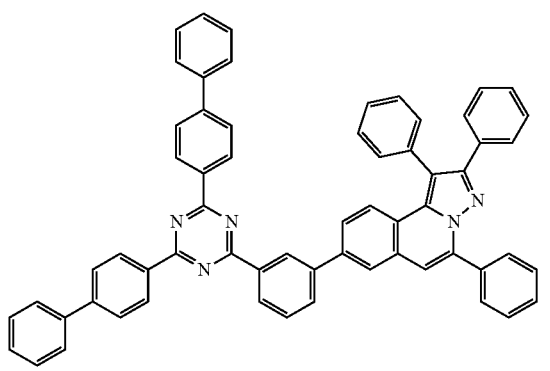
206
207
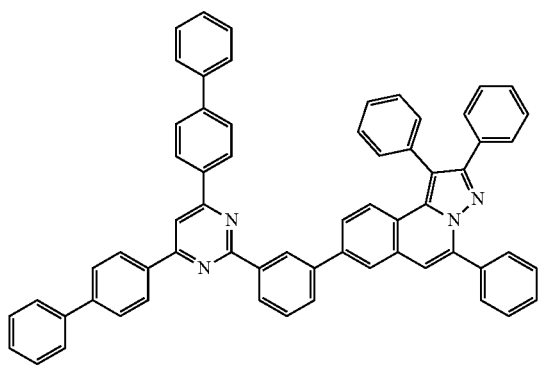
208
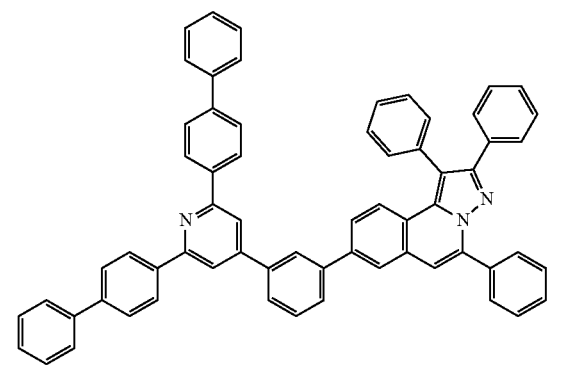

-continued
209
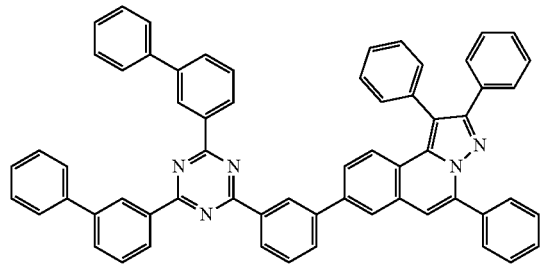
210
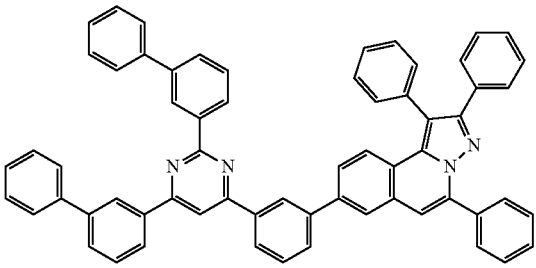
211
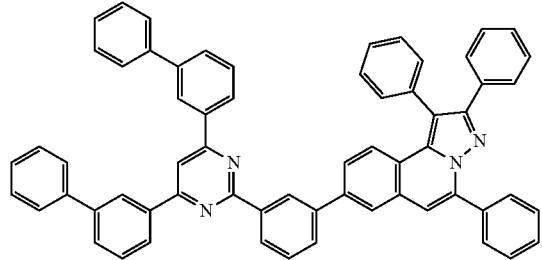
212
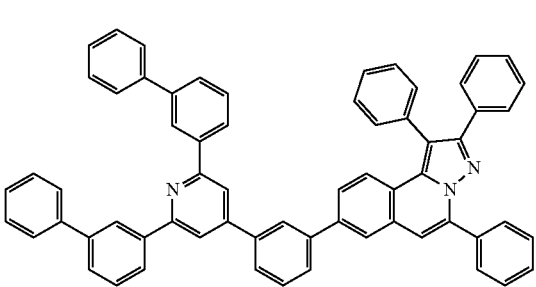
213
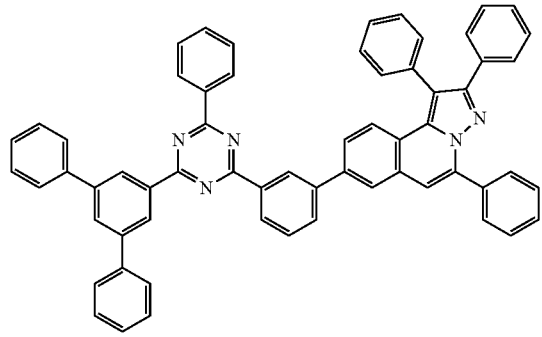
214
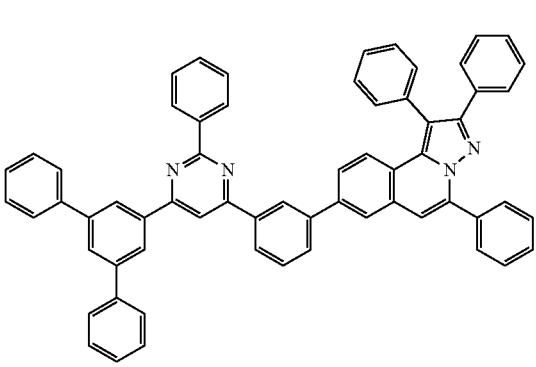
215
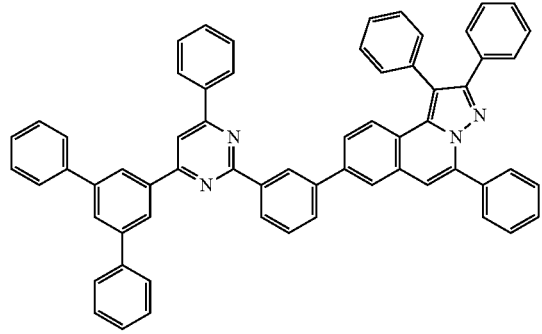
216
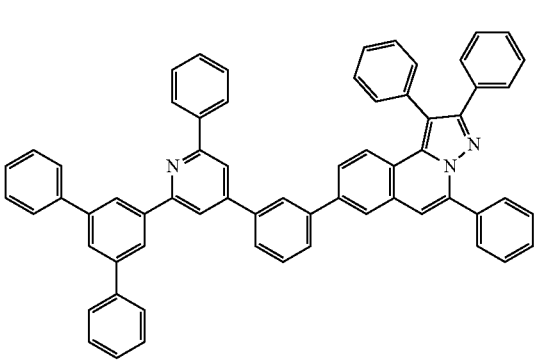
217
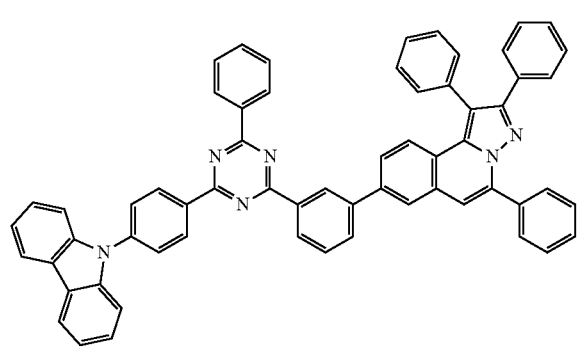
218
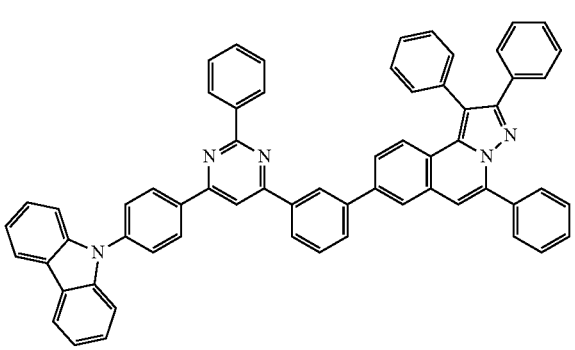

-continued
219
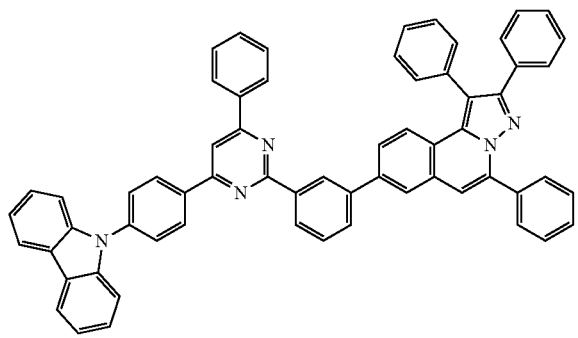
220
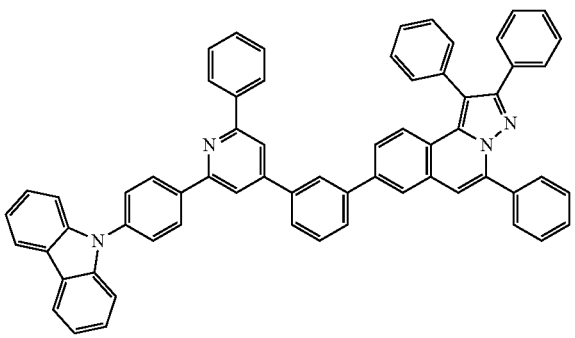
221
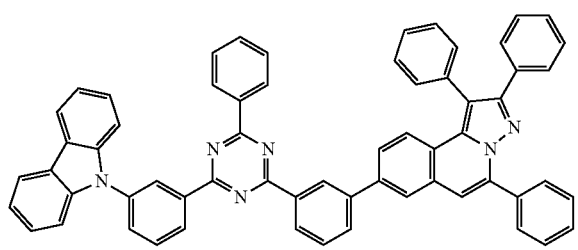
222
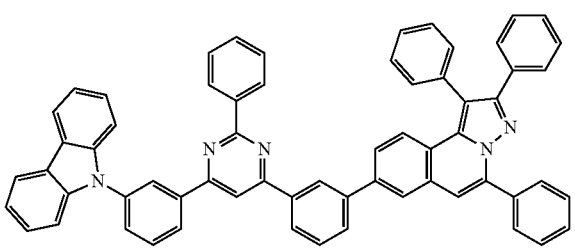
223
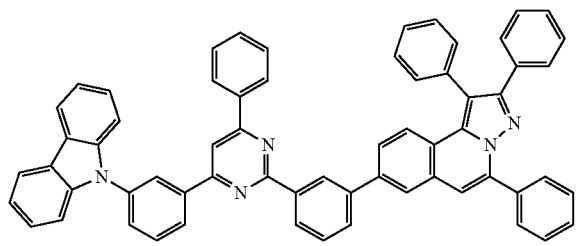
224
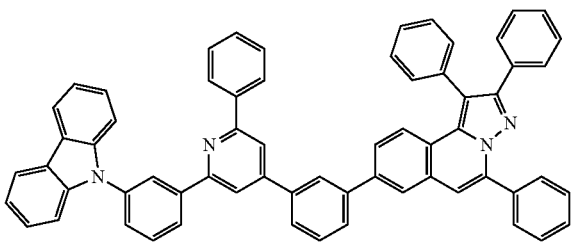
225
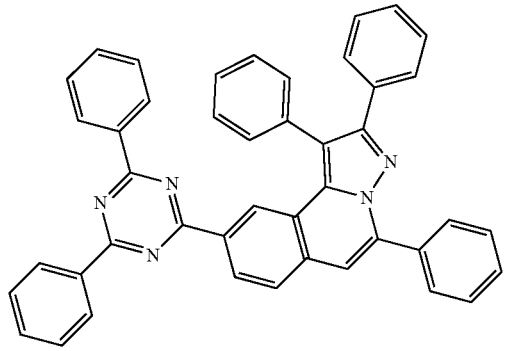
226
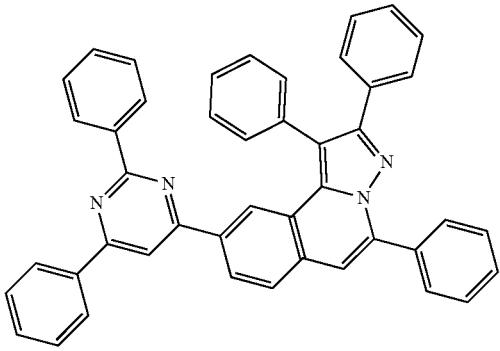
227
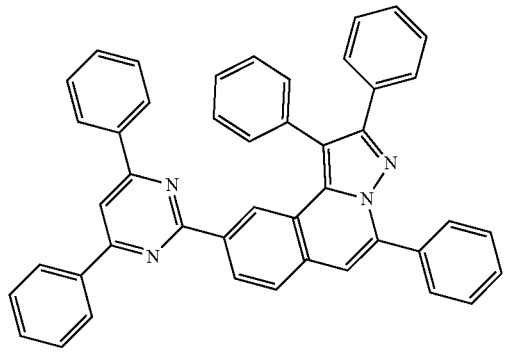
228
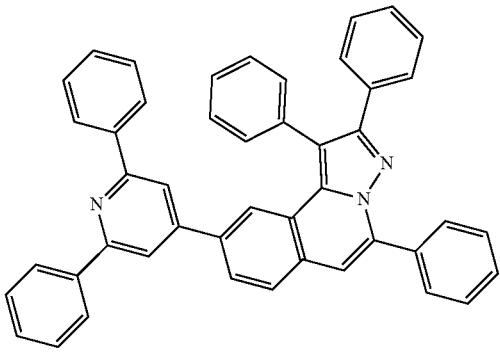

229
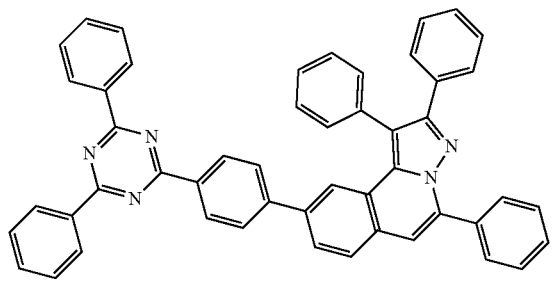
230
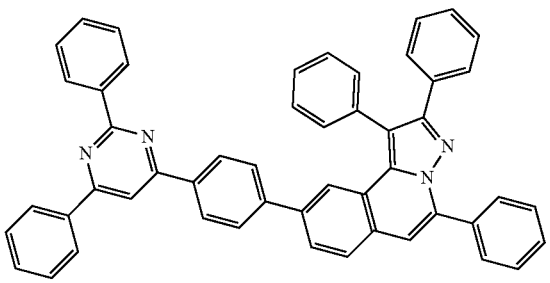
231
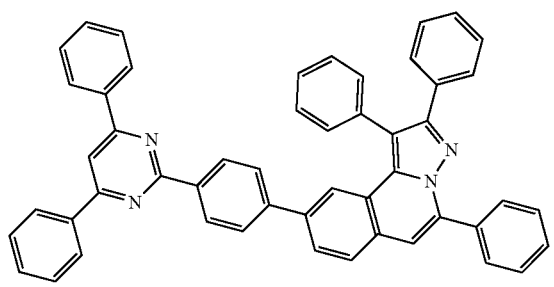
232
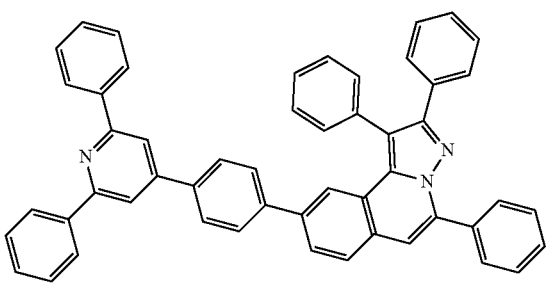
233
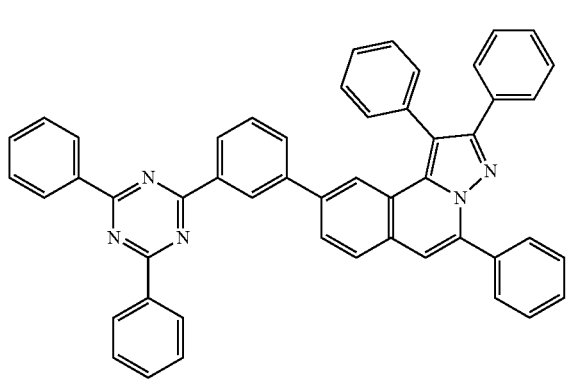
234
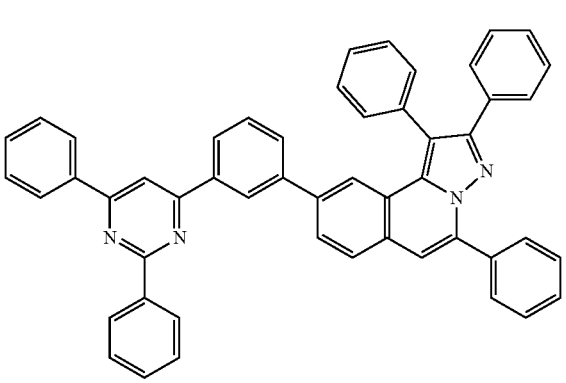
235
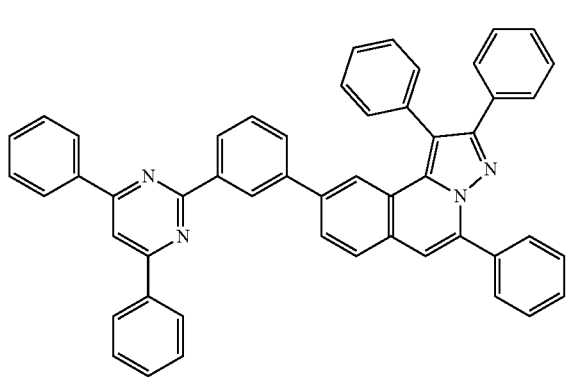
236
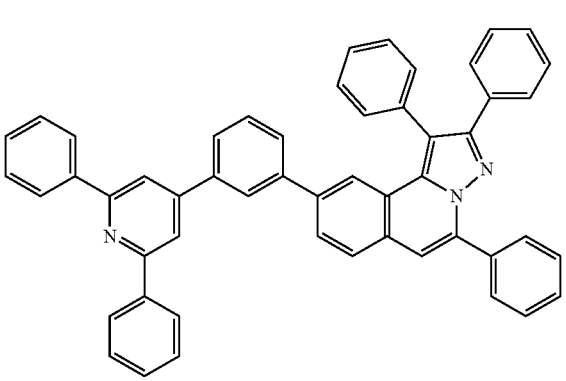
237
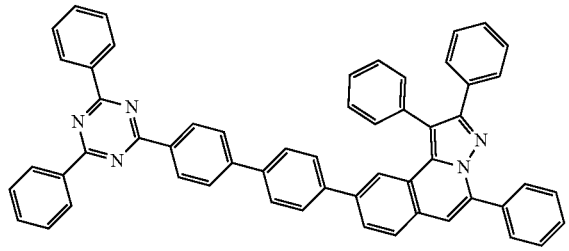
238
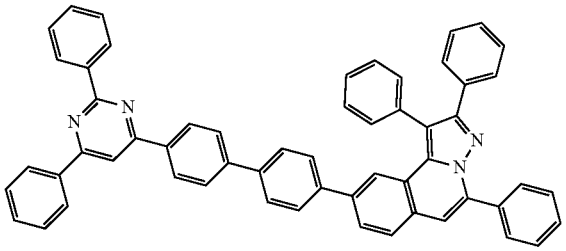

-continued
239
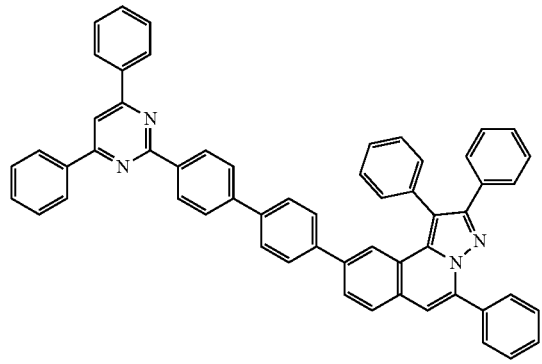
240
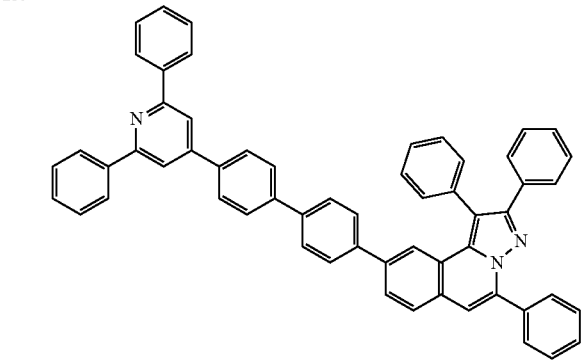
241
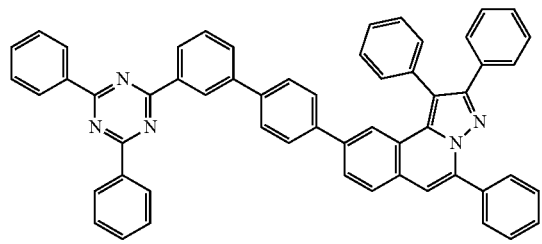
242
243
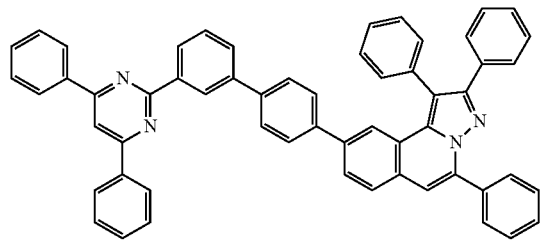
244
245
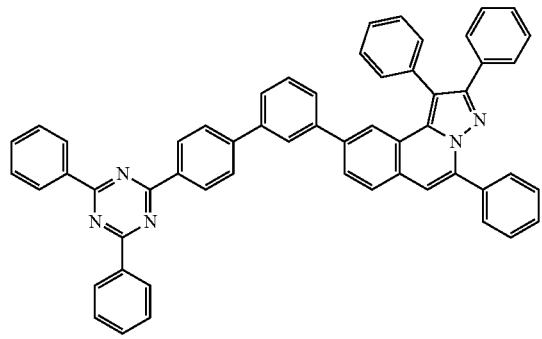
246
247
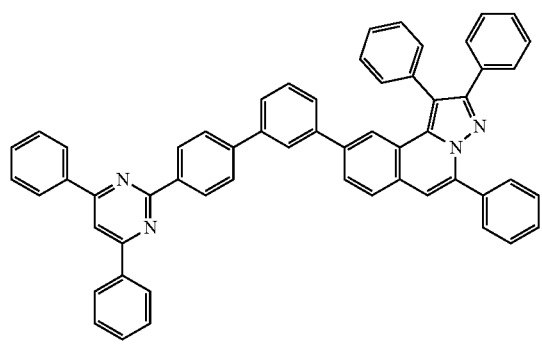
248
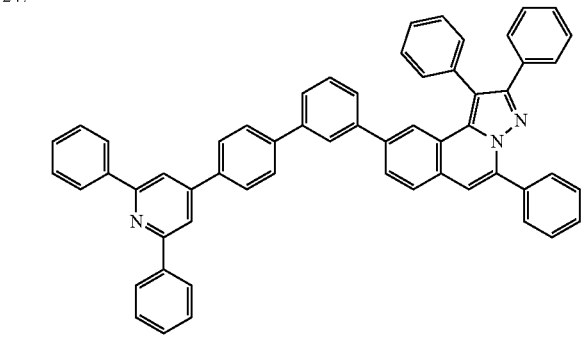

-continued
249 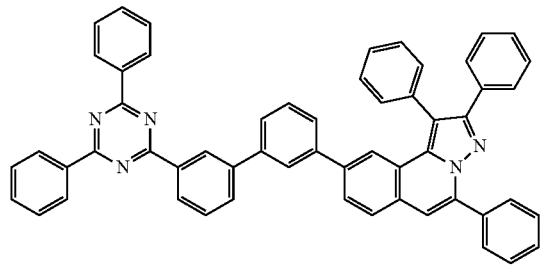
250
251 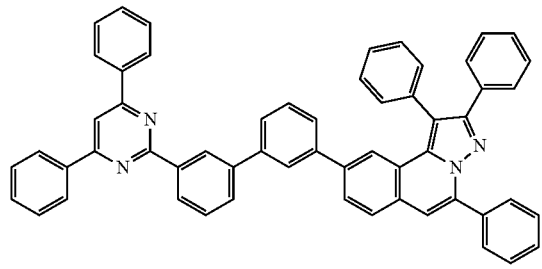
252
253 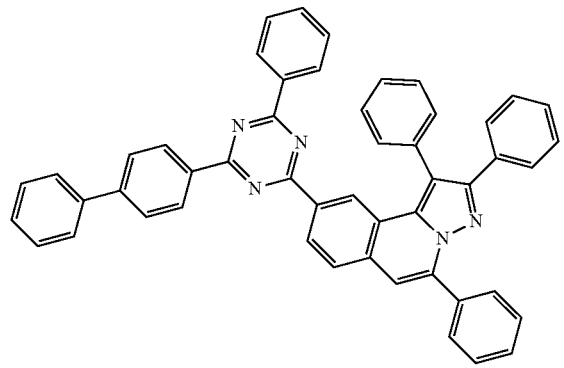
254
255 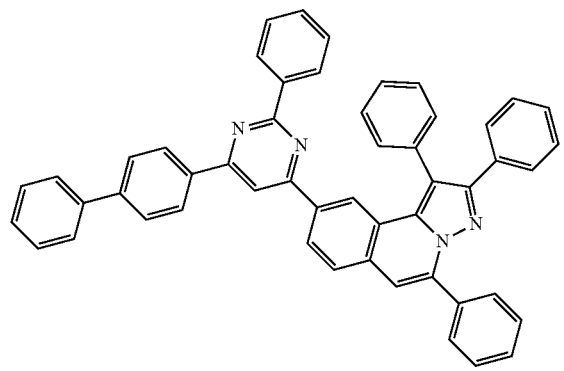
256 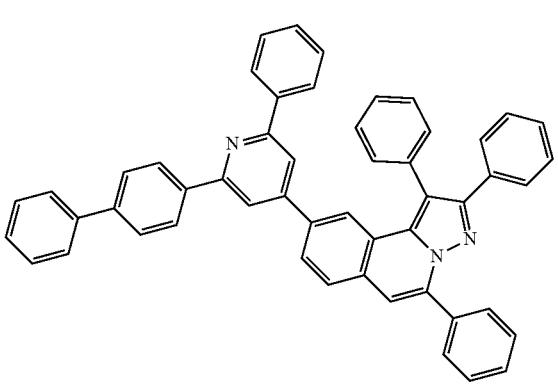

-continued
257
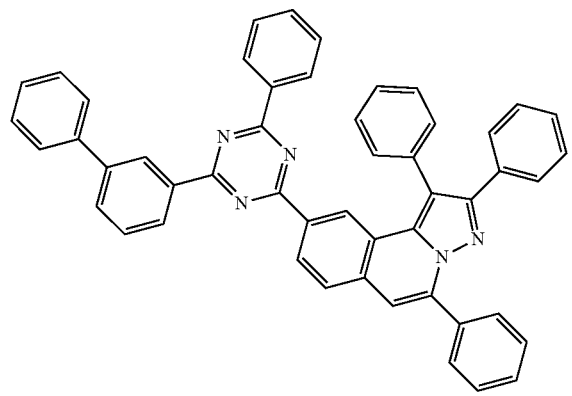
258
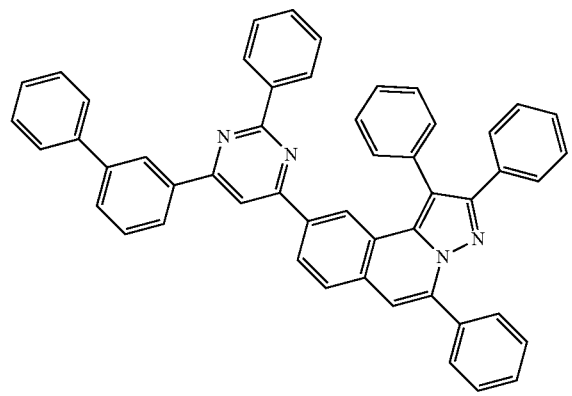
259
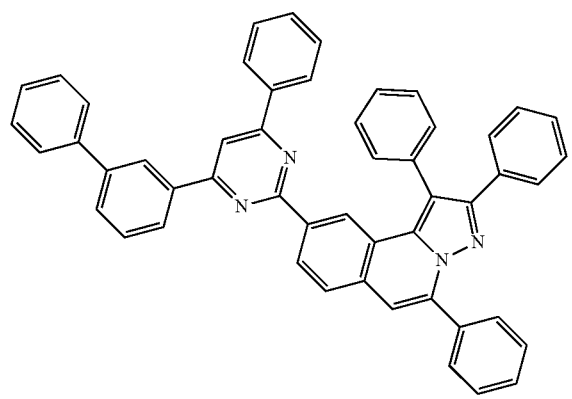
260
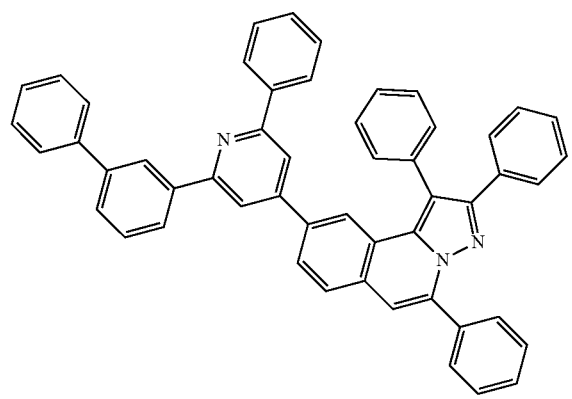
261
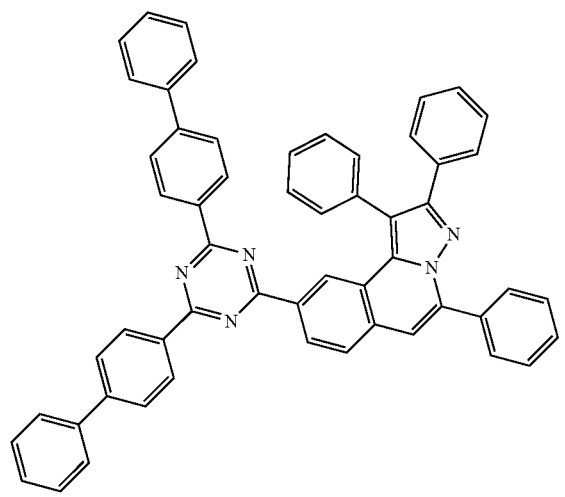
262
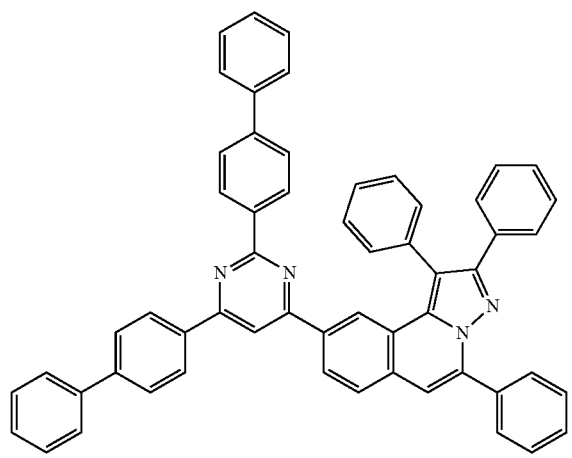

-continued
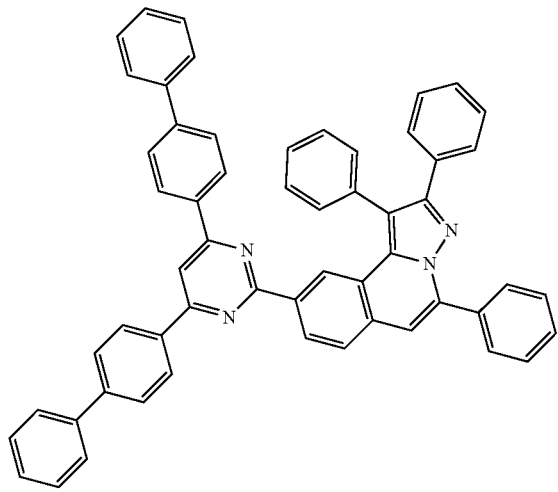
263
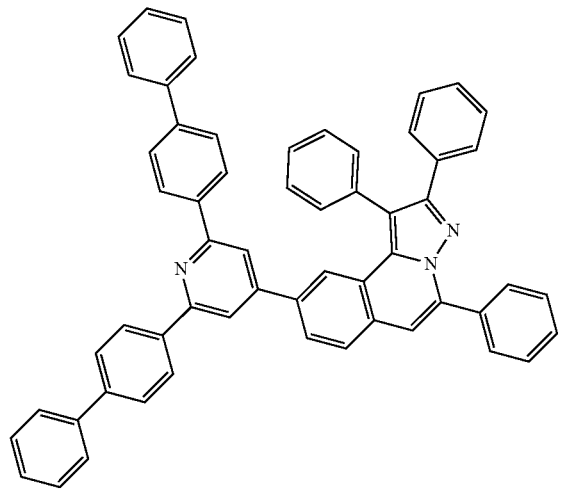
264
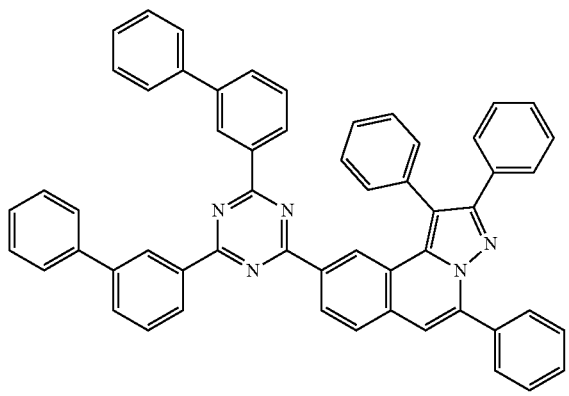
265
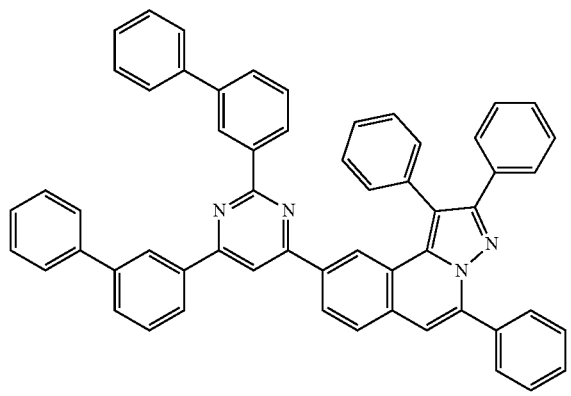
266
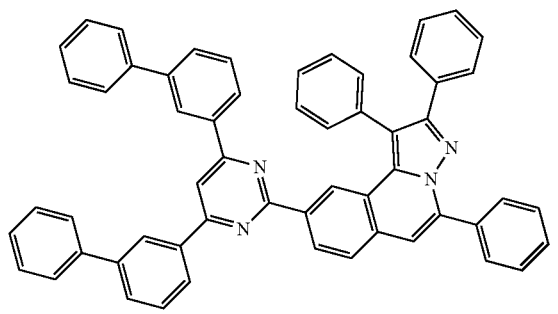
267
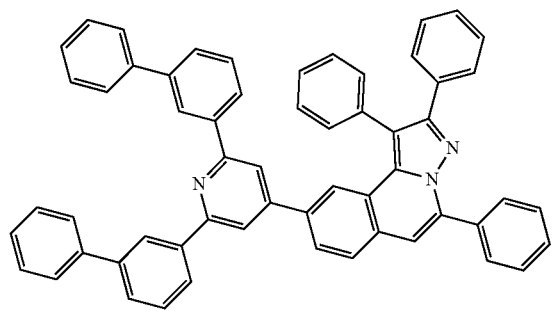
268
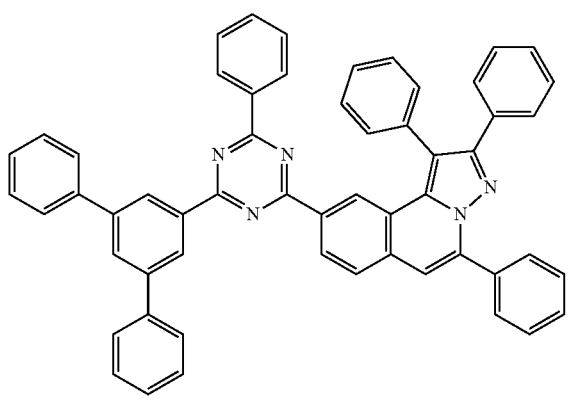
269
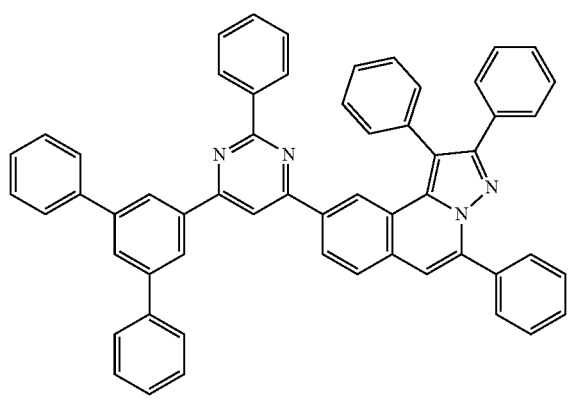
270

-continued
271
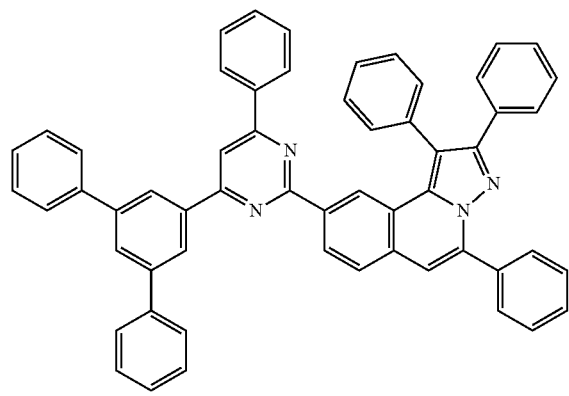
272
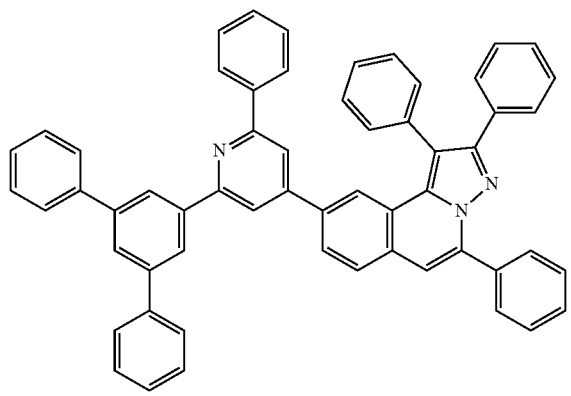
273
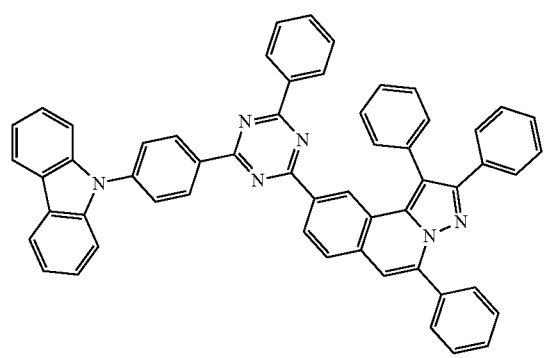
274
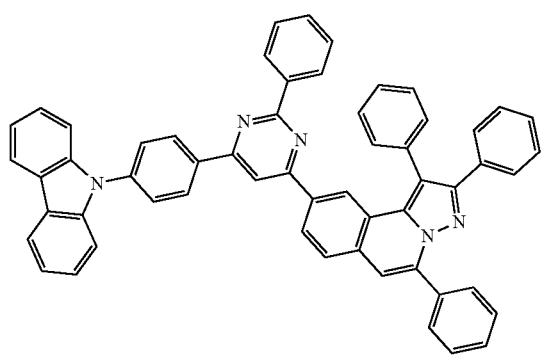
275
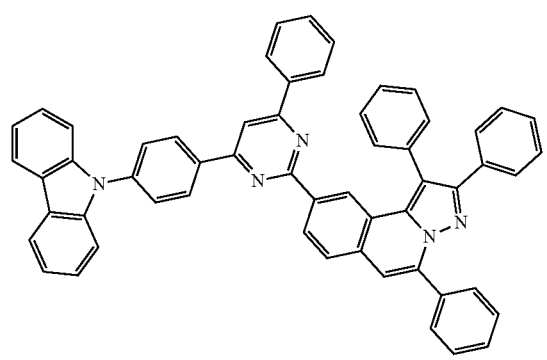
276
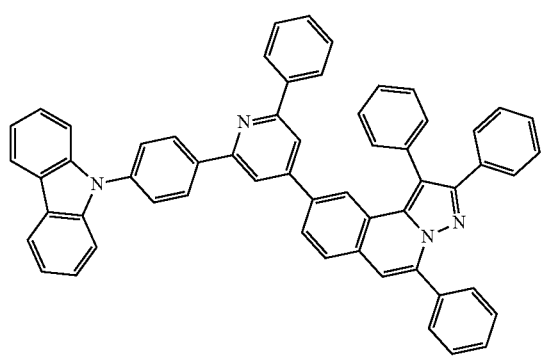
277
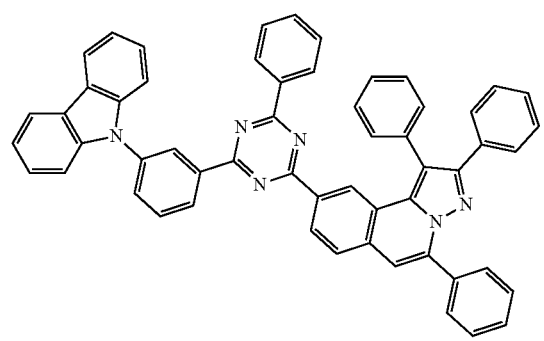
278
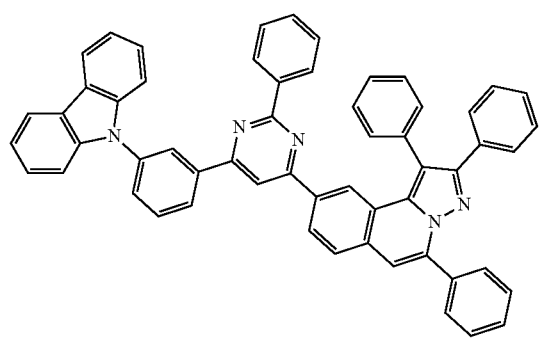

-continued
279
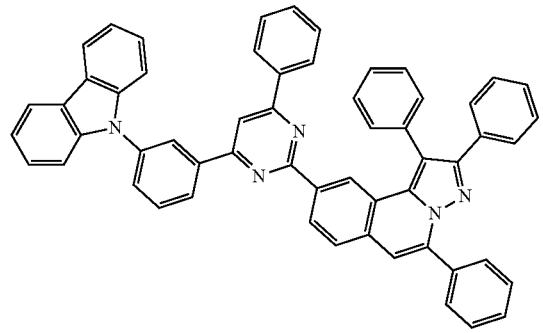
280
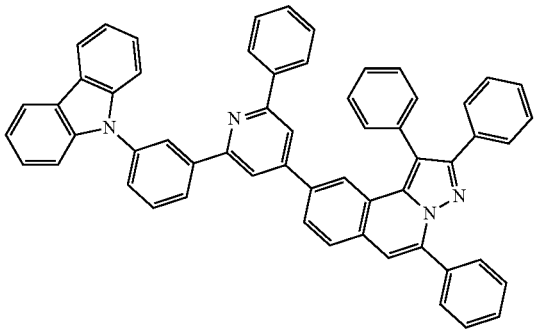
281
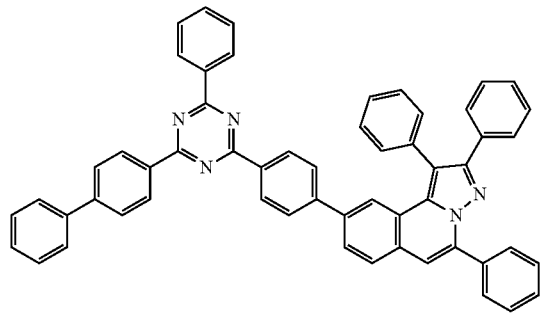
282
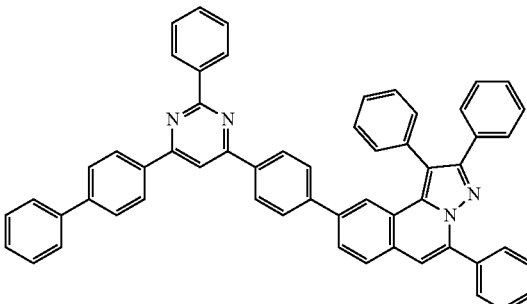
283
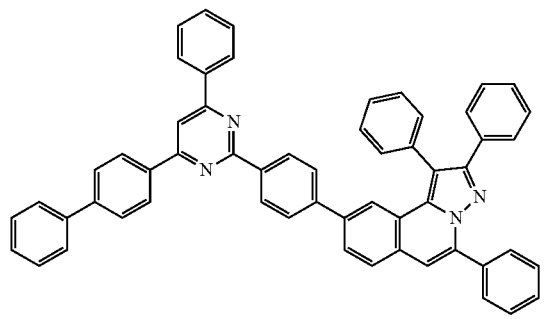
284
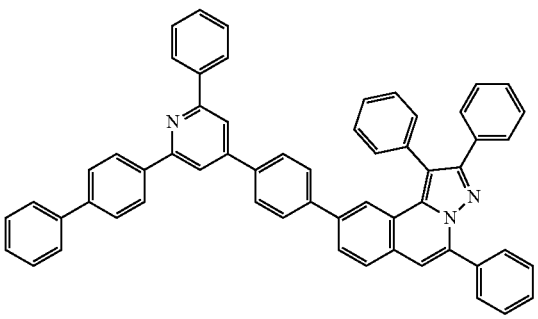
285
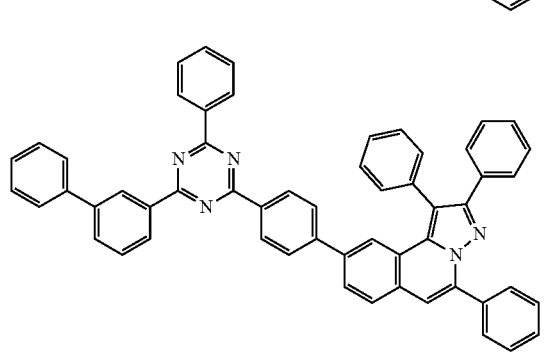
286
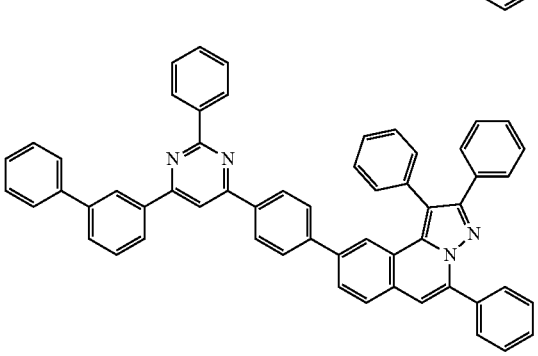
287
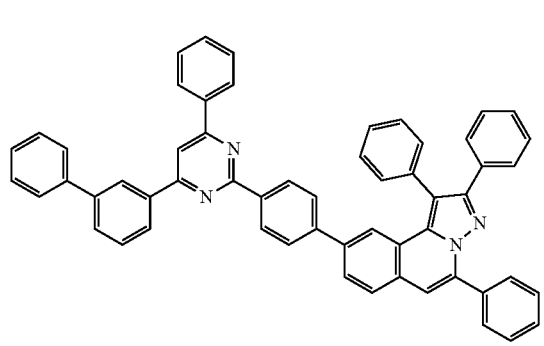
288
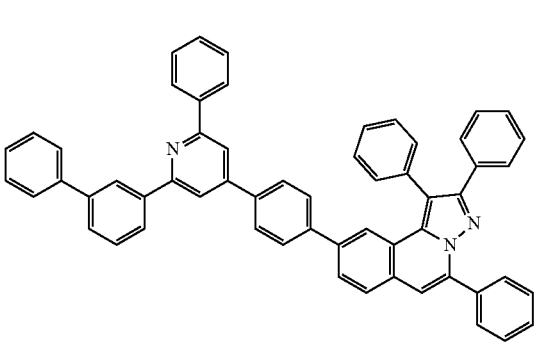

-continued
289
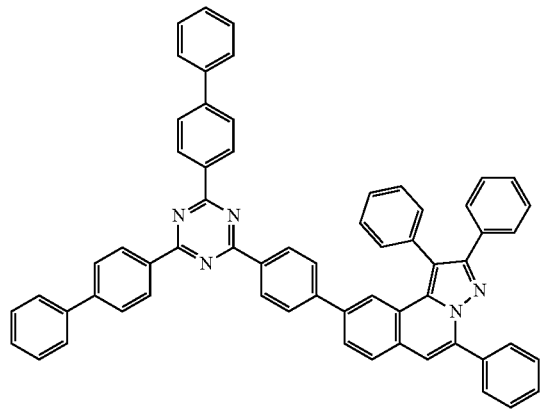
290
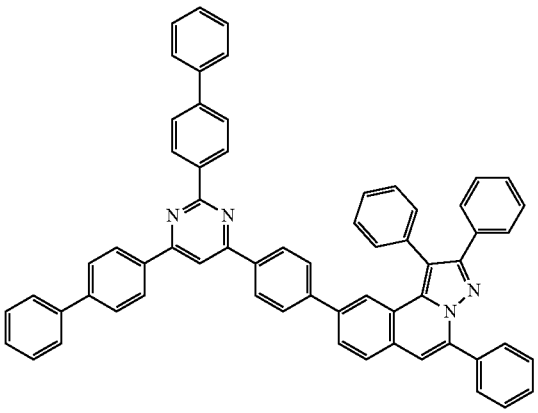
291
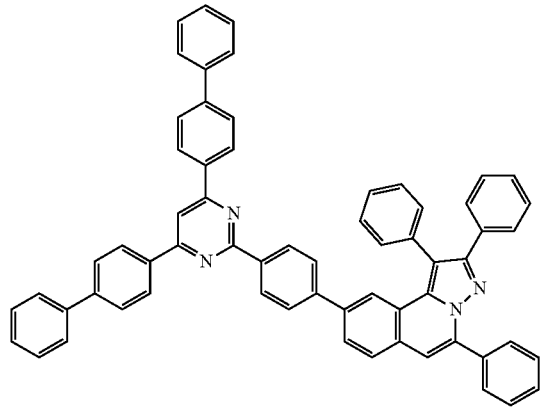
292
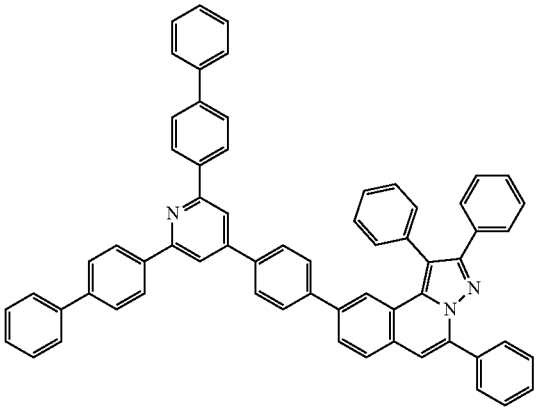
293
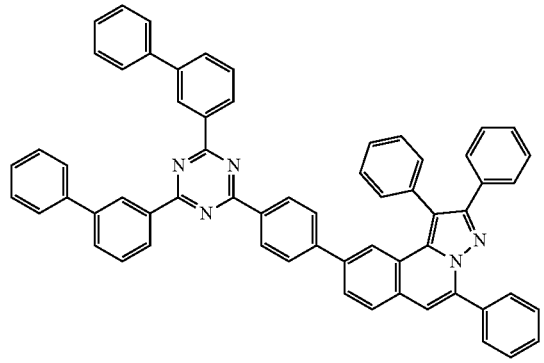
294
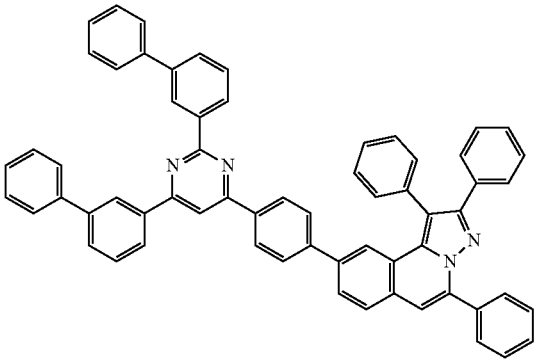
295
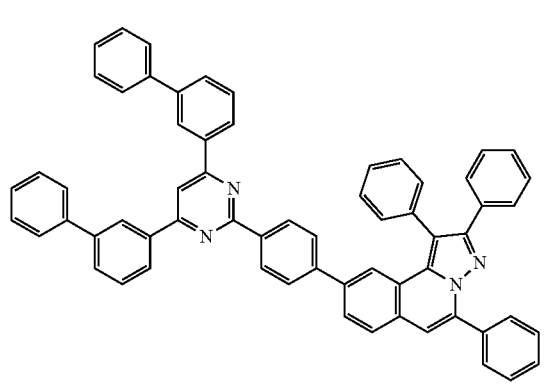
296
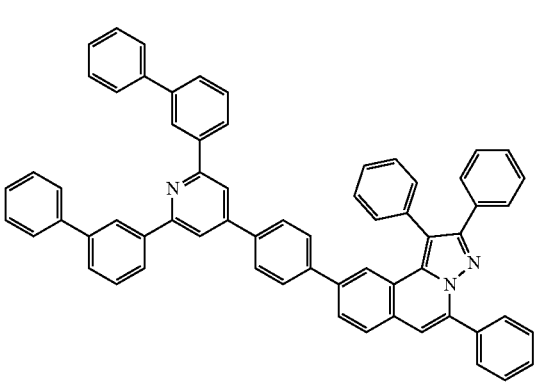

-continued
297
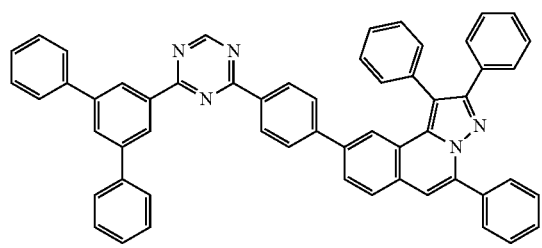
298
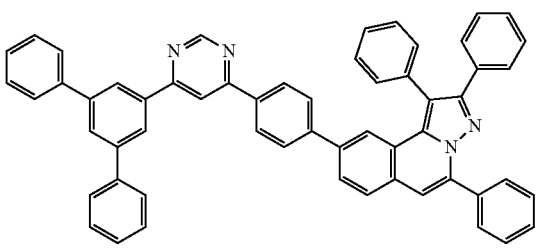
299
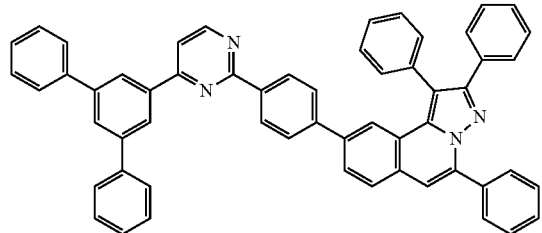
300
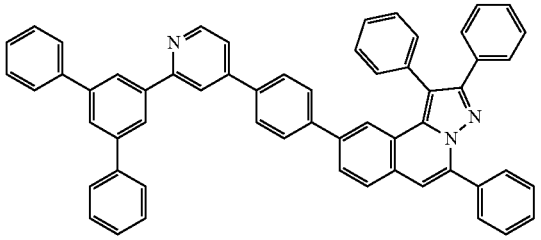
301
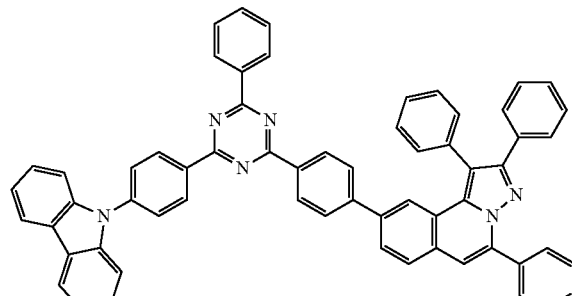
302
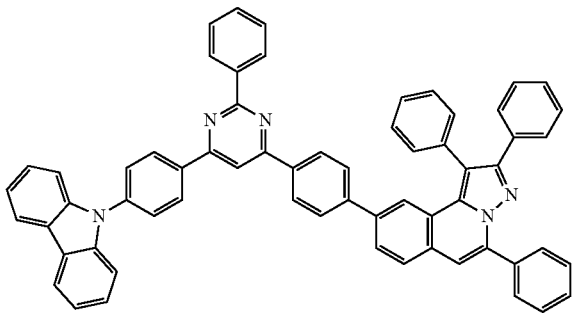
303
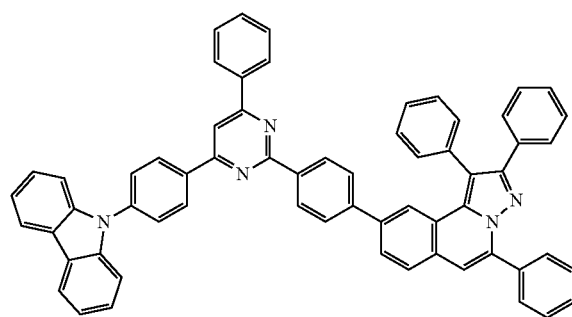
304
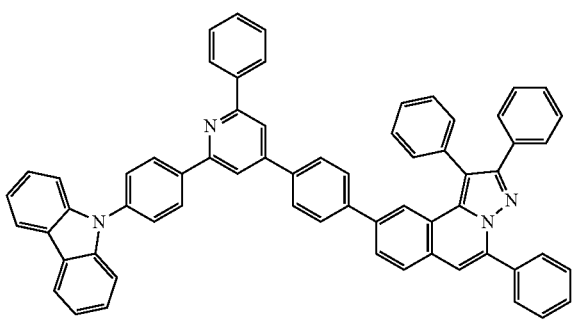
305
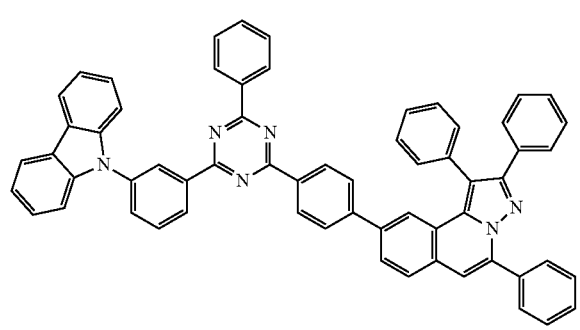
306
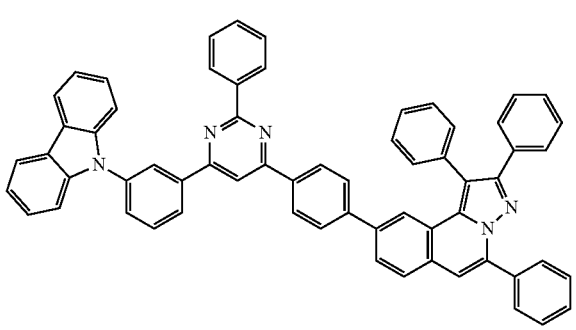

-continued
307
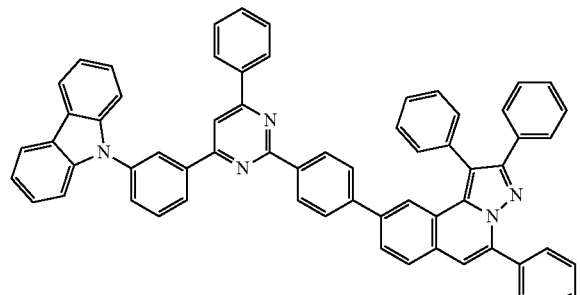
308
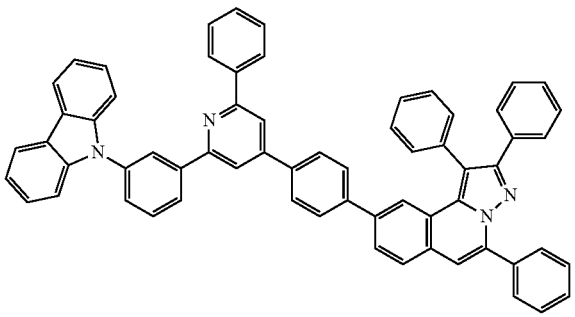
309
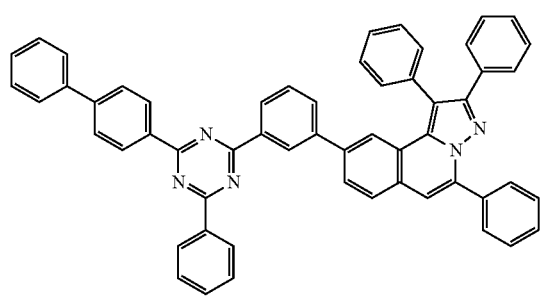
310
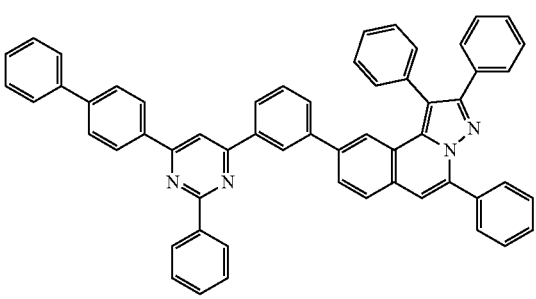
311
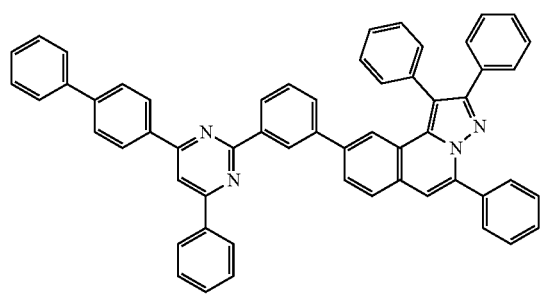
312
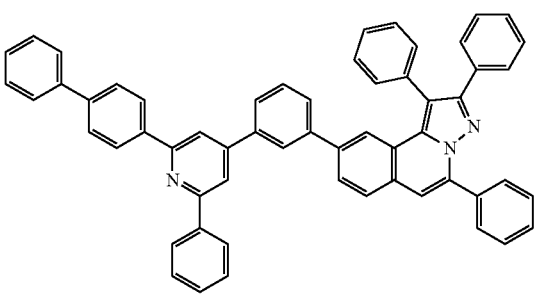
313
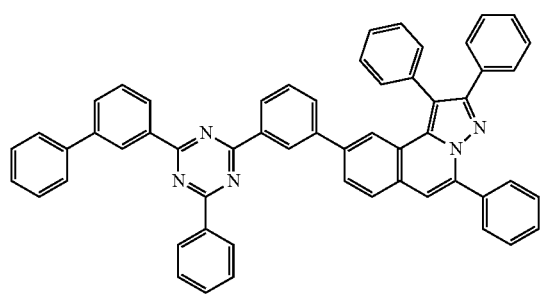
314
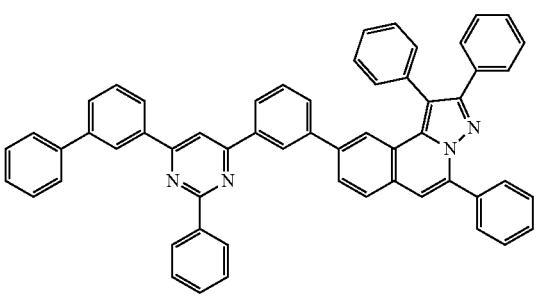
315
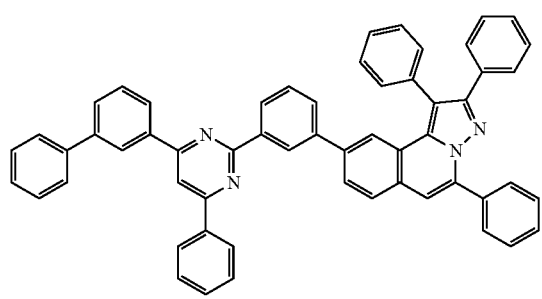
316
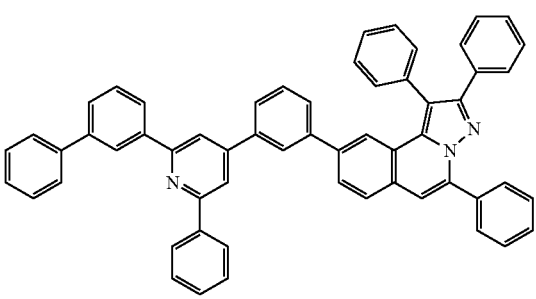

-continued
317
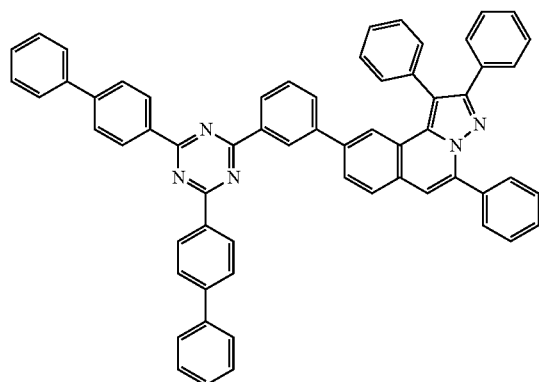
318
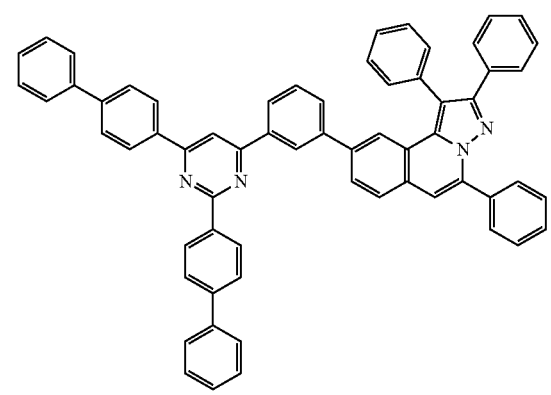
319
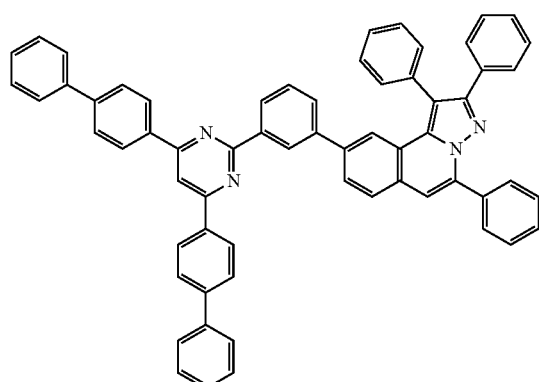
320
321
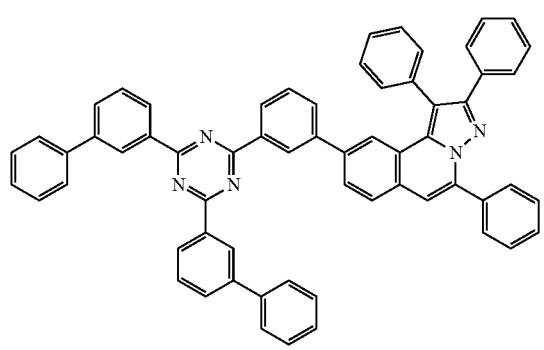
322
323
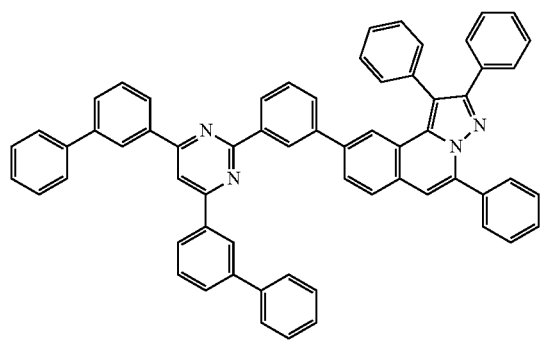
324
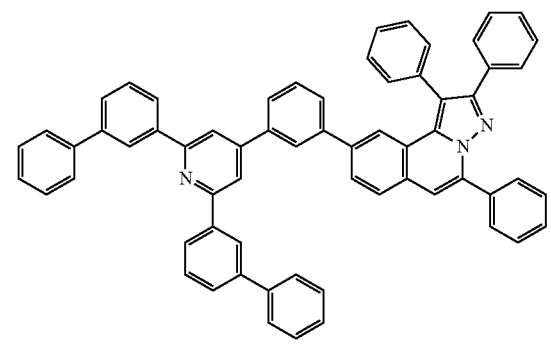

-continued
325
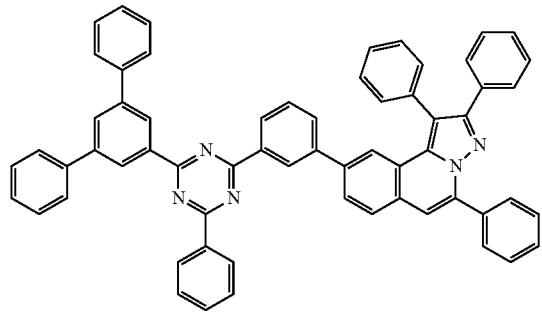
326
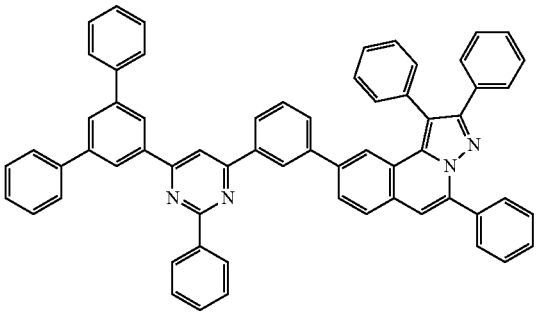
327
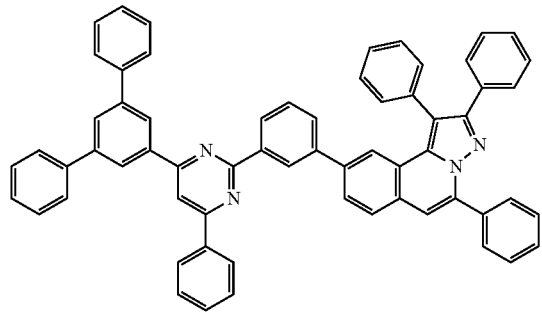
328
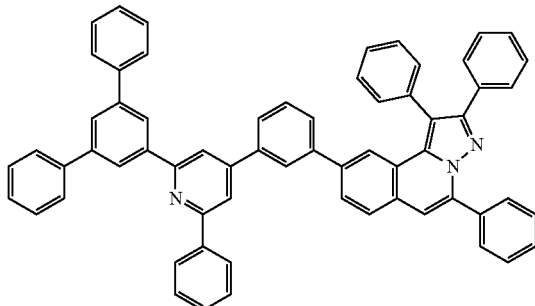
329
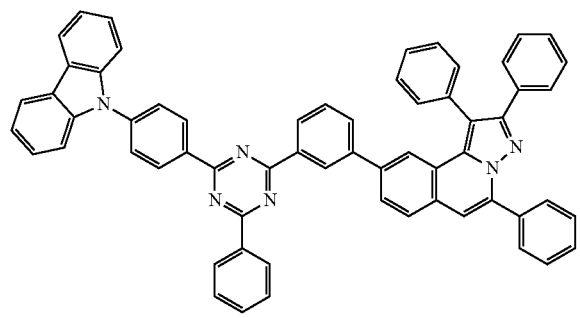
330
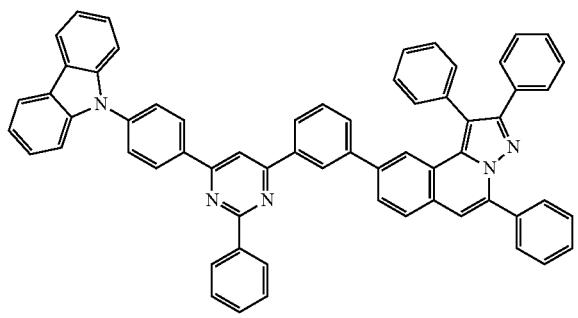
331
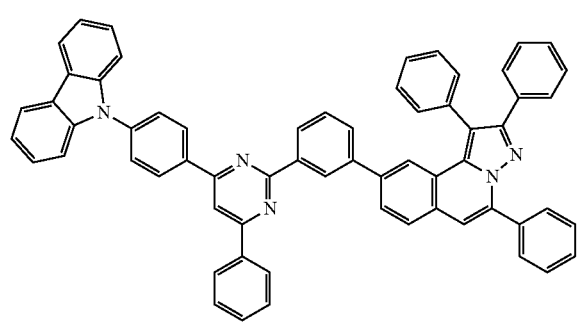
332
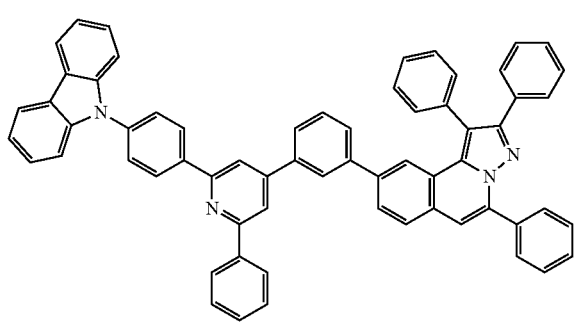
333
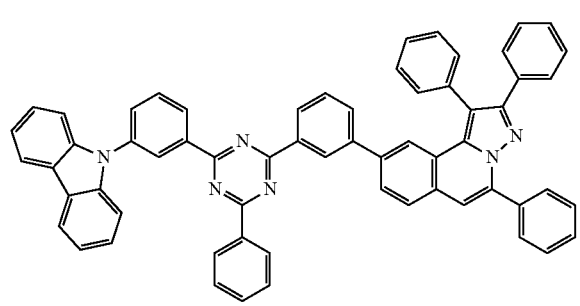
334
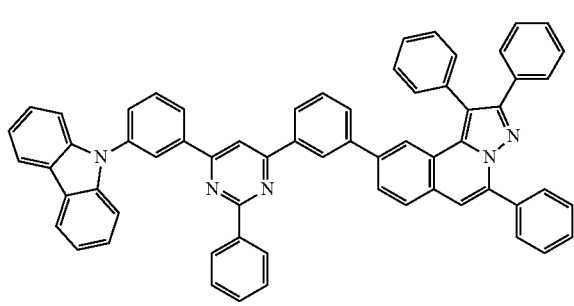

-continued
335
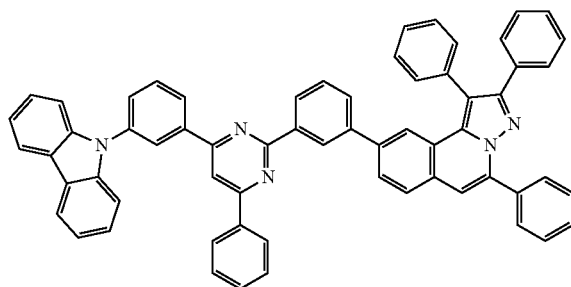
336
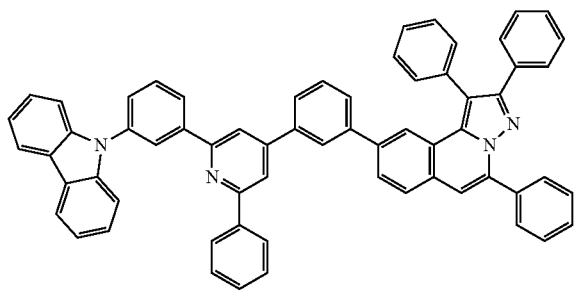
337
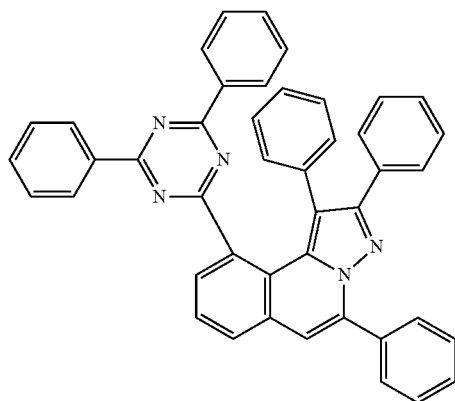
338
339
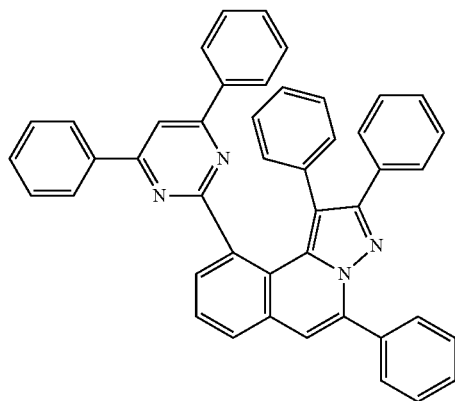
340
341
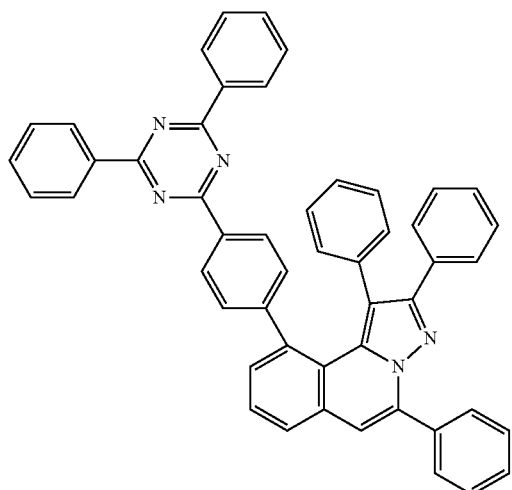
342
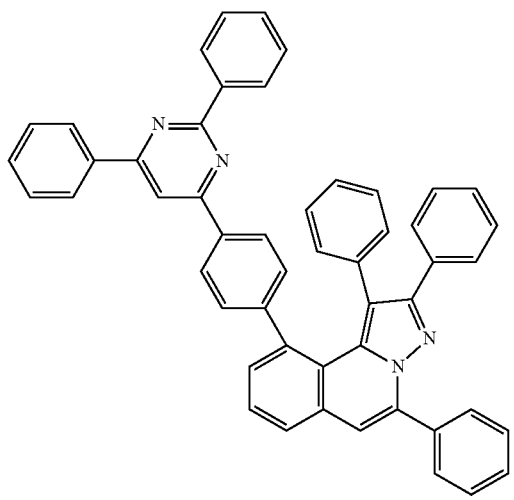

-continued
343
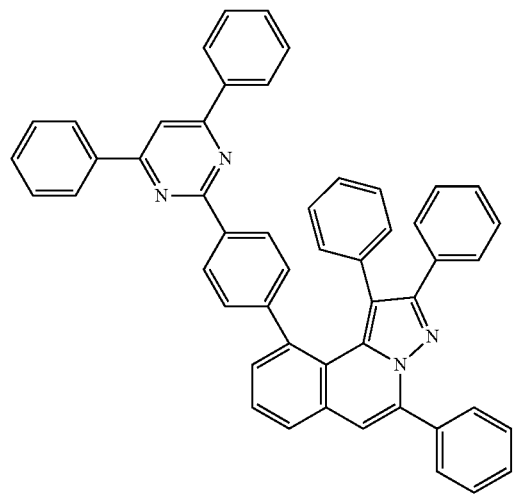
344
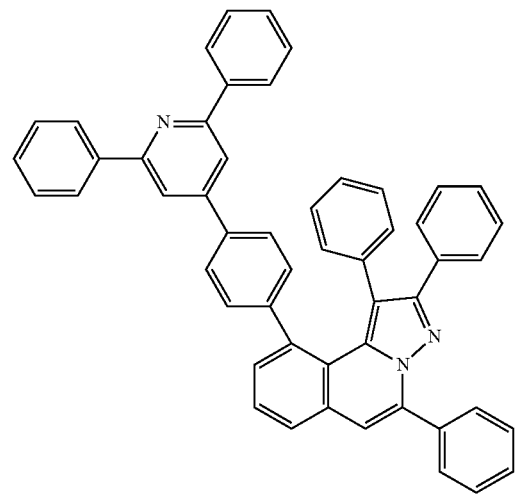
345
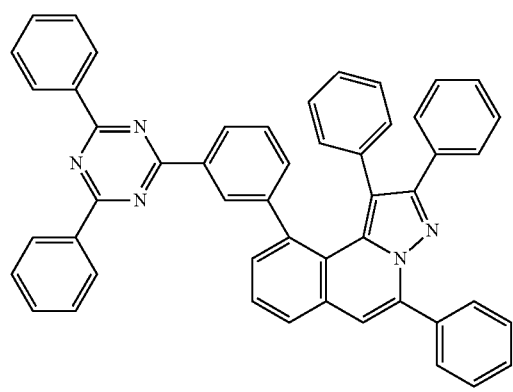
346
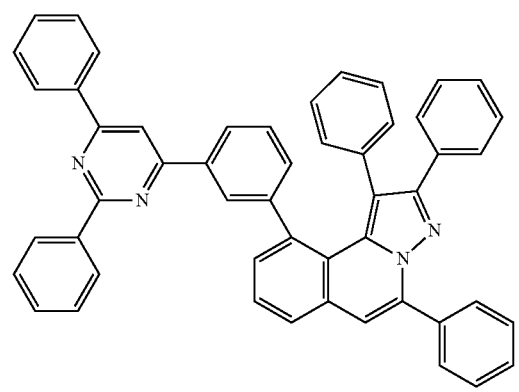
347
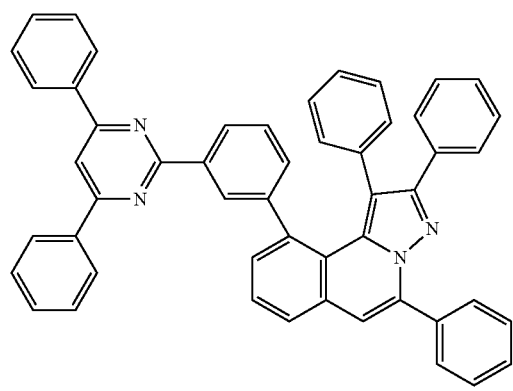
348
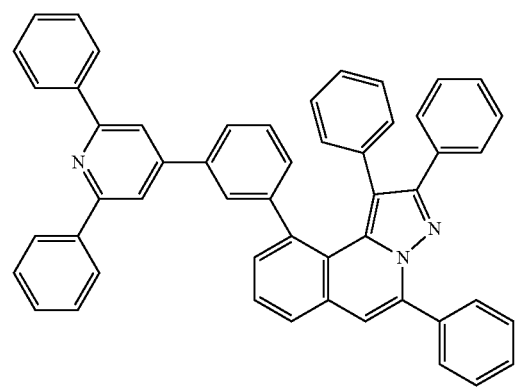

349
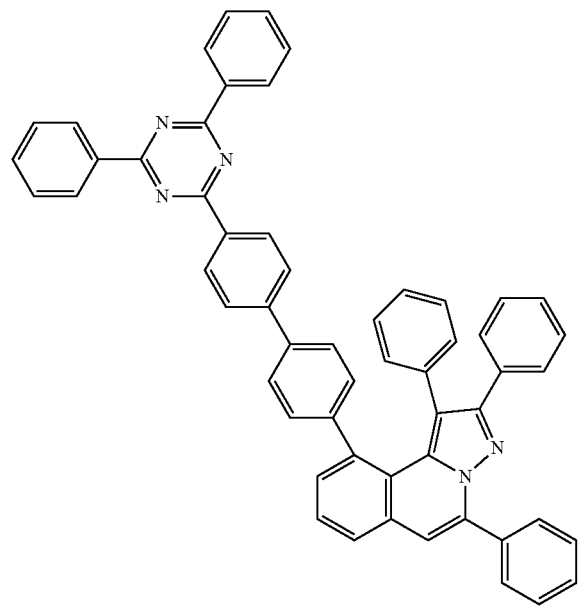
350
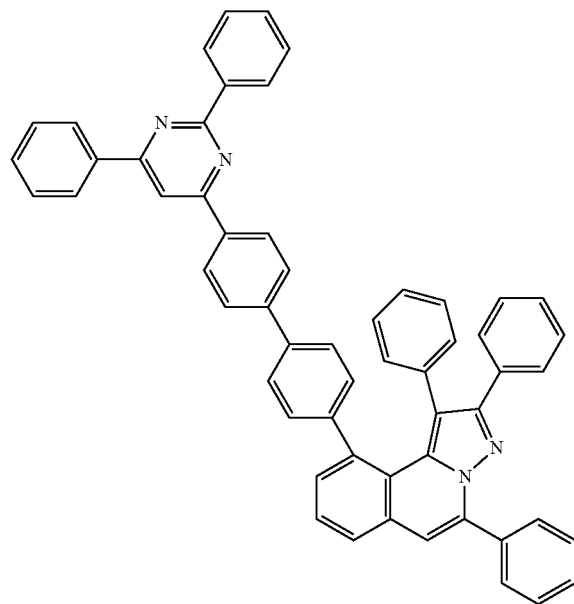
351
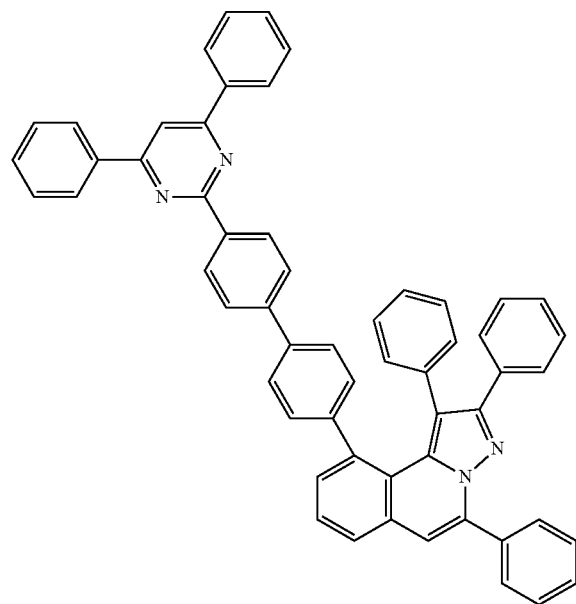
352
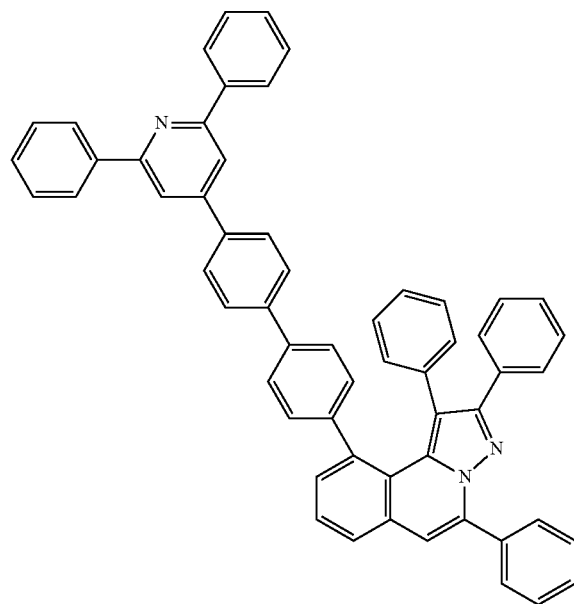

-continued
353
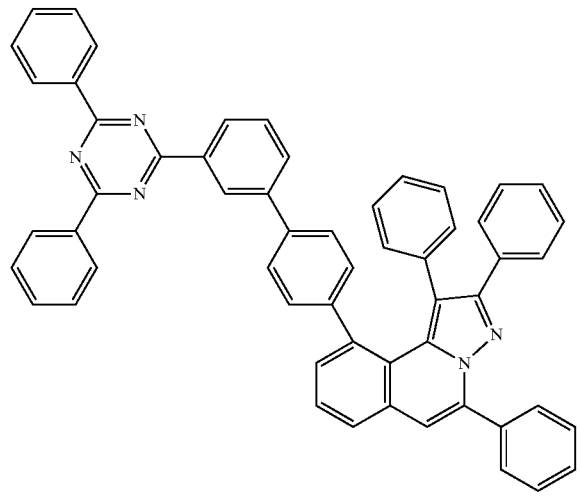
354
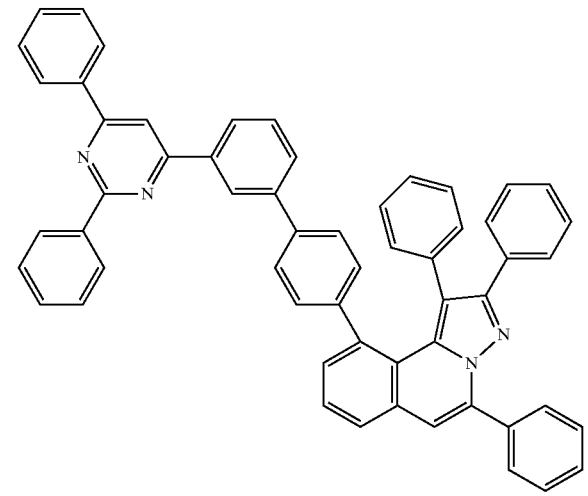
355
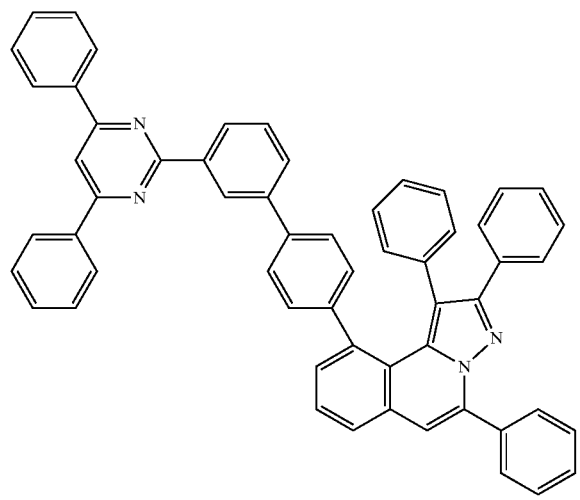
356
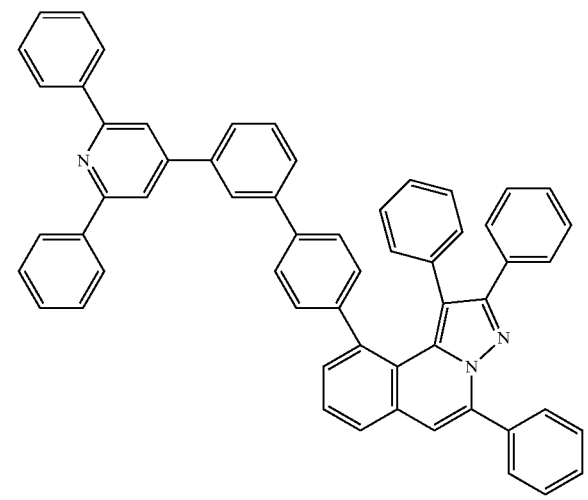
357
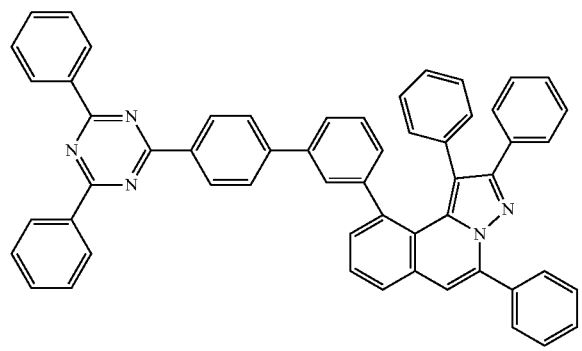
358
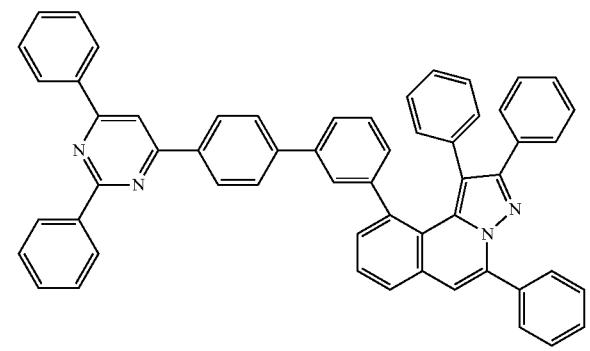

359
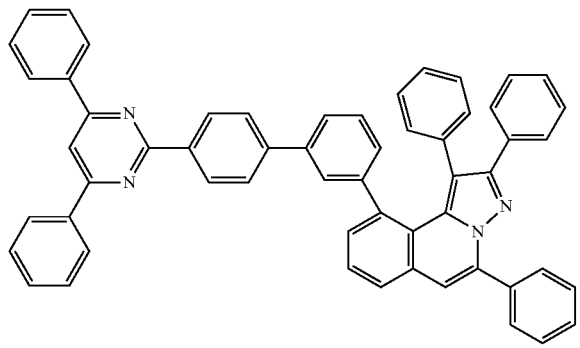
360
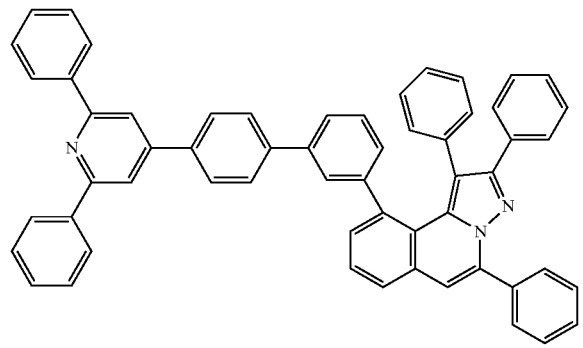
361
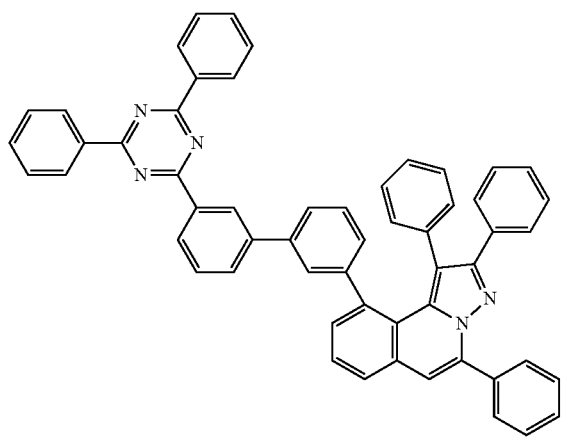
362
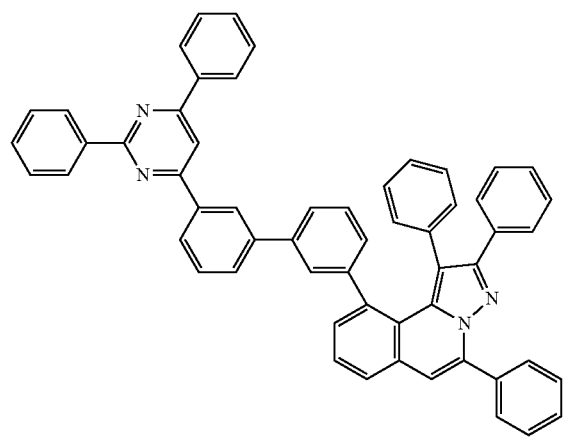
363
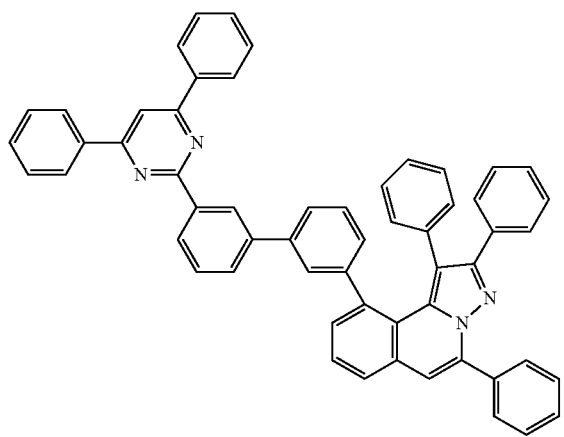
364
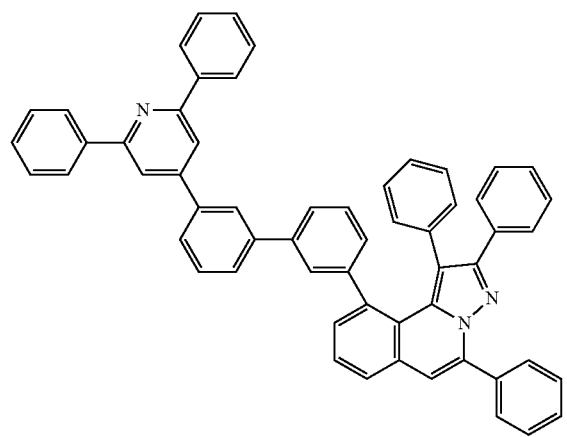

-continued
365
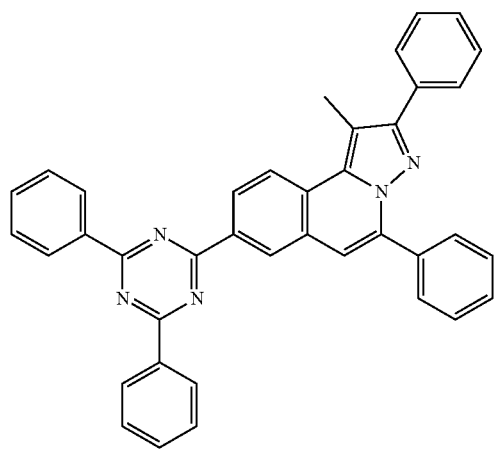
366
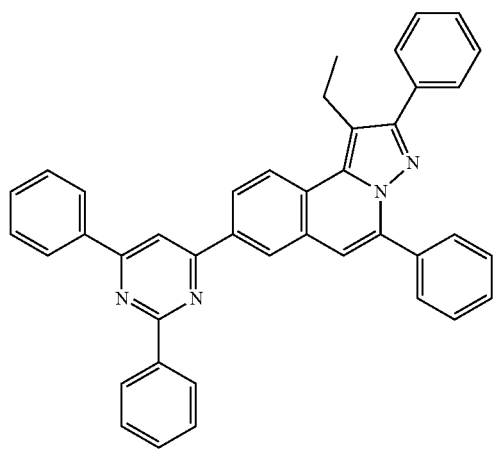
367
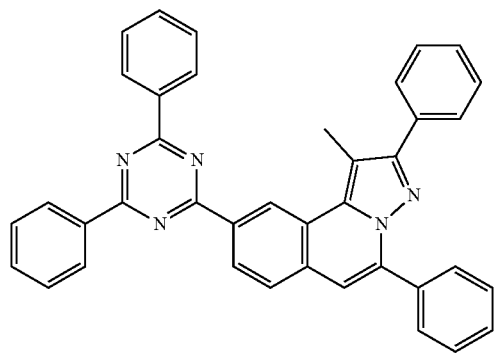
368
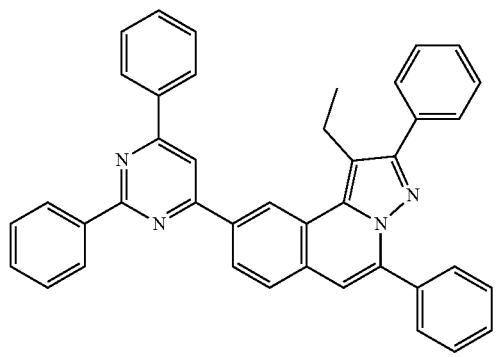
369
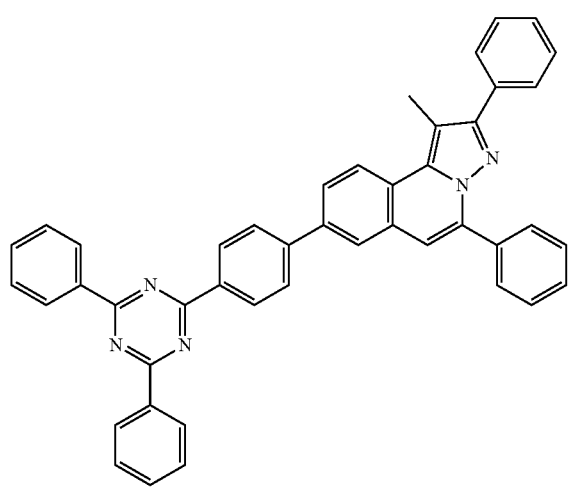
370
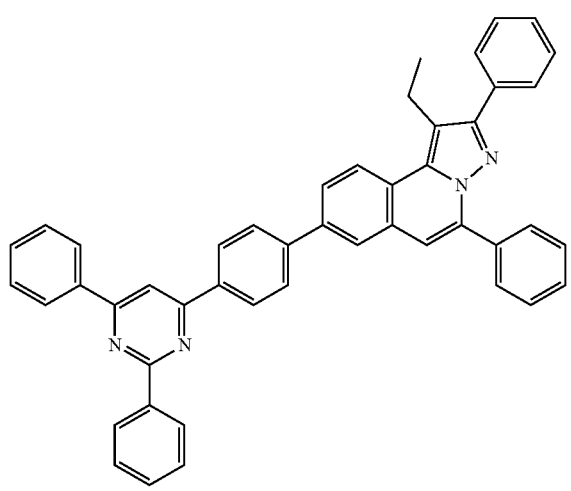

-continued
| 371 | 372 |
|---|---|
| 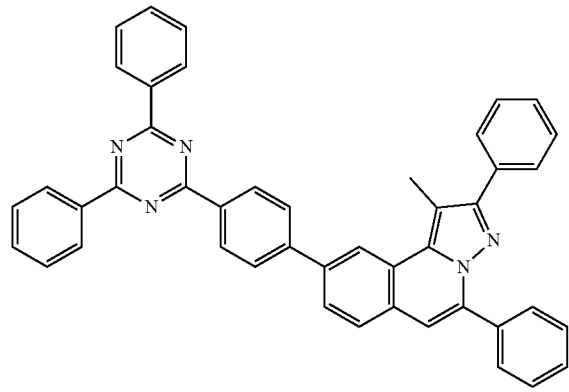 | 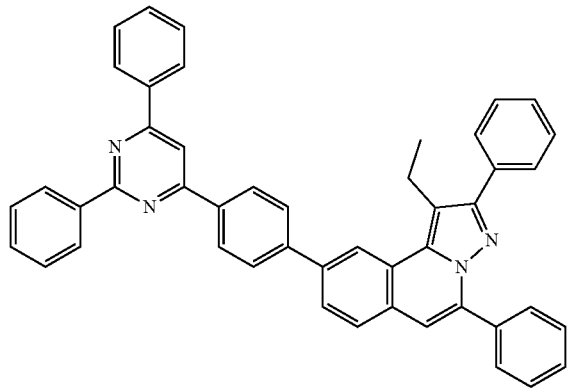 |
| 373 | 374 |
| 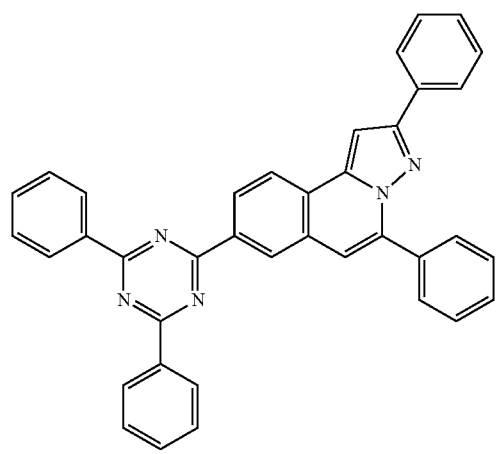 | 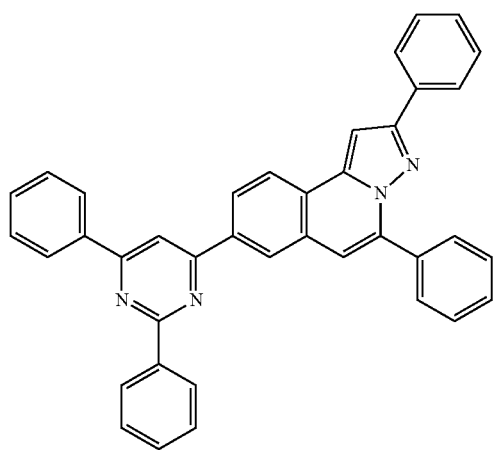 |
| 375 | 376 |
| 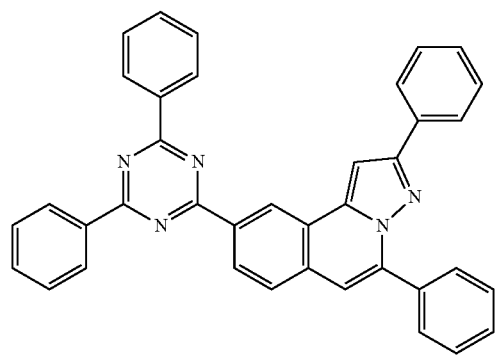 | 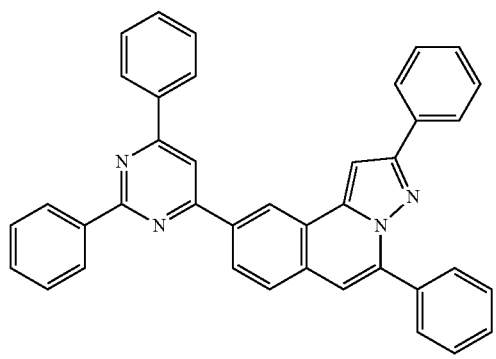 |

-continued
377
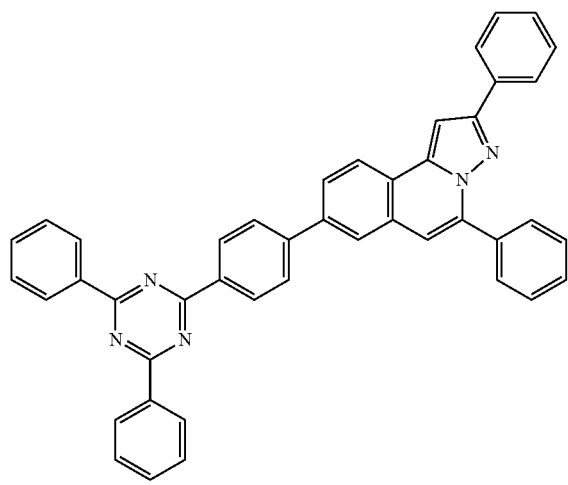
378
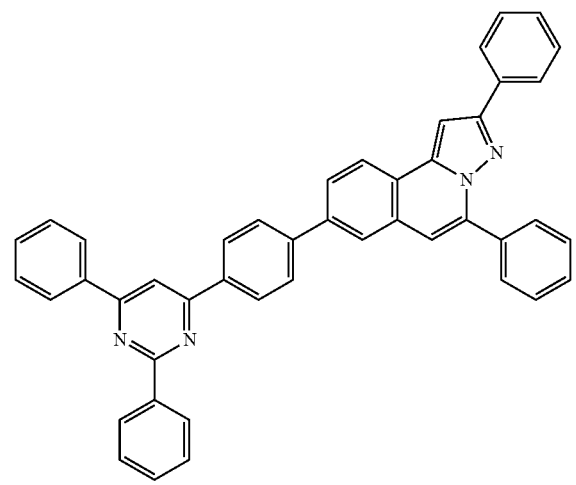
379
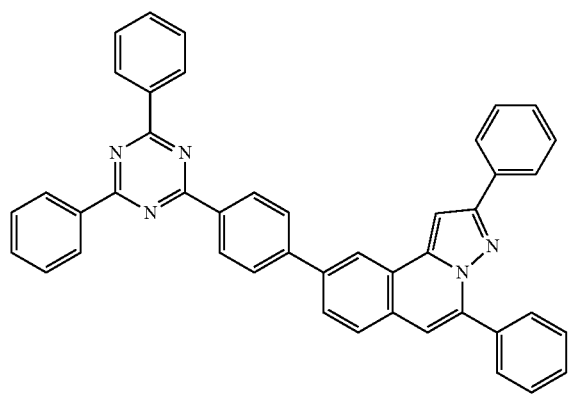
380
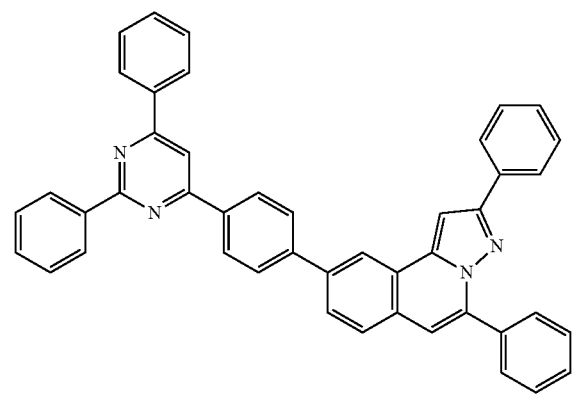
381
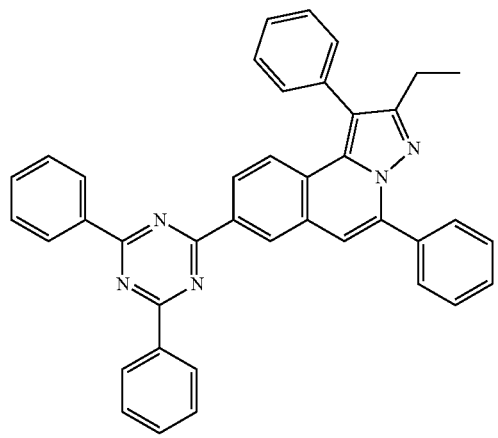
382
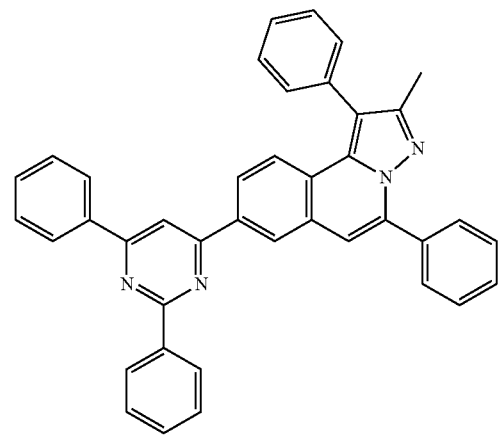

-continued
| 383 | 384 |
|---|---|
| 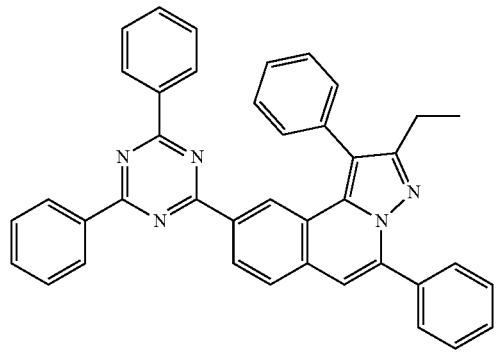 | 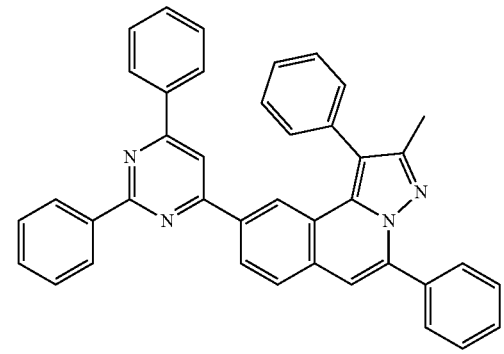 |
| 385 | 386 |
| 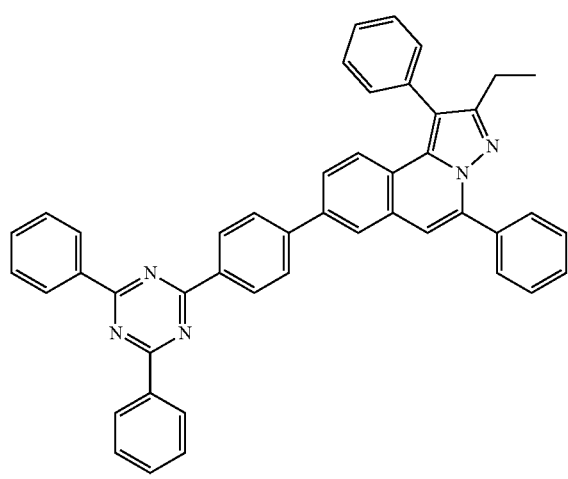 | 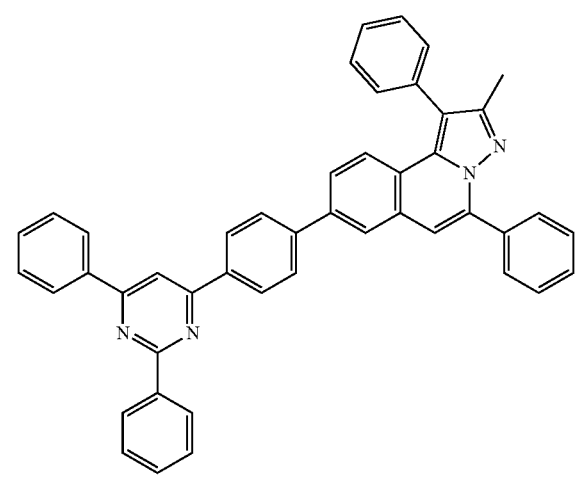 |
| 387 | 388 |
| 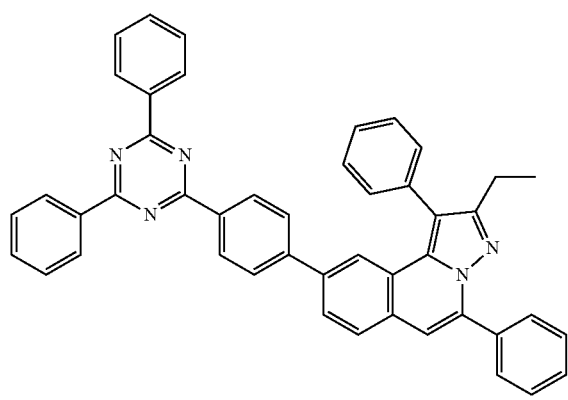 | 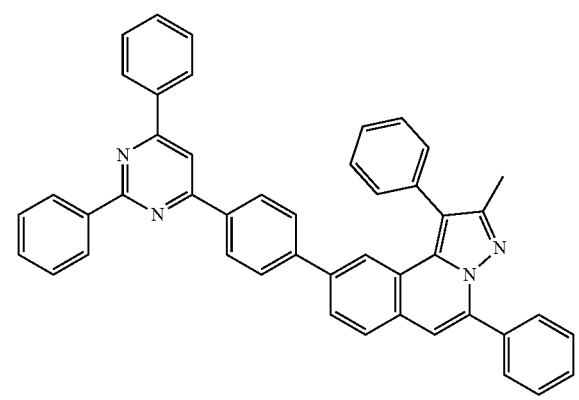 |

-continued
281 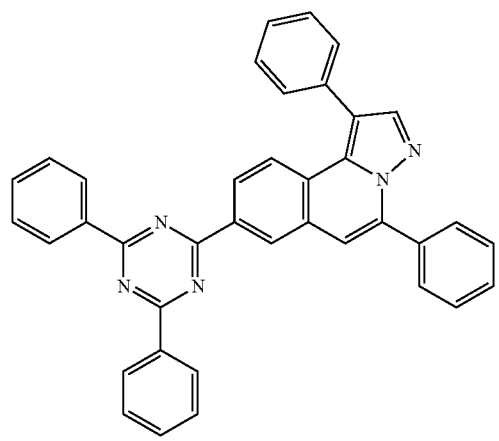
389
282 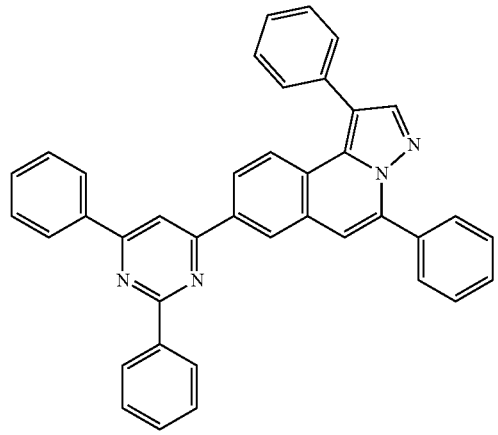
390
391 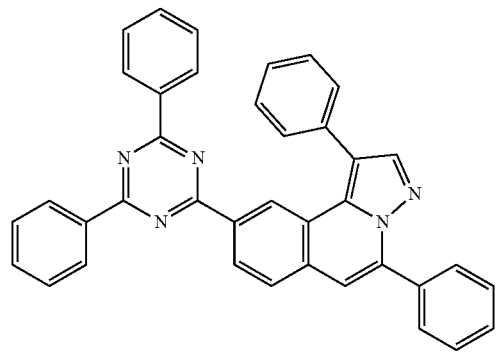
392 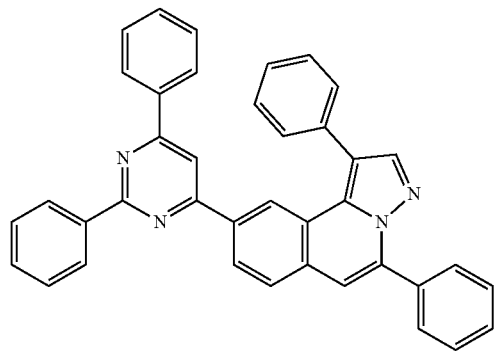
393 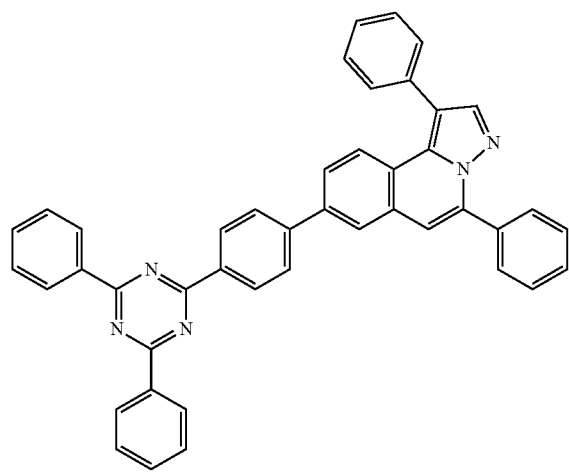
394 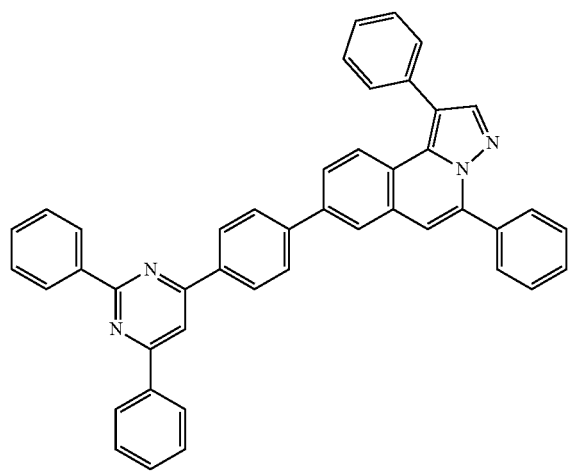

-continued
395
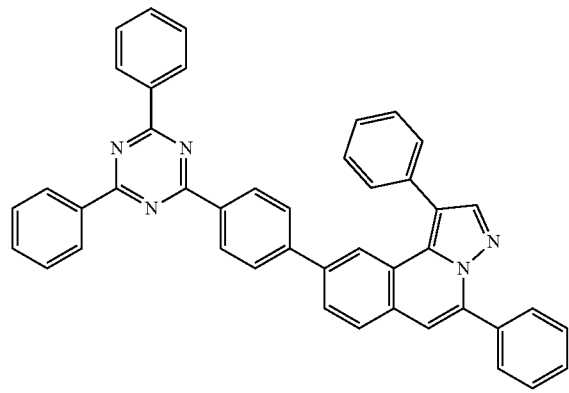
396
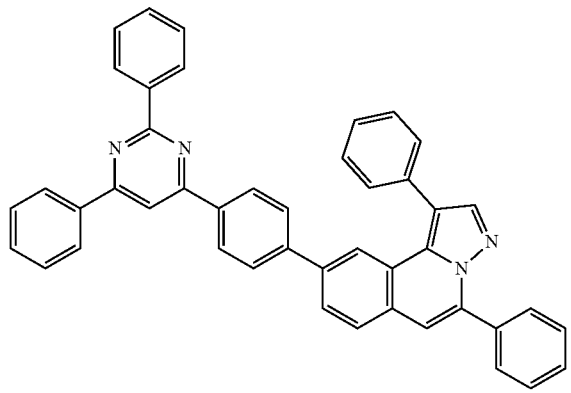
397
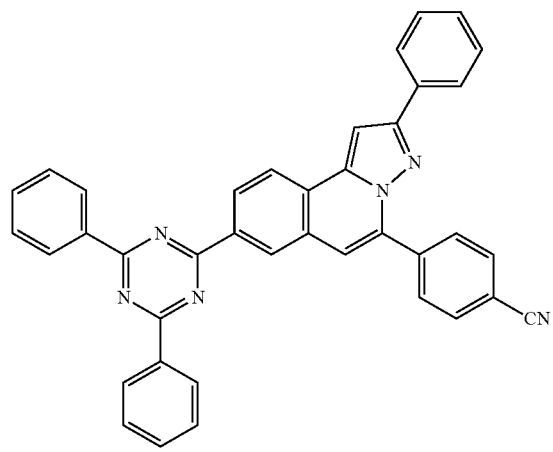
398
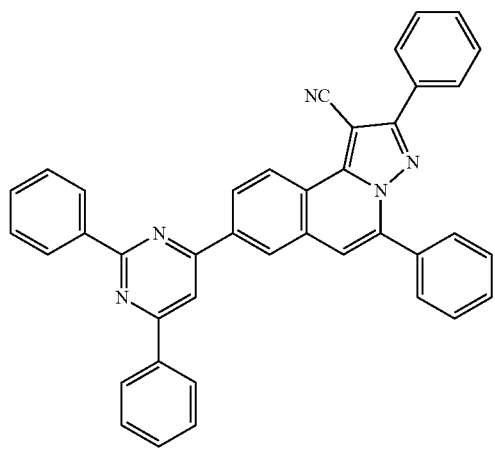
399
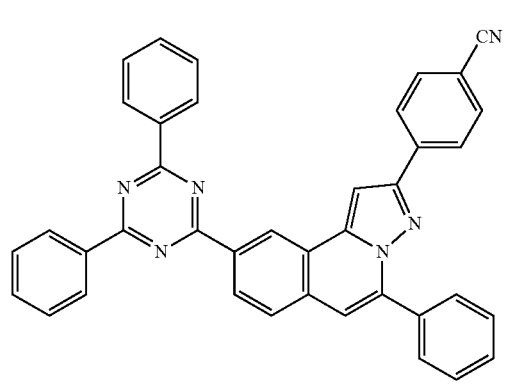
400
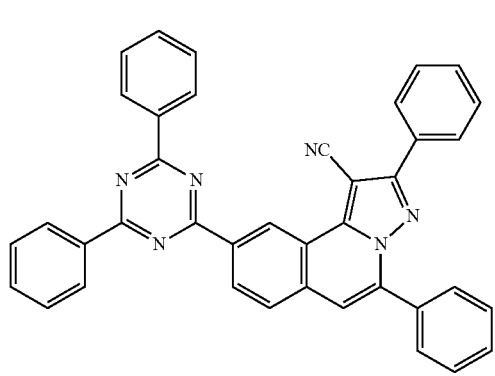

-continued
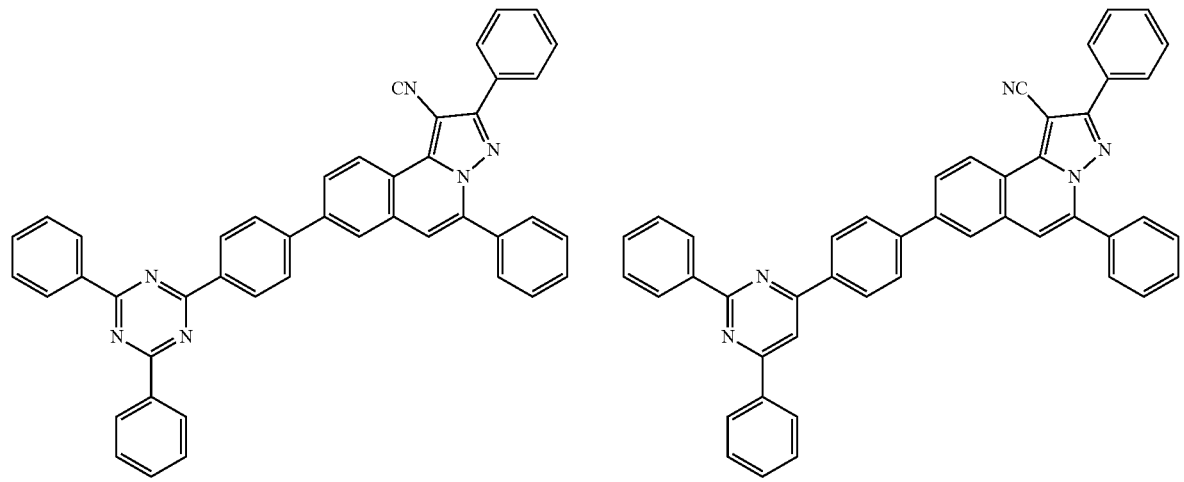
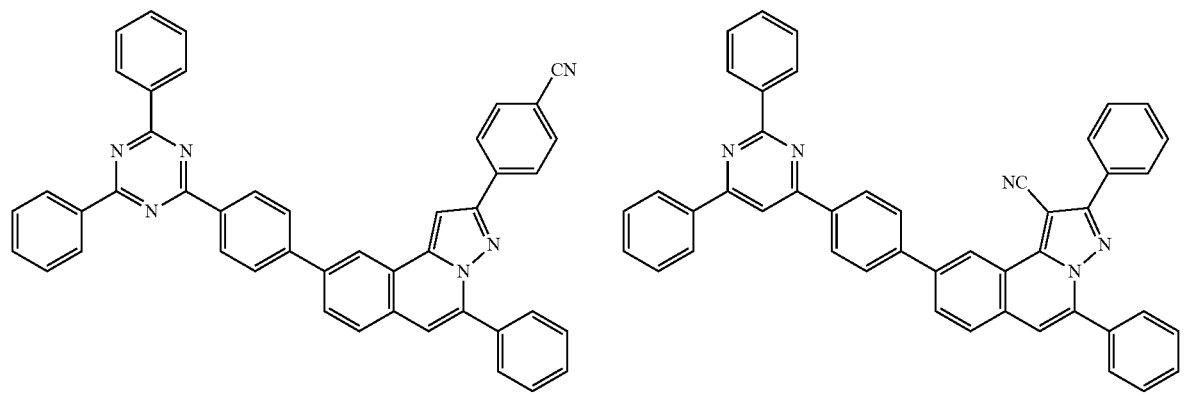
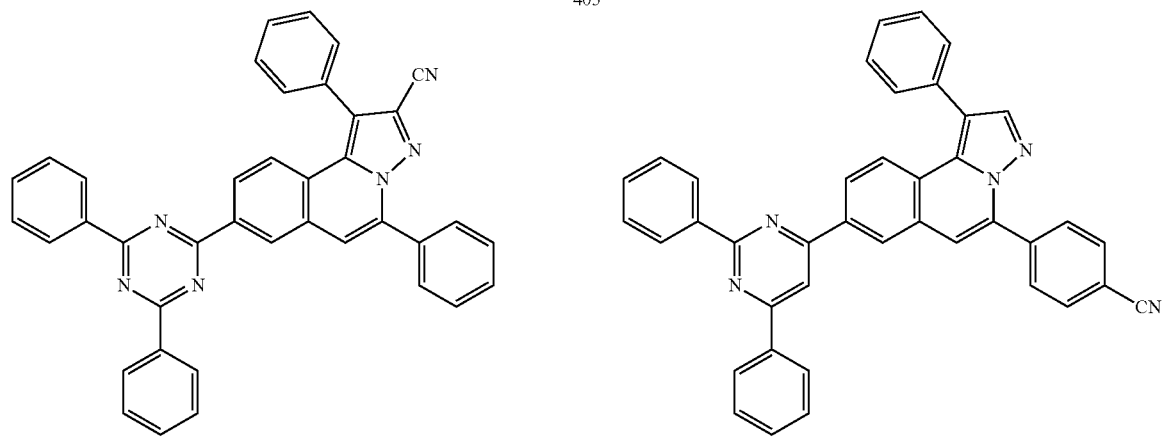

-continued
407
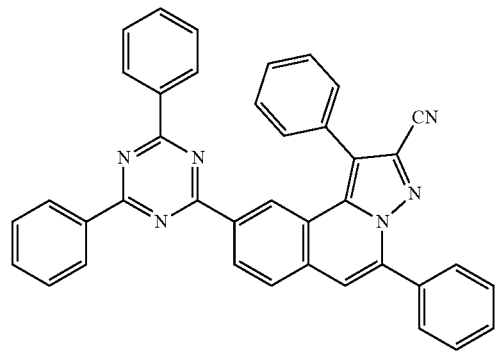
408
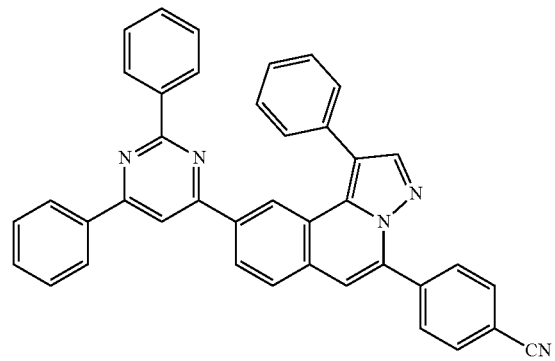
409
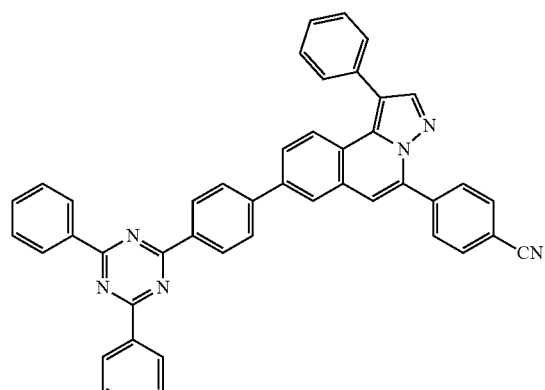
410
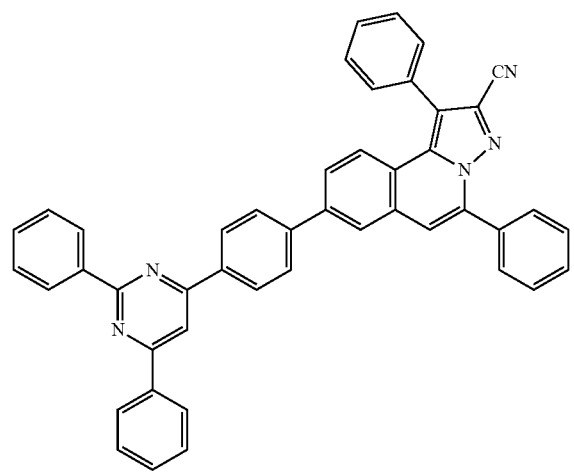
411
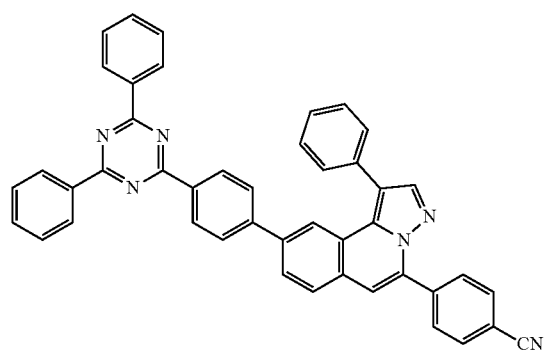
412
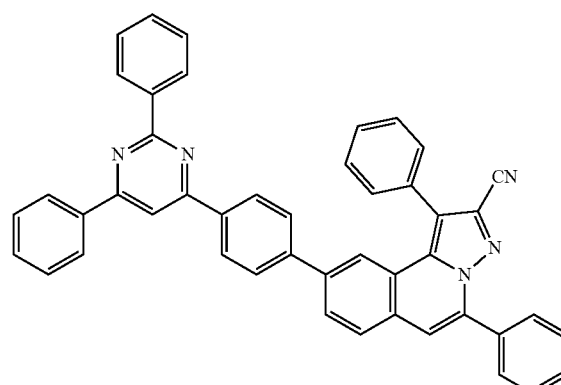

-continued
413
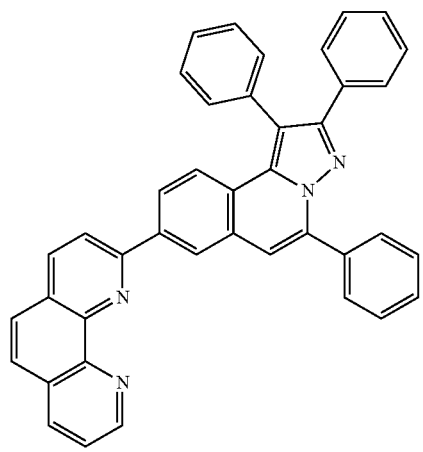
414
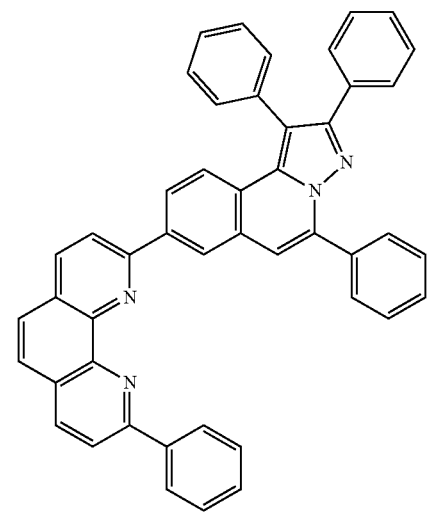
415
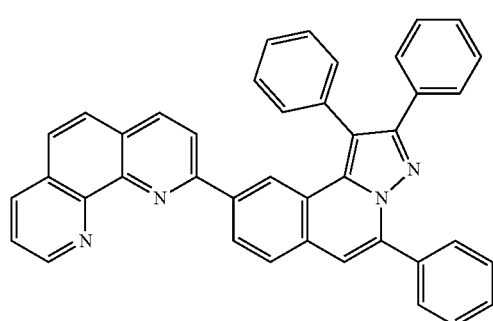
416
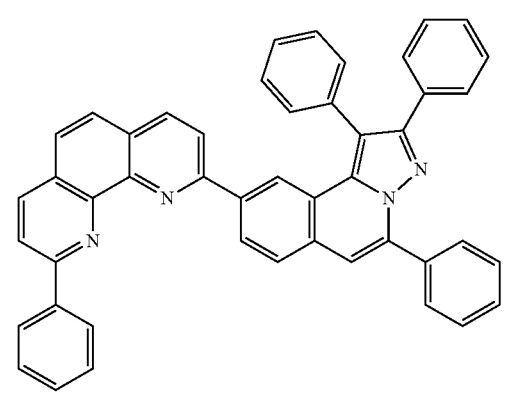
417
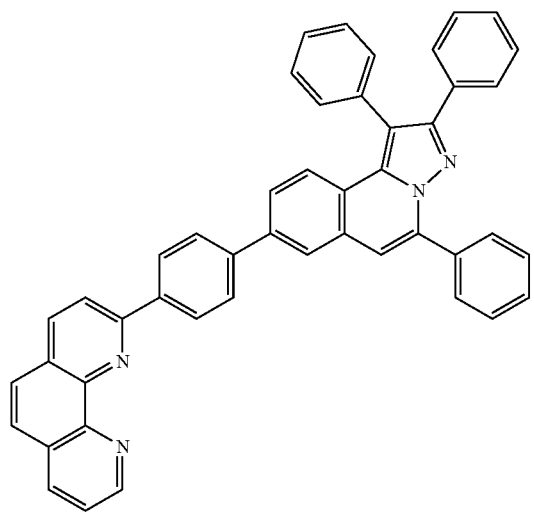
418
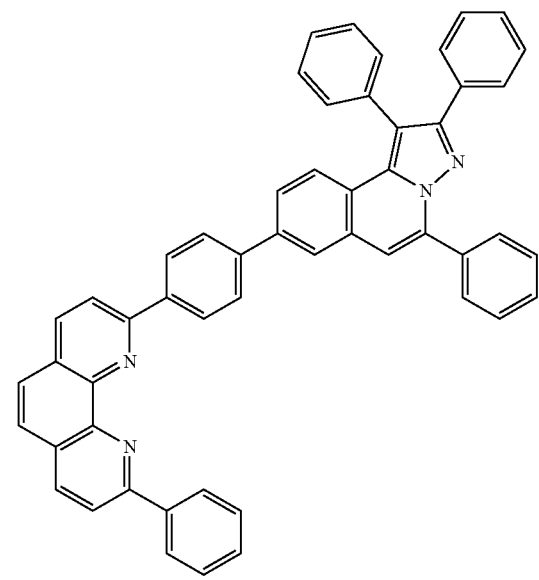

419
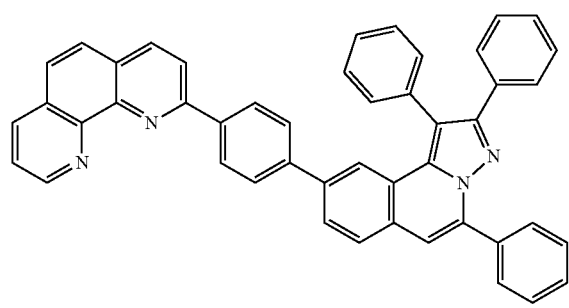
420
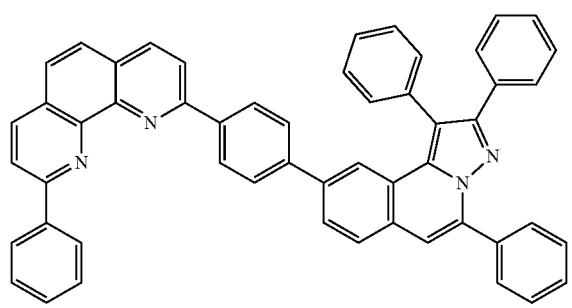
421
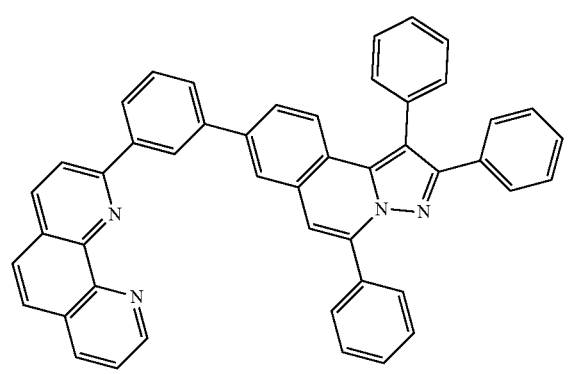
422
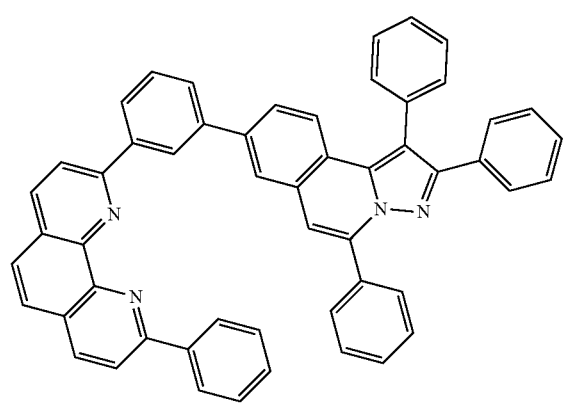
423
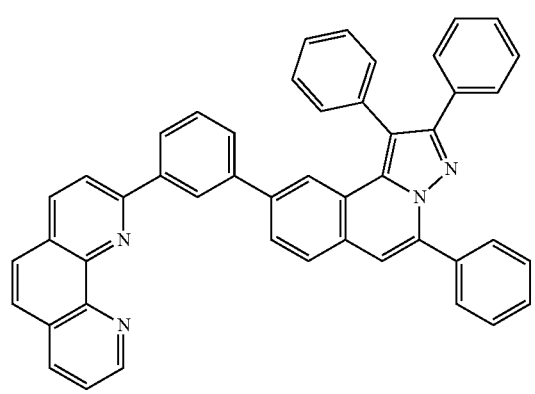
424
425
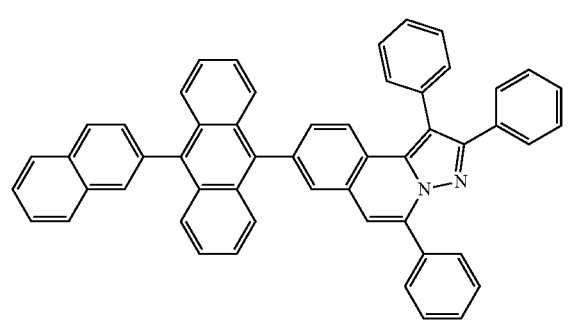
426
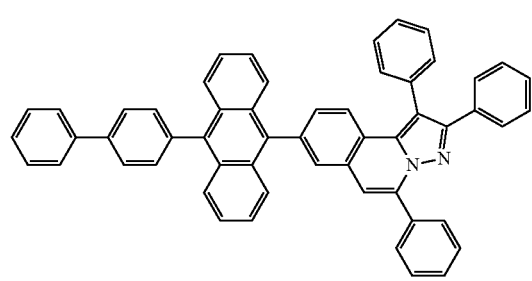

-continued

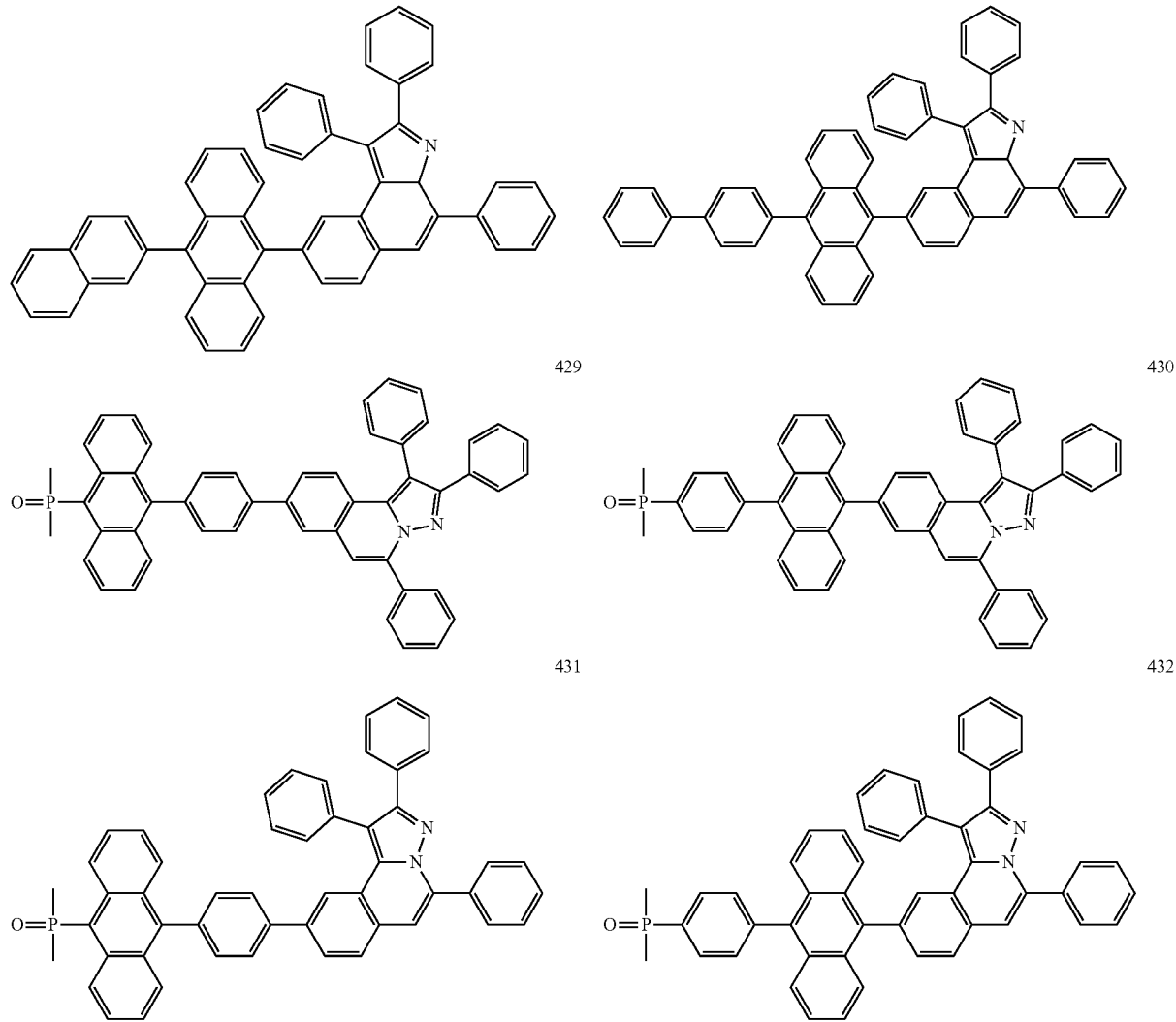

7. An organic light emitting device comprising:
a first electrode;
a second electrode; and
an organic material layer provided between the first electrode and the second electrode,
wherein the organic material layer comprises one or more types of the heterocyclic compound of claim 1.

8. The organic light emitting device of claim 7, wherein the organic material layer comprises an electron transfer layer, and the electron transfer layer comprises the heterocyclic compound.

9. The organic light emitting device of claim 7, wherein the organic material layer comprises a hole blocking layer, and the hole blocking layer comprises the heterocyclic compound.

10. The organic light emitting device of claim 7, further comprising one layer selected from the group consisting of a light emitting layer, a hole injection layer, a hole transfer layer, an electron injection layer, an electron transfer layer, an electron blocking layer and a hole blocking layer.

11. The organic light emitting device of claim 7 comprising:
a first stack provided on the first electrode and comprising a first light emitting layer;
a charge generation layer provided on the first stack; and
a second stack provided on the charge generation layer and comprising a second light emitting layer,
wherein the second electrode is provided on the second stack.

12. The organic light emitting device of claim 11, wherein the charge generation layer comprises the heterocyclic compound.

13. The organic light emitting device of claim 12, wherein the charge generation layer comprises an N-type charge generation layer, and the N-type charge generation layer comprises the heterocyclic compound.

* * * * *